United States Patent [19]

Murashita et al.

[11] Patent Number: 5,907,637
[45] Date of Patent: May 25, 1999

[54] METHOD AND APPARATUS FOR COMPRESSING AND DECOMPRESSING DATA

[75] Inventors: Kimitaka Murashita; Yoshiyuki Okada; Shigeru Yoshida, all of Kawasaki, Japan

[73] Assignee: Fujitsu Limited, Kawasaki, Japan

[21] Appl. No.: 08/948,325

[22] Filed: Oct. 10, 1997

Related U.S. Application Data

[63] Continuation of application No. 08/426,700, Apr. 24, 1995, abandoned.

[30] Foreign Application Priority Data

Jul. 20, 1994 [JP] Japan .................................. 6-168502

[51] Int. Cl.⁶ .................................................. G06K 9/36
[52] U.S. Cl. .......................... 382/239; 382/232; 382/245; 382/246
[58] Field of Search .................................. 382/232, 239, 382/229, 245, 246; 358/261.1, 261.2, 261.3, 426, 427; 341/51, 65, 79, 87, 67

[56] References Cited

U.S. PATENT DOCUMENTS

| | | | |
|---|---|---|---|
| 3,835,467 | 9/1974 | Woodrum | 341/65 |
| 4,500,955 | 2/1985 | Chang | 395/775 |
| 4,626,829 | 12/1986 | Hauck | 382/245 |
| 4,847,677 | 7/1989 | Music et al. | 382/245 |
| 4,853,696 | 8/1989 | Mukherjee | 382/246 |
| 4,955,066 | 9/1990 | Notenboom | 382/229 |
| 5,136,289 | 8/1992 | Yoshida et al. | 341/67 |
| 5,150,119 | 9/1992 | Yoshida et al. | 341/51 |
| 5,151,950 | 9/1992 | Hullender | 382/229 |
| 5,177,622 | 1/1993 | Yoshida et al. | 358/429 |
| 5,254,990 | 10/1993 | Yoshida et al. | 341/87 |
| 5,278,918 | 1/1994 | Bernzott et al. | 382/229 |
| 5,377,281 | 12/1994 | Ballard et al. | 382/229 |
| 5,392,563 | 2/1995 | Fujisaki et al. | 382/229 |
| 5,422,734 | 6/1995 | Kang | 382/232 |

FOREIGN PATENT DOCUMENTS

| | | | |
|---|---|---|---|
| 0 582 907 A2 | 2/1994 | European Pat. Off. | H03M 7/30 |
| 4-185117 | 7/1992 | Japan | H03M 7/30 |
| 4-270413 | 9/1992 | Japan | G06F 5/00 |
| 4-286084 | 10/1992 | Japan | G06F 15/66 |
| 5-152971 | 6/1993 | Japan | H03M 7/30 |
| 6-18412 | 1/1994 | Japan | G01N 21/41 |

OTHER PUBLICATIONS

European Search Report for EP 95 10 6027; dated Jul. 4, 1996.

Bailey, R.L. and Mukkamala, R.; *Pipeline Data Compression Algorithms;* 8199 The Computer Journal; vol. 33, No. 4; pp. 308–313; Aug. 1990.

Jones, Douglas W.; *Application of Splay Trees to Data Compression;* 8070 Communications of the ACM; vol. 31, No. 8; pp. 996–1007; Aug. 1988.

*Primary Examiner*—Jose L. Couso
*Assistant Examiner*—Anh Hong Do
*Attorney, Agent, or Firm*—Armstrong, Westerman, Hattori, McLeland & Naughton

[57] ABSTRACT

A method and an apparatus for compressing and decompressing data employ a splay coding instead of an arithmetic coding to achieve a high speed code entering process. The data compressing apparatus encoding input data according to a history of occurrence of the input data in the past to compress it, includes a pre-data retaining unit retaining a context, a history retaining unit retaining a combination of input data and a context, a code tree retaining unit retaining code trees each independent for each context, a code tree determining unit determining a code tree, a code outputting unit outputting unique data according to bifurcation from a node on the code tree, a code tree rearrangement unit exchanging an encoded leaf with another leaf or an internal node, and a pre-data updating unit entering the data in the pre-data retaining unit.

34 Claims, 75 Drawing Sheets

| ADDRESS | CHILD NODE | BROTHER NODE | STORED CHARACTER |
|---|---|---|---|
| 000 | 101 | (001) | a |
| 001 | 102 | (002) | b |
| 002 | VACANT | (003) | c |
| : | : | : | : |
| 0FF | VACANT | (100) | z |
| 100 | VACANT | VACANT | EOF |
| 101 | VACANT | 103 | a |
| 102 | VACANT | VACANT | b |
| 103 | 105 | 104 | b |
| 104 | VACANT | VACANT | c |
| 105 | VACANT | VACANT | c |
| : | : | : | : |
| FFF | VACANT | VACANT | VACANT |

STORING FORM OF A CONTEXT TREE

PARENTAL RELATION IN DICTIONARY

INITIALIZATION OF CODE TREE

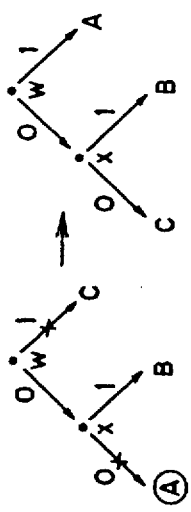
FIG. 19(a) BASIC OPERATION FOR UPDATING A SPLAY CODE
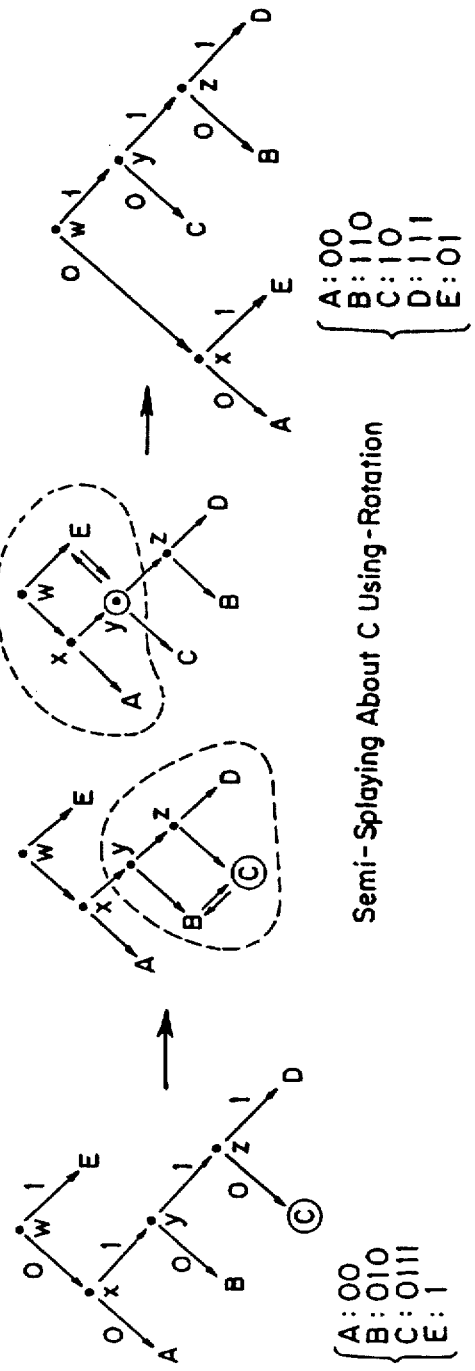
FIG. 19(b) EXAMPLE OF SPLAY CODE UPDATING

CONTEXT TREE

ENCODING

FIG. 29

[EXAMPLE OF ENCODING]

| CODE | ① | ② | ③ | ④ | ⑤ | ⑥ | ⑦ | ⑧ |
|---|---|---|---|---|---|---|---|---|
| INPUT CHARACTER (C) | a | b | c | a | b | c | ab | b |
| CHARACTER (STRING) NUMBER | 1 | 2 | 3 | 5 | 7 | 9 | 11 | ESC+2 |
| CODE WORD | 00 | 01 | 000 | 0 | 0 | 0 | 10 | 11 1 |

FIG.30(a)

```
Ak:= cum+1;
Aes= cum+2;
Child[Ap]:=Ak;
Key[Ap]:= K;
Sibling[Ak]:=cum+2;
Key[Aes]:= ESC;
Left[Ap]:= map(Ak);
Right[Ap]:= map(Aes);
Up[map(Ak)]:= map(Ap);
Up[map(Aes)]:= map(Ap);
cum:=cum+2;
enode:=enode+2;
```

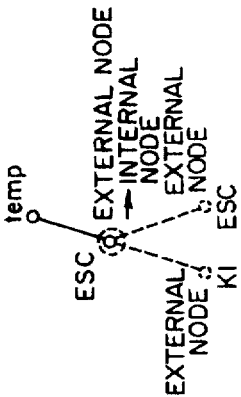

PROCEDURE TO GENERATE A CHILD NODE OF THE CHARACTER K BELOW THE IMMEDIATELY PRECEDING CHARACTER P

DESCRIPTION OF SYMBOLS: CONTEXT TREE
  AP : A POINTER TO A NODE OF THE PRECEDING CHARACTER P IN THE CONTEXT TREE
  cum: THE NUMBER OF NODES
  Up : ARRAY OF POINTERS TO ABOVE NODES
     : ARRAY OF POINTERS TO NODES ON THE LOWER RIGHT SIDE
  Right: ARRAY OF POINTERS TO NODES ON THE LOWER LEFT SIDE
  Left : THE NUMBER OF INTERNAL NODES
  inode : THE NUMBER OF EXTERNAL NODES INITIAL SET VALUE
  cum: = 257;
  enode: = 4096;
  inode: = 256;

FIG.30(b)

```
Ak1:= cum+1;
Sibling[Ak]:= Ak1;
Key[Ak1]:= K1;
temp:=Up[map(Ak)];
T:=inode+1;
Up[T]:=temp;
if(Left[temp]=map(Ak))
    Left[temp]:=T;
else
    Right[temp]:=T;
Up[map(Ak)]:=T;
Up[map(Ak1)]:=T;
cum:=cum+1;
inode:=inode+1;
enode:=enode+1;
```

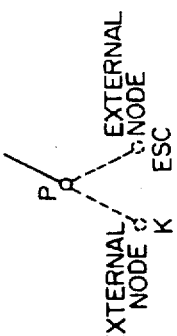

PROCEDURE TO GENERATE A BROTHER NODE (K1) OF THE CHARACTER K BELOW THE IMMEDIATELY PRECEDING CHARACTER P

AK : A POINTER TO A NODE OF THE CHARACTER K ON THE CONTEXT TREE
  AK1: A POINTER TO A NODE OF THE CHARACTER K1 ON THE CONTEXT TREE
  T  : A POINTER TO A NEW INTERNAL NODE ON ITS CODE TREE

DESCRIPTION OF SYMBOLS: CODE TREE
  Key: ARRAY OF A STORED CHARACTER OF THE NODE
  Sibling : ARRAY OF A POINTER OF THE BROTHER NODE
  Child : ARRAY OF A POINTER OF THE CHILD NODE
  cum : THE NUMBER OF NODES map(X) = X+4096
  FUNCTION TO CONVERT THE POINTER X OF THE CONTEXT TREE TO A POINTER OF AN EXTERNAL NODE OF THE CODE TREE

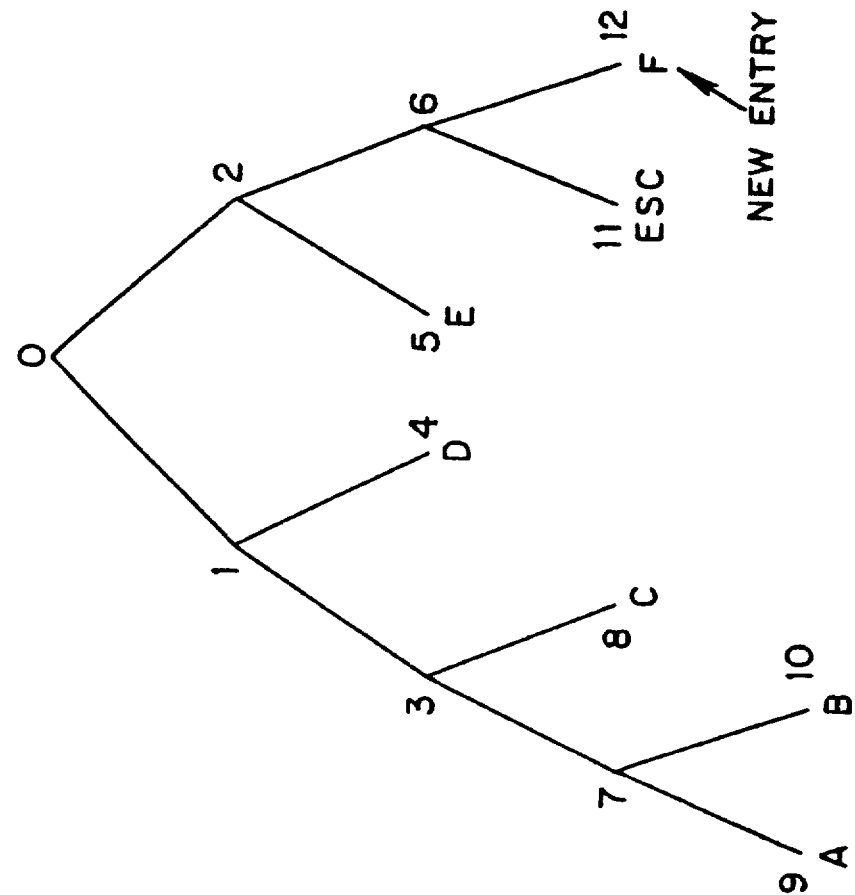
FIG. 60(a) BEFORE ENTRY
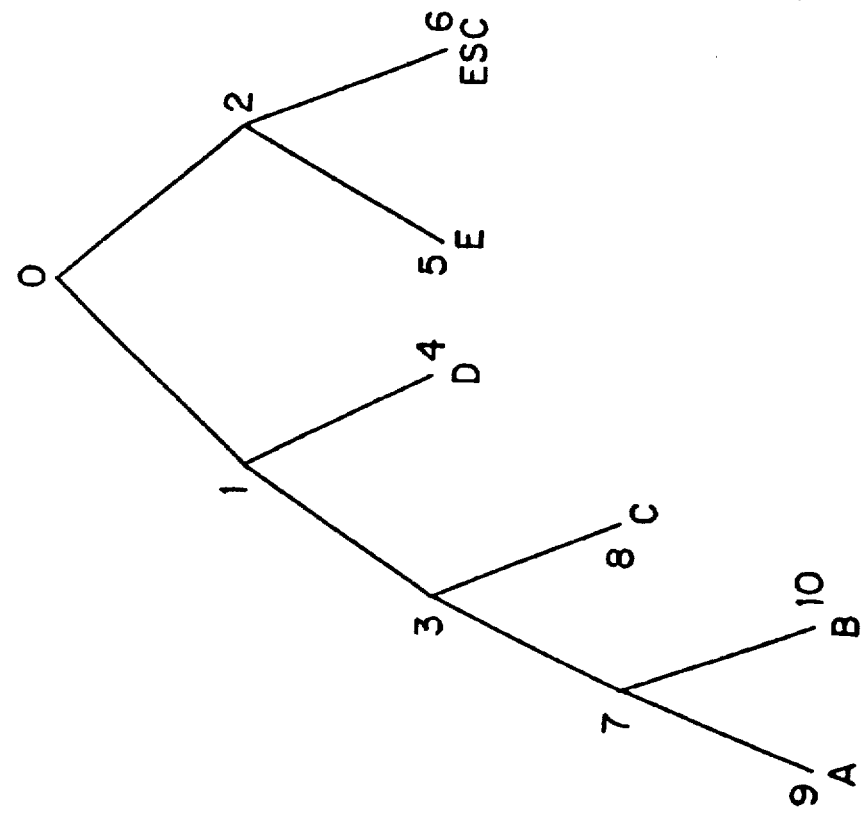
FIG. 60(b) AFTER ENTRY

| SYMBOL | FREQUENCY OF OCCURRENCE | SECTION |
|--------|-------------------------|---------|
| a | 0.20 | (0, 0.2) |
| b | 0.10 | (0.2, 0.3) |
| c | 0.05 | (0.3, 0.35) |
| d | 0.15 | (0.35, 0.5) |
| e | 0.50 | (0.5, 1) |

EXAMPLE OF SYMBOLS AND FREQUENCY OF OCCURRENCE

WHEN A CHARACTER STRING IS "abe", FOR EXAMPLE

EXAMPLE OF SECTION DIVISION ACCORDING TO FREQUENCY OF OCCURRENCE

FIG. 72

```
/* ARITHMETIC ENCODING ALGORIHM.*/

/* Call encode_symbol repeatedly for each symbol in the message.      */
/* Ensure that a distinguished "terminator" symbol is encoded last, then */
/* transmit any value in the range (low, high).                       */ encode_symbol(symbol, cum_freq)
    range = high - low
    high  = low + range* cum_freq(symbol-1)
    low   = low + range* cum_freq(symbol)

/* ARITHMETIC DECODING ALGORITHM

/* "Value" is the number that has been received.                              */
/* Continue calling decode_symbol until the terminator symbol is returned.    */ decode_symbol(cun_freq)
    find symol such that
        cum_freq(symbol) <= (value-low)/(value-low) < cum_freq symbol-1)
                        /* This ensures that value lies within the new    */
                        /* (low, high) range that will be calculated by   */
                        /* the following lines of code                    */ range = high - low
    high  = low + range cum(freq(symbol-1)
    low   = low + range cum_freq(symbol)
    return symbol
```

CODE TREE OF A SPLAY TREE

CODE OF SYMBOL A : 10110
CODE OF SYMBOL B : 001

EXAMPLE OF REARRANGING SPLAY-TREE

CODE OF THE SYMBOL A IS 10110

CODE OF THE SYMBOL A IS 110

CONTEXT AND OBJECT CODE

TREE STRUCTURE OF CONTEXT

METHOD AND APPARATUS FOR COMPRESSING AND DECOMPRESSING DATA

This application is a Continuation of Ser. No. 08/426,700 filed Apr. 24, 1995, now abandoned.

BACKGROUND OF THE INVENTION

(1) Field of the Invention

The present invention relates to a data compressing method and a data decompressing method, and a data compressing apparatus and a data decompressing apparatus therefor.

(2) Description of Related Art

Recent computers tend to deal various types of data such as graphic character codes, vector information, image pictures, etc. and a volume of the data dealt in the computer rapidly increases. When a large volume of data is dealt with, redundant portions in the data are omitted to compress the volume of data so as to decrease a required storage capacity or transmit the data faster. A universal coding is proposed as a method being capable of compressing various data in one manner.

Incidentally, this invention is applicable to various data, not limited to a field of character code compression. In this specification, one word unit is called a character, and data composed of the voluntary number of words is called a character string.

There are a dictionary coding utilizing analogy of data sequences, and a statistical coding utilizing frequency of occurrence of a data string. The above-mentioned universal coding is a representative method of the statistical coding.

As a representative manner of the universal coding, there is also an arithmetic coding. The arithmetic coding is to generate a code adaptable to an occurrence probability of each character without using a code table, considered to be able to compress at a maximum efficiency if an occurrence probability of each character of information source is known. The arithmetic coding is classified into a binary arithmetic coding and a multi-value arithmetic coding of more than binary value.

Hereinafter, the multi-value arithmetic coding will be described.

In the multi-value arithmetic coding, a number line of $0 \leq P < 1$ (described as [0,1] hereinafter) is, to begin with, divided by the number of events of characters having appeared (referred as a symbol, hereinafter).

A width of each section is taken as in proportion to a ratio of an occurrence probability of each symbol, and the sections are arranged in the order of high occurrence probability.

Next, a section corresponding to an occurring symbol is selected, the selected section is divided into sections corresponding to the number of all symbols when the next symbol occurs, and a section corresponding to the next symbol is selected so that the selected section is divided recursively.

The above process will be described in more detail by reference to illustrations showing a principle of the multi-value arithmetic coding in FIGS. 70(a) and 70(b).

FIG. 70(a) shows an example of frequencies of occurrence of symbols, while FIG. 70(b) showing an example of how to divide the section of a symbol.

By way of an example where a section of a graphic character string "abe" is obtained in the dividing.

Now, a number line (0, 1) is divided into five sections of characters a, b, c, d and e as shown in FIG. 70(a).

First, a section (0, 0.2) of a symbol "a" which occurs first is selected. Then, the selected section (0, 0.2) is further divided into five sections of all the symbols "a" through "e".

A section (0.04, 0.06) of the symbol "b" which occurs secondary is selected, then divided into five sections of all the symbols "a" through "e". A section of the symbol "e" which occurs last is selected so that a section [0.05, 0.06) of a character string "a b e" is finally obtained.

As above, by repeating the above process on all input data, it is possible to determine a section of a character string to be encoded. An arbitrary point in the section of the character string that is finally determined is represented in a binary notation, then outputted as a compressed code.

A term "arithmetic coding" is derived from that a code word is expressed in a binary numerical value after the decimal point as [0.11011..], which can be obtained in calculation.

As a method to divide a section according to a frequency of occurrence as above, there are a static coding in which a section is divided according to a predetermined frequency of occurrence, not depending on an actual frequency of occurrence of a character string, a semi-adaptive coding in which a section is divided according to a frequency of occurrence obtained by scanning in advance all character strings, and an adaptive coding in which a frequency is calculated whenever a character occurs to reset the section for each character.

Meanwhile, a method to compress data into a unit of bite (character) using the above multi-value arithmetic coding for file compression is described in, for example, the following two documents (1) and (2). (1) "Arithemtic Coding for Data Compression," Commun. of ACM. Vol.30, No.6, PP.520–540 (1986) (2) "An Adaptive Dependency Source Model for Data Compression Scheme," Commun. of ACM, Vol.32, No.1, PP.77–83

The document (1) teaches an actual algorithm of the multi-value arithmetic coding. The multi-value coding in document (1) is one of the methods, which is called as an entropy coding which codes and compresses data by a single character unit. In the entropy coding, a probability of occurrence of a focused character is encoded in the multi-value coding and the probability of occurrence of each character is sequentially updated whenever a character occurs so that the entropy coding can code various data dynamically and adaptively. A detailed process of the multi-value coding is as shown in a flowchart in FIG. 71(a).

The document (2) teaches a method to express a focused character with a conditional probability using an immediately preceding character, encode the conditional probability in the multi-value coding so as to obtain a high compression rate. In the method in the document (2), each of the conditional probability is sequentially updated so as to be able to encoded various data dynamically and adaptively various data. In such the multi-value coding, the process shown in a flowchart in FIG. 70(b) is performed.

There is proposed, instead of the multi-value coding, a Dynamic Huffman Coding which is a modification of Huffman coding (refer to "Variations on a Theme by Huffman", IEEE Trans. Inform. Theory, Vol.24, No.6, 1978, or "Design and Analysis of Dynamic Huffman Codes", Journal of ACM, Vol.34, No.4, 1987). The Dynamic Huffman Coding has a coding efficiency inferior to the multi-value coding, which requires a longer processing time. For this, there is no actual application of a method to encode a conditional probability in the dynamic Huffman coding.

FIG. 72 shows an example of an algorithm of the multi-value arithmetic encoding and decoding.

Different from the arithmetic coding, there is a Splay-Tree coding (refer to "Application of Splay Tree to Data Compression" by Douglas W. Jones, Commun. of ACM, Vol.31, No.8, P.996–1007, for example).

The splay coding uses a code table in a tree structure (referred as a code tree, hereinafter) as shown in FIG. 73(a), where a symbol is entered at an end of the code tree (called a leaf, in general) and a distance from a top of the code tree (called a root, in general) to a leaf at which input data is stored is outputted as a code word.

More specifically, assuming the path goes down from the root to the leaf of the code tree, "1" is allocated to the code word when the path branches to the right, and "0" is allocated when the path branches to the left.

In the example shown in FIG. 73(a), the code of a symbol A becomes [10110] and a symbol B becomes [001].

If the code length is changed (that is, if the code is updated), a coded leaf is exchanged with other leaf or a contact on the code tree (called as a node).

FIG. 73(b) shows an example of the above-mentioned code updating. As shown in FIG. 73(b), as input data, symbols A, B, C and D are initially stored in leaves of the code tree.

A node of the symbol A and a node of the symbol C are exchanged, a higher degree node D of the symbol A and a node of a symbol E are exchanged as shown in FIG. 73(C). As a result, the code of the symbol A becomes [110] from [10110] so that the code is updated.

The above case is to dynamically encode a probability of occurrence of each word in a variable length coding. To more increase a compression rate, a conditional probability of occurrence introduced a relationship of dependency between an input signal and the immediately preceding character therein is encoded in a dynamic variable-length coding.

This method is a statistical coding using a statistical characteristic of data. As shown in FIG. 74, this coding is performed in a process made up of two stages, that is, a context collecting step 511 and a dynamic variable-length coding step 512, as shown in FIG. 74.

A context in a front and behind relation with a character string is collected from input data at a context collecting step, a tree structure of a context as shown in FIG. 75(b) is generated and it is encoded in a dynamic variable-length coding to determine a conditional probability.

The above conditional probability is determined by counting the number of occurrence every time a character string crosses over a character in each node on a context tree in a tree structure shown in FIG. 75(b).

A context collecting method to determine a conditional probability is chiefly classified into the following two methods. Incidentally, the number of character of a condition (a context) will be hereinafter referred as degree (refer to "Data Compression Using Adaptive Coding and Partial String Matching", JOHN G. CLEARY et al., IEEE, Vol.COM-32, No.4, APRIL 1984, PP.396–402).

(1) Fixed-Degree Context Collecting Method

This method expresses a condition of a conditional probability with a fixed character number.

For instance, in an degree-2 context, a context of a character following two immediately preceding characters is collected to encode a conditional probability $p(y|x_1, x_2)$, wherein y is a focused character to be encoded, $x_1$ and $x_2$ are the first character and the second character followed by the focused character, respectively.

(2) Blending Context Collecting Method

In the above fixed-degree context collecting method, if the immediately preceding conditional character string rarely occurs, an estimation of a conditional probability tends to be inaccurate. To the contrary, if the immediately preceding conditional character string frequently occurs, an estimation of the conditional probability tends to be accurate, where there still remains a possibility to increase the degree.

In general, data coming to have a stronger correlation between characters when the degree used is more increased can provide a high compression rate. However, data coming to have a weaker correlation between characters as the degree used is more increased provides a poor compression rate.

What can solve the above problem is to blend the context (blending of the degree). In this method, the degree of the immediately preceding character string is not fixed. The degree is increased if the occurrence is frequent, and if the occurrence is rare, the degree is kept in the lower number. As this, the degree is increased adaptively to input data.

However, the statistical coding employing an arithmetic coding to a dynamic variable-length code needs to compute once more an accumulated frequency of all data having been inputted every time data is inputted and to divide a number line of [0, 1) once more. There is required an enormous volume of arithmetic process so that it is impossible to increase the processing rate.

SUMMARY OF THE INVENTION

To solve the above problems, an object of this invention is to provide a data compressing method and a data decompressing method, and a data compressing apparatus and a data decompressing apparatus therefor, which enable a high-speed code entering process by entering new data into a code tree while rearranging the code tree, instead of complying a computation of sections in an arithmetic coding.

In accordance with the present invention, a data compressing method for compressing input data by encoding the input data according to a history of occurrence of the input data in the past, comprising performing a context collecting step for collecting character strings of said input data, and performing a coding step for generating and updating a code tree while rearranging the code tree according to the character strings of said input data obtained in said context collecting step.

A data compressing method for compressing input data by encoding the input data according to a history of occurrence of the input data in the past comprising collecting the character strings of said input data, numbering them, and entering them in a dictionary, corresponding a code to each of the character strings, encoding and updating the code corresponding to a dictionary number of a longest coinciding character string, entering an elongated character string of said character string to be encoded until said elongated character string reaches a predetermined maximum character string length, entering a code corresponding to said elongated character string.

A data decompressing method for decompressing encoded data obtained by encoding input data according to a history of the input data in the past, comprising performing context collecting step for collecting character strings of decoded data, performing a coding step for generating and updating a code tree while rearranging the code tree according to said character strings of the decoded data obtained at said context collecting step.

A data decompressing method for decompressing encoded data obtained by encoding input data according to a history of the input data in the past, comprising collecting character strings of decoded data, numbering them, and entering them in a dictionary, and corresponding a code to each of the character strings of said decoded data, decoding a character string corresponding to a dictionary number as a code and updating it, entering an elongated character string of said encoded character string until said elongated character string reaches a predetermined maximum character string length, entering a code corresponding to said elongated character string.

A data compressing method for compressing input data by encoding the input data according to a history of occurrence of the input data in the past comprising performing a context collecting step for retaining a combination of input data and a context composed of continuous n data followed by said input data, performing a code tree retaining step for retaining code trees each independent for each of said context, performing a code outputting step for outputting a code defined as unique data according to bifurcation of nodes that is a bifurcating point on a path from a root that signifies a top of said code tree to leaf in which said data is stored if data corresponding to the context retained in said context collecting step occurs, performing a code tree rearrangement step for exchanging a leaf of said data with a leaf of another data or an internal node after a process at said code outputting step.

A data compressing method for compressing input data by encoding the input data according to a history of occurrence of the input data in the past comprising performing a context collecting step for retaining a combination of input data and a context composed of continuous n data followed by said input data, performing a code tree retaining step for retaining code trees each independent for each of said context, performing a code outputting step for outputting a code defined as unique data according to bifurcation of a node that is a bifurcating point on a path from a root that signifies a top of said code tree to a leaf on said code tree in which said data is stored if data corresponding to the context retained in said context collecting step occurs, performing a code tree rearrangement step for exchanging a leaf of said data with a leaf of another data or an internal node after a process at said code outputting step, performing a context discriminating step for discriminating whether said combination of the input data and the context is retained at said context collecting step, performing an escape code retaining step for retaining in advance on said code tree a leaf in which an escape code defined as data representing that data is not stored, if said combination of the input data and the context is not retained in a history at said context collecting step, outputting said escape code, repeating a process to shorten a context of said data until a combination retained at said context collecting step is obtained.

A data compressing method for compressing input data by encoding the input data according to a history of occurrence of the input data in the past comprising performing a context collecting step for retaining a combination of input data and a context composed of continuous n data followed by said input data, performing a code tree retaining step for retaining code trees each independent for each of said context, performing a code outputting step for outputting a code defined as unique data according to bifurcation of a node that is a bifurcating point on a path from a root that signifies a top of said code tree to a leaf on said code tree in which said data is stored if data corresponding to the context retained at said context collecting step occurs, performing a code tree rearrangement step for exchanging a leaf of said data with a leaf of another data or an internal node after a process at said code outputting step, performing a context discriminating step for discriminating whether said combination of the input data and the context is retained at said context collecting step, performing an escape code retaining step for retaining in advance on said code tree a leaf in which an escape code defined as data representing that data is not stored, performing a context newly entering step for newly entering said combination of input data and a context in said context collecting step if said combination of the input data and the context is not retained in a history at said context collecting step, performing a code tree newly entering step for, if said combination of the input data and the context is not retained in a history at said context collecting step, newly entering said data in said code tree corresponding to the context, if said combination of the input data and the context is not retained in the history at said context collecting step, outputting a code of said escape code, entering at the same time said combination of the input data and the context in the history, entering said data in said code tree corresponding to the context, repeating a process to shorten the context of said data until a combination retained at said context collecting step is obtained.

A data compressing method for compressing input data by encoding the input data according to a history of occurrence of the input data in the past comprising performing a context collecting step for retaining a combination of input data and a context composed of continuous n data followed by said input data, performing a code tree retaining step for retaining code trees each independent for each of said context, performing a code outputting step for outputting a code defined as unique data according to bifurcation of a node that is a bifurcating point on a path from a root that signifies a top of said code tree to a leaf on said code tree in which said data is stored if data corresponding to the context retained at said context collecting step occurs, performing a code tree rearrangment step for exchanging a leaf of said data with a leaf of another data or an internal node after a process at said code outputting step, performing a context discriminating step for discriminating whether said combination of the input data and the context is retained at said context collecting step, performing an escape code retaining step for in advance on said code tree retaining a leaf in which an escape code defined as data representing that data is not stored, performing a context newly entering step for newly entering said combination of input data and a context in said context collecting step if said combination of the input data and the context is not contained in a history at said context collecting step, performing a code tree newly entering step for, if said combination of the input data and the context is not retained in a history at said context collecting step, newly entering said data in said code tree corresponding to the context, at said context newly entering step and said code tree newly entering step, entering only a combination of an immediately preceding context which is decided to be included in the history and said data.

A data decompressing method for decompressing decoded data obtained by encoding input data according to a history of the input data in the past comprising performing a context collecting step for retaining s history of a combination of decoded data and a context, performing a code tree retaining step for retaining code trees each independent for each of said context, performing a code tree determining step for determined a code tree of said data from a context of data having been decoded up to immediately before, performing decoding step for decoding said data from said code tree determined at said code tree determining step and a code of said data, performing a code tree rearrangement step for exchanging a leaf that is a data storing point on said code tree with another leaf or an internal node that is a bifurcating point on said code tree using the same means as a compressor after said data has been decoded at said decoding step.

A data decompressing method for decompressing encoded data obtained by encoding input data according to a history of the input data in the past comprising performing a context collecting step for retaining a history of a combination of decoded data and a context, performing a code tree retaining step for retaining code trees each independent for each context, performing a code tree determining step for determined a code tree of said data from a context of data having been decoded up to immediately before, performing decoding step for decoding said data from said code tree determined at said code tree determining step and a code of said data, performing a code tree rearrangement step for exchanging a leaf that is a data storing point on said code tree with another leaf or an internal node that is a bifurcating point on said code tree using the same means as an encoder after said data has been decoded in said decoding step, entering in advance an escape code defined as data representing that data is not stored in each of said code trees corresponding respective contexts, if said escape code is decoded at the decoding step, repeating a process to shorten a length of a context until a code excepting said escape code is decoded.

A data decompressing method for decompressing encoded data obtained by encoding input data according to a history of the input data in the past comprising performing a context collecting step for retaining history of a combination of decoded data and a context, performing a code tree retaining step for retaining code trees each independent for each context, performing a code tree determining step for determined a code tree of said data from a context of data having been decoded up to immediately before, performing decoding step for decoding said data from said code tree determined at said code tree determining step and a code of said data, performing a code tree rearrangement step for exchanging a leaf that is a data storing point on said code tree with another leaf or an internal node that is a bifurcating point on said code tree using the same means as an encoder after said data has been decoded at said decoding step, performing a context newly entering step for newly entering said data at said context collecting step, performing a code tree newly entering step for newly entering the decoded data in said code tree corresponding to the context, if an escape code defined as data representing that data is not stored is decoded, executing said context newly entering step and said code tree newly entering step, repeating a process to shorten a length of the context until a code excepting said escape code is decoded.

A data decompressing method for decompressing encoded data obtained by encoding input data according to a history of the input data in the past comprising performing a context collecting step for retaining history of a combination of decoded data and a context, performing a code tree retaining step for retaining code trees each independent for each context, performing a code tree determining step for determined a code tree of said data from a context of data having been decoded up to immediately before, performing a decoding step for decoding said data from said code tree determined at said code tree determining step and a code of said data, performing a code tree rearrangement step for exchanging a leaf that is a data storing point on said code tree with another leaf or an internal node that is a bifurcating point on said code tree using the same means as an encoder after said data has been decoded at said decoding step, performing a context newly entering step for newly entering said data at said context collecting step, performing a code tree newly entering step for newly entering the decoded data in said code tree corresponding to the context, if said escape code is decoded even once in a process until a code excepting the escape code defined as data representing that data is not stored is decoded, newly entering the decoded data in a context obtained immediately before the decoding of a code excepting said escape code at said context newly entering step and said code tree newly entering step.

A data compressing apparatus encoding input data according to a history of occurrence of the input data in the past to compress the input data comprising a pre-data retaining means retaining a context composed of n input data having been inputted up to immediately before an input of said input data, a code tree retaining means retaining code trees each independent for each of said context, code tree determining means determining a code tree of said data from said input data obtained up to immediately before retained in said pre-data retaining means, a code outputting means outputting unique data according to bifurcation from a node that is a bifurcating point positioning on a path from a root that signifies a top of said code tree selected by said code tree determining means to a leaf in which said data is stored, a code tree rearrangement means exchanging an encoded leaf with another leaf or an internal node, a pre-data updating means entering said data in said pre-data retaining means.

A data compressing apparatus encoding input data according to a history of occurrence of the input data in the past to compress the input data comprising a pre-data retaining means retaining a context composed of n input data having been inputted up to immediately before an input of said input data, a history retaining means retaining a combination of said input data and a context, a code tree retaining means retaining code trees each independent for each context in which an escape code defined as data representing that data is not stored is entered in advance, a code tree determining means determining a code tree of said data from said context and said input data, a context discriminating means discriminating whether said data is stored in said code tree determined by said code tree determining means, an escape code outputting means outputting an escape code according to bifurcation from a node that is a bifurcating point positioning on a path from a leaf that signifies a top of said code tree to a leaf that is a data storing point if said data is not stored in said code tree, a context altering means shortening a length n of the context if said data is not stored in said code tree, a code outputting means outputting a code of said data according to bifurcation from a node positioning on a path from a root of said code tree to a leaf of said data if said data is not stored in said code tree, a code tree rearrangement means exchanging an encoded leaf with another leaf or an internal node, a pre-data updating means entering said data in said pre-data retaining means, a control means repeating a process until said data is encoded if said escape code is encoded.

A data compressing apparatus encoding input data according to a history of occurrence of the input data in the past to compress the input data comprising a pre-data retaining means retaining a context composed of n input data having been inputted up to immediately before an input of said input data, a history retaining means retaining a combination of said input data and a context, a code tree retaining means retaining code trees each independent for each context in which an escape code defined as data representing that data is not stored is entered in advance, a code tree determining means determining a code tree of said data from said context and said input data, a context discriminating means discriminating whether said data is stored in said code tree determined by said code tree determining means, an escape code outputting means outputting an escape code according to bifurcation from a node that is a bifurcating point positioning on a path from a leaf that signifies a top of said code tree to a leaf that is a data storing point if said data is not stored in said code tree, a history entering means entering said combination of said data and the context in said history retaining means if said data is not stored in said code tree, a code entering means newly entering said data in said code tree if said data is not stored in said code tree, a context altering means shortening a length n of the context if said data is not stored in said code tree, a code outputting means outputting a code of said data according to bifurcation from a node positioning on a path from a root of said code tree to a leaf of said data if said data is stored in said code tree, a code tree rearrangement means exchanging an encoded leaf with another leaf or an internal node, a pre-data updating means entering said data in said pre-data retaining means, a control means repeating a process until said data is encoded if said escape code is encoded.

A data compressing apparatus encoding input data according to a history of occurrence of the input data in the past to compress the input data comprising a pre-data retaining means retaining a context composed of n input data having been inputted up to immediately before an input of said input data, a history retaining means retaining a combination of said input data and a context, a code tree retaining means retaining code trees each independent for each context in which an escape code defined as data representing that data is not stored is entered in advance, a code tree determining means determining a code tree of said data from said context and said input data, a context discriminating means discriminating whether said data is stored in said code tree determined by said code tree determining means, an escape code outputting means outputting an escape code according to bifurcation from a node that is a bifurcating point positioning on a path from a leaf that signifies a top of said code tree to a leaf that is a data storing point if said data is not stored in said code tree, a context altering means shortening a length n of the context if the said data is not stored in said code tree, an escape code outputting means outputting a code of said data according to bifurcation from a node positioning on a path from a root of said code tree to a leaf of said data if said data is stored in said code tree, a history entering means entering the combination of said data and the context in said history retaining means, a code entering means newly entering said data in a code tree, a code tree rearrangement means exchanging an encoded leaf with another leaf or an internal node, a pre-data updating means entering said data in said pre-data retaining means, a control means causing said history entering means to enter a combination of a context immediately before the encoding of said data and said data in said history retaining means if said escape code is encoded even one in encoding of said data, and causing said code entering means to newly enter said data in a code tree having an escape code having been encoded immediately before the encoding of said data.

A data decompressing apparatus decoding a code having been encoded according to a history of occurrence in the past comprising a pre-data retaining means retaining n data having been decoded before decoding a code, a history retaining means retaining a combination of decoded data and a context therein, a code tree determining means determining a code tree used to decode said data from the context retained in said pre-data retaining means, a decoding means outputting data stored in a leaf that is a data storing point on a path reached by scanning a node that is a bifurcating point from a root that signifies a top of said code tree selected by said code tree determining means according to a code, a code tree rearrangement means exchanging a decoded leaf with another leaf or an internal node, and a pre-data updating means entering the decoded data in said pre-data retaining means.

A data decompressing apparatus decoding a code having been encoded according to a history of occurrence in the past comprising a pre-data retaining means retaining n data having been encoded before decoding a code, a history retaining means retaining a combination of decoded data and a context, a code tree retaining means retaining a code tree in which an escape code defined as data representing that data is not stored is entered in advance, a code tree determining means determining a code tree used to decode said data from the context retained in said pre-data retaining means, a decoding means outputting data stored in a leaf that is a data storing point reached by scanning a node that is a bifurcating point on a path from a root that signifies a top of said code tree selected by said code tree determining means according to a code, a code tree rearrangment means exchanging a decoded leaf with another leaf or an internal node, a context altering means discarding said data if outputted data is said escape code to shorten the context, a pre-data updating means entering the decoded data in said pre-data retaining means, a control means causing said context altering means to reset the context when said escape code is decoded and repeating a process until a code excepting said escape code is decoded.

A data decompressing apparatus decoding a code having been encoded according to a history of occurrence in the past comprising a pre-data retaining means retaining n data having been decoded before decoding a code, a history retaining means retaining a combination of decoded data and a context, a code tree retaining means retaining a code tree in which an escape code is stored in advance, a code tree determining means determining a code tree used to decode said data from the context retained in said pre-data retaining means, a decoding means outputting data stored in a leaf that is a data storing point reached by scanning a node that is a bifurcating point on a path from a root that signifies a top of said code tree selected by said code tree determining means according to a code, a code tree rearrangement means exchanging the decoded leaf with another leaf or internal node, a context altering means discarding said data if output data is said escape code to shorten the context, a pre-data updating means entering the decoded data in said data retaining means, a history entering means entering all contexts obtained when said escape code is decoded in a decoding process and decoded data in said history retaining means, a code entering means entering a code of said data in all code trees corresponding to the context obtained at the time of decoding of said escape code in the decoding process for said data, a control means causing said context altering means to reset the context when said escape code is decoded and repeating a process until said escape code is decoded.

A data decompressing apparatus decoding a code having been encoded according to a history of occurrence in the past comprising a pre-data retaining means retaining n data having been decoded before decoding a code, a history retaining means retaining a combination of decoded data and a context therein, a code tree retaining means retaining a code tree in which an escape code defined as data representing that data is not entered is stored in advance, a code tree determining means determining a code tree used to decode said data from the context retained in said pre-data retaining means, a decoding means outputting data stored in a leaf that is a data storing point reached by scanning a node that is a bifurcating point on a path from a root that means a top of said code tree selected by said code tree determining means according to a code, a code tree rearrangement means exchanging decoded leaf with another leaf or an internal node, a context altering means discarding said data if outputted data is said escape code to shorten the context, a pre-data updating means entering the decoded data in said pre-data retaining means, a history entering means entering a context at the time of the last decoding of said escape code in a decoding process for said data and the decoded data in said history retaining means, a code entering means entering a code of said data in a code tree corresponding to a context at the time of the last decoding of said escape code in the decoding process for said data, a control means causing said context altering means to reset the context if said escape code is decoded and repeating a process until a code excepting said escape code is decoded.

A data compressing method for encoding input data according to a history of occurrence of the input data in the past to compress the input data, comprising performing a context retaining step for retaining a context tree in which a combination of input data and a context composed of continuous n data followed by said input data performing a code tree retaining step for retaining code trees each independent for each of said context, performing a context tree newly entering step for newly entering said data in the context tree retained at said context tree retaining step if said combination of the input data and the context is not retained at said context tree retaining step, performing a code tree newly entering step for newly entering said data in the code tree retained at said code tree retaining step if said combination of the input data and the context is not retained at said context tree retaining step, performing a newly entering step for storing said data in a new leaf obtained by branching a leaf that is a data storing point on the code tree retained at said code tree retaining step if said combination of the input data and the context is not retained at said context tree retaining step, performing a context altering step for altering the context if said combination of the input data and the context is not retained at said context tree retaining step, performing a code outputting step for outputting a code according to bifurcation on a path from a top of said code tree to a leaf in which said input data or a specific code is stored on said code tree, performing a code tree rearrangement step for exchanging a leaf in which said input data or the specific code in said code tree is stored with another leaf or an internal node defined as a bifurcating point excepting the top of said code tree, branching a leaf in which said specific code is stored to enter said specific code and new data in newly obtained two leaves at said newly entering step.

A data compressing method for encoding input data according to a history of occurrence of the input data in the past to compress the input data, comprising performing a code tree retaining step for retaining a code tree in which an escape code defined as data representing that data is not stored is stored in advance, performing a context tree retaining step for retaining a context tree in which a com-
bination of input data and continuous n data followed by said input data, performing a context tree newly entering step for newly entering said data in the context tree retained at said context tree retaining step if said combination of the input data and the context is not retained at said context tree retaining step, performing a code tree newly entering step for newly entering said data in the code tree retained at said code tree retaining step if said combination of the input data and the context is not retained at said context tree retaining step, performing a newly entering step for storing said data in a new leaf obtained by branching a leaf that is a data storing point on the code tree retained at said code tree retaining step if said combination of the input data and the context is not retained at said context tree retaining step, performing a context altering step for altering the context if said combination of the input data and the context is not retained at said context tree retaining step, performing a code outputting step for outputting a code according to bifurcation on a path from a top of said code tree to a leaf in which said input data or the escape code is stored, performing a code tree rearrangement step for exchanging a leaf in which said input data or the escape code is stored with another leaf or an internal node defined as a bifurcating point excepting the top of said code tree, branching a leaf in which said escape code is stored to enter said escape code and new data in newly obtained two leaves at said newly entering step.

A data decompressing method for decoding a code obtained by encoding input data according to a history of the input data in the past, comprising performing a context retaining step for retaining a context tree in which a combination of decoded data and a context is stored, performing a code tree retaining step for retaining code trees each independent for each said context, performing a code tree determining step for determining a code tree of said code from data having been decoded up to immediately before, performing a decoding step for decoding a code by scanning a path from a root that signifies a top of said code tree to a leaf that is a data storing point according to said code, performing a context altering step for altering the context if the reached leaf is a specific code in the code tree, performing a code tree rearrangement step for exchanging leaves of the decoded data and said specific code with another leaves or an internal node that is a bifurcating point, performing a newly entering step for newly entering the decoded data in the code tree if said specific code is decoded, performing a context tree entering step for entering the data having been entered at said newly entering step in the context tree retained at said context tree retaining step, at said newly entering step, branching the same leaf as a leaf having been selected to be branched in an encoder to enter new data therein.

A data decompressing method for decoding a code obtained by encoding input data according to a history of the input data in the past, comprising performing a code tree retaining step for retaining a code tree in which an escape code defined as data representing that data is not stored is stored in advance performing a context tree retaining step for retaining a context tree in which a combination of decoded data and a context is stored, performing a code tree determining step for determining a code tree of said code from data having been decoded up to immediately before, performing a decoding step for decoding a code by scanning a path from a root that signifies a top of said code tree to a leaf that is a data storing point according to said code, performing a context altering step for altering the context if a reached leaf is said escape code, performing a code tree rearrangement step for exchanging leaves of the decoded data and said escape code with another leaves or an internal node that is a bifurcating point, performing a newly entering step for newly entering the decoded data in the code tree if said escape code is decoded, performing a context tree entering step for entering the data having been entered at said newly entering step in the context tree retained at said context tree retaining step, at said newly entering step, branching the same leaf as a leaf having been selected to be branched in an encoder to enter new data therein.

A data compressing apparatus encoding input data according to a history of occurrence of the input data in the past comprising a code tree retaining means retaining a code tree in which an escape code defined as data representing that data is not stored is stored in advance, a context tree retaining means retaining therein a context tree in which a combination of input data and a context is stored, a context entering means newly entering said data in said context tree after said escape code has been encoded, a code entering means branching a leaf that is a data storing point of said escape code on the code tree after said escape code has been encoded to newly enter said data therein, a context altering means altering the context if the combination of said input data and the context is not retained in the context tree, an encoding means outputting a code according to bifurcation on a path from a top of the code tree to a leaf in which said input data or an escape code is stored, a code updating means exchanging leaves in which encoded data and said escape code are stored with another leaves or an internal node.

A data compressing apparatus encoding input data according to a history of occurrence of the input data in the past comprising a code tree retaining means retaining a code tree in which an escape code defined as data representing that data is not stored is stored in advance, a context tree retaining means retaining therein a context tree in which a combination of input data and a context is stored, a context entering means newly entering said data in the context tree after said escape code has been encoded, a branching position searching means searching a leaf having the longest code length on said code tree, a code entering means branching a leaf that is a data stored point having been searched by said branching position searching means to newly enter said data after said escape code has been encoded, a context altering means altering the context if the combination of said input data and the context is not retained in the context tree, an encoding means outputting a code according to bifurcation on a path from a top of the code tree to a leaf in which the input data or said escape code is stored; and a code updating means exchanging leaves in which encoded data and said escape code are stored with another leaves or an internal node.

A data compressing apparatus encoding input data according to a history of occurrence of the input data in the past comprising a code tree retaining means retaining a code tree in which an escape code defined as data representing that data is not stored in advance, a context tree retaining means retaining a context tree in which a combination of input data and a context is stored, a context entering means newly entering said data in the context tree after said escape code has been encoded, a branching position retaining means retaining a position of a leaf that is a data storing point having been newly entered in said code tree, a code entering means branching a leaf in a position retained in said branching position retaining means after said escape code has been encoded to newly enter said data therein, a context altering means altering the context if the combination of said input data and the context is not stored in the context tree, an encoding means outputting a code according to bifurcation on a path from a top of the code tree to a leaf in which the input data or said escape code is stored, a code updating means exchanging leaves in which encoded data and said escape code are stored with another leaves or an internal node that is a bifurcating point.

A data decompressing apparatus decoding a code obtained by encoding input data according to a history of the input data in the past comprising a code tree retaining means retaining a code tree in which an escape code defined as data representing that data is not stored in advance, a context tree retaining means retaining a context tree in which a combination of decoded data and a context is stored, a code tree determining means determining a code tree of said code from data having been decoded up to immediately before, a decoding means decoding a code by scanning a path from a root that signifies a top of said code tree to a leaf that is a data storing point according to said code, a context altering means altering the context if a reached leaf is said escape code, a code updating means exchanging leaves of the decoded data and said escape code with another leaves or an internal node that is a bifurcating point, a code entering means branching a leaf of said escape code when said escape code is decoded to newly enter the decoded data therein, a context tree entering means entering the data having been entered by said code entering means in the context tree retained in said context tree retaining means.

A data decompressing apparatus decoding a code obtained by encoding input data according to a history of the input data in the past comprising a code tree retaining means retaining a code tree in which an escape code defined as data representing that data is not stored is stored in advance, a context tree retaining means retaining a context tree in which a combination of decoded data and a context is stored, a code tree determining means determining a code tree of said code from data having been decoded up to immediately before, a decoding means decoding a code by scanning a path from a root that signifies a top of said code tree to a leaf that is a data storing point according to said code, a context altering means altering the context if a reached leaf is said escape code, a code updating means exchanging leaves of the decoded data and said escape code with another leaves or an internal node that is a bifurcating point, a branching position searching means searching a leaf having the longest code length on said code tree, a code entering means branching a leaf having been searched by said branching position searching means after said escape code has been encoded to newly enter said data therein, a context tree entering means entering the data having been entered by said code entering means in the context tree retained in said context tree retaining means.

A data decompressing apparatus decoding a code obtained by encoding input data according to a history of the input data comprising a code tree retaining means retaining a code tree in which an escape code defined as data representing that data is not stored is stored in advance, a context tree retaining means retaining a context tree in which a combination of decoded data and a context is stored, a code tree determining means determining a code tree of said code from data having been decoded up to immediately before, a decoding means decoding a code by scanning a path from a root that signifies a top of said code tree to a leaf that is a data storing point according to said code, a context altering means altering the context if a reached leaf is said escape code, a code updating means exchanging leaves of the decoded data and said escape code with another leaves or an internal node that is a bifurcating point, a branching position retaining means retaining a position of a leaf having been newly entered in said code tree, a code entering means branching a leaf in a position retained in said branching position retaining means after said escape code has been encoded to newly enter said data therein, a context tree entering means entering the data having entered by said code entering means in the context tree retained in said context tree.

According to the data compressing method of this invention, a code tree is generated and updated while rearranging the code tree according to a character string of input data obtained by collecting character strings of the input data. It is therefore possible to perform a process in two stages, that is, a stage to determine a frequency of occurrence of occurring input data to establish a probability model so as to make a code table, and a stage to assign a code to each input data from this code table at the same time. This may largely increase a processing rate in the data compression.

Further, according to the data compressing method of this invention, character strings of input data are collected, numbered and entered in a dictionary, a code is corresponded to each character string, the code corresponding to a dictionary number of the longest coinciding character string is encoded and updated, an elongated character string of a character string to be encoded is entered until it reaches to a predetermined maximum character string length, and a code corresponding to the elongated character string is entered. For this, it is possible to encode the input data not in a unit of a character but in a unit of a character string as a plurality of characters so that a processing rate in the data compression may be largely increased.

Still further, according to the data decompressing method of this invention, a code tree is generated and updated while a splay coding is performed according to a character string of decoded data obtained by collecting character strings of decoded data. It is thus possible to perform a process in two stages, that is, a stage to determine a frequency of occurrence of a code of a character string to be decoded to establish a probability model so as to make a code table, and a stage to decode a code of a character string to be decoded from this code table. This may largely increase a processing rate in the data decompression.

Still further, according to the data decompressing method of this invention, character strings of decoded data are collected, numbered and entered in a dictionary, a splay code is corresponded to each decoded character string, a character string corresponding to a dictionary number is decoded into a splay code and updated, an elongated character string of a character string to be decoded is entered until it reaches a predetermined maximum character string length. For this, inputted data may be decoded not in a unit of one character but in a unit of a character string as a plurality of characters so that a processing rate in the data decompression may be largely increased.

Still further, according to the data compressing method of this invention, it is possible to perform a process in two stages, that is, a stage to determine a frequency of occurrence of input data to establish a probability model, assign a code to each input data to make a code table, and a stage to output a code of a character to be encoded from this code table, at the same time so that a processing rate in the data compression may be largely increased. It is also possible to omit an enormous volume of arithmetic operation to reestablish a probability model that has been already establish each time data is inputted so that a processing rate in the data compression may further increased. It is also possible to express a code with bits of the fewer number as the same data as input data that has been occurred in the past occurs more frequently so that an effect of the data compression may be largely improved.

Still further, according to the data compressing method of this invention, if a combination of input data and a context is not a combination retained in a history at the context collecting step, an escape code is outputted and a process to shorten a context of the data is repeated until a combination retained at the context collecting step is obtained. It is therefore unnecessary to enter all history of combinations of input data and a context in advance so as to decrease a time period required until a combination of input data and a context is obtained. This may largely increase a processing rate in the data compression.

Still further, according to the data compressing method of this invention, if a combination of input data and a context is not retained in the history at the context collecting step, a code of an escape code is outputted, the combination of the input data and the context is entered in the history at the same time, the data is entered in a code tree corresponding to the context, and a process to shorten the context of the data is repeated until a combination retained at the context collecting step is obtained. It is thus possible to newly enter the input data that has not been entered in the past so that this newly entered data may be encoded in an early stage in the next decoding process. This may more increase an effect of data compression as the encoding process proceeds further.

Still further, according to the data compressing method of this invention, only a combination of a context and data that is decided to be retained in the history is entered at the context newly entering step and the code tree newly entering step. It is thus unnecessary to enter all combinations of a context and data that is decided not to be retained in the history. This may largely improve the data compression. Moreover, it is possible to give a code (enter) only data actually having a high frequency of occurrence so that an effect of the data compression may be largely improved.

According to the data decompressing method of this invention, a leaf that is a data storing point is exchanged with another leaf or an internal node that is a bifurcating point on a code tree using the same means as in the encoder. It is thus possible to perform a process in two stages, that is, a stage to determine a frequency of occurrence of input data to establish a probability model and assign a code to each input data to make a code table, and a stage to output a character to be decoded from this code table, at the same time so that a processing rate in the data decompression may be largely increased. It is also possible to omit an enormous volume of arithmetic operation to reestablish a probability model that has already been establish each time data is inputted so that a processing rate in the data decompression may be further increased. It is also possible to express a code of data with bits of the fewer number as the same code of the that of input data that has occurred in the past occurs more frequently so that an effect of data decompression may be largely improved.

Further, according to the data decompressing method of this invention, if an escape code is decoded in the decoding process, a process to shorten a length of a context is repeated until a code excepting the escape code is decoded so that it is unnecessary to enter all history of a combination of decoded data and a context in advance. It is also possible decrease a time period required until the combination of the decoded data and the context is obtained. This may largely increase a processing rate in the data decompression.

Still further, according to the data decompressing method of this invention, data is newly entered at the context collecting step, and decoded data is newly entered in a code tree corresponding to a context. When an escape code defined as data representing that data is not stored is decoded, a process to shorten a length of the context is repeated until a code excepting the escape code is decoded. It is possible to newly enter decoded data that has not been entered in the past, and to decode the decoded data newly entered in an early stage in the next data decoding. For this, an effect of data decompression may more improved as the process of decoding proceeds further.

Still further, according to the data decompressing method of this invention, if an escape code defined as data representing that data is not entered is decoded even once in a process until a code excepting the escape code is decoded, new entry process at the context newly entering step and the code tree newly entering step is performed only on a context obtained immediately before the decoding of a code excepting the escape code so that it is unnecessary to enter all combinations of the context and data that are decided not to be retained in the history of the input data in the past. It is thus possible to assign a code to (enter) only data actually having a high frequency of occurrence. This may largely improve an effect of the data decompression.

In the data compressing apparatus of this invention, a process at two stages, that is, a stage to determine a frequency of occurrence of input data to establish a probability model and assign a code to each data to make a code tree, and a stage to output a code of data to be encoded from this code table, may be performed at the same time so that a processing rate in the data compression may be largely increased. It is also possible to omit an enormous volume of arithmetic operation to reestablish a probability model that has been already establish each time data is inputted so that a processing rate in the data compression may be more increased. Each time the same data as data that has been encoded in the past occurs, an encoded leaf is exchanged with another leaf or an internal node to alter a code length so that it is possible to express a code of data with bits of the fewer number as the same data occurs more frequently. This may largely improve an effect of the data compression.

Further, in the data compressing apparatus of this invention, it is unnecessary to enter all history of a combination of input data and a context in advance so that a processing rate in the data compression may be largely increased. It is also possible to reduce a volume of a storage used to enter the context therein, thereby reducing largely a processing load on the data compressing apparatus.

Still further, in the data compressing apparatus of this invention, it is possible to newly enter input data that has not been stored in the past so that the newly entered data may be encoded in an early stage in the next encoding process. This may more improve an effect of the data compression as the encoding process proceeds further so that a processing load on the data compressing apparatus may be largely reduced.

Still further, in the data compressing apparatus of this invention, it is unnecessary to enter all combinations of a context and data that is decided not to be retained in the history of input data in the past. It is thus possible to assign a code to (enter) only data actually having a high frequency of occurrence so that an effect of the data compression may be largely improved. As a result, a performance of the data compressing apparatus may be noticeably improved.

In the data decompressing apparatus of this invention, a process in two stages, that is, a stage to determine a frequency of occurrence of input data to establish a probability model and assign a code to each input data to make a code table, and a stage to output a character to be decoded from this code table, may be performed at the same time so that a processing rate in the data decompression may be largely increased. It is possible to omit an enormous volume of arithmetic operation to reestablish a probability model that has been already established each time data is inputted so that a processing rate in the data decompression may be further increased. It is also possible to express data with bits of the fewer number as the same code of that of input data having occurred in the past occurs more frequently so that an effect of the data decompression may be largely improved. With the above advantages, a performance of the data decompression apparatus may be noticeably improved.

Further, in the data decompressing apparatus of this invention, it is unnecessary to enter all history of a combination of decoded data and a context in advance so that a time period required until a combination of the decoded data and the context is obtained may be decreased. This may largely improve a processing rate in the data decompression, along with a performance of the data decompressing apparatus.

Still further, in the data decompressing apparatus of this invention, decoded data that has not been entered in the past may be newly entered and this newly entered decoded data may be decoded in an early stage in the next process. This may more improve an effect of the data decompression as the decoding process proceeds further, thereby improving a performance of the data decompressing apparatus greatly.

Still further, the data decompressing apparatus of this invention, it is unnecessary to enter all combinations of context and data that is decoded not to be retained in the history of input data in the past so that it is possible to assigned a code to (enter) only data actually having a high frequency of occurrence. this may largely improve an effect of the data decompression and a performance of the data decompressing apparatus.

According to the data compressing method of this invention, a high encoding rate is available in the case where data outputting a relatively large number of the escape codes is dealt with, or in an early stage where entry of context retained at the context tree retaining step is insufficient. If the code tree rearrangement step is performed before the code tree newly entering step, a code or the specific code may have a code length of as small as 2 bits. If the code tree rearrangement step is performed after the code tree newly entry, the specific code may have a code length of as small as 1 bit. As this, an efficiency of the encoding may be largely improved. In the code tree newly entering process, data is always newly entered one by one so that only a symbol having a high repeatability is entered in the higher degree of the code tree at any time. This may prevent a decrease in the efficiency of the encoding caused from existence of data that has once been entered in the code tree but is not used actually so that after sufficient entry of data, an efficiency of the encoding is largely improved.

Still further, according to this data compressing method of this invention, the above specific code may be treated as an escape code defined as data representing no entry of data. In which case, the same advantage may be given.

According to the data decompressing method of this invention, each of divided two leaves may have a code length of (a code length of a leaf before divided) +1) bits at the data newly entering step, as same as in the encoder. In addition, a code of newly entered data and the specific code may have a code length of as small as 2 bits. For this, if data outputting a relatively large number of escape codes is dealt with, or in an early stage where dictionary entry (entry of symbols in the code tree) is insufficient, an effect of the data decoding may be largely improved.

If the code tree rearrangement step is performed before the data newly entering step, decoded data and the escape code may have a code length of as small as 2 bits. If the code tree rearrangement step is performed after the newly entering step, the escape code may have a code length of as small as 1 bit. For this, an efficiency of the data decoding may be largely improved. The decompressor performs the same newly entering step as the encoder so that data having been encoded in the encoder may be accurately decoded.

Still further, according to this data compressing method of this invention, the above specific code may be treated as an escape code defined as data representing no entry of data. In which case, the same advantage may be given.

The data compressing apparatus of this invention may provide an extremely high decoding rate in the case of data outputting the escape codes relatively frequently, or in an early stage where entry of context retained in the context tree retaining means is insufficient. If the code updating means updates a code before the code entering means enters the code, the code and a specific code may have a code length of as small as 2 bits. If the code updating means updates a code after the code entering means has entered the code, an escape code may have a code length of as small as 1 bit. For this, an efficiency of the encoding may be largely improved. The code entering means newly enters a code in a one-by-one manner at any time so that only data having a repeatability may be entered in the higher degree of the code tree at any time. This may prevent a decrease in encoding efficiency caused from existence of data that has once been entered but is not actually used so that the encoding efficiency after sufficient entry of data may be largely improved and a performance of the data compressing apparatus may be noticeably improved.

Further, in the data compressing apparatus of this invention, a long code length is given to data having the smallest frequency of occurrence, that is, data not used frequently. It is thus possible to minimize a decrease of the encoding efficiency caused from that the code length is increased by 1 bit so as to improve largely a processing rate of the data compression along with a performance of the data compressing apparatus.

Still further, the data compressing apparatus of this invention may more approximate newer data stored in a leaf having entered last to data having a relatively long code length so that a processing rate in the data compression may be largely increased and a processing load on the data compressing apparatus may also be greatly reduced.

Still further, the data compressing apparatus of this invention may provide a high decoding rate in the case where data outputting a relatively large number of escape codes is dealt with or in an early stage where entry of contexts retained in the context tree retaining means is insufficient. If the code updating means performs code updating before the code entering means performs code entry, a code and the specific code may have a code length of as small as 2 bits. If code updating means performs code updating after the code entering means has performed code entry, the escape code may have a code length of as small as 1 bit. This is very effective to increase the decoding efficiency. Moreover, the code entering means performs new entry of a code to be decoded in a one-by-one fashion at any times so that only data having a high repeatability is entered in the higher degree of the code tree. This may prevent a decrease in the decoding efficiency caused from existence of data that has once been entered but is not used actually. This may largely increase the decoding efficiency after entry of sufficiency volume of data. As a result, a performance of the data compressing apparatus may be noticeably improved.

Further, in the data decompressing apparatus of this invention, a long code length is given to data having the smallest frequency of occurrence, that is, data not used frequently. It is thus possible to minimize a decrease of the decoding efficiency caused from that the code length is increased by 1 bit so as to improve largely a processing rate of the data decompression along with a performance of the data decompressing apparatus.

Still further, in the data decompressing apparatus of this invention, new entry of data is performed on a leaf in which data having been entered last is stored so that it is possible to approximate this data stored in a leaf having been entered last to data having a long code length. This may effectively minimize a decrease in the decoding efficiency caused from an increase of a code length of data used frequently by 1 bit so as to largely increase a processing rate of the data decompression along with a performance of the data compressing apparatus.

BRIEF DESCRIPTION OF THE DRAWINGS

FIGS. 19(a) and 19(b) illustrate an example of a basic operation for code updating of splay codes and code updating operation on the splay codes;

FIG. 29 illustrates a character string after encoding according to the first embodiment of this invention;

FIGS. 30(a) and 30(b) show algorithms for generating a context tree;

FIGS. 60(a) and 60(b) depict a state of new entry of a code according to the third embodiment of this invention;

FIG. 72 shows an example of algorithm of the multi-value arithmetic coding;

Figure 1:
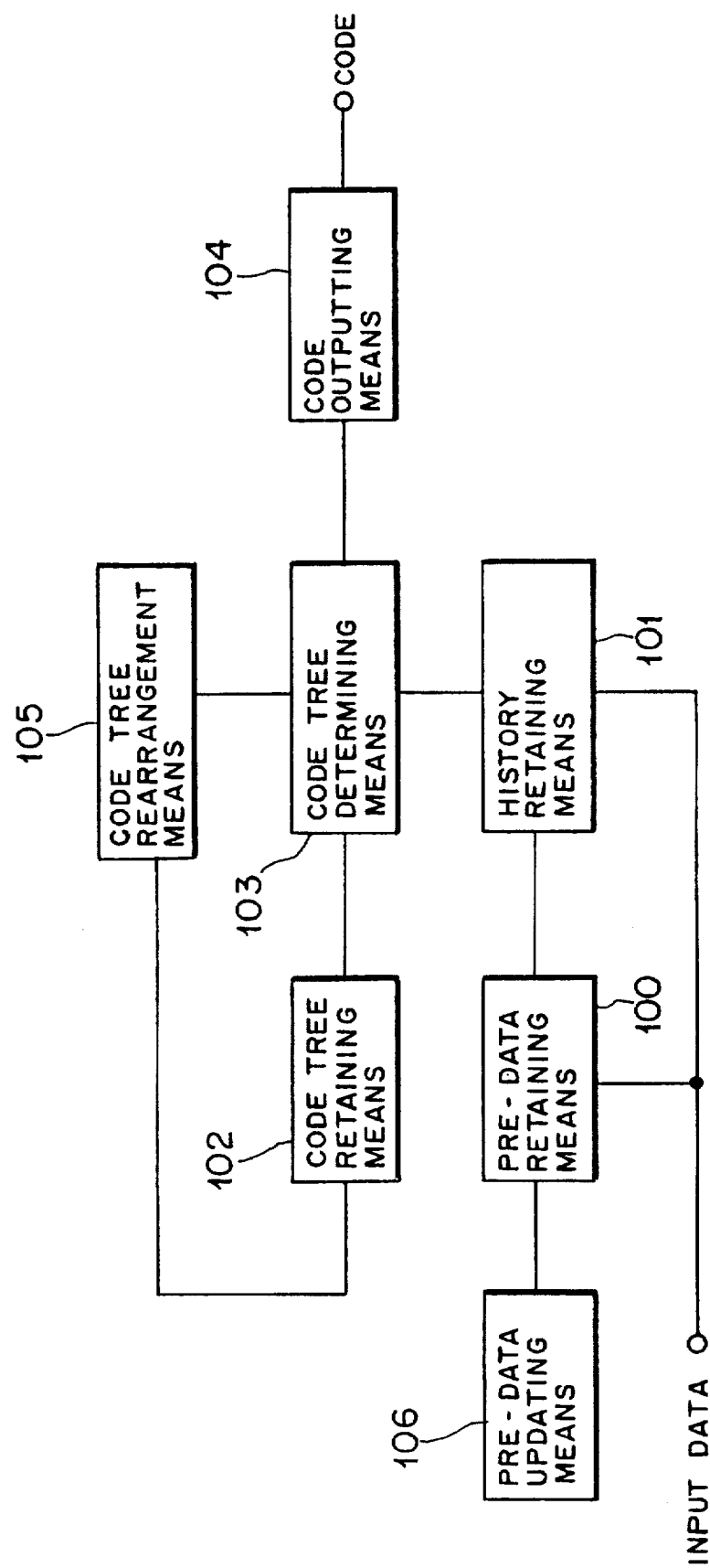
FIGS. 1 through 14 are block diagrams showing aspects of this invention.

DESCRIPTION OF THE PREFERRED EMBODIMENT (a) Description of Aspects of the Invention A data compression method according to this invention is to encode input data according to a history of occurrence of the data occurring in the past, which takes the following steps:

(1) a context collecting step to collect character strings of input data; and (2) a coding step to generate and update a code tree while rearranging the code tree according to a data string of the input data having been obtained at the context collecting step.

In the above-mentioned data compression method according to this embodiment, character strings of input data are collected, and a code tree is generated and updated while the data is processed in the splay operation according to the character strings of the input data obtained at the context collecting step.

Accordingly, it is possible to perform a process in two stages simultaneously, that is, a stage to determine a frequency of occurrence of occurring input data to establish a probability model to make a code table, and a stage to assign a code to each input data by reference to this code table, whereby a processing rate in the data compression may be largely increased.

In the data compression method of this invention, character strings of the above input data are collected, numbered respectively, and entered in a dictionary. Each character string corresponds to a code. The code corresponding to a dictionary number of the longest coinciding character string is encoded and updated while an elongated character string of a character string to be encoded is entered until it reaches a predetermined maximum character string length so as to enter the code corresponding to the elongated character string.

As above, according to the data compressing method of this invention, an extended character string of a character string to be encoded may be entered until it reaches a predetermined maximum character string length so as to enter a code corresponding to the extended character string. Accordingly, it is possible to encode input data as a character string not in a unit of one character, but in a unit of a plurality of characters, thereby increasing largely a processing rate in the data compression.

The above character string may be entered in the dictionary in such a manner that the immediately preceding character that has been already encoded is first entered and a character string following the immediately preceding character is then encoded. Alternatively, a code may be assigned to each single character and, if a character string following the immediately preceding character is not included in character strings in the dictionary that have been already collected, a code for the single character is encoded and outputted. After that, the encoded character following the immediately preceding character is entered in the dictionary.

Through the above process, the character string to be entered in the dictionary is entered from the immediately preceding character that has been already encoded, then a character string following the immediately preceding character is encoded. If the character string following the immediately preceding character is not included in character strings in the dictionary that have been already collected, a code for the single character is encoded, outputted and updated. After that, the encoded character following the immediately preceding character is entered in the dictionary.

Therefore, it is unnecessary to enter a character string that is not contained in the dictionary every occasion so that a processing rate in the data compression may be largely increased.

On the other hand, a data decompressing method of this invention is to decode encoded data that have been encoded according to a history of input data in the past, which takes the following step:

(1) a context collecting step to collect character strings of decoded data; and (2) a splay coding step to generate and update a code tree while rearranging the code tree according to a character string of the decoded data obtained at the context collecting step.

In the above data decompressing method according to this invention, character strings of decoded data are collected at the context collecting step, and a code tree is generated and updated while being rearranged according to the character string of the decoded data obtained at the context collecting process.

Therefore, according to the above-mentioned data decompressing method of this invention, it is possible to perform a process in two stages simultaneously, that is, a stage to determine a frequency of occurrence of a code of the character string to be decoded, establish a probability mode to make a code table, and a stage to decode the code of the character string to be decoded by reference to this code table, whereby a processing rate in the data decompressing may be largely increased.

The data decompressing method of this invention is to decode input data that have been encoded according to a history of input data in the past, in which a character strings of decoded data are collected, numbered respectively, and entered in the dictionary, a code is corresponded to each of the decoded character strings, a character string corresponding to a dictionary number is encoded and updated, an elongated character string of the character string to be encoded is entered until it reaches a predetermined maximum character string length, and a code corresponding to the extended character string is then entered.

In the above-mentioned data decompressing method of this invention, it is possible to enter an elongated character string of a character string to be encoded until it reaches a predetermined maximum character string length so as to enter a code corresponding to the extended character string. It is therefore possible to decompress the input data not in a unit of one character but as a character string in a unit of a plurality of characters. This may largely increase a processing rate in the data decompression.

Further, in the data decompressing method of this invention, it is possible to enter a character string in the dictionary in such a manner that the immediately preceding character that has been decoded is entered, then a character string following the immediately preceding character is decoded. It is alternatively possible to assign a splay code to every single character, and if a code of single character in a character string following the immediately preceding character is not included in collected character strings in the dictionary is encoded, the code is updated, then the decoded character following the immediately preceding character is entered in the dictionary.

According to the data decompressing method of this invention, a character string is entered in the dictionary in such a manner that the immediately preceding character that has been decoded is first entered, then a character string following the immediately preceding character is decoded. In practice, a code is assigned to every single character, to begin with, if a code of a single character in a character string following the immediately preceding character being not included in collected character strings in the dictionary is decoded, the code is updated and the decoded character following the immediately preceding character is entered in the dictionary.

Therefore, according to the data decompressing method of this invention, it is unnecessary to enter a code of a character string not included in the dictionary every occasion so that a processing rate in the data decompression may be further increased to a large extent.

The data compressing method according to this invention is to compress input data by encoding the input data according to a history of occurrence of the input data in the past, which takes the following step:

(1) a context collecting step to retain a combination of input data and a context composed of continuous n data followed by the input data;

(2) a code tree retaining step to retain code trees each independent for each context;

(3) a code outputting step to output a code defined as unique data according to bifurcation of a node that is a bifurcating point on a path from a root that signifies a top of a code tree to a leaf on the code tree in which data is stored when data corresponding to the context retained at the context collecting step occurs; and (4) a code tree rearrangement step to exchange a leaf of the data with a leaf of another data or an internal node.

The data compressing method of this invention functions as follows:

(1) retaining the input data and the context composed of the continuous n data followed by the input data at the context collecting step;

(2) retaining code trees each independent for each context at the code tree retaining step;

(3) at the code outputting step, outputting a code defined as unique data according to bifurcation of a node that is a bifurcating point on a path from a root that signifies a top of a code tree to a leaf on the code tree in which data is stored when data corresponding to the context retained at the context collecting step; and (4) at the code tree rearrangement step, exchanging a leaf of the data with a leaf of another data or an internal node after a process at the code outputting step.

The above data compressing method of this invention allows a process in two stages to be performed simultaneously, that is, a stage to determine a frequency of occurrence of input data to establish a probability mode and assign code to each data to make a code table, and a stage to output a code of a character to be encoded by reference to this code table. This may largely increase a processing rate in the data compression. This may also reduce an enormous volume of arithmetic operation to reestablish the probability model that has been already established every time data is inputted, whereby the processing rate may be further increased in the data compression. Still further, a code of data may be expressed with bits of the fewer number if the same data as input data having occurred in the past occurs more frequently so that an effect of the data compression may be largely improved.

The data compressing method of this invention is to compress input data by encoding the input data according to a history of occurrence of the input data in the past, which takes the following steps:

(1) a context collecting step to retain input data and a context composed of continuous n data followed by the input data;

(2) a code tree retaining step to retain code trees each independent for each context;

(3) a code outputting step to output a code defined as unique data according to bifurcation of node that signifies a bifurcating point on a path from a root that is a top of a code tree to a leaf on the code tree in which data is stored when data corresponding to the context retained at the context collecting step occurs;

(4) a code tree rearrangement step to exchange a leaf of the data with a leaf of another data or an internal node after a process at the code outputting step;

(5) a context discriminating step to discriminate whether the combination of the input data and the context is retained at the context collecting step or not;

(6) an escape code retaining step to retain on the code tree a leaf in which an escape code defined as data representing that no data is stored is in advance entered; and (7) a step to output an escape code when the combination of the input data and the context is not retained in a history at the context collecting steps, and to shorten the context of the data until a combination retained at the context collecting step is obtained.

The above data compressing method of this invention functions as follows:

(1) retaining a combination of input data and a context composed of continuous n data followed by the input data at the context collecting step;

(2) retaining code trees each independent for each context at the code tree retaining step;

(3) at the code outputting step, outputting a code defined as unique data according to bifurcation of a node that is a bifurcating point on a path from a root that signifies a top of a code tree to a leaf on the code tree in which data is stored when data corresponding to the context retained at the context collecting step;

(4) at the code tree rearrangement step, exchanging a leaf of the data with a leaf of another data or a node after an operation at the code outputting step;

(5) discriminating whether the combination of the input data and the context is retained at the context collecting step or not;

(6) retaining on a code tree a leaf in which an escape code that is defined as data representing that no data is stored is entered in advance at the escape code retaining process; and (7) outputting an escape code when the combination of the input data and the context is not retained in a history retained at the context collecting step (1), and shortening the context of the data until a combination retained at the context collecting step is obtained.

According to the data compressing method of this invention, it is unnecessary to enter beforehand all history of the combination of the input data and the context. This is effective to shorten a time period required until the combination of the input data and the context is obtained so that a processing rate in the data compression may be largely increased.

The data compressing method of this invention is to compress input data by encoding the input data according to a history of occurrence of the input data in the past, taking the following steps:

(1) a context collecting step to retain a combination of input data and a context composed of continuous n data followed by the input data;

(2) a code tree retaining step to retain code trees each independent for each context;

(3) a code outputting step to output a code defined as unique data according to bifurcation of a node that is a bifurcating point on a path from a root that signifies a top of a code tree to a leaf on the code tree in which data is stored when data corresponding to the context retained at the context collecting step;

27

(4) a code tree rearrangement step to exchange a leaf of the data with a leaf of another data or an internal node after a process at the code outputting step;

(5) a context discriminating step to discriminate whether the combination of the input data and the context is retained at the context collecting step or not;

(6) an escape code retaining step to retain on the code tree a leaf in which an escape code defined as data representing that no data is stored in advance;

(7) a context newly entering step to newly enter the combination of the input data and the context at the context collecting step if the combination of the input data and the context is not retained in a history at the context collecting step.

(8) a code tree newly entering step to newly enter data in a code tree corresponding to the context if the combination of the input data and the context is not retained in a history of the context collecting step; and (9) a process to output a code of an escape code if the combination of the input data and the context is not retained in the history of the context collecting step and enter the combination of the input data and in the history at the same time, enter the data in a code tree corresponding to the context, and repeat a process to shorten the context of the data until a combination retained at the context collecting process is obtained.

The above data compressing method of this invention functions as follows:

(1) retaining a combination of input data and a context composed of continuous n data followed by the input data at the context collecting step;

(2) retaining code trees each independent for each context in the code tree retaining step;

(3) at the code outputting step, outputting a code defined as unique data according to bifurcation of a node that is a bifurcating point on a path from a root that signifies a top of a code tree to a leaf on the code tree in which data is stored when data corresponding to the context retained at the context collecting step;

(4) at the code tree rearrangement step, exchanging a leaf of the data with a leaf of another data or an internal node after a process at the code outputting step;

(5) at the context discriminating step, discriminating whether the combination of the input data and the context is retained at the context collecting process or not;

(6) at the escape code retaining step, retaining a leaf in which an escape code that is defined as data representing that no data is stored is beforehand entered;

(7) at the context newly entering step, entering a combination of input data and a context at the context collecting step if the combination of the input data and the context is not retained in a history at the context collecting step;

(8) at the code tree newly entering step, newly entering the data in a code tree corresponding to the context if the combination of the input data and the context is not retained in the history at the context collecting step; and (9) outputting a code of an escape code if the combination of the input data and the context is not retained in the history at the context collecting step and entering the combination of the input data and the context in the history at the same time, entering the data in a code tree corresponding to the context, and repeating a process to shorten the context of the data until a combination retained in the context collecting process is obtained.

28

According to the above data compressing method of this invention, it is possible to newly enter input data that have not been entered in the past, and to encode this newly entered data in an early stage in the next encoding process so that an effect of data compression may be more enhanced as the encoding process proceeds further.

The data compression method of this invention is to compress input data by encoding the input data according to a history of occurrence of the input data in the past, which takes the following steps:

(1) a context collecting step to retain a combination of input data and a context composed of continuous n data followed by the input data;

(2) a code tree retaining step to retain code trees each independent for each context;

(3) a code outputting step to output a code defined as unique data according to bifurcation of a node that is a bifurcating point on a path from a root that signifies a top of a code tree to a leaf on the code tree in which data is stored when data corresponding to the context retained at the context collecting step;

(4) a code tree rearrangement step to exchange a leaf of the data with a leaf of another data or an nternal node after a process at the code outputting step;

(5) a context discriminating step to discriminate whether the combination of the input data and the context is retained at the context collecting process or not;

(6) an escape code retaining step to retain a leaf in which an escape code defined as data representing that no data is entered is stored in advance on the code tree;

(7) a context newly entering step to newly enter the combination of the input data and the context at the context collecting step if the combination of the input data and the context is not retained in a history at the context collecting step;

(8) a code tree newly entering step to newly enter data in a code tree corresponding to the context if the combination of the input data and the context is not retained at the context collecting step; and (9) a step to enter only a combination of an immediately preceding context which is decided to be retained in the history and that data at the context newly entering step and the code tree entering step.

The above data compressing method of this invention functions as follows:

(1) retaining a combination of input data and a context composed of continuous n data followed by the input data at the context collecting step;

(2) retaining code trees each independence for each context at the code tree retaining step;

(3) at the code outputting step, outputting a code defined as unique data according to bifurcation of a node that is a bifurcating point on a path from a root that signifies a top of the code tree to a leaf on a code tree in which data is stored when data corresponding to the context retained at the context collecting process occurs;

(4) at the code tree rearrangement step, exchanging a leaf of the data with a leaf of another data or an internal node after a process at the code outputting step;

(5) at the context discriminating step, discriminating whether the combination of the input data and the context is retained at the context collecting step or not;

(6) at the escape code retaining step, retaining on the code tree a leaf in which an escape code defined as data representing that no data is restored is in advance entered;

(7) at the context newly entering step, newly entering the combination of the input data and the context at the context collecting step if the combination of the input data and the context is not retained in a history at the context collecting step;

(8) at the code tree newly entering step, newly entering the data in a code tree corresponding to the context if the combination of the input data and the context is not retained in the history at the context collecting step; and (9) at the above context newly entering step (7) and the code tree newly entering step (8), entering only a combination of a context followed by data which is decided to be retained in the history and that data.

According to the above data compressing method of this invention, it is unnecessary to enter every combination of the context and data that has been decided to be not stored in the history of the input data in the past so that it is possible to improve largely the data compression process. It is also possible to assign (enter) a code to only data actually occurring frequently so that an efficiency of data compression may be largely improved.

Meanwhile, the data decompresssing method of this invention is to decompress encoded data obtained by encoding input data according to a history of the input data in the past, which takes the following steps:

(1) a context collecting step to retain a history of a combination of decoded data and a context;

(2) a code tree retaining step to retain code trees each independent for each context;

(3) a code tree determining step to determine a code tree of the data from a context of data that has been decoded up to immediately before;

(4) a decoding step to decode data from the code tree determined at the code determining step and a code of the data; and (5) a code tree rearrangement step to exchange a leaf on the code tree in which data is stored with another leaf or or an internal node that is a bifurcating point on the code tree using the same means in an encoder after the decoding at the decoding step.

The above data decompressing method of this invention functions as follows:

(1) retaining a history of a combination of decoded data and a context at the context collecting step;

(2) retaining code trees each independent for each context at the code tree retaining step;

(3) determining a code tree of data from a context of data that has been decoded up to immediately before at he code tree determining step;

(4) decoding the data from the code tree determined at the code tree determined step and a code of the data at the decoding step; and (5) after the encoding at the encoding step, exchanging a leaf on the code tree in which data is stored with another leaf or an internal node that is a bifurcating point using the same means as in an encoder at the code tree rearrangement step.

According to the above data restoring method of this invention, it is possible to perform a process in two stages simultaneously, that is, a stage to determine a frequency of occurrence of input data to establish a probability model and assign a code to each input data to make a code table, and a stage to output a decoded character by reference to this code table so that a processing rate in the data decompression may be largely increased. It is also possible to omit an enormous volume of arithmetic operation to reestablish the probability mode that has been already established every time data is inputted so that a processing rate in the data decompression may be more increased. It is further possible to express a code of data with bits of the fewer number as the same code of data as that of input data having occurred in the past occurs more frequently so that an effect of the data decompression may be largely enhanced.

The data decompressing method of this invention is to decompress encoded data having been encoded according to a history of the input data in the past, which takes the following steps:

(1) a context collecting step to retain a history of a combination of decoded data and a context;

(2) a code tree retaining step to retain code trees each independent for each context;

(3) a code tree determining step to determine a code tree of the data from a context of data that has been decoded up to immediately before;

(4) a decoding step to decode the data from a code tree determined at the code determining step and a code of the data;

(5) a code tree rearrangement step to exchange a leaf on the code tree in which data is stored with another leaf or an internal node that is a bifurcating point on the code tree using the same means in an encoder after the decoding at the decoding step; and (6) a step to enter an escape code defined as data representing that no data is stored in code trees each corresponding to each context, and if the escape code is decoded in the decoding, repeat a process to shorten a length of the context until a code excepting the escape code is decoded.

The above data decompressing method of this invention functions as follows:

(1) retaining a history of a combination of decoded data and a context at the context collecting step;

(2) retaining code trees each independent for each context at the code tree retaining step;

(3) determining a code tree of data from a context of data that has been decoded up to immediately before at the code tree determining step;

(4) decoding the data from the code tree determined at the code tree determined step and a code of the data at the decoding step;

(5) after the encoding at the encoding step, exchanging a leaf on the code tree in which data is stored with another leaf or an internal node on the code tree that is a bifurcating point using the same means as in an encoder at the code tree rearrangement step; and (6) entering in advance an escape code defined as data representing that no data is stored in each code tree corresponding to each context, and if an escape code is decoded in the decoding, repeating a process to shorten a length of the context until a code excepting the escape code is encoded.

According to the data decompressing method of this invention, it is unnecessary to enter beforehand all history of the combination of the decoded data and the context so that a processing rate in the data decompression may be largely increased. It is also possible to shorten a time period required until the combination of the decoded data and the context is obtained so that a processing rate in the data restoration may be more largely increased.

The data decompressing method of this invention is to decompress encoded data obtained by encoding input data according to a history of the input data in the past, which takes the following steps:

(1) a context collecting step to retain a history of a combination of decoded data and a context;

(2) a code tree retaining step to retain code trees each independent for each context;

(3) a code tree determining step to determine a code tree of the data from a context of data that has been decoded up to immediately before;

(4) a decoding step to decode the data from the code tree determined at the code determining step and a code of the data;

(5) a code tree rearrangement step to exchange a leaf on the code tree in which data is stored with another leaf or an internal node that is a bifurcating point on the code tree using the same means in an encoder after the decoding at the decoding process;

(6) a context newly entering step to newly enter the data at the context collecting step;

(7) a code tree newly entering step to newly enter the decoded data in a code tree corresponding to the context;

(8) a step to execute the context newly entering step and the code tree newly entering step when an escape code defined as data representing that no data is stored is decoded, and to repeat a process to shorten a length of the context until a code excepting the escape code is encoded.

The above data restoring method of this invention functions as follows:

(1) retaining a history of a combination of decoded data and a context at the context collecting step;

(2) retaining code trees each independent for each context at the code tree retaining step;

(3) determining a code tree of data from a context of data that has been decoded up to immediately before at the code tree determining step;

(4) decoding the data from the code tree determined at the code tree determined step and a code of the data in the decoding step;

(5) after the encoding at the encoding step, exchanging a leaf on the code tree in which data is stored with another leaf or an internal node on the code tree that is a bifurcating point using the same means as in an encoder at the code tree rearrangement step;

(6) at the context newly entering step, newly entering the data at the context collecting step;

(7) newly entering the encoded data in a code tree corresponding to the context at the code tree newly entering step; and (8) when an escape code defined as data representing that no data is entered is decoded, executing the above context newly storing step (6) and the code tree newly entering step (7), and repeating a process to shorten a length of the context until a code excepting the escape code is decoded.

According to the above data decompressing method of this invention, it is possible to newly enter encoded data that have not been entered in the past, thus to decode the new entered decoded data in an early stage in the next decoding process so that an effect of the data decompression may be more improved as the decoding process further proceeds.

The data decompressing method of this invention is to decompress encoded data obtained by encoding input data according to a history of the input data in the past, which takes the following steps:

(1) a context collecting step retaining a history of a combination of decoded data and a context;

(2) a code tree retaining step retaining code trees each independent for each context;

(3) a code tree determining step to determine a code tree of the data from a context of data that has been decoded up to immediately before;

(4) a decoding step to decode the data from the code tree determined at the code determining step and a code of the data;

(5) a code tree rearrangement step to exchange a leaf on the code tree in which data is stored with another leaf or or an internal node that is a bifurcating point on the code tree using the same means in an encoder after the decoding at the decoding process;

(6) a context newly entering step to newly enter the data at the context collecting step;

(7) a code tree newly entering step to newly enter the decoded data in a code tree corresponding to the context; and (8) in a process until a code excepting the escape code defined as data representing that no data is stored is encoded, if the escape code is encoded even once, performing a newly entering process on only a context immediately before the decoding of a code excepting the escape code at the context newly entering step and the code tree entering step.

The above data decompressing method of this invention functions as follows:

(1) retaining a history of a combination of decoded data and a context at the context collecting step;

(2) retaining code trees each independent for each context in the code tree retaining step;

(3) determining a code tree of data from a context of data that has been decoded up to immediately before at the code tree determining step;

(4) decoding data from the code tree determined at the code tree determined step and a code of the data at the decoding step;

(5) after the encoding at the encoding step, exchanging a leaf on the code tree in which data is stored with another leaf or an internal node on the code tree that is a bifurcating point using the same means as in an encoder at the code tree rearrangement step;

(6) at the context newly entering step, newly entering the data at the context collecting step;

(7) newly entering the encoded data in a code tree corresponding to the context at the code tree newly entering step; and (8) if the escape code is encoded even once in a process until a code excepting the escape code defined as data representing that no data is stored is decoded, performing a newly entering step on only a context immediately before the decoding of a code excepting the escape code at the context newly entering step and the code tree newly entering step.

According to the above data decompressing method of this invention, a newly entering process is performed on only the context immediately before the decoding of a code excepting the escape code at the context newly entering step and the code tree newly entering step so that it is unnecessary to enter all combinations of a context and data that it is decided not to be included in the history of the input data in the past, whereby a processing rate of the data compression may be largely increased and an efficiency in the data decompression may be largely improved since only data actually occurring frequently are given (entered) a code.

FIG. 1 is a block diagram showing an aspect of a data compressing apparatus according to this invention. The data compressing apparatus shown in FIG. 1 compresses input data by encoding the input data according to a history of occurrence of the input data occurring in the past.

In FIG. 1, reference numeral 100 denotes a pre-data retaining means, 101 denotes a history retaining means, 102 denotes a code tree retaining means, 103 denotes a code tree determining means, 104 denotes a code outputting means, 105 denotes a code tree rearrangement means and 106 denotes a pre-data updating means.

The pre-data retaining means 100 retains a context composed of n input data that have been inputted up to immediately before the input of the input data. The history retaining means 101 retains a combination of input data and a context. The code tree retaining means retains code trees each independent for each context.

The code tree determining means 103 determines a code tree of data from the immediately preceding input data retained in the pre-data retaining means 100. The code outputting means 104 outputs unique data according to bifurcation from a node that is a bifurcating point positioning in the course of a path from a root of a code tree that means a top of the code tree selected by the code tree determining means 103 to a leaf in which data is stored.

The code tree rearrangement means 105 exchanges an encoded leaf with another leaf or an internal node. The pre-data updating means 106 enters the data in the pre-data retaining means 100.

In the above data compressing apparatus with the above structure, the pre-data retaining means 100 retains a context composed of n input data that have been inputted up to immediately before the input of the input data, the history retaining means 101 retains a combination of the input data and the context, and the code tree retaining means 102 retains code trees each independent for each context.

The code tree determining means 103 determines a code tree from the input data having been inputted up to immediately before retained in the pre-data retaining means 100, the code outputting means 104 outputs unique data according to bifurcation from a node that is a bifurcating point positioning in the course of a path from a root of a code tree that signifies a top of the code tree selected by the code tree determining means 103 to a leaf in which data is stored.

Further, the code tree rearrangement means 105 exchanges an encoded leaf with another leaf or an internal node, and the pre-data retaining means 106 enters the data in the pre-data retaining means 100.

According to the above data compressing apparatus of this invention, it is possible to perform a process consisting of two stages simultaneously that is, a stage to determine a frequency of occurrence of input data to establish a probability model and assign a code to each input data to make a code table, and a stage to output a code of the data from this code table, whereby it is possible to largely increase a processing rate in the data compression. It is also possible to omit an enormous volume of arithmetic operation to reestablish the probability mode that has been already established every time data is inputted so that the processing rate in the data compression may be more increased. It is further possible to rearrange a code tree by exchanging an encoded leaf with another leaf or an internal node every time the same data as the data having been encoded in the past occurs so that it is possible to express a code of that data with bits of the fewer number as the same data occurs more frequently. This may largely improve an effect of the data compression in the data compressing apparatus.

Figure 2:
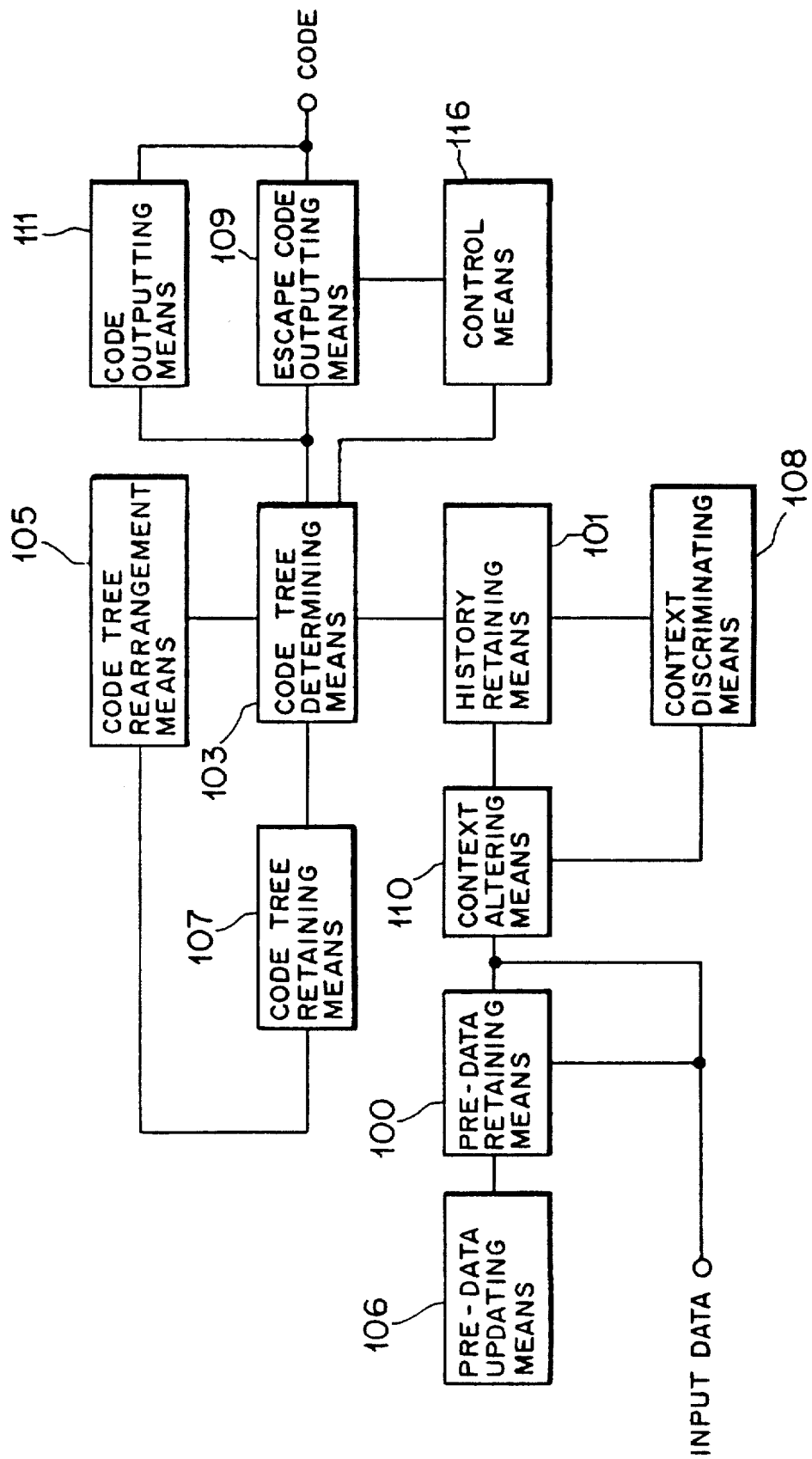

FIG. 2 is a block diagram showing another aspect of the data compression apparatus of this invention. The data compressing apparatus shown in FIG. 2 encodes input data according to a history of occurrence of the input data in the past to compress the input data.

In FIG. 2, reference numeral 100 denotes a pre-data retaining means, 101 denotes a history retaining means, 103 denotes a code tree determining means, and 107 denotes a code tree retaining means. Further reference numeral 108 denotes a context discriminating means, 109 denotes an escape code outputting means, 110 denotes a context alternating means, 111 denotes a code outputting means, and 116 denotes a control means.

The data re-retaining means 100 retains a context composed of n input data that have been inputted up to immediately before the input of the input data. The history retaining means 101 retains a combination of input data and a context. The code tree retaining means 107 retains code trees each independent for each context, in each of which an escape code defined as data representing that no data is stored is entered in advance.

The code tree determining means 103 determines a code tree of the data from the context and the input data. The context discriminating means 108 discriminates whether data is stored in the code tree determined by the code tree determining means 103. The escape code outputting means 109 outputs an escape code according to bifurcation from a node that is a bifurcating point positioning in the course of a path from a root that signifies a top of a code tree to a leaf in which the data is stored if the data is not stored in the code tree.

The context updating means 110 shortens a length n of the context if the data is not stored in the code tree. The code outputting means 111 outputs a code of the data according to bifurcation from a node positioning in the course of a path from a root of the code tree to a leaf of the data if the data is stored in the code tree.

The code tree rearrangement means 105 exchanges an encoded leaf with another leaf or an internal node. The pre-data updating means 106 enters the data in the pre-data retaining means 110. The control means 116 repeats a process until the data is encoded when an escape code is encoded.

In the above data compressing apparatus, the pre-data retaining means 100 retains a context composed of n input data having been inputted up to immediately before the input of the data, the history retaining means 101 retains a combination of the input data and the context, and the code tree retaining means 107 retains code trees each independent for each context in each of which an escape code defined as data representing that no data is entered beforehand.

The code tree determining means 103 determines a code tree of the data from the context and the input data, the context discriminating means 108 discriminates whether the data is stored in the code tree determined by the code tree determining means 103, and the escape code outputting means 109 outputs an escape code according to bifurcation from a node that is a bifurcating point positioning in the course of a path from a root that signifies a top of the code tree to a leaf in which the data is stored if the data is not stored in the code tree.

Further, the context altering means 110 shorten a length n of the context if the data is not stored in the code tree, the code outputting means 111 outputs a code of the data according to bifurcation from a node positioning in the course of a path from a root of the code tree and a leaf of the data if the data is stored in the code tree, and the code tree rearrangement means 105 exchanges an encoded leaf or another leaf or an internal node.

The pre-data updating means 106 then enters the data in the pre-data retaining means 100, and the control means 116 repeats a process until the data is encoded when the escape code is encoded.

According to the above data compressing apparatus of this invention, it is unnecessary to enter beforehand entire history of the combination of the input data and the context so that a processing rate in the data compression may be largely increased, besides a storage used to enter the contexts therein may be largely reduced. This may improve a performance of the data compressing apparatus to a large extent.

Figure 3:
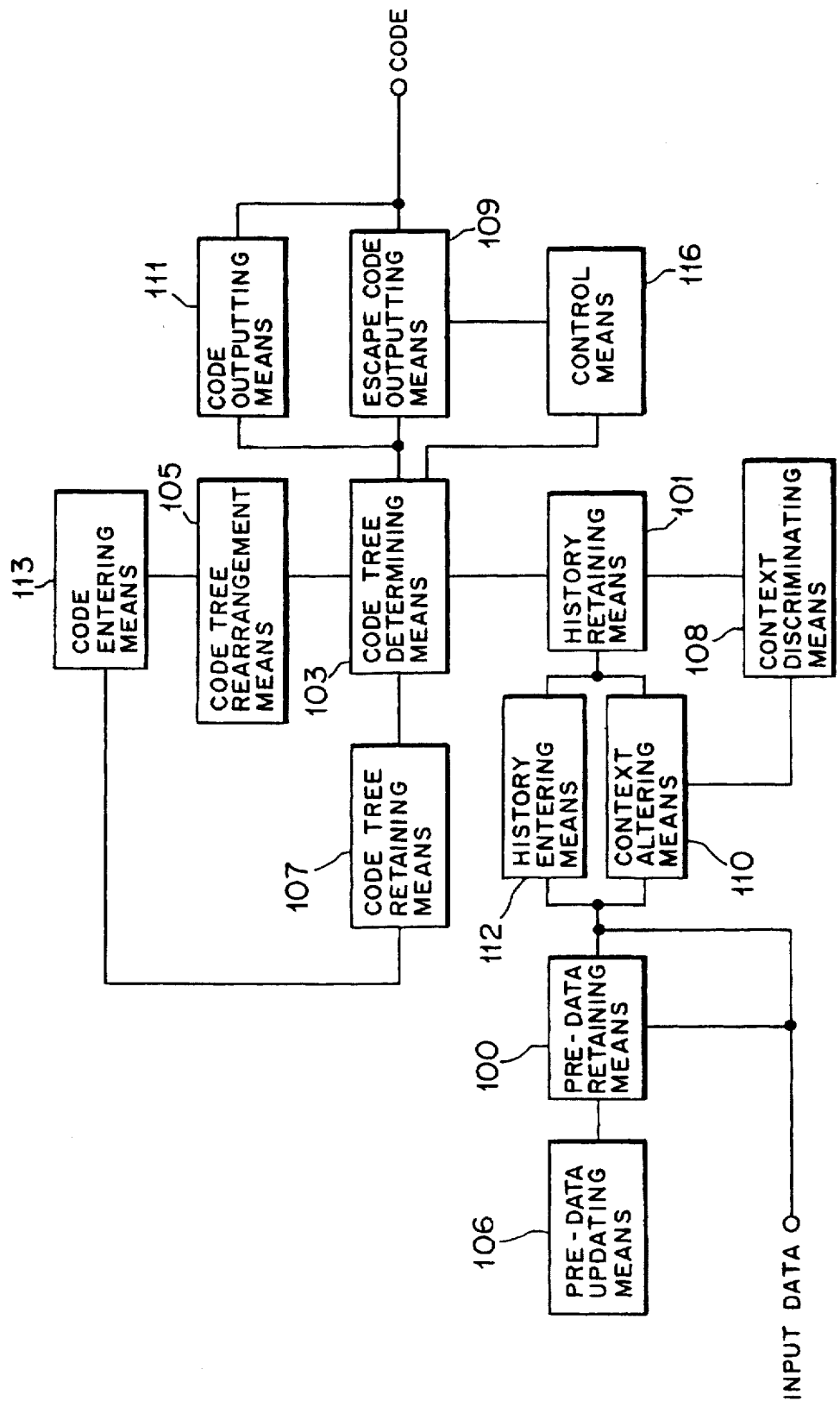

FIG. 3 is a block diagram showing another aspect of the data compressing apparatus according to this invention. In FIG. 3, reference numeral 100 denotes a pre-data retaining means, 101 denotes a history retaining means, 103 denotes a code tree determining means, 105 denotes a code tree rearrangement means, 106 denotes a pre-data updating means, 107 denotes a code tree retaining means, 108 denotes a context discriminating means, 109 denotes an escape code outputting means, 110 denotes a context altering means, 111 denotes a code outputting means, 112 denotes a history entering means, 113 denotes a code entering means and 116 denotes a control means.

The pre-data retaining means 100 retains a context composed of n input data that have been inputted up to immediately before the input of the input data. The history retaining means 101 retains a combination of the input data and the context. The code tree retaining means 107 retains code trees each independent for each context in each of which an escape code defined as data representing that no data is stored is entered beforehand.

The code determining means 103 determines a code tree of the data from the context and the input data. The context discriminating means 108 discriminates whether the data is stored in the code tree determined by the code tree determining means 103 or not.

Further, the escape code outputting means 109 outputs an escape code according to bifurcation from a node that is a bifurcating point positioning in the course of a path from a root that signifies a top of the code tree to a leaf that is a data storing point in which an escape code is stored if the data is not stored in the code tree.

The history entering means 112 enters a combination of the data and the context in the history retaining means 101 if the data is not stored in the code tree. The code entering means 113 newly enters the data in the code tree if the data is not stored in the code tree. The context altering means 110 shortens a length n of the context if the data is not stored in the code tree.

Further, the code outputting means 111 outputs a code of the data according to bifurcation from a node positioning in the course of a path from a root of the code tree to a leaf of the data if the data is stored in the code tree. The code tree rearrangement means 105 exchanges an encoded leaf with another leaf or an internal node.

The pre-data updating means 106 enters the data in the pre-data retaining means 100. The control means 116 repeats a process until the data is encoded when the escape code is encoded.

In the above the data compressing apparatus, the pre-data retaining means 100 retains a context composed of n input data having been inputted up to immediately before an input of the input data, the history retaining means 101 retains a combination of the input data and the context, and the code tree retaining means 107 retains code trees each independent for each context in each of which an escape code defined as data representing that no data is stored is entered beforehand.

The code tree determining means 103 determines a code tree of the data from the context and the input data, the context discriminating means 108 discriminates whether the data is stored in the code tree determined by the code tree determined means 103, and the escape outputting means 109 outputs an escape code according to bifurcation from a node that is a bifurcating point positioning in the course of a path from a root that signifies a top of a code tree to a leaf in which the escape code is stored if no data is stored in the code tree.

Further, the history entering means 112 enters a combination of the data and the context in the history retaining means 101 if the data is not stored in the code tree, the code entering means 113 newly enters the data in the code tree if the data is not stored in the code tree, the context altering means 110 shortens a length n of the context if the data is not stored in the code tree, and the code outputting means 111 outputs a code of the data according to bifurcation from a node positioning in the course of a path from a root of the code tree to a leaf of the data if the data is stored in the code tree.

The code tree rearrangement means 105 then exchanges an encoded leaf with another leaf or an internal node, the pre-data updating means 106 enters the data in the pre-data retaining means 100, and the control means 116 repeats a process until the data is encoded when an escape code is encoded.

According to the data compressing apparatus of this invention, it is possible to newly enter input data that has not been entered beforehand in the past, and to encode this newly entered data in an early stage in the next encoding process. This may largely improve an effect of the data compression as the encoding process proceeds further, besides largely reducing a processing load on the data compressing apparatus.

Figure 4:
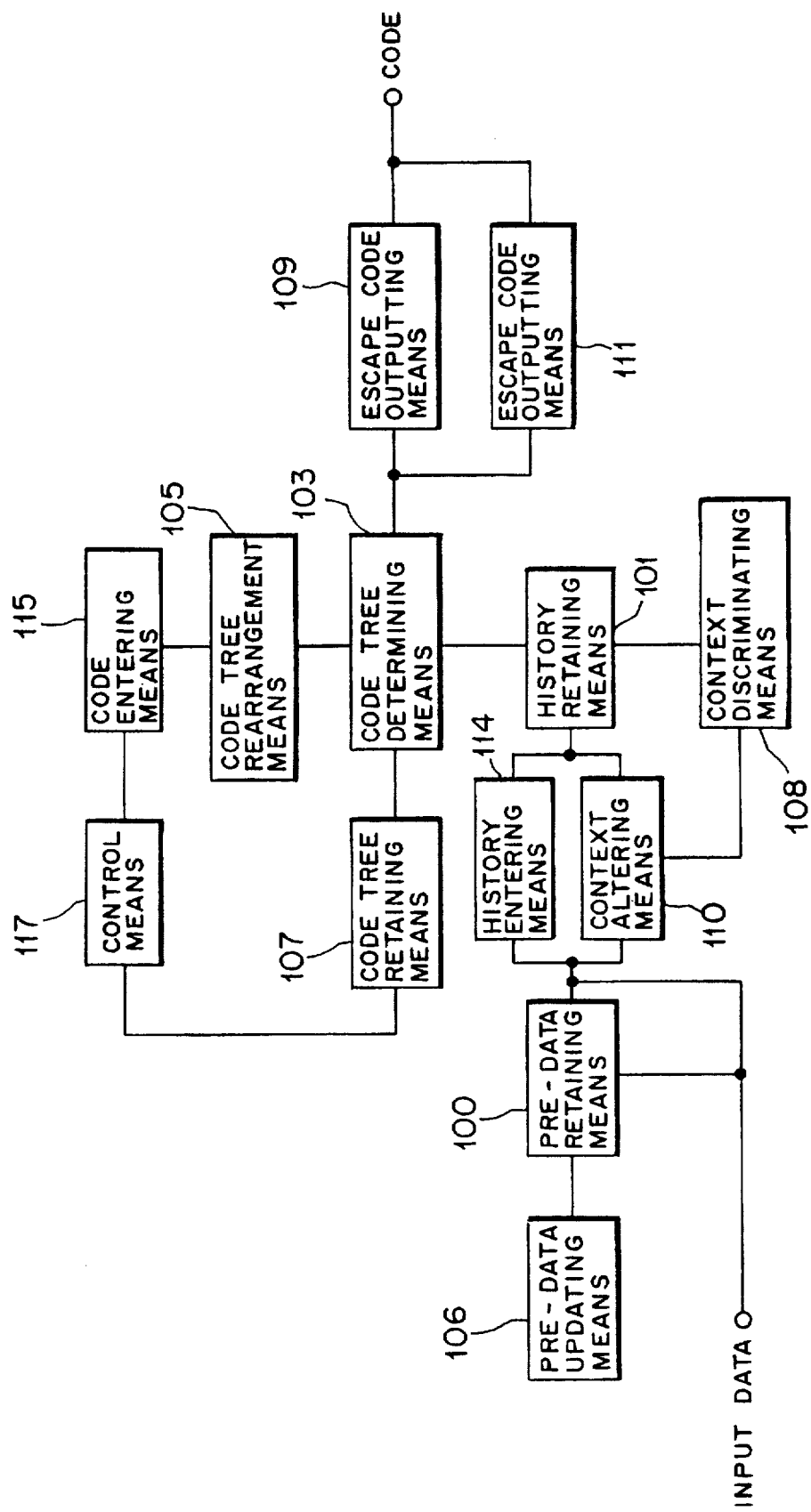

FIG. 4 is a block diagram showing another aspect of the data compressing apparatus according to this invention. In FIG. 4, reference numeral 100 denotes a pre-data retaining means, 101 denotes a history retaining means, 103 denotes a code tree retaining means, 105 denotes a code tree rearrangement means, 106 denotes a pre-data updating means, 107 denotes a code tree retaining means, 108 denotes a context discriminating means, 109 and 111 denote escape code outputting means, 110 denotes a context altering means, 114 denotes a history entering means, 115 denotes a code entering means and 117 denotes a control means.

The pre-data retaining means 100 retains a context composed of n input data that have been inputted up to immediately before an input of input data. The history retaining means 101 retains a combination of the input data and the context. The code tree retaining means 107 retains code trees each independent for each context in which an escape code is beforehand entered defined as data representing that no data is stored.

The code tree determining means 103 determines a code tree of the data from the context and the input data. The context discriminating means 108 discriminates whether the data is stored in the code tree determined by the code tree determining means 103.

Further, the escape code outputting means 109 outputs an escape code according to bifurcation from a node that is a bifurcating point positioning in the course of a path from a root that signifies a stop of the code tree to a leaf in which data of the escape code is stored.

The context altering means 110 shortens a length n of the context if the data is not stored in the code tree. The escape code outputting means 111 outputs a code of the data according to bifurcation from a node positioning in the course of a path from a root to a leaf of the data on the code tree if the data is stored in the code tree.

The history entering means 114 enters a combination of the data and the context in the history retaining means 101. The code entering means 115 newly enters the data in the code tree. The code tree rearrangement means 105 exchanges an encoded leaf with another leaf or an internal node. The pre-data updating means 106 enters the data in the pre-data retaining means 100.

The control means 117 causes the history entering means 114 to enter a combination of the context immediately before the encoding of the data and the data in the history retaining means 101 if an escape code is encoded even once in encoding of the data, and causes the code entering means 115 to newly enter the data in the code tree having an escape code that has been encoded immediately before the encoding of the data.

In the above data compressing apparatus, the pre-data retaining means 100 retains a context composed of n input data that have been inputted up to immediately before an input of data, the history retaining means 101 retains a combination of the input data and the context, the code tree retaining means 107 retains code trees each independent for each context in which an escape code representing that no data is entered is beforehand entered.

The code tree determining means 103 determines a code tree of the data from the context and the input data, the context discriminating means 108 discriminates whether the data is entered in the code tree determined by the code tree determined means 103, and the escape code outputting means 109 outputs an escape code according to bifurcation from a node positioning in the course of a path from a root that signifies a top of the code tree to a leaf that is a code storing point for the escape code if the data is not entered in the code tree.

Further, the context altering means 110 shortens a length n of the context if the data is not stored in the code tree, the escape code outputting means 111 outputs a code of the data according to bifurcation from a node positioning in the course of a path from a root of the code tree to a leaf of the data if the data is stored in the code tree.

The history entering means 114 enters the combination of the data and the context in the history retaining means 101, the code entering means 115 newly enters the data in the code tree, the code tree rearrangement means 105 exchanges an encoded leaf with another leaf or an internal node, and the pre-data updating means 106 enters the data in the pre-data retaining means 100.

Further, the control means 116 causes the history entering means 114 to enter a combination of a context obtained immediately before the encoding of the data and the data in the history retaining means 101 if an escape code is encoded even once in the encoding of the data, and causes the code entering means 115 to newly enter the data in a code tree having an escape code that has been encoded immediately before the encoding of the data.

Accordingly, in the above data compressing apparatus of this invention, it is unnecessary to enter all combinations of the context and data that are decided to have not been entered in the history of the input data in the past so that it is possible to largely improve the data compression process. This may also allow only data that actually occurs frequently to be assigned a code (entered) so that an efficiency in the data compression may be largely improved, besides a performance of the data compression apparatus may also be remarkably improved.

Figure 5:
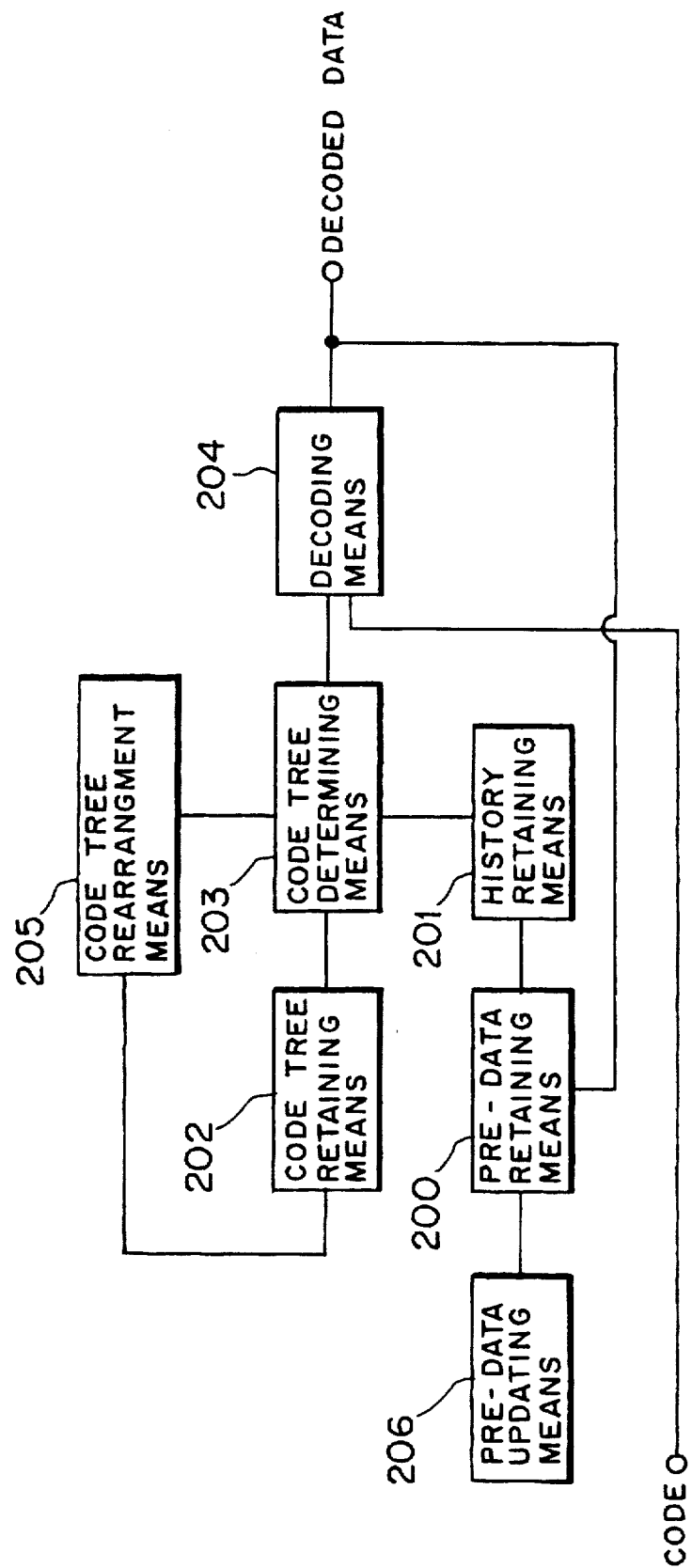

FIG. 5 is a block diagram showing another aspect of the data decompressing apparatus of this invention. The data decompressing apparatus shown in FIG. 5 decodes an encoded code having been encoded according to a history of data occurred in the past.

In FIG. 5, reference numeral 200 denotes a data re-retaining means, 201 denotes a history retaining means, 202 denotes a code tree retaining means, 203 denotes a code tree determining means, 204 a decoding means, 205 a code tree rearrangement means and 206 a pre-data updating means 206.

The pre-data retaining means 200 retains n data that have been decoded in the past. The history retaining means 201 retains a combination of decoded data and a context. The code tree retaining means 202 retains code trees each independent for each context.

The code tree determining means 203 determines a code tree used to decode data from the context retained in the pre-data retaining means 200. The decoding means 204 outputs data stored in a leaf that is a data storing point reached by scanning a path from a root that signifies a top of the code tree that has been selected by the code tree determining means 203 to a node that is a bifurcation point according to a code.

The code tree rearrangement means 205 exchanges a decoded leaf or another leaf or an internal node. The pre-data updating means 206 enters the decoded data in the pre-data retaining means 200.

In the above data restoring apparatus, the pre-data retaining means 200 retains n data that have been decoded before decoding a code, the history retaining means 201 retains a combination of decoded data and a context, and the code tree retaining means 202 retains code trees each independent for each context.

The code tree determining means 203 determines a code tree used to decode data from the context retained in the pre-data retaining means 200, and the decoding means 204 outputs data stored in a leaf as a data storing point reached by scanning a path from a root that signifies a top of the code tree selected by the code tree determining means 203 to a node that is a bifurcation point according to a code.

Further, the code tree rearrangement means 205 exchanges a decoded leaf with another leaf or an internal node, and the pre-data updating means 206 enters the decoded data in the pre-data retaining means 200.

In the above data restoring apparatus of this invention, it is possible to perform a process in two stages simultaneously, that is, a stage to determine a frequency of occurrence of input data to establish a probability model and assign a code to each input data to make a code table, and a stage to output a character to be decoded from this code table so that a processing rate in the data decompression in the data decompressing apparatus may be largely increased. It is also possible to omit an enormous volume of arithmetic operation to reestablish a probability model that has already been established every time data is inputted so that a processing rate in the data restoration may be more improved. It is further possible to express a code of data with bits of the fewer number as a code of the same data as data having occurred in the past occurs more frequently so that an effect of data decompression may be largely improved, besides a performance of the data decompression apparatus may be largely improved.

Figure 6:
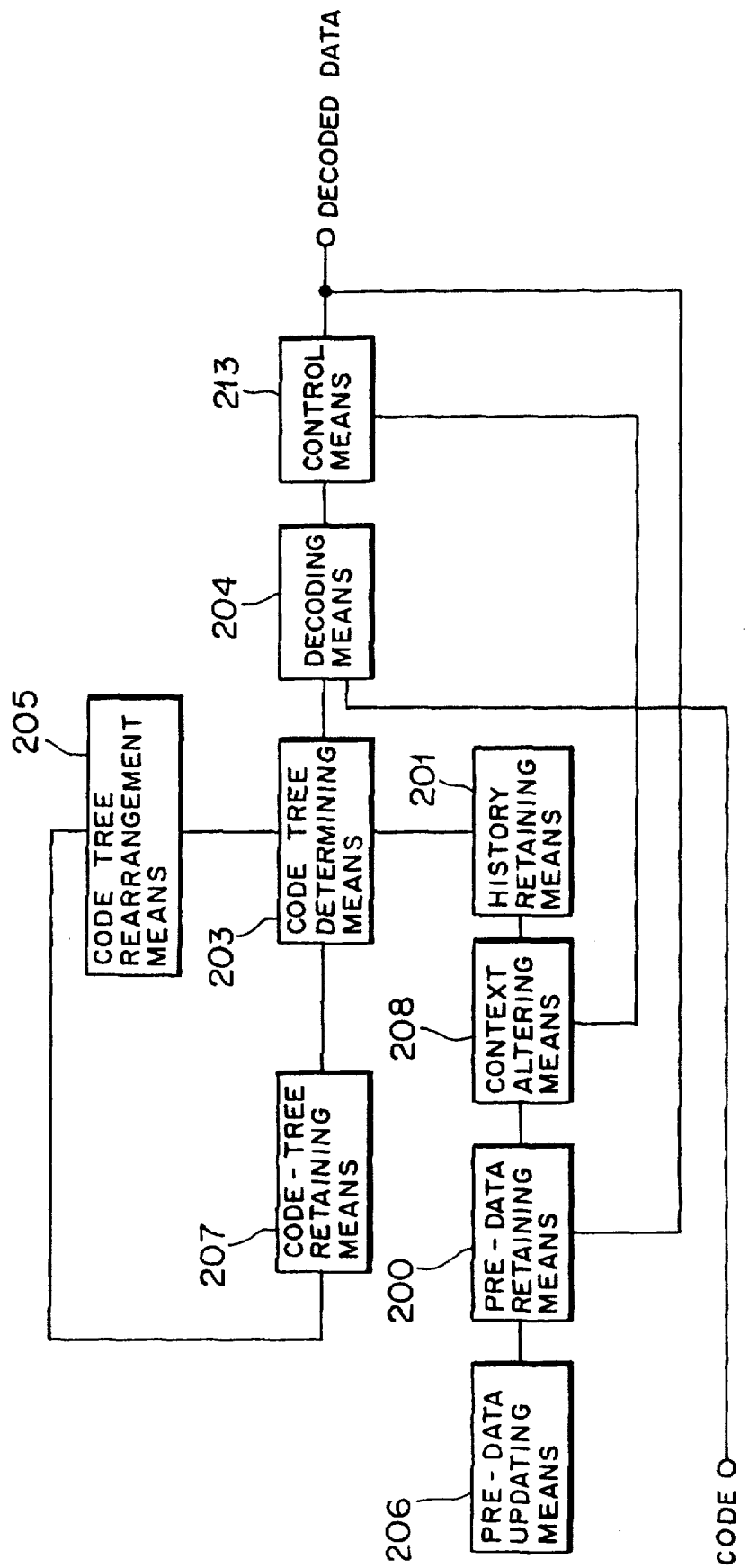

FIG. 6 is a block diagram of another aspect of the data decompressing apparatus according to this invention. In FIG. 6, reference numeral 200 denotes a pre-data retaining means 200, 201 denotes a history retaining means, 203 denotes a code tree determining means, 204 denotes a decoding means, 205 denotes a code tree rearrangement means, 206 denotes a pre-data updating means, 207 denotes a code tree retaining means, 208 denotes a context altering means, and 213 denotes a control means.

The pre-data retaining means 200 retains n data that have been decoded before decoding a code. The history retaining means 201 retains a combination of decoded data and a context. The code tree retaining means 207 retains code trees in each of which an escape code defined as data representing that no data is entered is beforehand stored.

The code tree determining means 203 determines a code tree used to decode data from the context retained in the pre-data retaining means 200. The decoding means 204 outputs data stored in a leaf that is a data storing point by scanning a path from a root that signifies a top of a code tree selected by the code tree determining means 203 to a node that is a bifurcating point according to a code.

Further, the code tree rearrangement means 205 exchanges a decoded leaf with another leaf or an internal node. The context altering means 208 discards data if the outputted data is an escape code so as to shorten the context. The pre-data updating means 206 enters the decoded data in the pre-data retaining means 200.

The control means 213 causes the context altering means 208 to reset the context if an escape code is decoded, and repeats a process until a code excepting an escape code is decoded.

In the above data restoring apparatus, the predata retaining means 200 retains n data that have been decoded before decoding a code. The history retaining means 201 retains a combination of decoded data and a context, and the code tree retaining means 207 retains code trees in each of which an escape code defined as data representing that no data is not stored is entered in advance.

The code tree determining means 203 determines a code tree used to decode data from the context retained in the pre-data retaining means 200, and the decoding means 204 outputs data stored in a leaf that is a data storing point reached by scanning a path from a root that signifies a top of a code tree determined by the code tree determining means 203 to a node that is a bifurcating point according to a code.

Further, the code tree rearrangement means 205 exchanges a decoded leaf with another leaf or an internal node, the context altering means 208 discards the data if outputted data is an escape code so as to shorten the context, and the pre-data updating means 206 enters the decoded data in the pre-data retaining means 200.

The control means 213 causes the context altering means 208 to reset the context when an escape code is decoded, and repeats a process until a code excepting the escape code is decoded.

In the above data decompressing means of this invention, it is unnecessary to enter beforehand all history of a combination of the decoded data and the context so that it is possible to shorten a time period required until the combination of the decoded data and the context is obtained. As a result, a processing rate in the data decompression may be largely increased, besides a performance of the data decompressing apparatus may be improved to a large extent.

Figure 7:
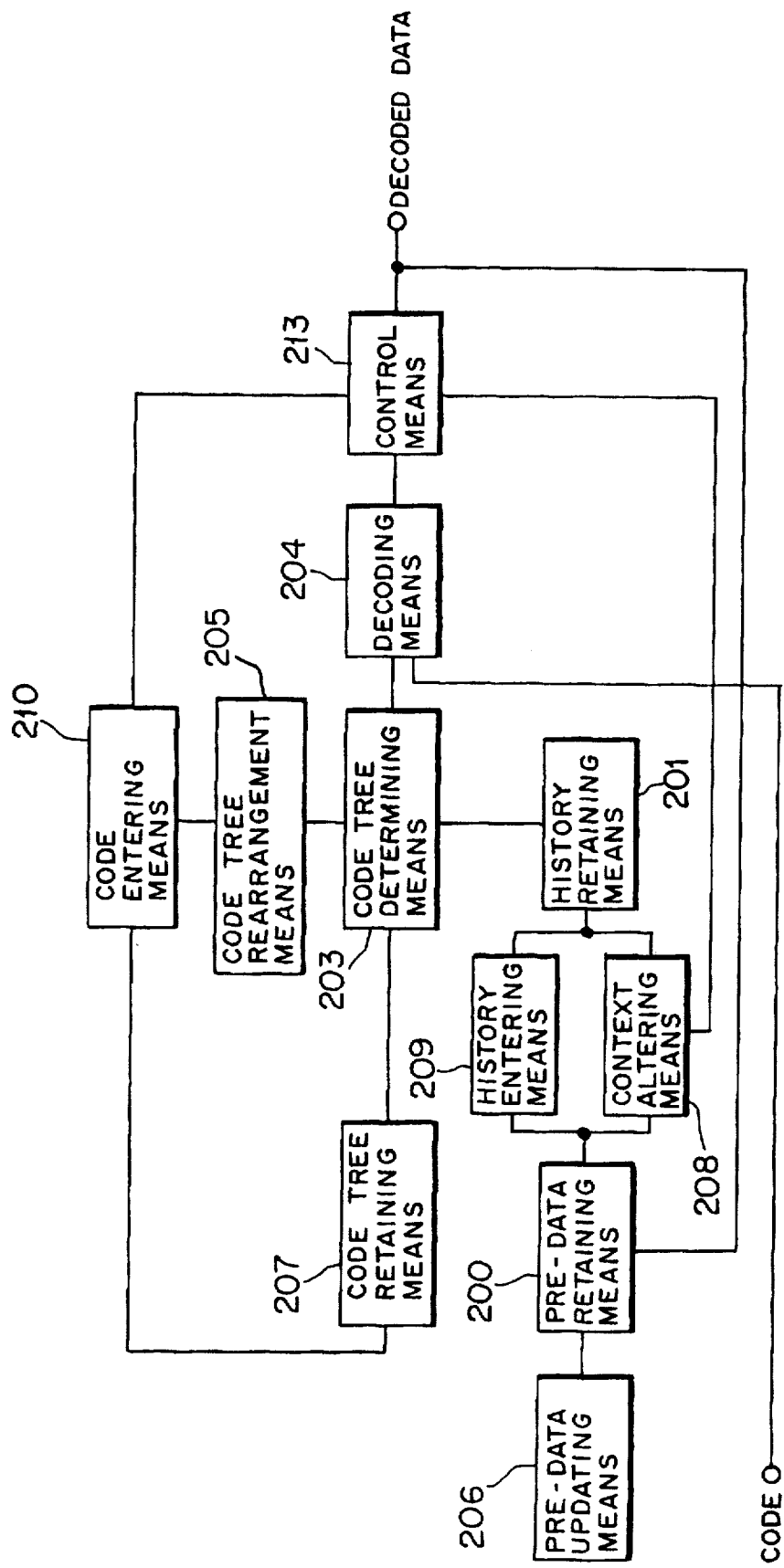

FIG. 7 is a block diagram showing still another aspect of the data decompressing apparatus of this invention. In FIG. 7, reference numeral 200 denotes a pre-data retaining means, 201 denotes a history retaining means, 203 denotes a code tree determining means, 204 denotes a decoding means, 205 denotes a code tree rearrangement means, 206 denotes a pre-data updating means, 207 denotes a code tree retaining means, 208 a context altering means, 209 a history entering means, 210 denotes a code entering means and 213 denotes a control means.

The data re-retaining means 200 retains n data that have been decoded before decoding a code. The history retaining means 201 retains a combination of decoded data and a context. The code tree retaining means 207 retains code trees in each of which an escape code is entered beforehand.

The code determining means 203 determines a code tree used to decode data from the context retained in the pre-data retaining means 200. The decoding means 204 outputs data stored in a leaf that is a data storing point reached by scanning a path from a root that signifies a top of a code tree selected by the code tree determining means 203 to a node that is a bifurcating point according to a code.

The code tree rearrangement means 205 exchanges a decoded leaf with another leaf or a node. The context altering means 208 discards the above data when outputted data is an escape code to as to shorten the context.

The pre-data updating means 206 enters the decoded data in the pre-data retaining means 200. The history entering means 209 enters every context obtained when an escape code is decoded in the data decoding process and the decoded data in the history retaining means 201.

The code entering means 210 enters a code of the data in all code trees corresponding to the context when an escape code is decoded in the data decoding process. The control means 213 causes the context altering means 208 to reset the context when an escape code is decoded, and repeats a process until a code excepting an escape code is decoded.

In the above data restoring apparatus, the data retaining means 200 retains n data that have been decoded before decoding a code, the history retaining means 201 retains a combination of the decoded data and a context, and the code tree retaining means 207 retains code trees in each of which an escape code is entered beforehand.

The code tree determining means 203 then determines a code tree used to decode data from the context retained in the pre-data retaining means 200, the decoding means 204 outputs data stored in a leaf that is a data storing point reached by scanning a path from a root that signifies a top of a code tree determined by the code tree determining means 203 to the leaf via a node that is a bifurcating point according to a code.

Further, the code tree rearrangement means 205 exchanges a decoded leaf with another leaf or an internal node, the context altering means 208 discards the data when outputted data is an escape code so as to shorten the context, and the pre-data updating means 206 enters the decoded data in the pre-data retaining means 200.

The history entering means 209 then enters all contexts and obtained when an escape code is decoded in the data decoding process and the decoded data in the history retaining means 201, the code entering means 210 enters a code of the data in all code trees corresponding to the context when an escape code is decoded in the data decoding process, and the control means 213 causes the context altering means 208 to reset the context when an escape code is decoded, and repeats a process until a code excepting an escape code is decoded.

In the above data decompressing apparatus of this invention, it is possible to newly enter decoded data that have not been entered in advance in the past, and to decode this decoded data that has been newly entered in an early stage in the next decoding process. This may more improve an effect of the data decompression as the decoding process proceeds further, and may largely improve a performance of the data decompressing apparatus.

Figure 8:
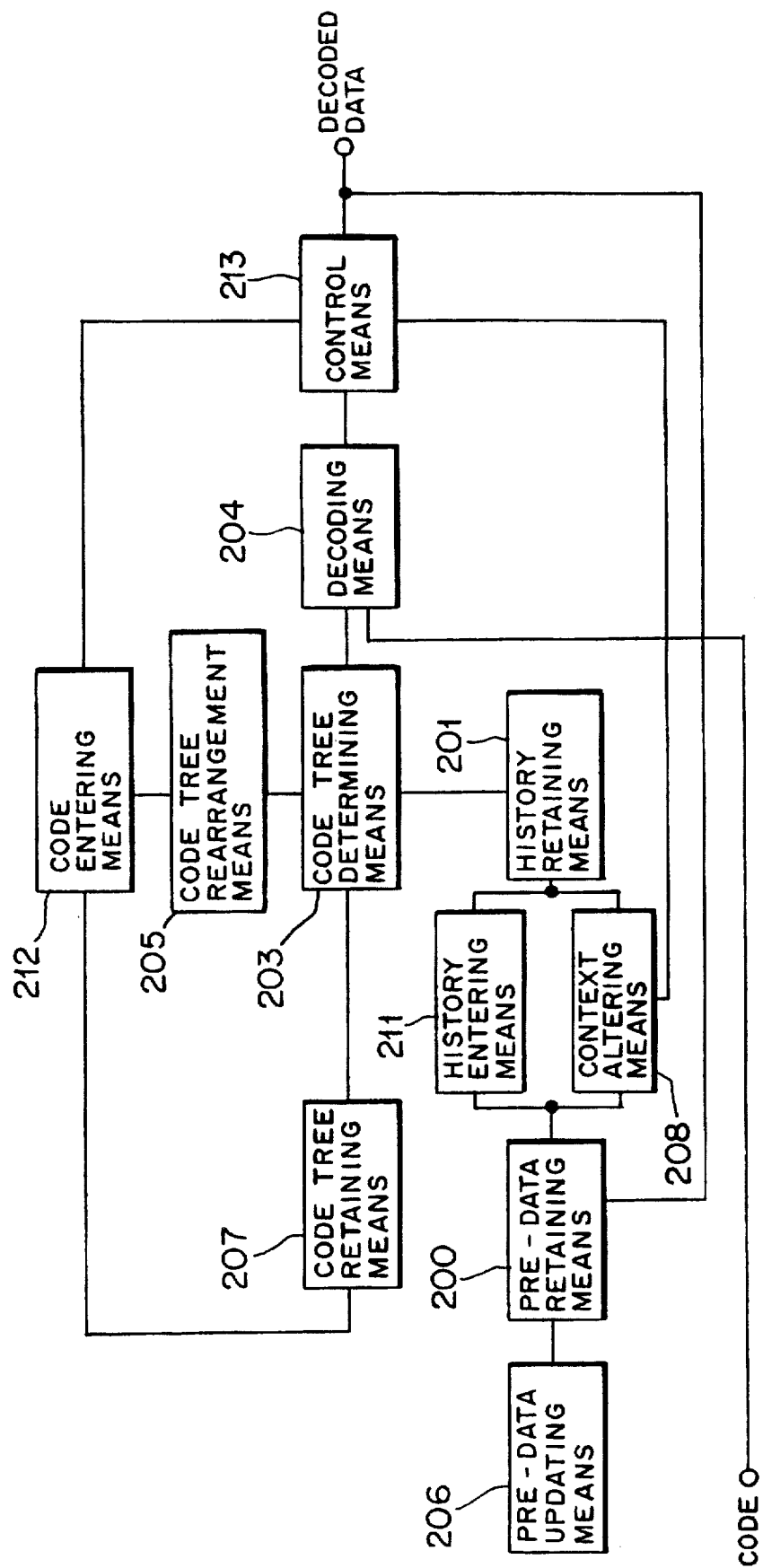

FIG. 8 is a block diagram showing still another aspect of the data decompressing apparatus of this invention. In FIG. 8, reference numeral 200 denotes a pre-data retaining means, 201 denotes a history retaining means, 203 denotes a code tree determining means, 204 denotes a decoding means, 205 denotes a code tree rearrangement means, 206 denotes a pre-data updating means, 207 denotes a code tree retaining means, 208 denotes a context altering means, 212 denotes a code entering means and 213 denotes a control means.

The pre-data retaining means 200 retains n data that have been decoded before decoding a code. The history retaining means 201 retains a combination of decoded data and a context. The code tree retaining means 207 retains code trees in each of which an escape code defined as data representing that data is not stored is entered beforehand.

The code tree determining means 203 determines a code tree used to decode data from the context retained in the pre-data retaining means 200. The decoding means 204 outputs data stored in a leaf that is a data storing point reached by scanning a path from a root that signifies a top of a code tree determined by the code tree determined means 203 to a node that is a bifurcating point according to a code.

The code tree rearrangement means 205 exchanges a decoded leaf with another leaf or an internal node. The context altering means 208 discards the data if outputted data is an escape code so as to shorten the context. The pre-data updating means 206 enters the decoded data in the pre-data retaining means 200.

The history entering means 211 enters a context at the time of the last encoding of an escape code in the data decoding process and the data in the history retaining means 201. The code entering means 212 enters a code of the data in a code tree corresponding to the context at the time of the last encoding of an escape code in the data decoding process. The control means 213 causes the context altering means 208 to reset a context when an escape code is decoded, and repeats the process until a code excepting an escape code is decoded.

In the above data decompressing means, the predata retaining means 200 retains n data that have been decoded before decoding a code, the history retaining means 201 retains a combination of the decoded data and a context, and the code tree retaining means 207 retains code trees in each of which an escape code defined as data representing no entry of data is entered beforehand.

The code tree determining means 203 determines a code tree used to decode the data from the context retained in the pre-data retaining means 200, and the decoding means 204 outputs data stored in a leaf that is a storing point of the data reached by scanning a path from a root that signifies a top of a code tree selected by the code tree determining means 203 to a node that is a bifurcating point according to a code.

Further, the code tree rearrangement means 205 exchanges a decoded leaf with another leaf or an internal node, and the context altering means 208 discards the data if outputted data is an escape code so as to shorten the context.

The pre-data updating means 206 then enters the decoded data in the pre-data retaining means 200, the history entering means 211 enters a context at the time of the last decoding of an escape code in the data decoding process and the decoded data in the history retaining means 201, and the code entering means 212 enters a code of the data in a code tree corresponding to the context at the time of the last decoding of an escape code in the data decoding process.

Further, the control means 213 causes the context altering means 208 to reset the context when an escape code is decoded, and repeats a process until a code excepting an escape code is decoded.

According to the above data restoring means of this invention, it is unnecessary to enter all combinations of a context and data that are decided to have not been stored in the history of input data in the past. In addition, only data actually occurring frequently may be assigned a code (entered) so that an efficiency in the data decompression may be largely improved, besides a performance of the data restoring apparatus may also be largely improved.

A data compressing method according to this invention is to compress input data by decoding the input data according to a history of occurrence of the input data in the past, which takes the following steps:

(1) a context tree retaining step to retain a context tree in which a combination of input data and a context composed of continuous n data followed by the input data is entered;

(2) a code tree retaining step to retain code trees each independent for each context;

(3) a context tree newly entering step to newly enter data in the context tree retained at the context tree retaining step if the combination of the input data and the context is not retained at the context tree retaining step;

(4) a code tree newly entering step to newly enter the data in the code tree retained at the code tree retaining step if the combination of the input data and the context is not stored in the context tree retaining step;

(5) a newly entering step to store the data in a leaf obtained by branching a leaf that is a data storing point on the code tree retained at the code tree retaining step if the combination of the input data and the context is not retained at the context tree retaining step;

(6) a context altering step to alter the context if the combination of the input data and the context is not retained at the code tree retaining step;

(7) a code outputting step to output a code according to bifurcation from a top of the code tree to a leaf in which the input data or a specific code in the code tree is stored;

(8) a code tree rearrangement step to exchange a leaf in which the input data or the specific code in the code tree is stored with another leaf or an internal node that is defined as a bifurcating point excepting the top of the code tree; and (9) a newly entering step to branch a leaf in which the specific code is stored to enter the specific code and the new data in respective two leaves newly obtained.

The above data compressing method of this invention functions as follows:

(1) retaining a code tree in which a combination of input data and a context composed of continuous n data followed by the input data at the context retaining step;

(2) retaining code trees each independent for each context at the code tree retaining step;

(3) at the context tree newly entering step, newly entering the data in the context tree retained at the context retaining step if the combination of the input data and the context is not retained at the context tree retaining step;

(4) at the code tree newly entering step, newly entering the data in the code tree retained at the code tree retaining step if the combination of the input data and the context is not retained at the context tree retaining step;

(5) at the newly entering step, storing the data in a new leaf obtained by branching a leaf that is a data storing point on the code tree retained at the code tree retaining step if the combination of the input data and the context is not retained at the context tree retaining step;

(6) at the context altering step, altering the context if the combination of the input data and the context is not retained at the context tree retaining step;

(7) outputting code according to bifurcation extending from a top of the code tree to a leaf in which the input data or a specific code is stored at the code outputting step;

(8) exchanging a leaf in which the input data or the specific code in the code tree is stored with another leaf or an internal node defined as a bifurcating point excepting the top of the code tree at the code tree rearrangement step; and (9) entering the specific code and new data in two leaves newly obtained by branching a leaf in which the specific code is stored at the newly entering step.

The above data compressing apparatus may provide a high encoding rate in the case of the data outputting the above specific code relatively frequently, or in an early stage in which entry of contexts retained at the code tree retaining step is insufficient. If the code tree rearrangement step is performed before the above code tree newly entering step, it is possible to express, for example, a code or the specific code with as small as 2 bits. If the code tree rearrangement step is performed after the above code tree newly entering step, it is possible to express the specific code with as small as 1 bit. This may largely improve the encoding efficiency. At the above code tree newly entering step, the data is always newly entered one by one so that only contexts having a high repeatability are entered in the higher degree of the code tree any time. As a result, it is possible to prevent a drop in the encoding efficiency due to existence of data that has once been entered in the code tree but not actually used. This may further improve the encoding efficiency to a large extent after data has been sufficiently entered.

The data compressing method of this invention is to compress input data by encoding the input data according to a history of occurrence of the input data in the past, which takes the following steps:

(1) a code tree retaining step to retain code trees in each of which an escape code defined as data representing no entry of data is entered;

(2) a context tree retaining step to retain a context tree in which a combination of input data and a context composed of continuous n data followed by the input data is stored;

(3) a code tree newly entering step to newly enter data in the context tree retained at the context tree retaining step if the combination of the input data and the context is not retained at the context retaining step;

(4) a code tree newly entering step to newly enter the data in the code tree retained at the code tree retaining step if the combination of the input data and the context is not retained at the context tree retaining step;

(5) newly entering step to newly enter the data in a leaf newly obtained by branching a leaf that is a data storing point on the code tree retained at the code tree retaining step, if the combination of the input data and the context is not retained at the context tree retaining step;

(6) a context altering step to alter the context if the combination of the input data and the context is not retained in the context tree retaining step;

(7) a code outputting step to output a code according to bifurcation of a path extending from a top of the code tree to a leaf in which the input data or an escape code is stored;

(8) a code tree rearrangement step to exchange a leaf in which the input data or an escape code is stored with another leaf or an internal node that is defined as a bifurcating point excepting the top of the code tree; and (9) a newly entering step to branch a leaf in which the escape code is stored to enter the escape code and the new data in two leaves newly obtained, respectively.

The above data compressing method of this invention functions as follows:

(1) retaining code trees in each of which an escape code that is defined as data representing no entry of data is entered beforehand at the code tree retaining step;

(2) retaining a code tree in which a combination of input data and a context composed of continuous n data followed by the input data is stored at the context tree retaining step;

(3) at the context tree newly entering step, newly entering data in the context tree retained at the context tree retaining step if the combination of the input data and the context is not retained at the context tree retaining step;

(4) at the code tree newly retaining step, newly entering the data in the code tree retained at the code tree retaining step if the combination of the input data and the context is not retained at the context tree retaining step;

(5) at the newly entering step, storing the data in a new leaf obtained by branching a leaf that is a data storing point at the code tree retained at the code tree retaining step if the combination of the input data and the context is not retained at the context tree retaining step;

(6) at the context altering step, altering the context if the combination of the input data and the context is not retained at the context tree retaining step;

(7) outputting a code according to bifurcation of a path from a top of the code tree to a leaf in which the input data or an escape code is stored at the code outputting step;

(8) exchanging a leaf in which the input data or an escape code is stored with another leaf or an internal node that is defined as a bifurcating point excepting the top of the code tree at the code tree rearrangement step; and (9) branching a leaf in which the escape code is stored to enter the escape code and the new data in two leaves newly obtained, respectively.

The above data compressing apparatus may provide a high encoding rate in the case of the data outputting the above specific code relatively frequently, or in an early stage in which entry of contexts retained at the code tree retaining step is insufficient. If the code tree rearrangement step is performed before the above code tree newly entering step, it is possible to express, for example, a code or the specific code with as small as 2 bits. If the code tree rearrangement step is performed after the code tree newly entering step, it is possible to express the specific code with as small as 1 bit. This may largely improve the encoding efficiency. At the above code tree newly entering step, the data is always newly entered one by one so that only contexts having a high repeatability are entered in the higher degree of the code tree any time. As a result, it is possible to prevent a drop in the encoding efficiency due to existence of data that has once been entered to the code tree but not actually used. This may further largely improve the encoding efficiency to a large extent after data has been sufficiently entered.

In the newly entering process at the above code tree newly entering step (4), it is possible to branch a leaf having the longest distance from the root that is defined as a top of the code tree among leaves under the same context, and enter code data that has been stored in the branched leaf and new data in two leaves newly obtained by the branching, respectively. It is alternatively possible to branch the last entered leaf among leaves under the same context, and enter data stored in the branched leaf and new data in two leaves newly obtained by the branching, respectively.

At the above newly entering step (5), a leaf having the longest distance from the root that is defined as a top of the code tree among leaves under the same context is branched so that data stored in the branched leaf and new data are entered in two leaves newly obtained by the branching, respectively. Alternatively, a leaf that has been entered last among leaves under the same context is branched so that data stored in the branched leaf and new data are entered in two leaves newly obtained by the branching, respectively.

According to the above data compressing method of this invention, it is possible to lengthen a code length of data having the lowest frequency of occurrence that is not used frequently. It is therefore possible to prevent a decrease in efficiency of the encoding due to, for example, an increase of the code length by 1 bit, and to increase largely a processing rate in the data compression. The new data stored in the last entered leaf can be approximated as data having a relatively long code length so that the processing rate in the data compression may be more increased.

The data decompressing method of this invention is to decompress encoded data obtained by decoding input data according to a history of the input data in the past, taking the following steps:

(1) a context tree retaining step to retain a context tree in which a combination of decoded data and a context are stored;

(2) a code tree retaining step to retain code trees each independent for each context;

(3) a code tree determining step to determine a code tree from data that has been decoded up to immediately before;

(4) a decoding step to decode a code by scanning a path from a root that signifies a top of a code tree to a leaf that is a data storing point according to the code;

(5) a context altering step to alter the context if the reached leaf is a specific code in the code tree;

(6) a code tree rearrangement step to exchange leaves of the decoded data and the specific code with another leaves or an internal node that is a bifurcating point;

(7) a newly entering step to newly enter the decoded data in the code tree when the specific code is decoded;

(8) a context entering step to enter the data having been entered at the newly entering step in the context tree retained in the context tree retaining step; and (9) a newly entering step to branch the same leaf as a leaf having been selected to be branched in an encoder to enter the new data therein.

The above data decompressing method of this invention functions as follows:

(1) retaining a context tree in which a combination of decoded data and a context is stored at the context tree retaining step;

(2) retaining code trees each independent for each context at the code tree retaining step;

(3) determining a code tree of a code from decoded data that has been decoded up to immediately before at the code tree determining step;

(4) decoding a code by scanning a path from a root that signifies a top of a code tree to a leaf that is a data storing point according to the code at the decoding step;

(5) altering the context if the reached leaf is a specific code in the code tree at the context altering step;

(6) exchanging leaves of the decoded data and the specific code with another leaves or an internal node that is a bifurcating point at the code tree rearrangement step;

(7) at the newly entering step, newly entering the decoded data in the code tree when the specific code is decoded;

(8) at the context tree entering step, entering the data having been entered at the newly entering step in the code tree retained at the context tree retaining step; and (9) branching the same leaf as a leaf having been selected to be branched in an encoder to enter the new data therein at the newly entering step.

According to the above data decompressing method of this invention, each of leaves divided into two may having a code length of, for example, [(a code length of a leaf before the division)+1] bits, and a code of the data newly entered or the specific code may be have a code length as small as 2 bits at the data newly entering step, similarly in the encoder (in the compressing method). As a result, it is possible to largely increase an efficiency in the data decoding in the case of dealing with data in which a relatively large number of the specific codes are decoded, or in an early stage where dictionary entry (entry of symbols in the code tree) is not sufficient. If the code tree rearrangement step is performed before the data newly entering step, the decoded data or the specific code may have a code length of as small as 2 bits, for example. If the code tree rearrangement step is performed after the newly entering step, the specific code may have a code length of as small as 1 bit. This may further increase an efficiency in the data decompression. In addition to the above, the decompressor performs the same newly entering step as the encoder so that it is possible to decode accurately the data having been encoded in the compressor.

The data decompressing method of this invention is to decompress input data having been encoded according to a history of the input data in the past, taking the following steps:

(1) a code tree retaining step to retain code trees in each of which an escape code defined as data representing that data is not stored is entered beforehand;

(2) a context tree retaining step to retain a context tree in which a combination of decoded data and a context is stored;

(3) a code tree determining step to determine a code tree from the data that has been decoded up to immediately before;

(4) a decoding step to decode a code by scanning a path from a root that signifies a top of a code tree to a leaf that is a data storing point according to the code;

(5) a context tree rearrangement step to alter the context if the reached leaf is an escape code;

(6) a code tree rearrangement step to exchange leaves of a decoded data and an escape code with another leaves or an internal node that is a bifurcating point;

(7) a newly entering step to newly enter the decoded data in the code tree when an escape code is decoded;

(8) a context entering step to enter the data having been entered at the newly entering step in the code tree retained at the context tree retaining step; and (9) a newly entering step to branching the same leaf as a leaf having been selected to be branched in an encoder to enter the new data therein.

The above data decompressing method of this invention functions as follows:

(1) retaining code trees in each of which an escape code defined as data representing no entry of data is stored at the code tree retaining step;

(2) retaining a context tree in which a combination of decoded data and a context is stored at the context tree retaining step;

(3) determining a code tree of a code from data that has been decoded up to immediately before at the code tree determining step;

(4) decoding a code by scanning a path from a root that signifies a top of the code tree to a leaf that is a data storing point according to the code at the decoding step;

(5) altering the context if the reached leaf is an escape code at the context altering step;

(6) exchanging leaves of the decoded data and an escape code with another leaves or an internal node that is a bifurcating point at the code tree rearrangement step;

(7) newly entering the decoded data in the code tree when an escape code is decoded at the newly entering step;

(8) at the context tree entering step, entering the data having been entered at the newly entering step in the code tree retained at the context tree retaining step; and (9) branching the same leaf as a leaf having been selected to be branched in an encoder to enter the new data therein at the newly entering step.

According to the above data decompressing method, each of leaves divided into two may have a code length of, for example, [(a code length of a leaf before the division)+1] bits, and a code of the newly entered data or the specific code may have a code length of as small as 2 bits at the data newly entering step, similarly in the encoder (in the compressing method). As a result, it is possible to largely increase an efficiency in the data decoding in the case of dealing with data in which a relatively large number of the specific codes are decoded, or in an early stage where dictionary entry (entry of symbols in the code tree) is not sufficient. If the code tree rearrangement step is performed before the data newly entering step, the data or the specific code may have a code length of as small as 2 bits, for example. If the code tree re-arrangement step is performed after the newly entering step, the specific code may have a code length of as small as 1 bit. This may further increase an efficiency in the data decoding. In addition to the above, the encoder performs the same newly entering step as the decompressor so that it is possible to decode accurately the data having been encoded in the encoder.

Figure 9:
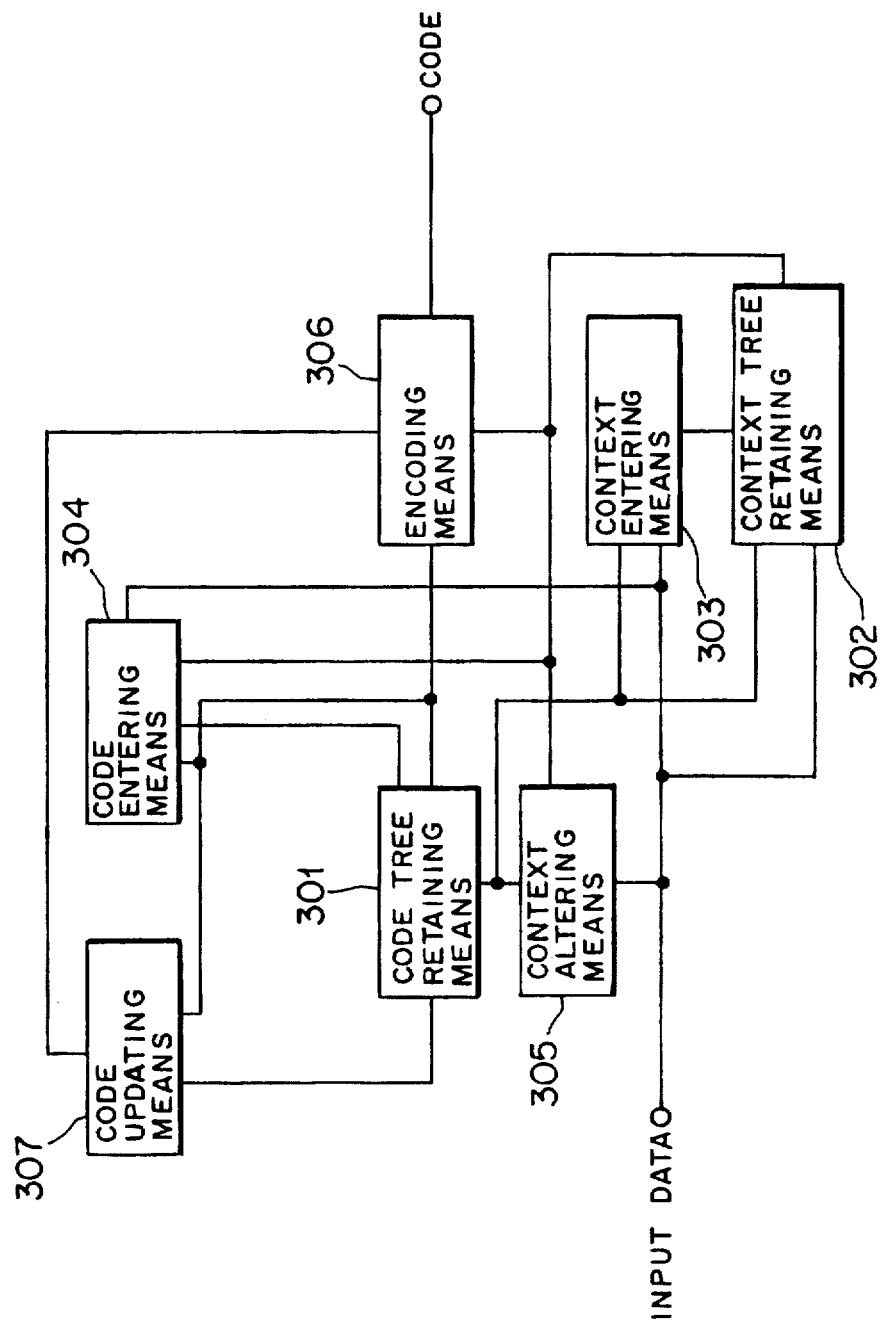

FIG. 9 is a block diagram of an apparatus used to implement the above-described data compressing method according to this invention. The data compressing apparatus shown in FIG. 9 encodes input data according to a history of occurrence of the input data in the past.

In FIG. 9, reference numeral 301 denotes a code tree retaining means, 302 denotes a context tree retaining means, 303 denotes a context entering means, 304 denotes a code entering means, 305 denotes a context altering means, 306 denotes an encoding means and 307 denotes a code updating means.

The code tree retaining means 301 retains code trees in each of which an escape code beforehand defined as data representing no entry of data is entered beforehand. The context tree retaining means 302 retains a context tree in which a combination of input data and a context is stored. The context entering means 303 newly enters data in the context tree after an escape code has been decoded.

The code entering means 304 branches a leaf that is a data storing point for an escape code in the code tree after t he escape code has been encoded so as to newly enter the data therein. The context altering means 305 alters the context if the combination of the input data and the context is not stored in the context tree.

The encoding means 306 outputs a code according to a path from a top of the code tree to a leaf in which the input data or the escape code is stored. The code updating means 307 exchanges a leaf in which the decoded data or the escape code is stored with another leaf or internal node.

In the above data compressing apparatus, the code tree retaining means 301 retains code trees in each of which an escape code that is defined as data representing no entry of data is entered beforehand, and the context tree retaining means 302 retains a context tree in which a combination of input data and a context is stored.

The context entering means 303 newly enters data in the context tree after the escape code has been encoded, the code entering means 304 branches a leaf that is a data storing point for the escape code in the code tree after the escape code has been encoded so as to newly enter the data therein, the context altering means 305 alters the context if the combination of the input data and the context is not retained in the context tree.

The encoding means 306 outputs a code according to a path from a top of the code tree to a leaf in which the input data or the escape code is stored, and the code updating means 307 exchanges a leaf in which the encoded data or the escape code is stored with another leaf or internal node.

The above data compressing apparatus of this invention may provide a high encoding rate in the case of data in which the escape code is relatively frequently outputted, or in an early stage where entry of contexts retained in the context tree retaining means 301 is not sufficient. If the code updating performed by the code updating means 307 is carried out before the code entering performed by the code entering means 304, the code or the escape code may have a code length as small as 2 bits, for example. If the code updating by the code updating means 307 is carried out before the code entering by the code entering means 304, the escape code may have a code length as small as 1 bit so that an efficiency in the encoding may be largely improved. Further, new entry of a code by the code entering means 304 is always carried out one by one so that it is possible to prevent a decrease in efficiency in the encoding due to existence of data that has been once entered in the code tree but is not used actually. This may largely improve an efficiency of the encoding after data has been entered to a sufficient extent. As a result, a performance of the data compressing apparatus may be noticeably improved.

Figure 10:
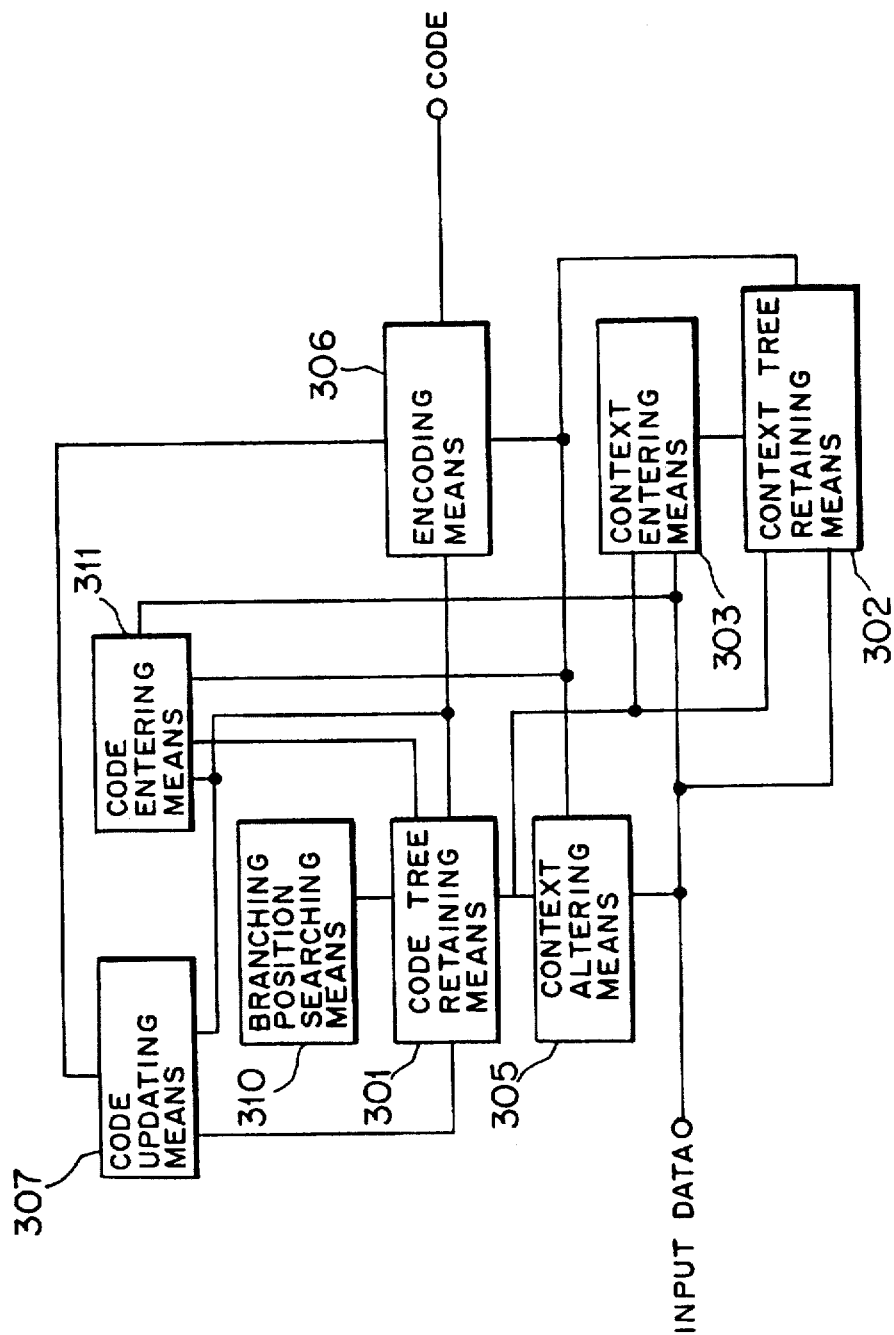

FIG. 10 is a block diagram of an apparatus used to implement the above-mentioned data compressing method of this invention. The data compressing apparatus shown in FIG. 10 has a code tree retaining means 301, a context tree retaining means 302, a context entering means 303, a context altering means 305, an encoding means 306 and a code updating means 307, which are similar to those shown in FIG. 9.

Reference numeral 310 denotes a branching position searching means. The branching position searching means 310 searches a leaf having the longest code length on a code tree.

Reference numeral 311 denotes a code entering means. The code entering means 311 branches a leaf that is a data storing point searched by the branching position searching means 110 to newly enter data therein after an escape code has been encoded.

In the above data compressing apparatus, the code tree retaining means 301 retains code trees in each of which an escape code defined beforehand as data representing no entry of data, and the context tree retaining means 302 retains a context tree in which a combination of input data and a context.

The context entering means 303 newly enters data in the context tree after an escape code has been encoded, the branching position searching means 310 searches a leaf having the longest code length, and the code entering means 311 branches a leaf that is a data storing point searched by the branching position searching means 310 after the encoding of the escape code to newly enter the data therein.

The context altering means 305 alters the context if the combination of the input data and the context is not retained in the context, the encoding means 306 outputs a code according to bifurcation of a path from a top of the code tree to a leaf in which the input data or an escape code is stored, and the code updating means 307 exchanges a leaf in which the encoded data or the escape code is stored with another leaf or a node.

The data compressing apparatus of this invention may give a long code length to rarely used data having the lowest frequency of occurrence so that it is possible, for example, to prevent a decrease in efficiency of the encoding due to a code length increased by 1 bit, thereby improving largely a processing rate in the data compression, besides a performance of the data compressing apparatus.

Figure 11:
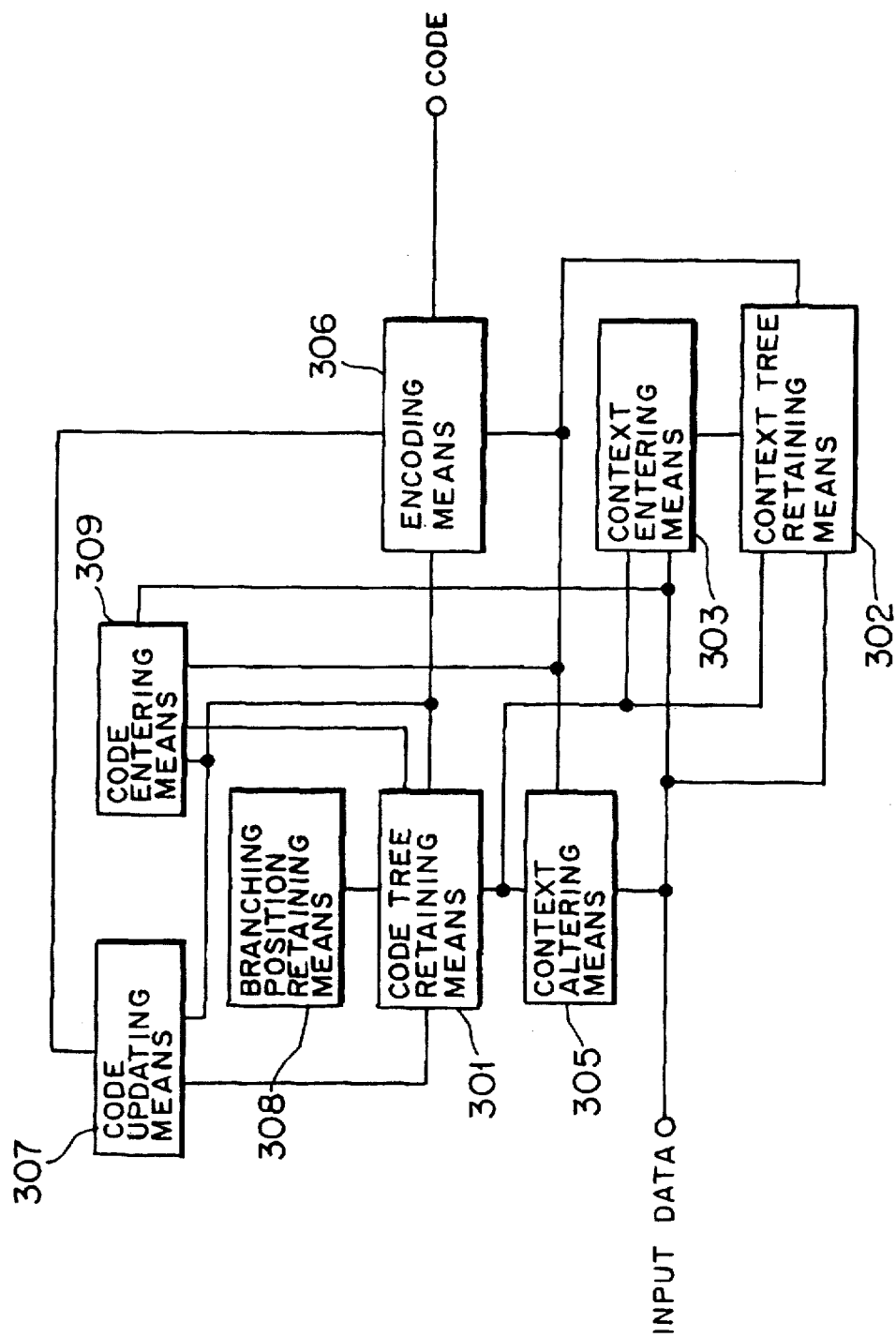

FIG. 11 is a block diagram of an apparatus used to implement the above-mentioned data compressing method of this invention. The data compressing apparatus shown in FIG. 11 has a code tree retaining means 301, a context tree retaining means 302, a context entering means 303, a context altering means 305, an encoding means 306 and a code updating means 307, which are similar to those shown in FIG. 9.

Reference numeral 308 denotes a branching position retaining means. The branching position retaining means 308 retains a position of a leaf that is a data storing point for newly entered data in a code tree.

Reference numeral 309 denotes a code entering means. The code entering means 309 branches a leaf in a position retained in the branching position retaining means 308 after an escape code has been encoded to newly enter the data therein.

In the above data compressing apparatus, the code tree retaining means 301 retains code trees in each of which an escape code that is defined as data representing that entry of data is entered beforehand, and the context tree retaining means 302 retains a context tree in which a combination of input data and a context is stored.

The context entering means 303 newly enters data in the context tree after the escape code has been encoded, the branching position retaining means 308 retains a position of a leaf that is a data storing point for newly entered data in the code tree, and the code entering means 309 branches a leaf in a position retained in the branching position retaining means 308 after the encoding of the escape code to newly enter the data therein.

The context altering means 305 alters the context if the combination of the input data and the context is not retained in the context tree, the encoding means 306 outputs a code according to bifurcation of a path from a top of the code tree to a leaf in which the input data or the escape code is entered, and the code updating means 307 exchanges a leaf in which the data or the escape code is stored with another leaf or an internal node that is a bifurcating point.

The above data compressing apparatus of this invention may approximate the new data stored in the leaf having been entered last to data having a relatively long code length, thereby largely increasing a processing rate in the data compression and largely reducing a processing load on the data compressing apparatus.

Figure 12:
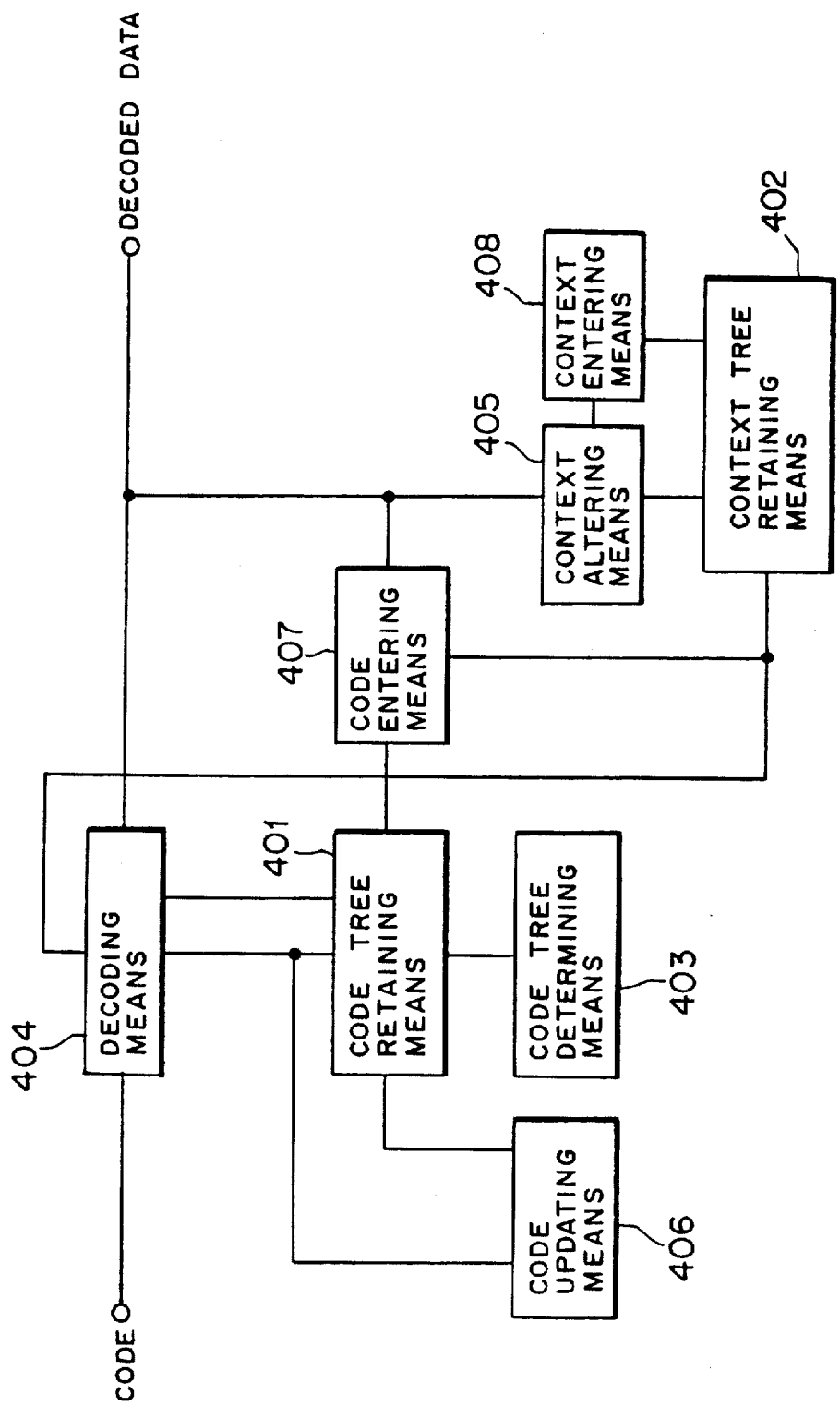

FIG. 12 is a block diagram of an apparatus used to implement the above-mentioned data decompressing method of this invention. The data restoring apparatus shown in FIG. 12 decodes a code that has been encoded according to a history of input data in the past.

In FIG. 12, reference numeral 401 denotes a code tree retaining means, 402 denotes a context tree retaining means, 403 denotes a code tree determining means, 404 denotes a decoding means, 405 denotes a context altering means, 406 denotes a code updating means, 407 denotes a code entering means, and 408 denotes a context tree entering means.

Here, the code tree retaining means 401 retains code trees in each of which an escape code that is defined as data representing that data is not entered is entered beforehand. The context tree retaining means 402 retains a context tree in which a combination of input data and a context is stored. The code tree determining means 403 determines a code tree from data that has been decoded up to immediately before.

Further, the decoding means 404 decodes a code by scanning a path from a root that signifies a top of the code tree to a leaf that is a data storing point according to the code. The context altering means 405 alters the context if the reached leaf is an escape code. The code updating means 406 exchanges leaves of the decoded data and an escape code with another leaves or an internal node that is a bifurcating point.

The code entering means 407 branches a leaf of the escape code if the escape code is decoded so as to newly enter the decoded data therein. The context tree entering means 408 enters the data having been entered by the code entering means 407 in the context tree retained by the context tree retaining means 402.

In the above data decompressing apparatus, the code tree retaining means 401 retains code trees in each of which an escape code that is defined as data representing no entry of data is entered beforehand, the context retaining means 402 retains a code tree in which a combination of decoded data and a context is stored, and the code tree determining means 403 determines a code tree of a code from data that has been decoded up to immediately before.

The decoding means 404 decodes a code by scanning a path from a root that signifies a top of the code tree to a leaf that is a data storing point according to the code, the context altering means 405 alters the context if the reached leaf is an escape code.

The code updating means 406 exchanges leaves of the decoded data and the escape code with another leaves or an internal node that is a bifurcating point, the code entering means 407 branches a leaf of the escape code when the escape code is encoded to newly enter the data therein, and the context tree entering means 408 enters the data having been entered by the code entering means 407 in the context tree retained by the context tree retaining means 402.

The above data restoring apparatus of this invention may provide a high decoding rate in the case of data that outputs the escape code relatively frequently, or in an early state where entry of context tree retained by the context tree retaining means 402 is not sufficient. If the code entering means 407 performs the entry of a code before the code updating by the code updating means 406, the code or the escape code may have a code length of as small as 2 bits, for example. If the code updating means 406 performs the code updating before the code entering by the code entering means 407, the escape code may have a code length of as small as 1 bit. This may largely improve an efficiency in the data decoding. Further, the new entry of a decoded code by the code entering means 407 is always carried out one by one so that only data having repeatability is always entered in the higher degree of the code tree. This may prevent a decrease in an efficiency of the data decoding due to existence of data that has been once entered in the code tree but is not used actually so that an efficiency of the data decoding after data has been entered to a sufficient extent may be greatly improved. As a result, a performance of the data decompressing apparatus may be noticeably improved.

Figure 13:
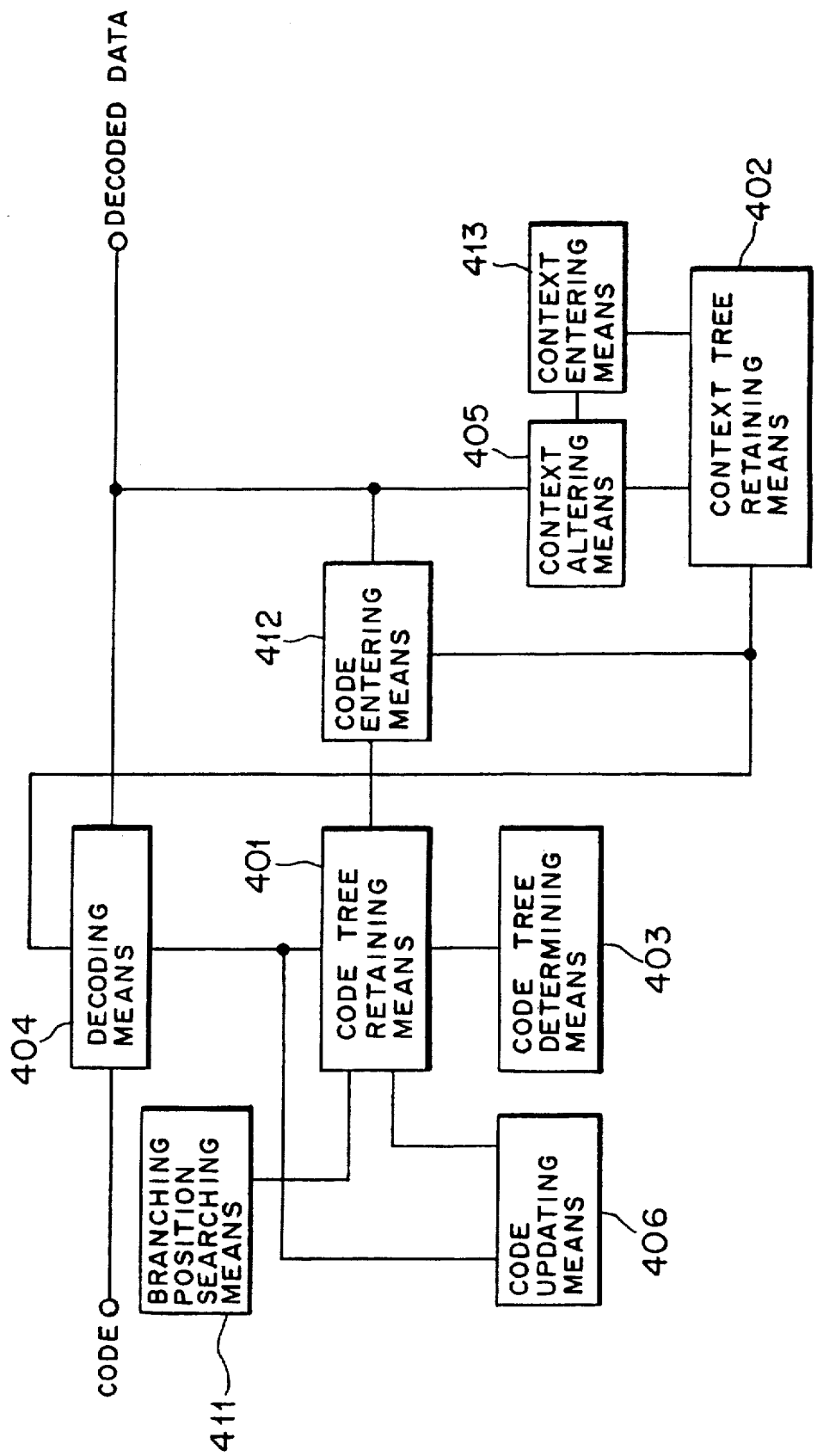

FIG. 13 is a block diagram of an apparatus used to implement the above-mentioned data decompressing method of this invention. The data decompressing apparatus shown in FIG. 13 has a code tree retaining means 401, a context tree retaining means 402, a code tree determining means 403, a decoding means 404, a context altering means 405 and a code updating means 406, which are similar to those shown in FIG. 12.

Reference numeral 411 denotes a branching position searching means. The branching position searching means 411 searches a position of a leaf having the longest code length on the code tree.

Reference numeral 412 denotes a code entering means. The code entering means 412 branches a leaf searched by the branching position searching means 411 after an escape code has been encoded to newly enter data therein.

Reference numeral 413 denotes a context tree entering means. The context tree entering means 413 enters data having been entered by the code entering means 413 in the context tree retained by the context tree retaining means 402.

In the above data restoring apparatus, the code tree retaining means 401 retains code trees in each of which an escape code that is defined as data representing that no entry of data is entered in advance, the context tree retaining means 402 retains a context tree in which a combination of decoded data and a context is stored, and the code tree determining means 403 determines a code tree of a code from data that has been decoded up to immediately before.

The decoding means 404 decodes a code by scanning a path from a root that signifies a top of the code tree to a leaf that is a data storing point, and the context altering means 405 alters the context if the reached leaf is an escape code.

Further, the code updating means 406 exchanges leaves of the decoded data and the escape code with another leaves or a node that is a bifurcating point, the branching position searching means 411 searches a position of a leaf having the longest code length on the code tree, the code entering means 412 branches a leaf searched by the branching position searching means 411 to newly enter the data therein, and the context tree entering means 408 enters the data having been entered by the code tree entering means 412 in the context tree retained by the context tree retaining means 402.

The above data restoring apparatus of this invention may allows rarely used data having a low frequency of occurrence to have a longer code length so that it is possible to minimize a decrease in efficiency of data encoding caused from an increase of the code length by 1 bit, whereby a processing rate in the data restoration may be largely increased and a performance of the data restoring apparatus may be noticeably improved.

Figure 14:
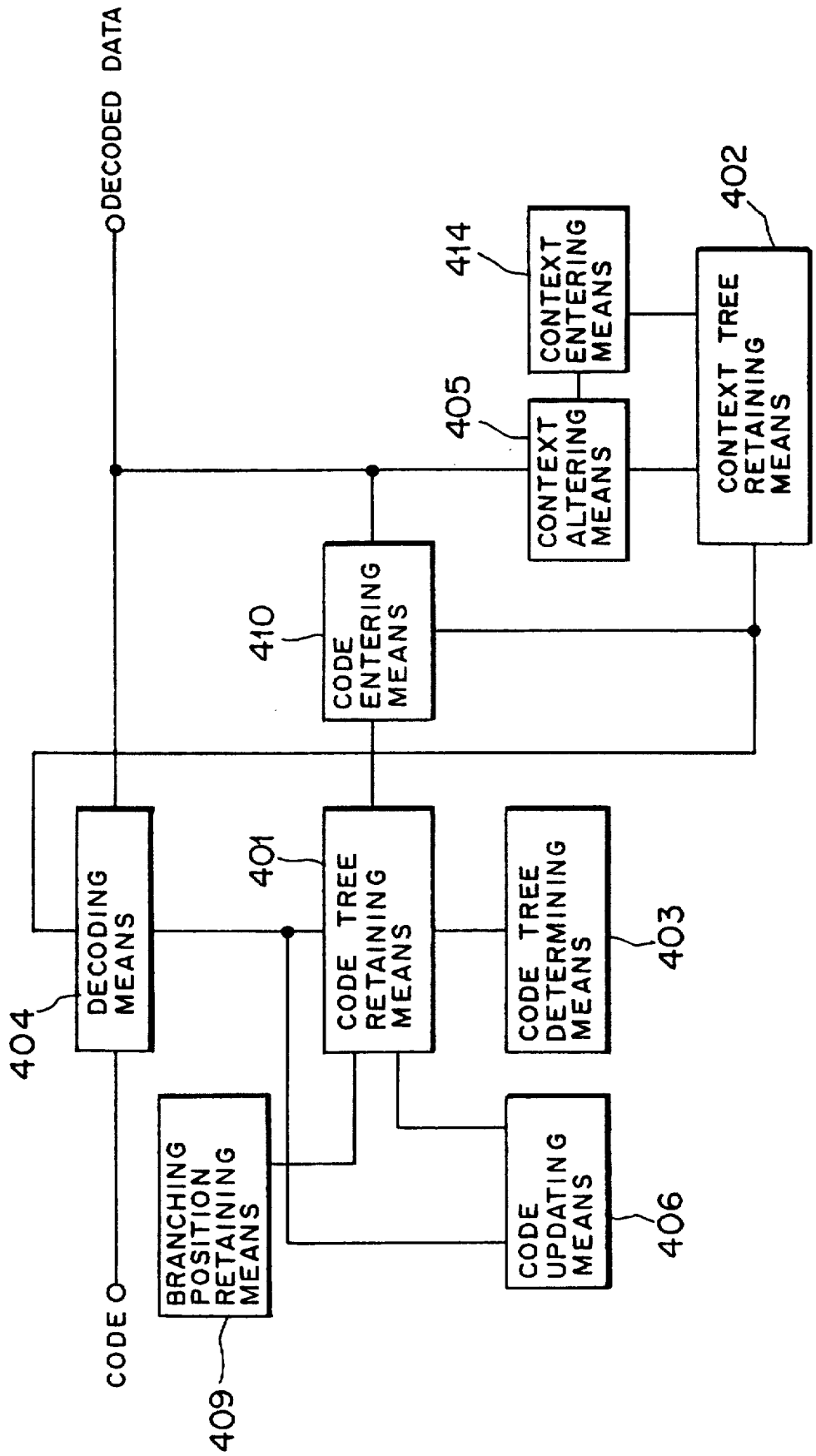

FIG. 14 is a block diagram of an apparatus used to implement the above-mentioned data decompressing method of this invention. The data decompressing apparatus shown in FIG. 14 has a code tree retaining means 401, a context tree retaining means 402, a code tree determining means 403, a decoding means 404, a context altering means 405 and a code updating means 406, which are similar to those shown in FIG. 12.

Reference numeral 409 denotes a branching position retaining means. The branching position retaining means 409 retains a position of a leaf having been newly entered in the code tree.

Reference numeral 410 denotes a code entering means 410. The code entering means 410 branches a leaf in a position retained in the branching position retaining means 409 after an escape code having been encoded to newly enter data therein.

Reference numeral 414 denotes a context tree entering means. The context tree entering means 414 enters the data having been entered by the code entering means in the context tree retained in the context tree retaining means 402.

In the above data decompressing apparatus, the code tree retaining means 401 retains code trees in each of which an escape code that is defined as data representing that data is not entered is entered in advance, the context tree retaining means 402 retains a code tree in which a combination of decoded data and a context is stored, and the code tree determining means 403 determines a code tree from the data that has been decoded up to immediately before.

The decoding means 404 decodes a code by scanning a path from a root that signifies a top of the code tree to a leaf that is a data storing point according to the code, the context altering means 405 alters the context if the reached leaf is an escape code, the code updating means 406 exchanges leaves of the decoded data and the escape code with another leaves or an internal node that is a bifurcating point, and the branching position retaining means 409 retains a position of a leaf having been newly entered in the code tree.

Further, the code entering means 410 branches a leaf in a position retained in the branching position retaining means 409 after the escape code has been encoded to newly enter the data therein, and the context tree entering means 408 enters the data having been entered by the code entering means 410 in the context tree retained by the context tree retaining means 402.

According to the above data decompressing apparatus of this invention, new entry of data is performed on a leaf in which data has been entered last, and the data stored in the leaf that has been entered last may be approximated to data having a relatively long code length. It is thus possible to minimize a decrease in efficiency of encoding due to an increase of a code length of rarely used data by 1 bit so that a processing rate in the data decompression may be largely increased, and a performance of the data restoring apparatus may also be improved noticeably.

(b) Description of First Embodiment of the Invention

Figure 15:
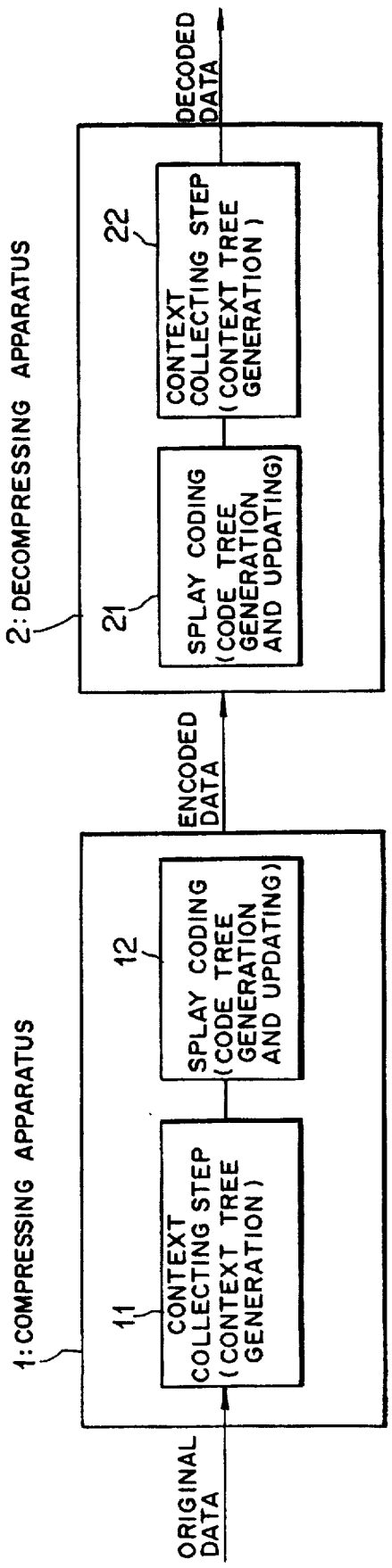
FIG. 15 is a block diagram of a data compressing apparatus and a data decompressing apparatus according to a first embodiment of this invention.

FIG. 15 is a block diagram of a data compressing apparatus and a data decompressing apparatus according to a first embodiment of this invention. In FIG. 15, reference numeral 1 denotes the data compressing apparatus encoding an inputted character according to a history of occurrence of it in the past to compress it, 2 denotes the data decompressing apparatus decompressing the character having been encoded in the data compressing apparatus 1.

The data compressing apparatus takes a context collecting step 11 to collect contexts of inputted character string data to generate a context tree, and a splay coding step 12 to generate and update a code tree in splay operation according to the character strings of the input data obtained in the context collecting step 11.

On the other hand, the data decompressing apparatus 2 takes a splay coding step 21 to generate and update a code tree in the splay operation according to the character strings of the decompressed data having been encoded in the data compression apparatus 1, and a context collecting step 22 to collect character strings as the decompressed data.

Hereinafter, the data compressing apparatus will be referred as an encoder and the data decompressing apparatus as a decoder.

(1) Description of Encoder

FIGS. 16(*a*) and 16(*b*) depicts an example of a context tree generated in the context collecting step 11. FIG. 16(*a*) shows an example in which character strings are stored in a storage in the form of a list in order to search the context tree within a short period of time in a Hashing Method. FIG. 16(*b*) shows a dictionary (list) in a tree structure in which the character strings are stored as in a relationship of parentage.

Figures 16A, 16B:
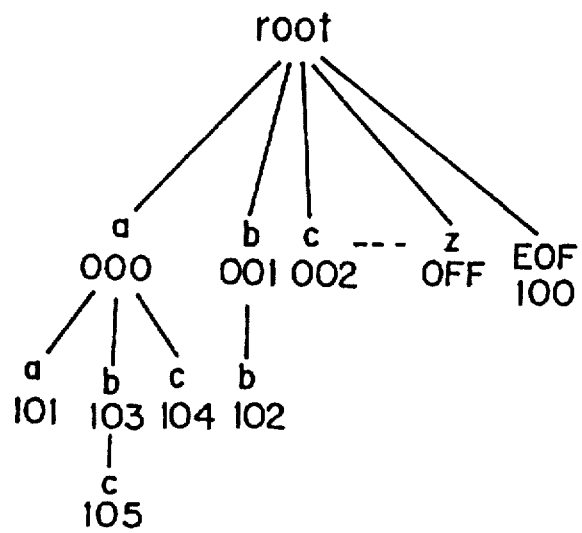
FIG. 16(a) shows an example of a storing form of a context tree.
FIG. 16(b) shows a parental relationship of a dictionary.

Address shown in FIG. 16(a) is expressed in a hexadecimal notation. In the example shown in FIG. 16(a), the maximum size of the context tree is 4K nodes (4KW).

As this, if all characters are entered in advance, a position of a brother node in the first level connecting to the root is known previously so that a direct access is capable without an operation on the list in the search.

In the second level and below, there are stored addresses of child nodes and right brother nodes. In a search, a character string is accessed by operating the list while being collated stored characters in the form of a list until the character string coincides with the stored characters.

When the context tree is initialized, the addresses are set to up to 100. At this time, End of File code (EOF) is entered in an address 100 in the first level, and a storage below an address 101 are served for new entry.

Figure 17:
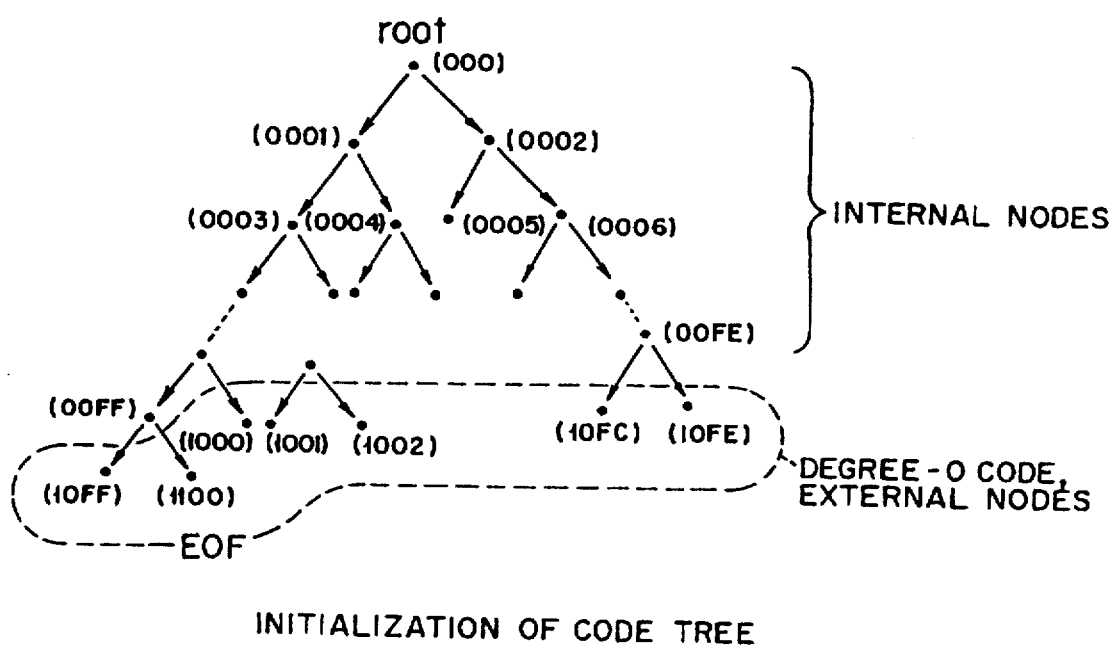
FIG. 17 depicts an initial state of a code tree.

FIG. 17 shows an example of a code tree generated at the splay coding step 12 above-mentioned.

The code tree is set at the initialization, as shown in FIG. 17, basically in the same manner as in the splay-tree coding.

If the maximum size of the code tree is up to 4K nodes (4KW) correspondingly to FIG. 16(B), the nodes in the code tree are classified into two types, an interior node (with a child node) and an exterior node (an end of each code without a leaf or child node).

Figure 18:
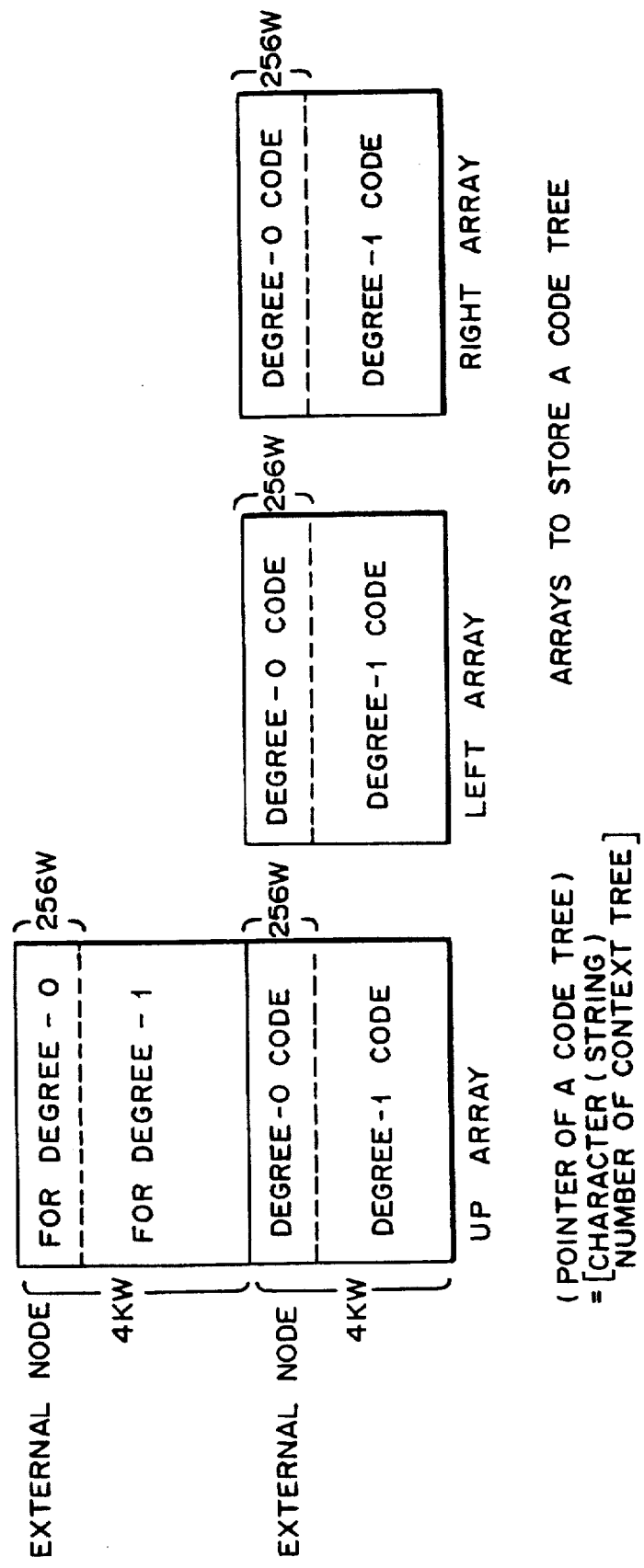
FIG. 18 shows an example of arrangement to store a code tree.

In the splay coding, there are used three arrays, that is, Up, Left and Right, in order to access to the code tree, as shown in FIG. 18.

In the Up array, an address from each node to its parent node is stored. In the Left array, an address from each node to its left child node is stored. In the Right array, addresses from each node to the right child node.

In the Up array, interior nodes are stored in the leading 4 KW [address (hexadecimal) 000-FFF], and exterior nodes are stored in the remaining 4 KW [address (hexadecimal) 1000-1FFF].

As in the above fashion, it is possible to correspond a code for each node in the context tree with an address of the code tree; a node pointer (number) of a context tree+4K.

Incidentally, the Up array has a 13 bit width, the Left and Right arrays each has a 12 bit width.

Basic operation of the code tree having the above structure at the time of updating will be next described by reference to FIGS. 19(a) and 19(b).

FIG. 19(a) depicts a basic operation of the splay code at the time of updating. As shown in FIG. 19(a), when a character A is accessed, a node A is exchanged with a node C on a branch which is in opposite to and two stage above a branch to which the node A attaches.

If a character C among characters A through E is accessed, the code tree is reshaped as, for example, shown in FIG. 19(b).

Namely, the above-mentioned basic operation is repeated twice to update the code tree.

The basic operation in the second time is to update a length of the parent node of the node which has been updated in the first time.

As above, if a depth of the code tree becomes deeper, repetition of the above basic operation allows a distance from the root to the accessed node C (code 0110) to be reduced to a half (code 10). This dynamic recombination of the code tree from the root to the accessed node allows the code table to be adaptable to input data.

In other words, the code updating of the splay codes is as the Move-To-Front operation in the linear list is performed in a Binary-Tree.

A process for generating a context tree at the context collecting step 11 and process for generating and updating the code tree at the splay-coding step 12 as above will be next described in more detail by reference to Steps E1 through E31 in a flowchart shown in FIG. 20. Here, an input character is designated as K (K is an arbitrary character) and a character inputted immediately before the input of the character K is designated as P (P is an arbitrary character).

A context tree, a code tree and the immediately preceding character P are initialized (Step E1).

A check is made on whether all characters having been inputted are encoded or not (Step E2). If any input character is left unencoded, a length L of a character string is set to zero (Step E3), and the character K is inputted (Step E4).

Then, a check is made on whether the immediately preceding character P on the context tree has a child node therebelow (Step E5). If the character P does not have a child node, a degree-0 code of the input character K is outputted (Step E6), and the input character K is entered in the context tree as a child node below the immediately preceding character P (Step E7).

On the side of the code tree, a node used to enter the character K and an escape code is generated below the immediately preceding character P, the character K is then entered (Step E8). An example of an algorithm to generate a node is shown in FIG. 30.

The immediately preceding character is altered to the input character K (Step E16). A check is made on whether a length L' of the immediately preceding character string is equal to a maximum length Lmax of the character string or not (Step E24).

If the length L' of the immediately preceding character string is not equal to the character string maximum length Lmax, a check is made on whether the immediately preceding character string has been encoded with the degree-1 code and outputted or not (Step E25).

If the immediately preceding character string has not been encoded with the primary code, a length L of a focused character string is shifted to the length L' of the immediately preceding character string (Step E28). A check is made on whether the character K has been encoded or not (Step E9). If the character K has been encoded, the above process from Step E2 is repeated (YES route at Step E9). If the character K has not been encoded, the above process from Step E3 is repeated (NO route at Step E9).

If a character stored in the child node is in coincidence with the input character K at the above-mentioned Step E10, a length of the character string is increased by 1 (Step E17). A check is made on whether a length of this character string is equal to the maximum code length Lmax set in advance or not (Step E18).

If not equal, a check is made on whether all the characters of the input data have been encoded or not (Step E19). If there remains any character that has not been encoded, the input characters up to now are shifted to the immediately preceding character P (Step E20), and a character K is further inputted (Step E21). The procedure then goes back to the process at the above-mentioned Step E10, where a check is made on whether a character stored in the child node is in coincidence with the character K or not.

If not in coincidence, a check is made on whether a length of the character string is 0 or not (Step E11). If the length L is equal to 1 or more, in other words, the immediately preceding character P has a child node but the corresponding character K is not yet attached, an escape code below the immediately preceding character P is outputted and a degree-0 code of the character K is outputted (Step E12).

Further, the character K is entered as a brother node of the child node below the immediately preceding character P on the code tree (Step E13). The escape code below the immediately preceding character P on the code tree is divided into an escape code and a code of the character K, and the code of the character K is added (Step E14). Code lengths of the escape code and the degree-0 code K on the code tree are updated as splay codes (Step E15).

As above, it is possible to enter an elongated character string of an encoded character string until the elongated character string reaches a predetermined maximum character string length.

Thereafter, via the above-mentioned Steps E16 and E24, check is again made on whether the immediately preceding character string is outputted as a degree-1 code or not (Step E25).

More specifically, if the immediately preceding character string is encoded as a degree-1 the primary code and outputted, an elongated character string that is the immediately preceding character string attached a leading character of the elongated character (string) thereto is entered in the context tree (Step E26). A code of the elongated character string having been encoded is entered in the code tree (Step E27). Then, the process from the Step E28 is repeated.

The above manner to enter the code is such conducted as to branch the code of the immediately preceding character and add the degree-1 code of the character string added the character K thereto. In the branching of the character string, the escape code is branched as being regarded as a code of the encoded character string to generate a code of the original character string and a code of the character string attached the character K thereto.

As above, the immediately preceding character having been encoded is first entered as a dictionary entered character string, and a character string following this immediately preceding character is then encoded.

If the length L of the character string is equal to the maximum code length Lmax set in advance at the above Step E18, or if the length L of the character string is equal to 0 at Step E11, a degree-1 code corresponding to a reference number of a character (string) of the context tree is outputted (Step E22). A code length of the degree-1 code outputted from the code tree is updated as a splay code (Step E23), thereafter the process from the above-mentioned Step E24 is performed.

The above closed loop process is to elongate the number of entered characters (a length of a character string) if a combination of the immediately preceding character P and the input character K has been entered in the context tree so as to enter it by a unit of a character string.

If all the input characters have been encoded at the above-mentioned Step E2, a check is made on whether the immediately preceding character P on the context tree has a child node therebelow or not (Step E29). If the immediately preceding character P has a child node, an escape code below the immediately preceding character P is outputted (from NO route at Step E29 to Step E30). Then, a degree-0 code of an EOF representing End Of File is outputted (Step E31), then the process is terminated (from NO route at Step E29 to Step E31).

If the immediately preceding character P does not have a child node, a degree-1 code of EOF is outputted, and the process is terminated.

In the data compressing method for encoding a character string as input data according to a history of its occurrence in the past to compress it, character strings of input data are given respective numbers and entered in the dictionary, while the splay codes are encoded and updated correspondingly to each of the character strings in the above process.

The updating and generating the context tree and the code tree will be next described in more detail by reference to FIGS. 21 through 28, by way of example where the above input character K is limited to any of alphabets a, b and c, and characters "abc, abc, ab and b" are successively inputted.

Figure 21A:
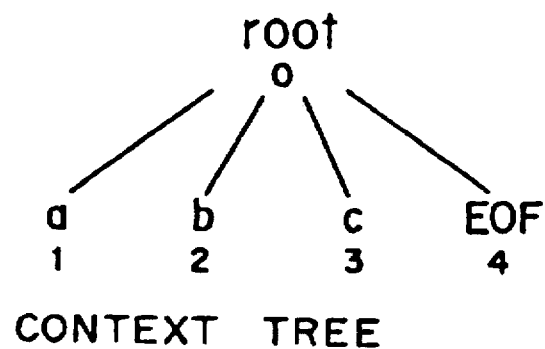
FIGS. 21(a) and 21(b) depict procedures for updating a context tree and a code tree, respectively, according to the first embodiment of this invention.
Figure 21B:
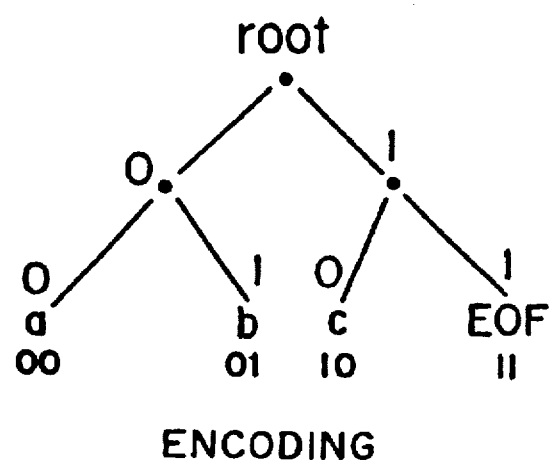

As shown in FIGS. 21(a) and 21(b), characters a, b and c, and an end code EOF which is outputted after all input data have been encoded are in advance given respective numbers and entered as $a_1$, $b_2$, $c_3$, $EOF_4$ in both the context tree and the code tree.

By initializing the context tree as above, any of the characters a, b and c which have been entered in the first place becomes an immediately preceding character. If there is no context following the immediately character, the immediately character also serves as an independent sole reference number. In the following description, the character c is assumed to be a first immediately preceding character.

As shown in FIG. 21(b), the code tree is a binary tree where a code "0" is assigned to the entered character when a path goes down leftward at the node from the root to a node, while "1" is assigned to the entered character when the path goes down rightward at the node from the root to a node. At the time of encoding, a path of the reference number of a corresponding character from the node to the root is stacked, the path is reversed, and a code "0" or "1" is assigned depending on whether the path descends to the left or to the right, whereby a code word corresponding to the reference number of that character may be obtained.

As degree-0 codes of the characters, $a_1$, $b_2$, $c_3$ and $EOF_4$, become "00, 01, 10, and 11", respectively.

When a character string "abc" is inputted in a state shown in FIGS. 21(a) and 21(b), a new node is generated below "c" ($c_3$) on the context tree since the character c ($c_3$) having been entered is assumed to be an immediately preceding character, and the first character "$a_5$" of the character string "abc" and an escape code ($ESC_5$) representing no entry of the character "$a_5$" are entered.

Figure 22A:
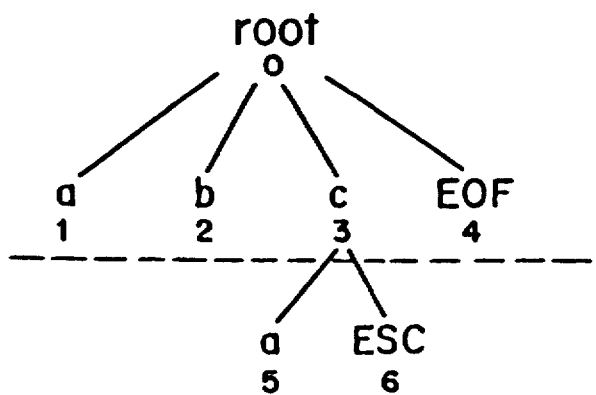
FIGS. 22(a) and 22(b) depict procedures for updating the context tree and the code tree, respectively, according to the first embodiment of this invention.
Figure 22B:
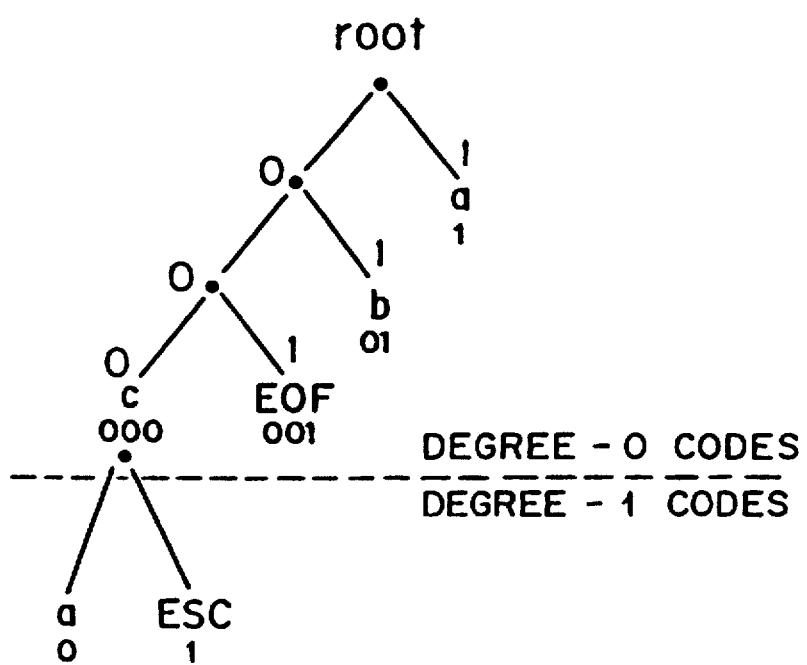

On a side of the code tree, since "a" has been entered in the code tree as shown in FIG. 22(b), a node in which "a" has been entered is exchanged with a higher degree node of "c" which is the immediately preceding character, "a" and an escape code (ESC) are entered with this "c" regarded as a new root (degree-1 encoding).

Figure 23A:
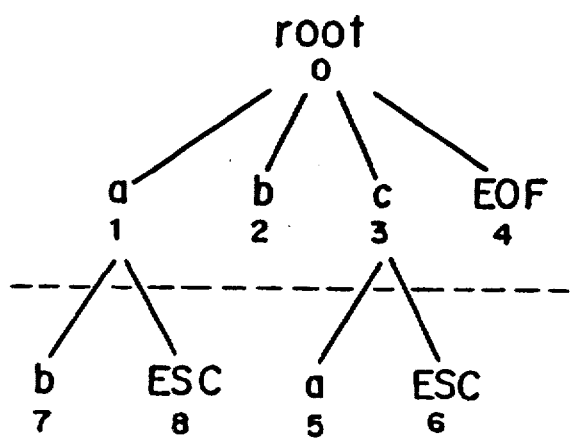
FIGS. 23(a) and 23(b) depict procedures for updating the context tree and the code tree, respectively, according to the first embodiment of this invention.
Figure 23B:
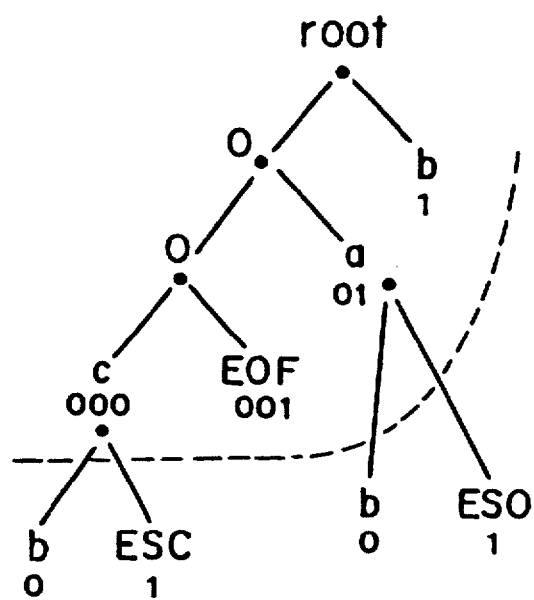
Figure 24A:
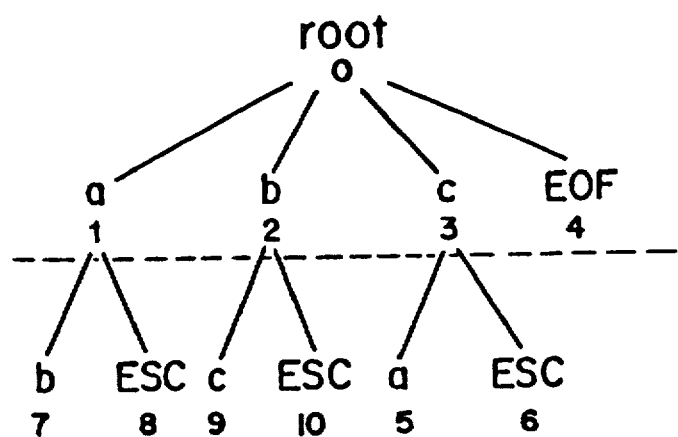
FIGS. 24(a) and 24(b) depict procedures for updating the context tree and the code tree, respectively, according to the first embodiment of this invention.
Figure 24B:
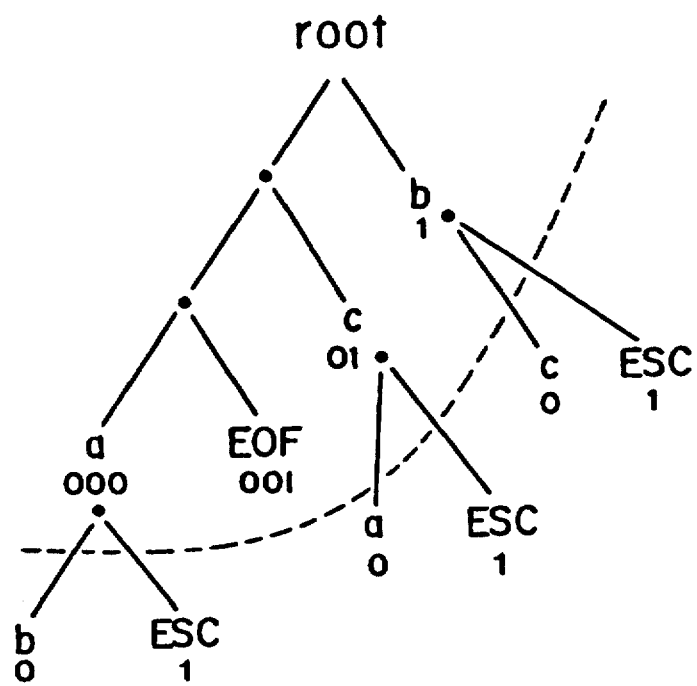

The above process is performed on the characters "b" and "c" in the character string "abc". Thereby, the context tree and the code tree when "b" is inputted become as shown in FIGS. 23(a) and 23(b), respectively. When "c" is next inputted, the context tree and the code tree become as shown in FIGS. 24(a) and 24(b), respectively.

Figure 20:
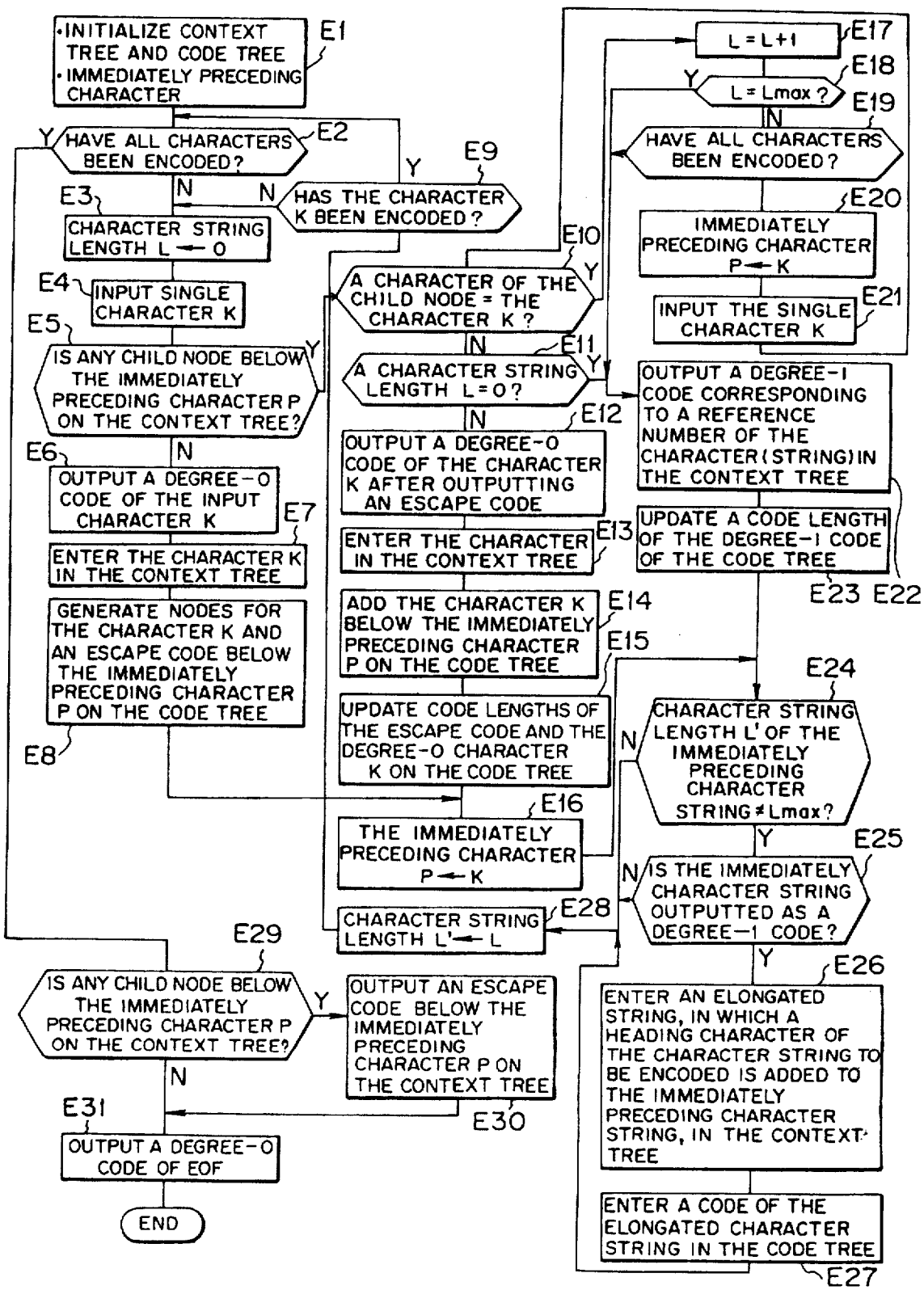
FIG. 20 is a flowchart illustrating a procedure of encoding according to the first embodiment of this invention.

This process corresponds to the above-mentioned closed loop process performed via the YES route at the Step E5, the NO route at Step E10 and the NO route at Step E25 shown in FIG. 20.

Namely, if there exists no child node below an immediately preceding character on the context tree, a nodes used to enter an input character and an escape code therein are newly generated below the immediately preceding character to enter them therein.

On the code tree, if the same character as a character having been entered in the past is again inputted, a node in which the character having been enter in the past is exchanged with a higher degree node of a node in which an immediately preceding character of the inputted character is entered, the node in which the character has been entered in the past is shifted to the higher degree, thereby decreasing a distance from the root to the node of that character to a half so as to shorten a code length.

When a character string "abc" is inputted successively, only a character "a" in the character string "abc" is tried to be entered below "$c_0$" that is the last character "c" in the character string "abc" having been inputted in the first place and is considered to be an immediately preceding character. However, "$a_5$" has been already entered below "$c_3$" in the code tree as shown in FIG. 24(a), so that a character to be entered is elongated from one character "a" to two characters "ab", and "$b_{11}$" is entered below "$a_5$" as shown in FIG. 25(a).

At this time, an escape code (ESC) stored below "c" along with "a" is branched to generate a new node, in which the entered "ab" obtained by elongating is entered in the context tree.

Figure 25A:
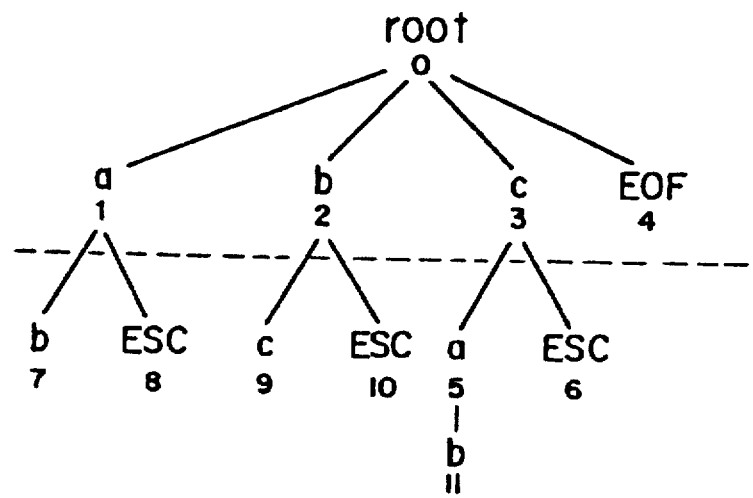
FIGS. 25(a) and 25(b) depict procedures for updating the context tree and the code tree, respectively, according to the first embodiment of this invention.
Figure 25B:
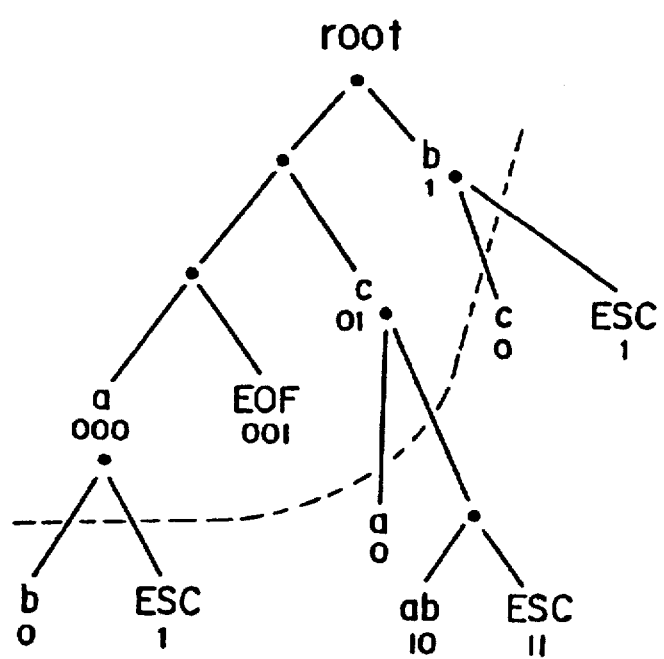
Figure 26A:
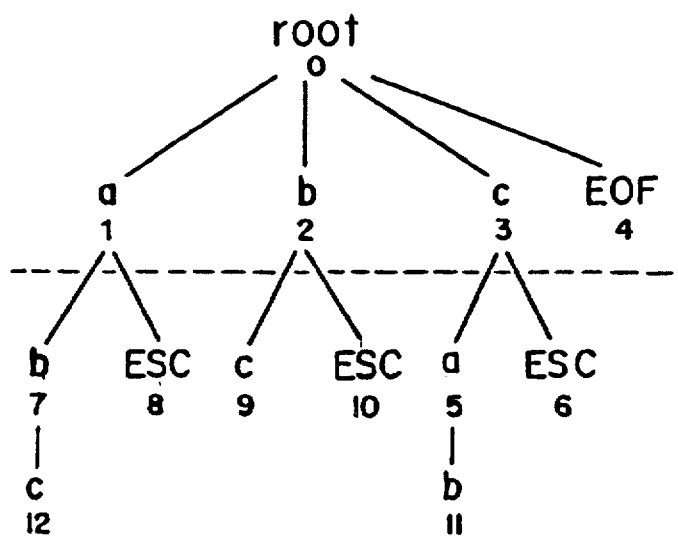
FIGS. 26(a) and 26(b) depict procedures for updating the context tree and the code tree, respectively, according to the first embodiment of this invention.

Successively, if "b" of the character string "abc" is tried to be entered in the context tree, a character to be entered is elongated from one character "b" to two characters "bc", "$c_{12}$" is then entered below "$b_7$" as shown in FIG. 26(a), since "$b_{11}$" has been already entered below "$a_5$" as shown in FIG. 25(a).

Figure 26B:
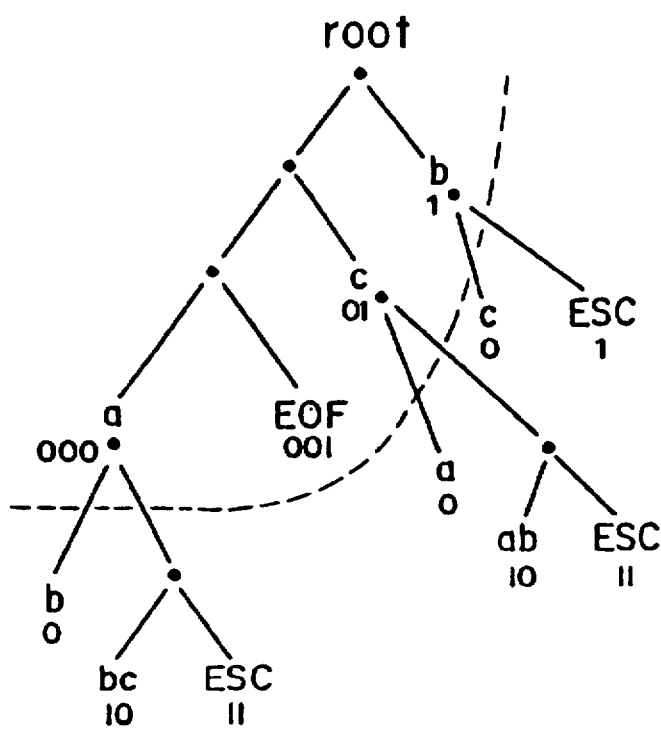

At this time, on the code tree, a node of an escape code (ESC) stored below "a" along with "b" is branched to generate a new node, and the "bc" entered by elongating by one character on the context tree is entered therein, as shown in FIG. 26(b).

If the last character "c" of the next character string "abc" is entered, the above process is performed. A resulting states of the context tree and the code tree are shown in FIGS. 27(a) and 27(b), respectively (up to this point, "abc abc" have been inputted).

If a character string "ab" is further entered, on the context tree, one character "a" is tried to be entered below an immediately preceding character "$c_{12}$". However, "$a_{13}$" is already stored below "$c_0$" as stated above, so the number of characters to be entered is increased by one to yield "ab", "b" is then tried to be entered below "$a_{13}$".

Figure 27A:
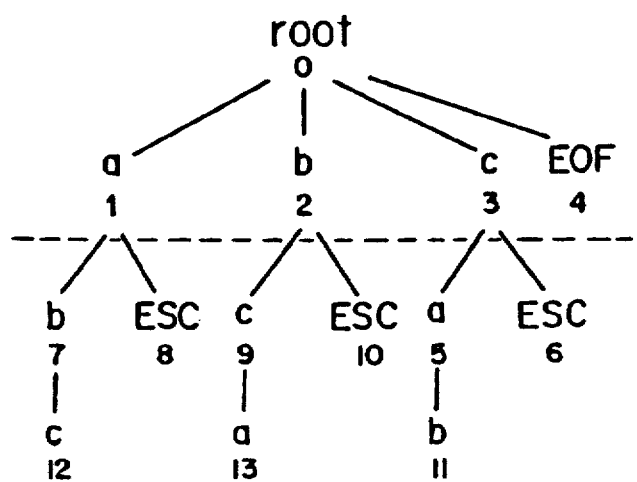
FIGS. 27(a) and 27(b) depict procedures for updating the context tree and the code tree, respectively, according to the first embodiment of this invention.
Figure 27B:
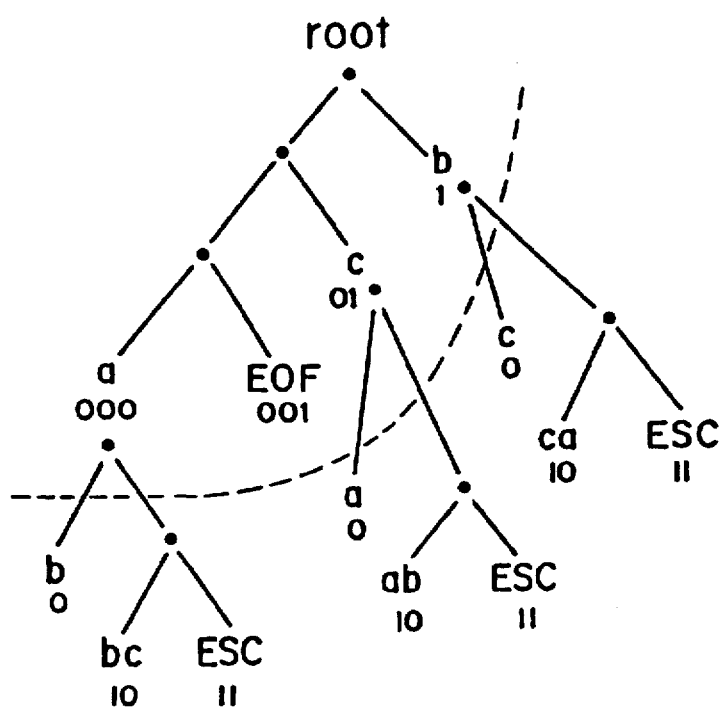
Figure 28B:
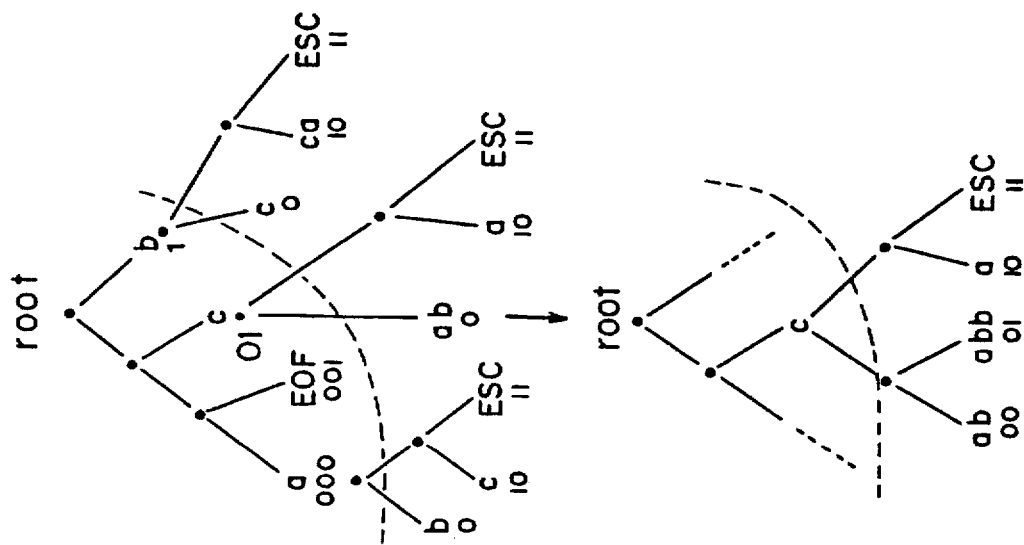
FIGS. 28(a) and 28(b) depict procedures for updating the context tree and the code tree, respectively, according to the first embodiment of this invention.
Figure 28A:
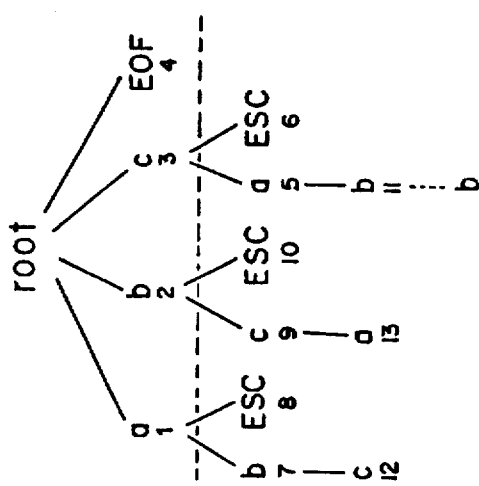

However, "$b_{11}$" is already stored below "$a_5$" as shown in FIG. 27(a), so the number of characters to be entered is increased by one to yield "abb", "b" is then entered below "$b_{11}$".

At this time, on the code tree, a node in which "ab" is stored is branched so as to enter "abb" therein.

The above process corresponds to the above-mentioned closed loop process performed via the YES route at Step E5, the YES route at Step E10 and the NO route at Step E25.

Namely, if, when a character string is inputted, a combination of an immediately preceding character and one character in the character string has already stored in the context tree, the number of characters to be entered is increased by one, and one character that has not been entered is entered.

At this time, on the code tree, a node of an escape code (ESC) that has been stored along with the immediately preceding character is branched to generated a new node, and this character string is entered therein.

As above, an input of character "abc abc ab b" is completed, a code assigned to each of the characters is as shown in FIG. 29.

As shown in FIG. 29, the characters "abc" that has been inputted in the first place are encoded one character by one character codes corresponding to which are "00", "01" and "10" each of two bits, respectively.

Code words corresponding to a character string "abc" that has been inputted secondary are "0", "0" and "0" each of one bit, respectively, because of relationships with the respective immediate preceding characters.

A code is further assigned to a character string of two characters "ab" that has been next inputted. As shown in FIG. 30, a character string made up of two characters is expressed with a code word of only two bits.

A character "b" that has been inputted last is a case where there is no character corresponding to a connection of the existing immediately preceding characters. The character "b" is thus expressed with a combination of three bits of an ESC and a code word of one sole character.

According to the data compressing method of this invention, a character (string) to be compressed is entered with a number given thereto in the context tree in a tree structure, a code tree corresponding to the context tree is generated and updated while splay coding is performed. It is therefore possible to perform a process in two stages, that is, a stage to construct a probability model to determine a frequency of occurrence of an occurring character and a stage to assign a code to each character, so that a processing rate in the data compression may be largely increased.

The above probability mode is constructed by generating and updating nodes of the code tree (splay process) every time a character is inputted. This manner may reduce a burden of an enormous volume of arithmetic calculation to reconstruct a probability mode that has already been constructed every time a character is inputted, increasing a processing rate in the data compression.

In the data compression method of this invention, whenever the same character as a character that has been compresses (encoded) in the past occurs, a node of the code tree of the same character that has been entered in the past is exchanged with a node in a higher degree (in the splay process) so as to decrease a length of the code to a half. It is therefore possible to express a code of that character (string) with the fewer number of bits as the frequency of occurrence of the same character (string) increases so that an effect of the compression may be largely improved.

In the data compression method of this invention, a character is not encoded character by character as in the case where the above-mentioned character string "ab" is encoded, but the character is encoded as a character string in a unit of a plurality of characters, thereby increasing a processing rate in the variable-length coding. According to this invention, a unit to be encoded is a character string so that information source may be expanded and an encoding efficiency in the splay coding may be largely improved.

(2) Description of Decoder

Figure 31:
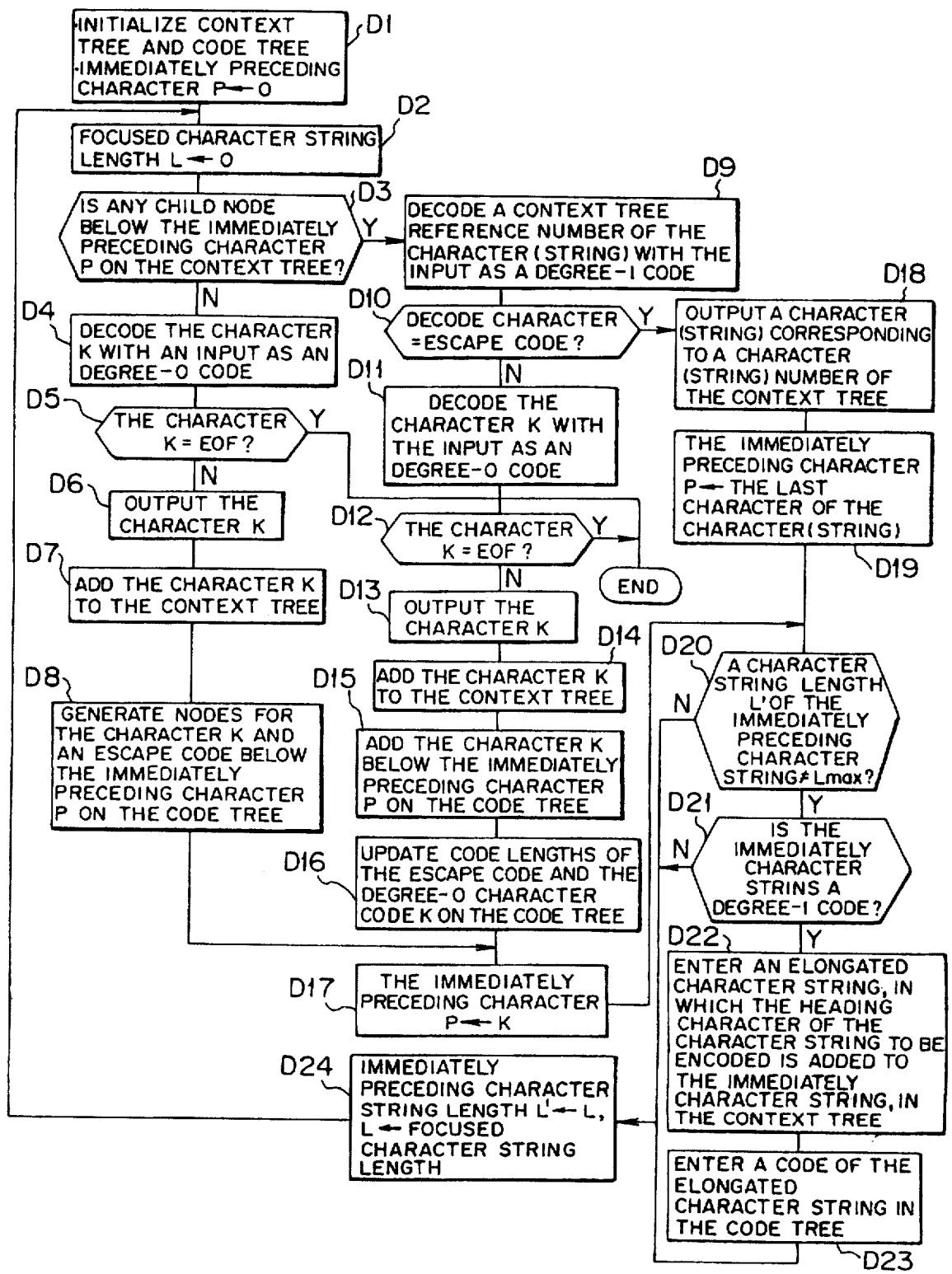
FIG. 31 is a flowchart for illustrating a procedure for decoding according to the first embodiment of this invention.

Next description will be of a process to decompress data in the context collecting step 21 and the splay encoding step 22 in the above-mentioned data decompressing apparatus 2 shown in FIG. 17, into which encoded (compressed) data are inputted as input codes, by reference to Steps D1 through D24 in a flowchart in FIG. 31.

This data decompression is basically a reverse of the encoding process having been described in terms of the encoder.

More specifically, a context tree and a code tree are initialized, and an immediately preceding character P is initialized to be set to "0" (Step D1). A length of string L is set to "0" (Step D2). A check is made on whether there is a child node below the immediately preceding character on the context tree (Step D3).

If there is no child node, a character "K" is decoded with an input code being a null code (from NO route at Step D3 to Step D4). A check is made on whether the encoded character "K" is an EOF code or not (Step D5).

If the encoded character "K" is not an EOF code, the procedure proceeds along the NO route, the encoded character "K" is outputted (Step D6), and the character is entered in the context tree (Step D7). The Step D7 is conducted in the same manner as the Step E7 in the encoding process having been described hereinbefore by reference to FIG. 17.

As same as at the Step E8 in the encoding process, nodes for the character "K" and an escape code are generated below the immediately preceding character "P" on the code tree (Step D8), and the immediately preceding character "P" is entered to the character "K" (Step D17).

The following Steps D20 through D23 are conducted in the same manner as at the Steps E20 through E23 in the encoding process. A length L' of the immediately preceding character string is replaced with a length L of a focused character string (Step D24), the the procedure goes back to the above Step D2.

At Step D3, if there is a child node below the immediately preceding character "P" on the context tree, an inputted code is encoded as being regarded as a degree-1 code from the code tree to obtain a reference number of a character (string) on the context tree (from YES route at Step D3 to Step D9).

A check is made on whether the encoded reference number is an escape code or not (Step D10). If not an escape code, the procedure takes the NO route, the next code is encoded as the input character is regarded as a degree-0 code to obtain a character "K" (from NO route at Step D10 to Step D11).

As same as at the above Step D5, a check is made on whether the decoded character "K" is an EOF code or not (Step D12). If the decoded character "K" is not an EOF code, the procedure takes the NO route and a character "K" is outputted (Step D13).

As same as at the Steps E13 through E15 in the coding process, the character "K" is entered in the context tree (Step D14). The character "K" is added below the immediately preceding character "P" (Step D15). An escape code and a code length of the degree-0 code "K" of the code tree are updated as splay codes (Step D16).

Thereafter, a process from Step D17 is performed.

As above, a splay code is assigned to every one character. If a splay code of a character whose character string following an immediately preceding character string is not included in character strings having been collected in the dictionary, the code is allowed to be updated and the encoded character following the above-mentioned immediately preceding character is allowed to be entered in the context tree.

At Step D10, if the encoded reference number is an escape code, the procedure takes the YES route to decompress a character string corresponding to the reference number on the context tree to output it (Step D18). The last letter in the character (string) is replaced with the immediately preceding character "P" (Step D19).

Thereafter, a process from the above Step D20 is performed.

As above, the immediately preceding character having been decoded may first entered in the dictionary as a character string to be entered in the dictionary, the character string following the immediately preceding character may be decoded.

At Step D4 or Step D12, if the decoded character is an EOF code, the procedure takes the YES route and terminates the decompressing process.

As stated above, character strings of decompressed data are collected in the context tree and entered with respective numbers. Along with this, a splay code is correlated to each of the decoded character strings, and a character string corresponding to a dictionary number is decoded and updated with a splay code. An elongated character string of an encoded character string is entered until it reaches a predetermined maximum length of a character string, and a splay code corresponding to this elongated character string is entered.

As above, the character "K" that has been compressed and encoded at the context collecting step 11 and the splay coding step 12 in the data compressing apparatus 1 is decompressed.

In the data decompressing method according to this invention, a decoded character (string) given a number thereto is entered in the context tree and a code tree that is a code table corresponding to the context tree is structured, whereby it is possible to perform a process of two stages, that is, a stage to search a code in coincidence with an encoded code in the code table, and a stage to output a character corresponding to a coinciding code as a decoded character. As this, the data restoring method of this invention is effective to increase a processing rate in the data decompression.

The above probability model is constructed by generating and updating nodes on the code tree (in the splay process) whenever a character is inputted. This manner may reduce a burden of an enormous volume of computation to reconstruct a code table that has been already constructed every time a character is inputted, more increasing a processing rate in the data decompression.

In the data decompressing method of this invention, every time the same code as a code that has been decoded in the past occurs, a node on the code tree in which the same code has been entered in the past is exchanged with a higher degree node (in the splay process) to decrease a code length to a half. As a result, it is possible to express a code with bits of the fewer number as the same code occurs more frequently. In the case where the same code is repeatedly encoded, a processing rate in the data decompression may be largely increased.

In the data decompressing method of this invention, a character is not decoded character by character, but decoded as a character string in a unit consisting of a plurality of characters. This manner may expand decompressible information source and improve largely an efficiency in the data decompression.

In this embodiment, the description has been made by way of an example where a character string following an immediately preceding character is collected as a context, and encoded and decoded. There is, however, no necessity to stick to the immediately preceding character, but it is possible to collect a context following previous two characters, and encode and decode it.

In this embodiment, description has been made by way of an example where the contexts are dynamically collected, and encoded and decoded in a splay process. However, this invention is not limited to the dynamic collection of the contexts, but it is also possible to use static contexts collected in advance from representative samples, and encode and decode them in the splay process.

In this embodiment, description has been made by way of an example where all inputted data are dynamically encoded in a variable-length coding (a splay coding). It is, however, possible to encode data of a considerable volume, then stop the updating operation of the splay coding and encode the data in a static variable-length coding. In which case, it is only necessary to make an arrangement between the decoder and encoder so that the decoder and encoder operate in synchronization with each other.

In this embodiment, description has been made by way of an example where data to be compressed are characters or character strings. The data compressing method and data decompressing method according to this invention is, however, applicable to all data such as image data, audio data, etc.

(c) Description of Second Embodiment

Next description will be of a second embodiment according to this invention.

Figure 32:
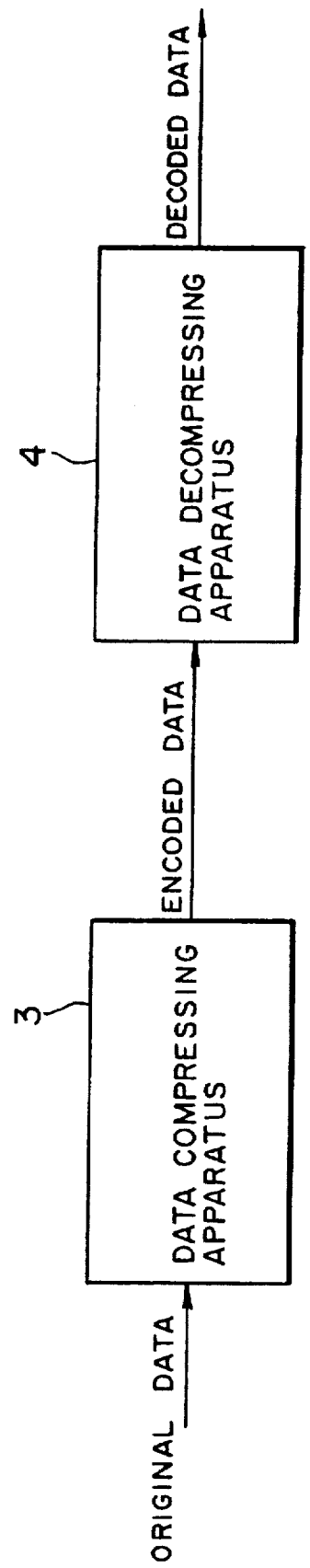
FIG. 32 is a block diagram of a data compressing apparatus and a data decompressing apparatus according to a second embodiment of this invention.

FIG. 32 is a block diagram of a data compressing apparatus and a data decompressing apparatus used to carry out a data compressing method and a data decompressing method according to a second embodiment of this invention. In FIG. 32, a data compressing apparatus 3 encodes input data according to a history of occurrence of the data in the past so as to compress it. A data decompressing apparatus 4 decodes codes which have been encoded by the data compressing apparatus 3.

Hereinafter, the data compressing apparatus 3 will be referred as an encoder, and the data decompressing apparatus 4 will be referred as a decoder. In the following description, a context tree and a code tree have the same function as those having been described in the first embodiment.

(1) Description of Encoder

Figure 33:
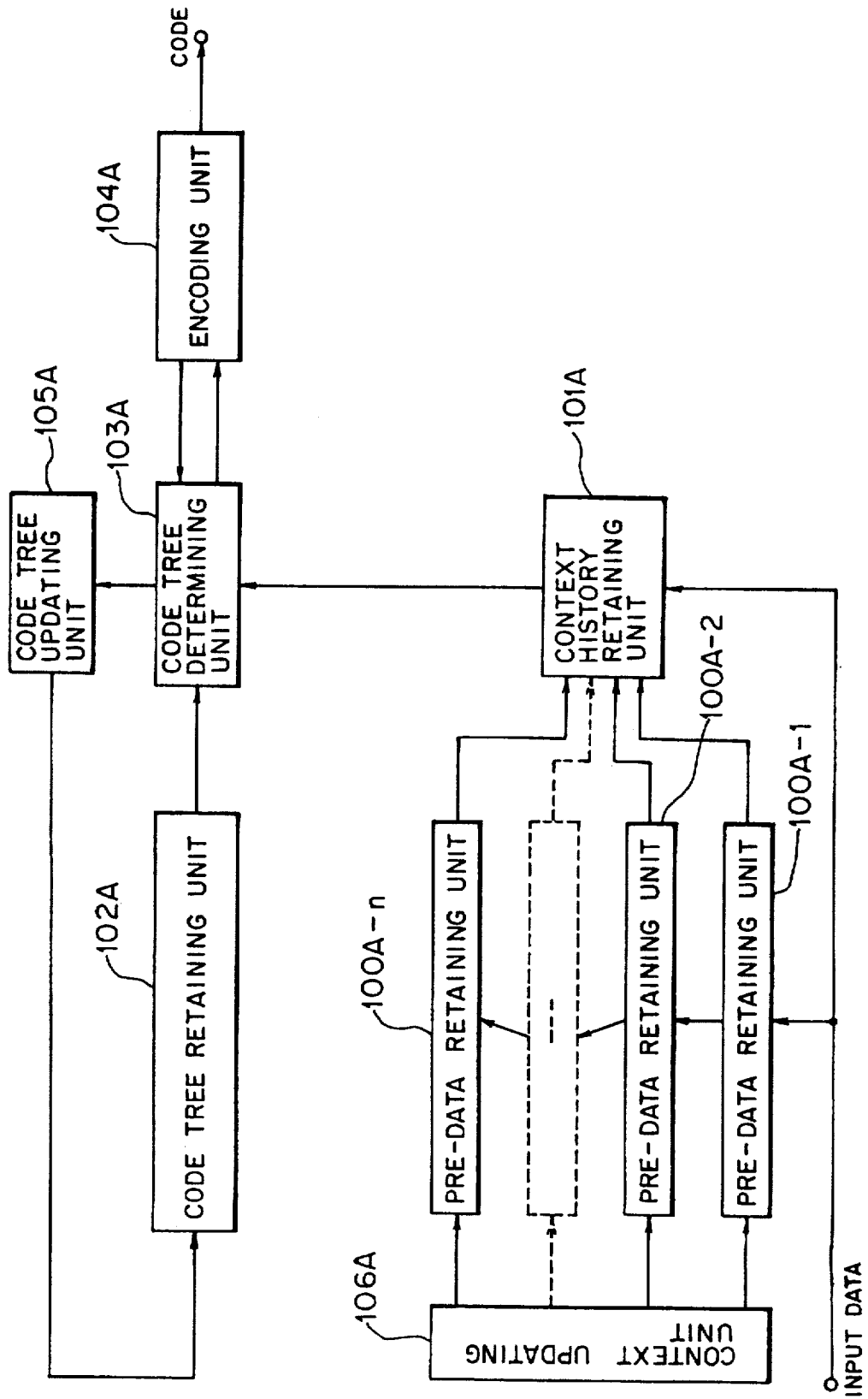
FIG. 33 is a block diagram of the data compressing apparatus according to the second embodiment of this invention.

FIG. 33 is a block diagram showing an internal structure of the above data compressing apparatus 3. As shown in FIG. 33, reference numerals 100A-1 through 100A-n (n is a natural number) denote pre-data retaining units, 101A denotes a context history retaining unit, 102A denotes a code tree retaining unit, 103A denotes a code tree determining unit, 104A denotes an encoding unit, 105A denotes a code tree updating unit and 106A denotes a context updating unit.

The pre-data retaining units (a pre-data retaining means) 100A-1 100A-n are to retain a context made up of data of the n number that have been inputted up to immediately before an input of data K (hereinafter, occasionally referred to as a symbol K).

The context history retaining unit (a history retaining means) 101A retains a combination of the inputted data K and a context. The code tree retaining unit (a code tree retaining means) 102A retains code trees each of which is independent for each context. The code tree determining unit (a code tree determining means) 103A determines a code tree from the data up to the input of the data K which is retained in the predata retaining units 100A-1~100A-n.

The encoding unit (a code outputting means) 104A encodes the data K, and outputs the encoded data K according to a bifurcation extending from a node which positions on a path from a root of a code tree (a top of the code tree) selected by the code tree determining unit 103A to a leaf of the same, in which the data K is stored.

The code tree updating unit (a code tree updating means) 105A exchanges an encoded leaf with another leaf or another internal node. The context updating unit (a pre-data updating means) 106A enters the data K in the pre-data retaining units 100A-1~100A-n.

Figure 34:
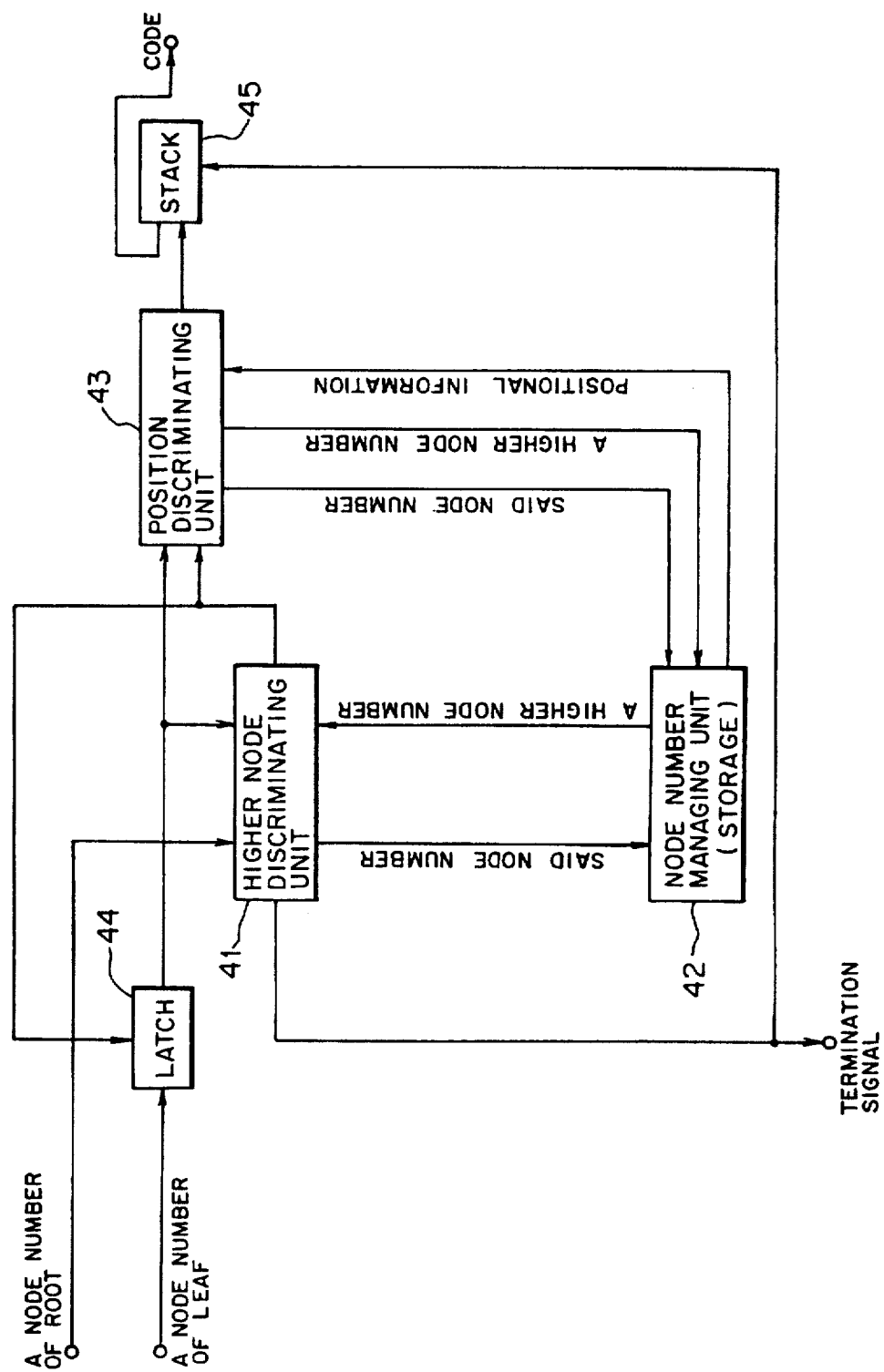
FIG. 34 is a block diagram of an encoding unit according to the second embodiment of this invention.

FIG. 34 is a block diagram showing an internal structure of the above-mentioned encoding unit 104A. As shown in FIG. 34, in order to output the encoded data K encoded according to a bifurcation extending from a node as stated above, the encoding unit 104A includes a higher degree node discriminating unit 41, a node number managing unit (storage) 42, a position discriminating unit 43, a latch 44 and a stack 45.

The higher node discriminating unit 41 obtains a node number of a higher degree node from a node number of a root of the code tree and a node number of a leaf of the context tree. The node number managing unit (storage) 42 manages node numbers of the context tree and the code tree.

The position discriminating unit 43 discriminates a state of bifurcation of a node.

The latch 44 is served to retain temporarily a node number of a leaf. The stack retains temporarily a code of the data K outputted from the position discriminating unit 43, and outputs successively codes retained therein when receiving an end signal.

In the above data compressing apparatus with the above structure shown in FIG. 33, the pre-data retaining units 100A-1~100A-n retain a context made up of input data of the n number that has been inputted up to the input of the data K. The context history retaining unit 101A retains a combination of input data and a context. The code tree retaining unit 102A retains a code trees each of which is independent for each context.

The code tree determining unit 103A determines a code tree of data from input data having been inputted up to an input of that data retained in the pre-data retaining units 100A-1~100A-n. The encoding unit 104A outputs a code (unique data) expressed with "0" or "1" according to a bifurcation extending from a node positioning on a path from a root (a top) of a code tree selected by the code tree determining unit 103A to a leaf of the same, in which the data K is stored.

The code tree updating unit 105A as a code tree updating means exchanges an encoded leaf with another leaf or another internal node. The pre-data updating unit 106A enters the data K in the pre-data retaining means 100A-1.

Figure 35:
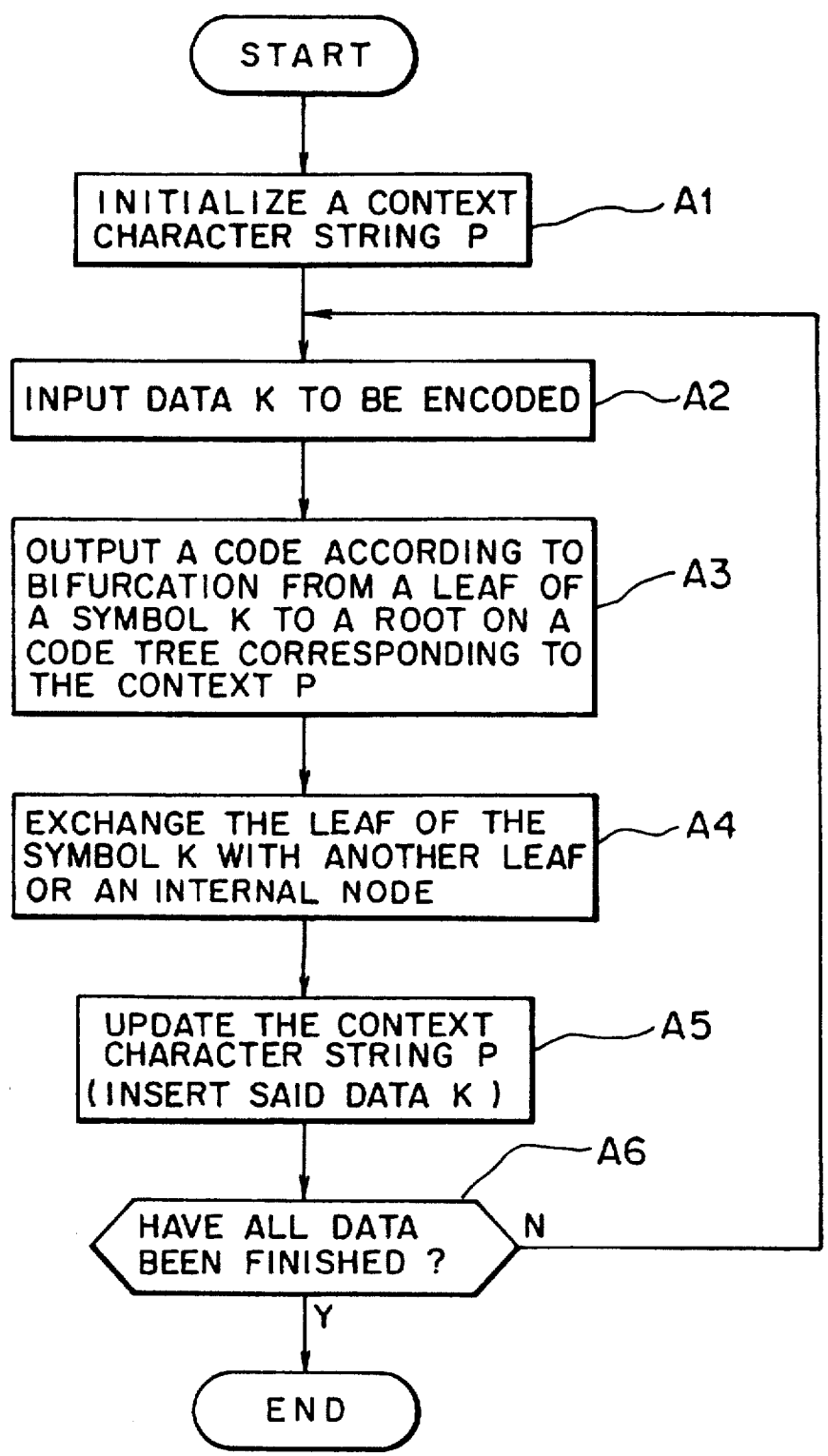
FIG. 35 is a flowchart illustrating a procedure for encoding according to the second embodiment of this invention.

The above operation will be described in more detail by reference to Steps A1 through A6 in a flowchart shown in FIG. 35.

To begin with, context character strings P retained in the pre-data retaining units 100A-1~100A-n is initialized (Step A1), the data K to be encoded is then inputted (Step A2).

The code tree determining unit 103A determines a code tree corresponding to a context P from the context history retaining unit 101A retaining a history of the context retained in the pre-data retaining units 100A-1~100A-n, and sends a node number (ID) of a leaf in which the data K is retained and a node number (ID) of a node of a root of the context P obtained from the determined code tree and information stored in the context history retaining unit 101A. The encoding unit 104A outputs a code according to bifurcation of a node extending from a leaf of a symbol K (the data K) to the root of the code tree corresponding to the context P (Step A3). Incidentally, a process performed by the encoding unit 104A will be later described in more detail by later reference to FIG. 36.

After the encoding in the encoding unit 104A, the code tree updating unit 105A exchanges a leaf of the event K on the code tree with another leaf or another node (Step A4), stores it back in the code tree retaining unit 102A, and thereby updates the code tree. A process performed by the code tree updating unit 105A will be later described in more detail by reference to FIG. 37.

The context updating unit 106A discards the oldest data (data retained in the pre-data retaining unit 100-n), enters the input data K as a context in the pre-data retaining unit 100A-1, thereby updating the context character string P (Step A5).

A check is made on whether the encoding of all the data is finished or not (Step A6). If not finished, a process from Step A2 is repeated. If finished, the encoding process is terminated (YES route at Step A6).

The order of the node recombining process (Step A4) and the context updating process (Step A5) is not limited to the above example. The context updating process (Step A5) may be performed ahead of the node recombining process (Step A4). It is alternatively possible to perform the above processes in parallel.

Figure 36:
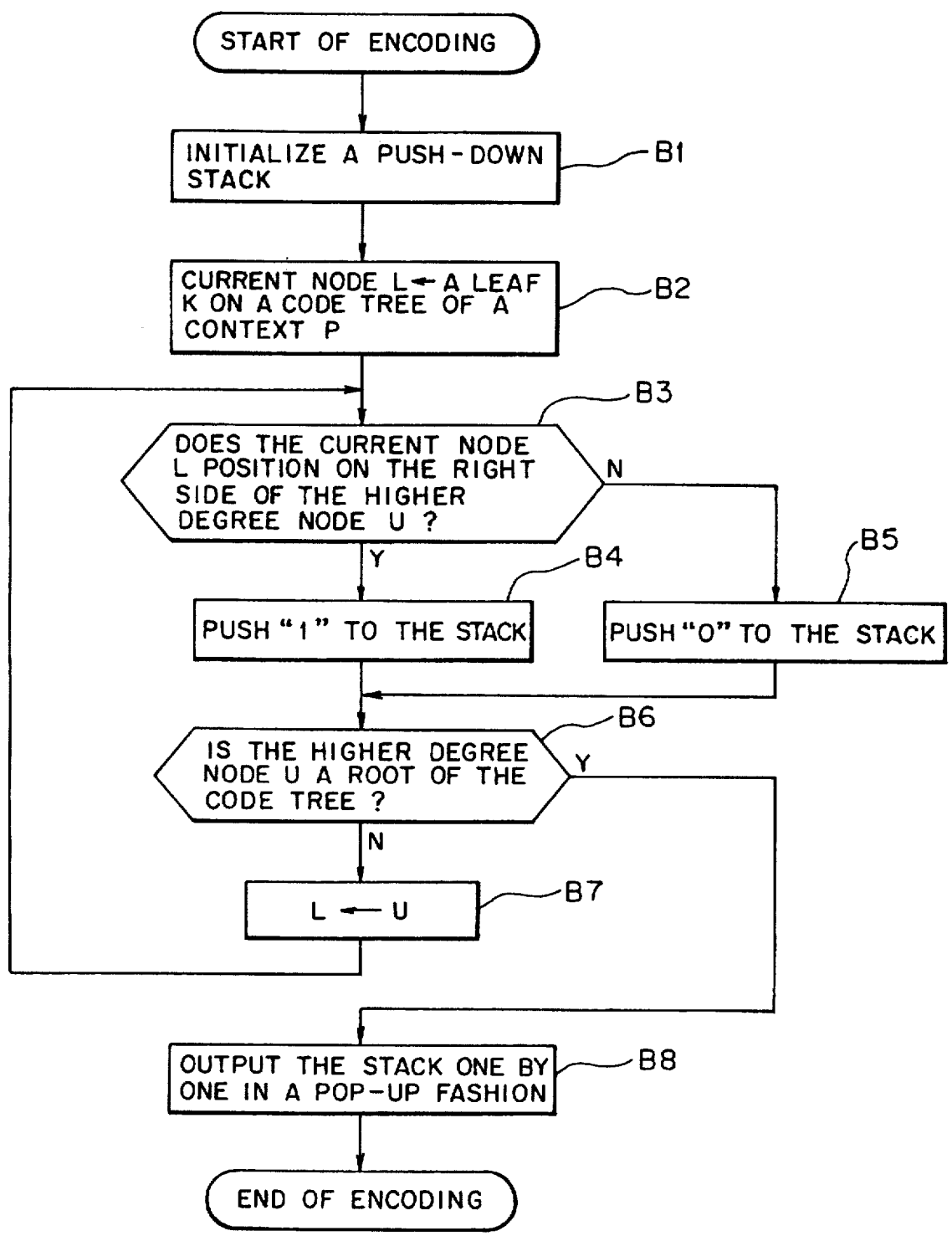
FIG. 36 is a flowchart illustrating a procedure for outputting a code according to the second embodiment of this invention.

As having been mentioned at Step A3, a process performed by the encoding unit 104A having the abovementioned structure shown in FIG. 34 will be next described by reference to Steps B1 through B8 in FIG. 36.

To begin with, the stack 45 (a push-down stack) is initialized (Step B1). An address pointer of a current node L is set to a leaf on the code tree of the context P in which the data K is stored (Step B2).

The node number (ID) of the leaf in which the data K is retained fed from the above-mentioned Step A3 is sent to the position discriminating unit 43 from the latch 44. The position discriminating unit 43 obtains, from the node number managing unit 42, information of on which side of a higher degree node the node of the received node number positions, and discriminates whether the node received from the information is on the right side of the higher degree node (Step B3).

If the received node is on the right side of the higher degree node, "1" is pushed (outputted) to the stack 45 (YES route at Step B3 to Step B4). If on the left side, "0" is pushed (outputted) to the stack 45 (NO route at Step B3 to Step B5).

A node number (ID), that is, another node number of the root of the context P fed from the above-mentioned step A3, is sent to the higher degree node discriminating unit 41. the higher degree node discriminating unit 41 discriminates whether the received node (or a leaf) is a root or not (Step B6).

If it is a root, the higher degree node discriminating unit 41 outputs an end signal (YES route at Step B6). If not a root, the higher degree node discriminating unit 41 accesses to the node number (ID) managing unit 42 to obtain a number of this node (or the leaf) or a higher degree node (U), and shift an address pointer to the higher degree node as regarding this node (U) as a new current node L. Then, the process from Step B3 is repeated (NO route at Step B6 to Step B7).

By repeating the process until the address pointer reaches the root, a path from the leaf to the root expressed with 11111 or "0" is stored in the stack 45.

This path is outputted reversely from a lower degree bit in a bit-by-bit manner (pop-up output) so that the path from the root to the leaf is outputted as a code (Step B8).

Figure 37:
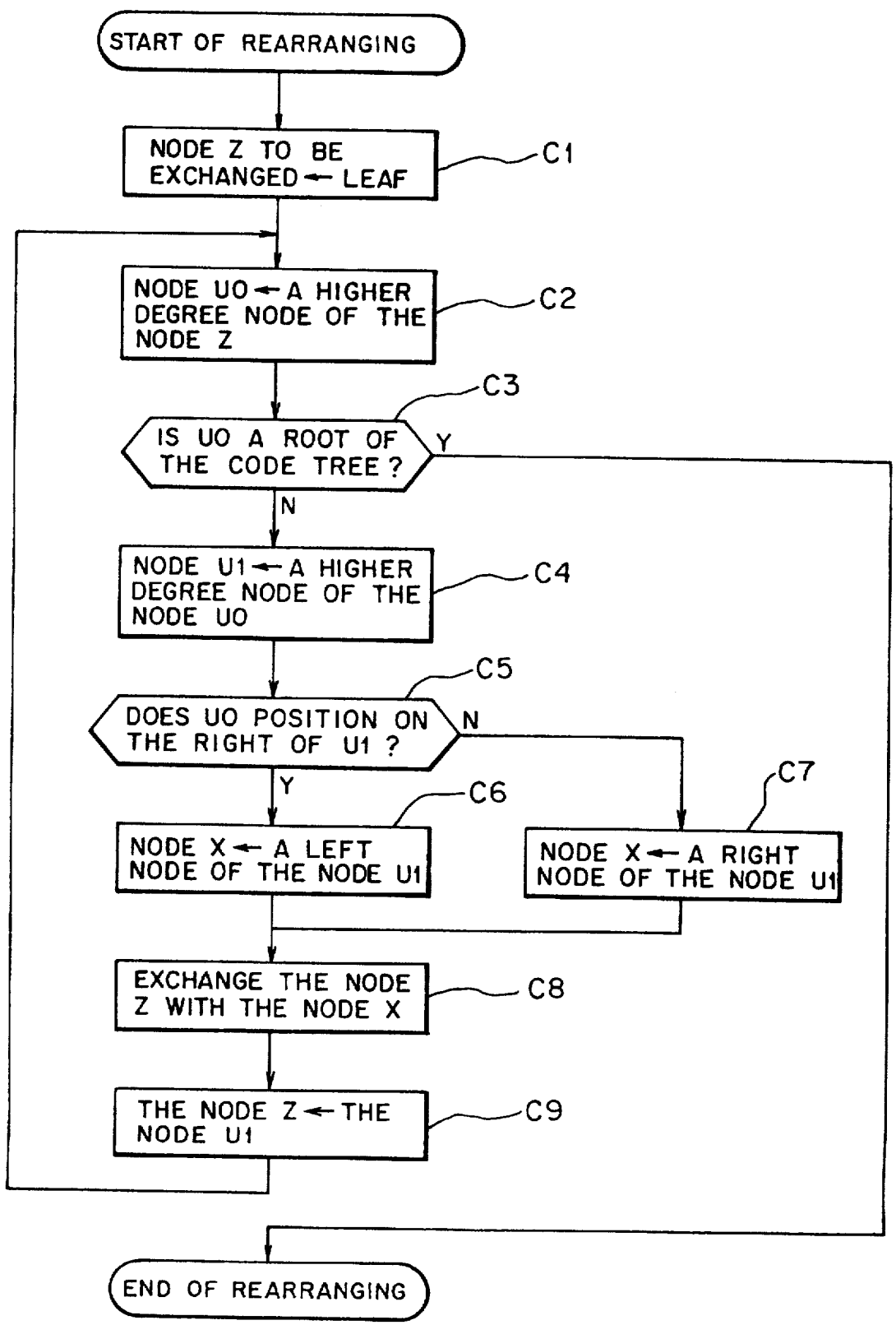
FIG. 37 is a flowchart illustrating a procedure for reshaping a code tree according to the second embodiment of this invention.

As having been described at Step A4, a process to exchange a leaf of the symbol K with another leaf or node performed by the code tree updating unit 105A will be next described in more detail by reference to Steps C1 through C9 in FIG. 37.

First, an address pointer of a node Z that is an object of the exchanging is set to the leaf K (Step C1). A higher degree node of the node Z is then set to a node U0 (Step C2).

Discrimination is made on whether the higher degree node U0 of the K is a root of the code tree or not (Step C3). If it is a root, the exchanging process is terminated (YES route at Step C3 to Step C9). If not a root, a higher node of the node U0 is set to a node U1 (NO route at Step C3 to Step C4), and discrimination is made as to on which side of the higher degree node U1 of the node U0 the node U0 positions (Step C5).

If the U0 positions on the right side of the U1, a node positioning on the left side of the node U1 to the node X (YES route at Step C5 to Step C6), and the node Z is exchanged with the node X (Step C8). In other words, a node on the left side of the node U1 is recombined with the leaf K.

If the node U0 is on the left side of the U1, a node positioning on the right side of the node U1 is set to the node X (NO route at Step C5 to Step C7), and a the node Z is exchanged with the node X (Step C8). In other words, a node on the right side of the node U1 is recombined with the leaf K.

Further, an address pointer of the node Z is set to the node U1 (Step C9). The procedure then goes back to the above-mentioned Step C2. At Step C3, the process is repeated until it is determined that a higher degree node of the set address pointer is a root, in other words, the address pointer is at a node just below the root.

Through the above process, a distance from the root to the accessed leaf (a code length) becomes a half.

By repeating the above process on all input characters, a character string may be encoded.

As above, in the data compressing apparatus to carry out the data compressing method according to the second embodiment of this invention, a character to be encoded is entered with its number in the context tree in a tree structure, and a code tree corresponding to this context tree is generated and updated while a splay coding is performed. Whereby, it is possible to perform a process in two stages at the same time, that is, a stage to construct a probability model by determining a frequency of occurrence of an occurring character so as to assign a code to each character to make a code table, and a stage to output a code of a character to be encoded from the code table. This manner may largely increase a processing rate in data compression.

As stated above, each time a character is inputted, nodes of the code tree is generated and updated (in the splay process) so as to construct a probability mode. This manner may reduce a burden of enormous volume of arithmetic operation to reconstruct a probability model that has been already constructed each time a character is inputted, thereby further increasing a processing rate in data compression.

Further, each time the same character as a character that has been already compressed (encoded) in the past, a node of the code tree of the same character that has been already entered in the past is exchanged with a higher degree node so as to decrease a length of a code length to a half (in the splay process). It is therefore possible to express a character (string) with the fewer number of bits as the same character (string) occurs more frequently. This may largely improve an effect of the compression.

(2) Description of Decoder

Figure 38:
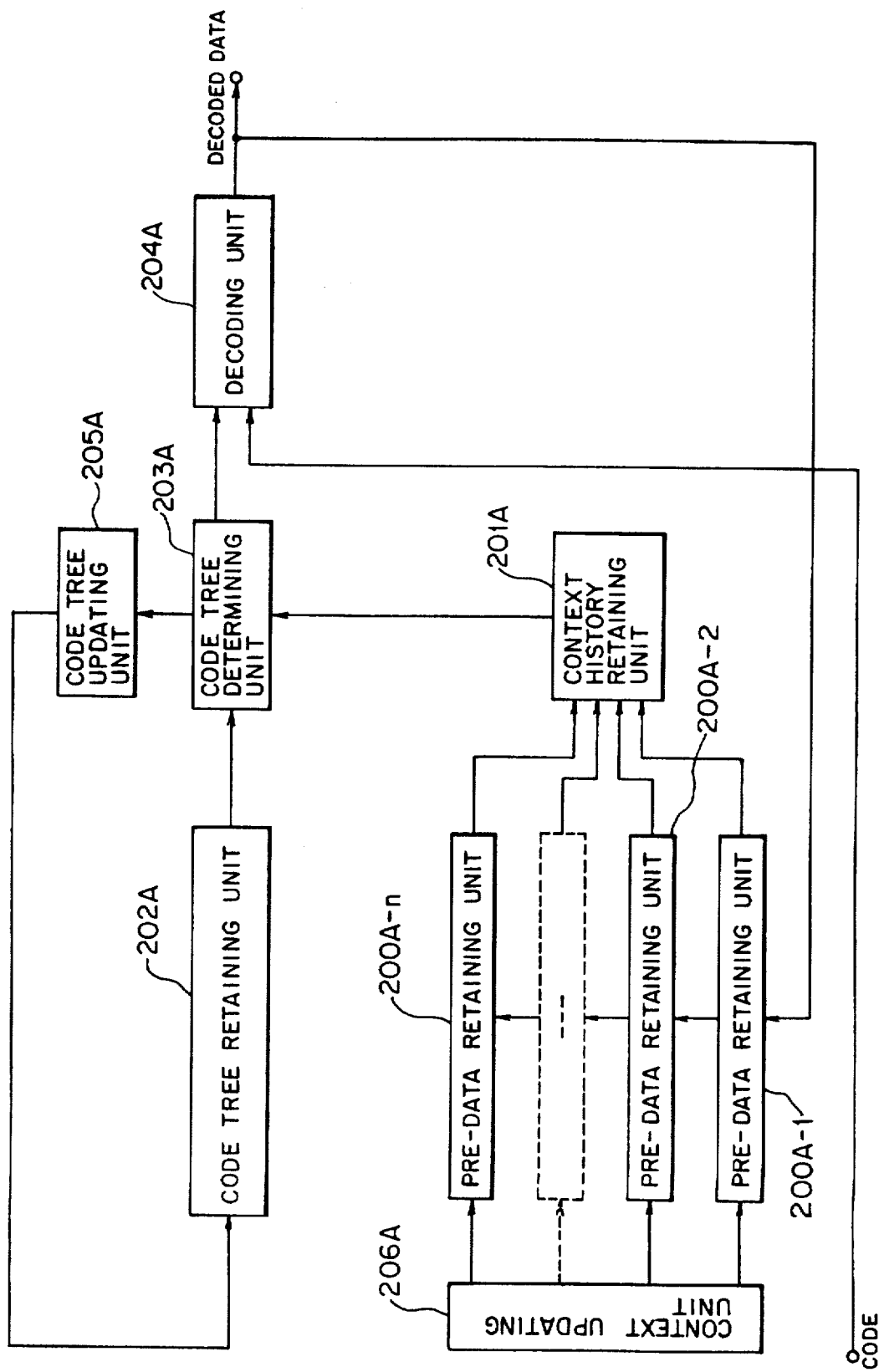
FIG. 38 is a block diagram of the data decompressing apparatus according to the second embodiment of this invention.

FIG. 38 is a block diagram showing an internal structure of the above-mentioned data decompressing apparatus 4. As shown in FIG. 38, reference numerals 200A-1~200A-n (n is a natural number) denote pre-data retaining units, 201A denotes a context history retaining unit, 202A denotes a code tree retaining unit, 203A denotes a code tree determining unit, 204A denotes a decoding unit, 205A denotes a code tree updating unit, and 206 denotes a context updating unit.

The pre-data retaining units (a pre-data retaining means) 200A-1~200A-n are served to retain data of the n number that have been decoded before decoding a code therein. The context history retaining unit (a history retaining means) 201A retains a combination of a decoded symbol and a context. The code tree retaining unit (a code tree retaining means) 202A retains code trees each of which is independent for each context.

The code tree determining unit (a code tree determining means) 203A determines a code tree in order to decode a symbol from contexts retained in the predata retaining units 200A-1~200A-n. The decoding unit (a decoding means)

204A outputs a symbol stored in a leaf reached by scanning a path from a root of a code tree (a top of a code tree) selected in the code tree determining unit 203A to a node (a bifurcation) of the same according to a code.

The code tree updating unit (a code length updating means) 205A exchanges an decoded leaf with another leaf or node. The context updating unit (a pre-data updating means) 206A enters a decoded symbol in the pre-data retaining units 200A-1~200A-n.

Figure 39:
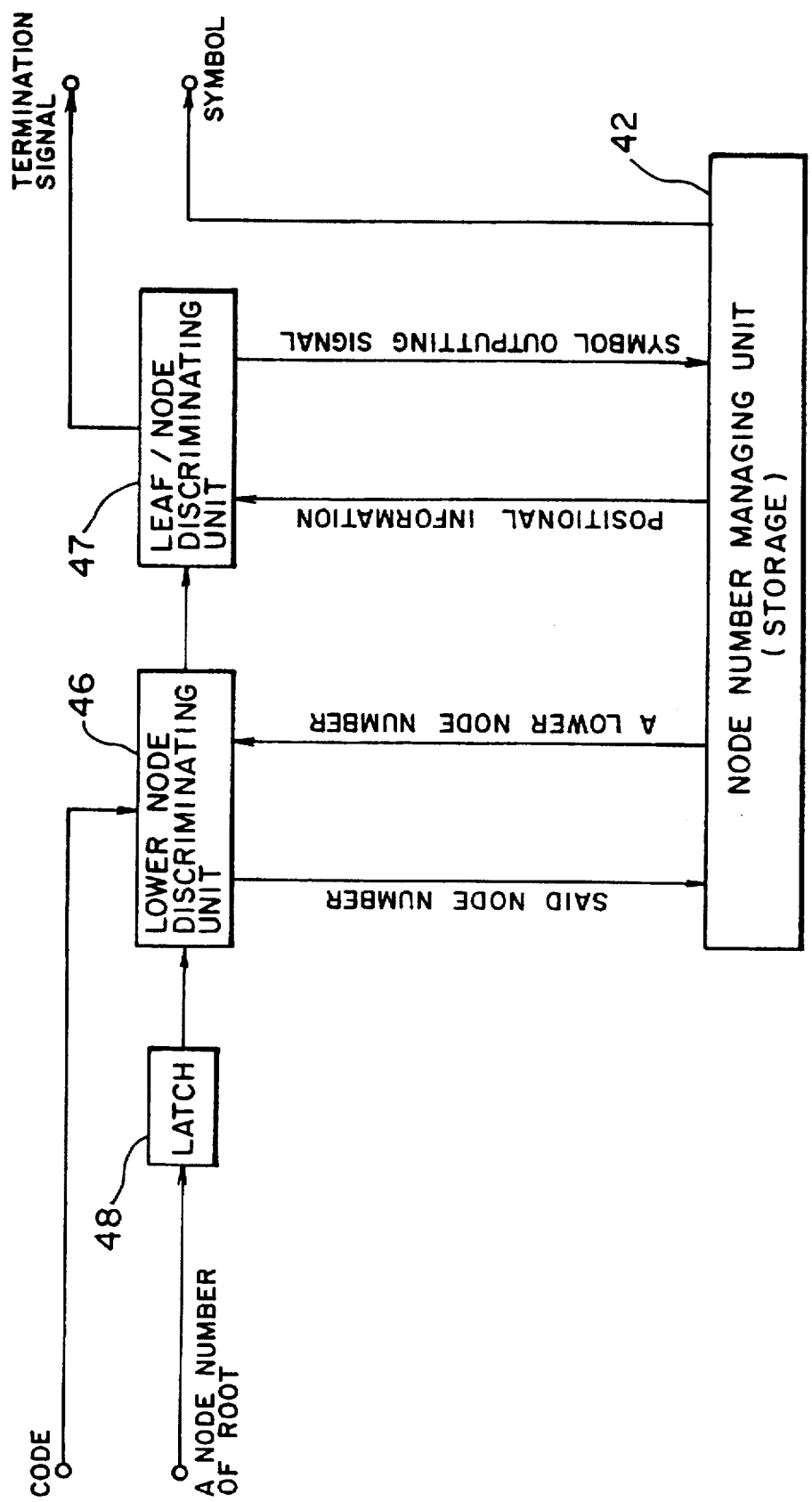
FIG. 39 is a block diagram of a decoding unit according to the second embodiment of this invention.

FIG. 39 is a block diagram showing an internal structure of the above-mentioned decoding unit 204A. As shown in FIG. 39, in order to output a symbol stored in a leaf reached by scanning a path from a root of a code tree selected by the code tree determining unit 203A to a node according to a code, the decoding unit 204A includes a node number managing unit (storage) 42, a latch 48, a lower degree node discriminating unit 46, a leaf/node discriminating unit 47.

The node number managing unit (storage) 42 is similar to that provided in the above-mentioned encoder shown in FIG. 34, which manages node number of a context tree and a code tree.

The lower degree node discriminating unit 46 obtains a node number of a lower degree node from a code, a node number of a root of the code tree and information stored in the node number managing unit 42. The leaf/node discriminating unit 47 discriminates whether a lower degree node is a leaf or node from information fed from the lower node discriminating unit 46 and the node number managing unit 42. The latch 48 temporarily retains a node number of a root.

In the above structure, the pre-data retaining unit 200A-1~200A-n retain a context (data) of the n number that have been decoded before decoding a code, and the code retaining unit 202A retains code trees each independent for each context.

The code tree determining unit 203A determines a code tree used to decode data K from a context retained in the pre-data retaining unit 200A-1~200A-n. The decoding unit 204A output a data K stored in a leaf reached by scanning a path from a root (a top) of a code tree selected by the code tree determining unit 203A to a node (a bifurcation) of the same according to a code of the encoded data K.

The code tree updating unit 205A as a code length updating means exchanges a decoded leaf with another leaf or internal node. The pre-data updating unit 206A enters the decoded data K as the latest context in the pre-data retaining unit 200A-1.

Figure 40:
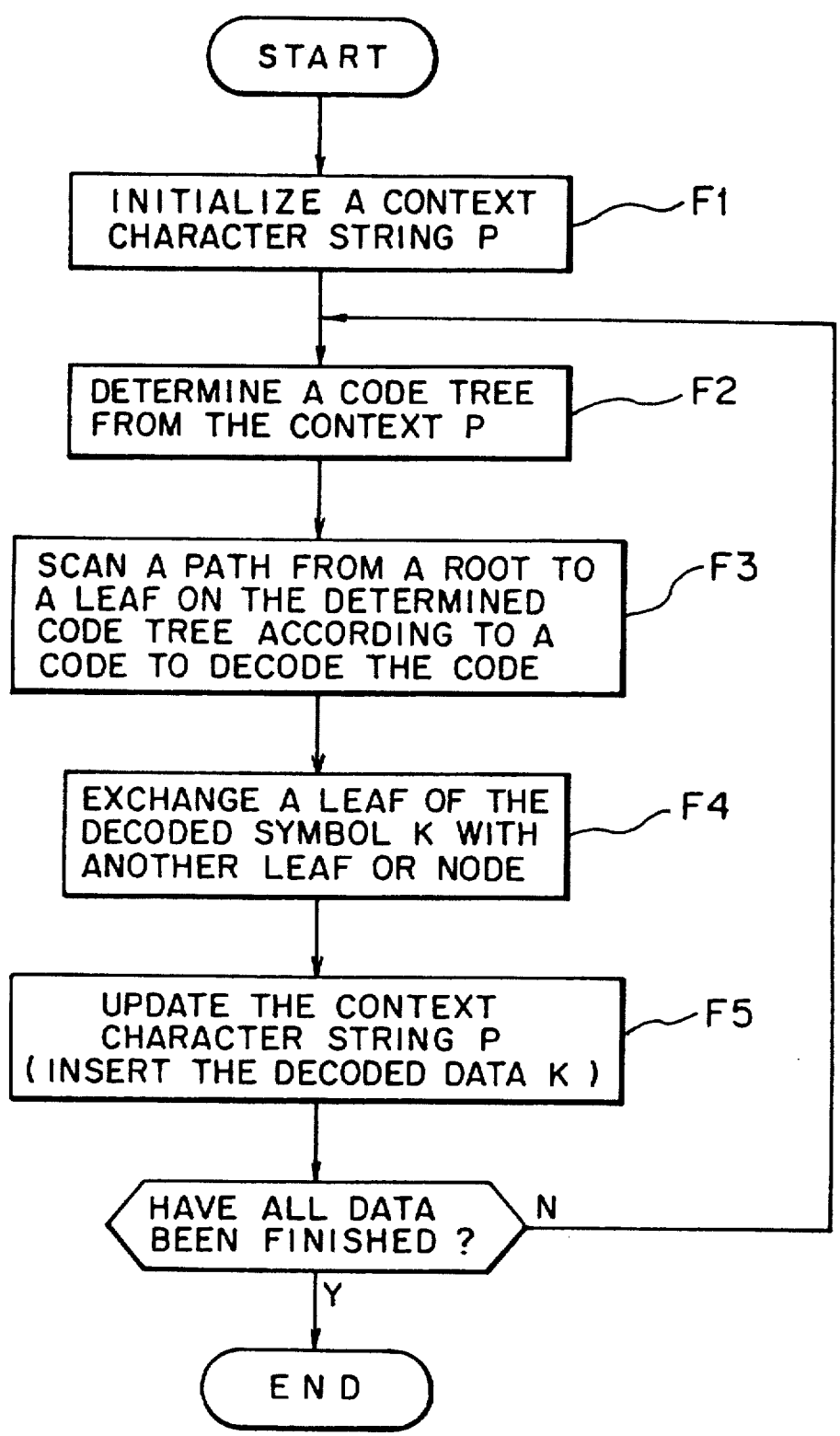
FIG. 40 is a flowchart illustrating a procedure for decoding according to the second embodiment of this invention.

The above process will be next described in more detail by reference to Steps F1 through F6 in a flowchart shown in FIG. 40.

To begin with, context character strings P of the n number retained in the pre-data retaining units 200A-1~200A-n are initialized (Step F1). Then, a symbol (data) K to be decoded is inputted (Step F2).

The code tree determining unit 203A determines a code tree corresponding to a context P from the context history retaining unit 201A retaining a history of the contexts retained in the pre-data retaining units 200A-1~200A-n, and sends a node number (ID) of the determined code tree and a code of the event K to be decoded to the decoding unit 204A. The decoding unit 204A scans a path on the determined code tree from the root to a leaf in which the event K is stored according to the fed code, and decodes a code (Step F3). Incidentally, a process performed by the decoding unit 204A will be later described in more detail by reference to FIG. 41.

After the decoding, the code tree updating unit 205A exchanges a leaf on the code tree of the event K that has been decoded with another leaf or internal node (Step F4), and stores it back in the code tree retaining unit 202A so as to update the code tree. The process to exchange nodes performed by the code tree updating unit 205A is performed in the same manner as the process at Steps C1 through C9 performed by the code tree updating unit 105A having been described hereinbefore by reference to the flowchart in FIG. 37.

The context updating unit 206A discards the oldest data (data retained in the pre-data retaining unit 200A-n), and updates the context character string P by entering the decoded symbol (data) K as a context in the pre-data retaining unit 200A-1.

A check is made on whether the decoding of all data is finished or not (Step F6). If not finished, the process from Step F2 is repeated (NO route at Step F6). If finished, the decoding process is terminated (YES route at Step F6).

As same as in the encoding process, the order of the above-stated processes, that is, the process to exchange nodes (at Step F4) and the process to update the context (at Step F5) may be changed. It is alternatively possible to perform the above processes in parallel.

Figure 41:
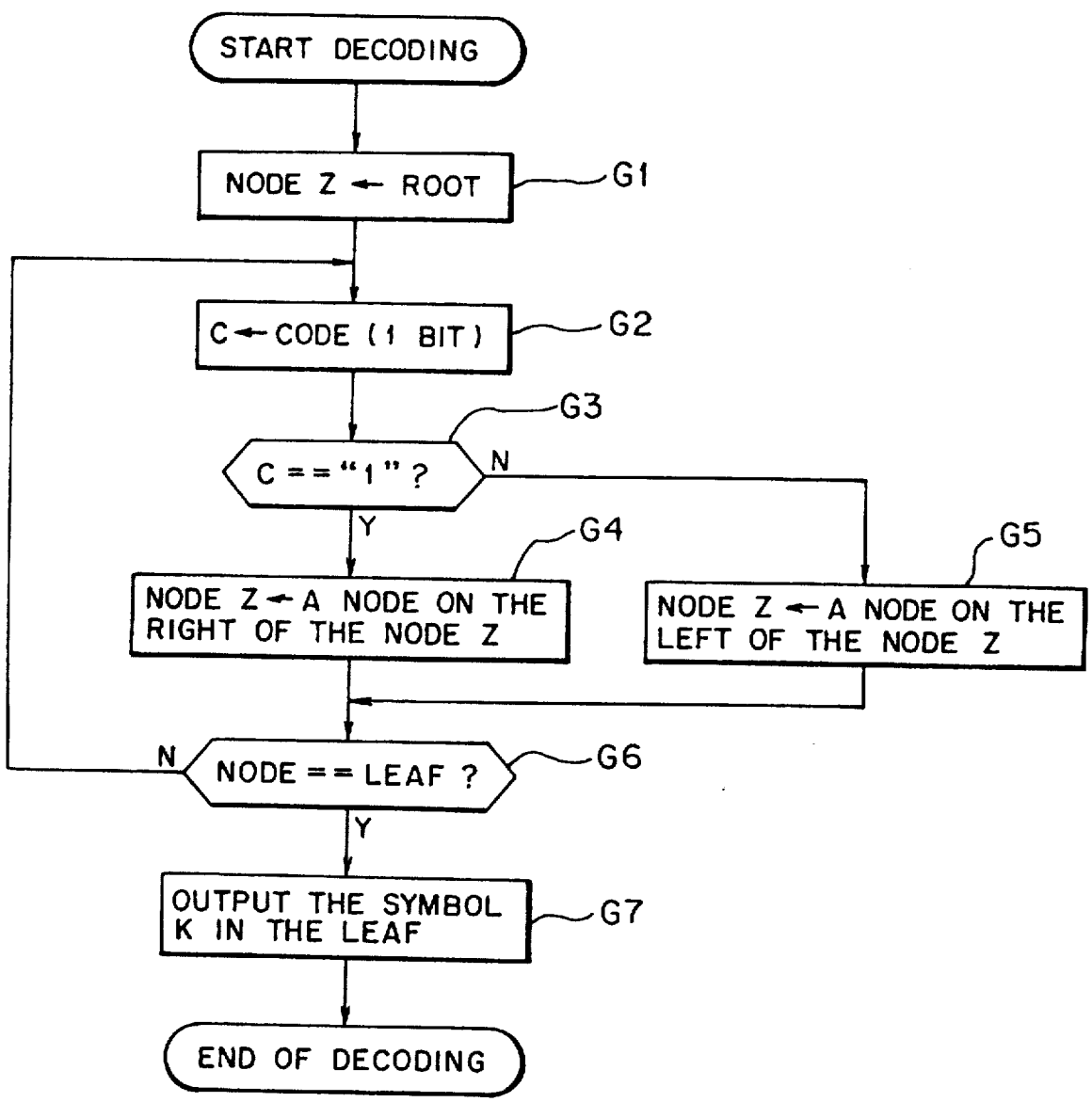
FIG. 41 is a flowchart illustrating a procedure for decoding according to the second embodiment of this invention.

As having been stated at Step F3, the encoding process performed by the decoding unit 204A with the above structure shown in FIG. 39 will be next described by reference to Steps G1 through G7 in a flowchart in FIG. 41.

The lower degree node discriminating unit 46 sets a node number (ID) of the root fed from the code tree determining unit 203A to a node Z (Step G1). The lower degree node discriminating unit 46 also sets a code (of 1 bit) of the symbol K to be decoded which has been fed from the same code tree determining unit 203A via the latch 48 to C (Step G2).

A check is made on whether the code of the symbol K to be decoded set to C is in coincidence with "1" or not (Step G3). If it is in coincidence with "1" (in the case of YES), a node on the right side of the node Z is set to Z (YES route at Step G3 to Step G4). If it is not "1" (that is, it is "0"), a node on the left side of the node Z is set to the node Z (NO route at Step G3 to Step G5). The lower degree node discriminating unit 46 obtains a node number of the node Z from the node number managing unit 42 on the basis of a node number of the node set to the node Z, sends that node number to the leaf/node discriminating unit 47. The leaf/node discriminating unit 47 obtains positional information of the node Z having the fed node number from the node number managing unit 42, and makes a check on whether that node number Z is a node or a leaf (Step G6).

If the node Z is not a leaf (NO route at Step G6), the procedure goes back to Step G2, and the process is repeated until reaching a leaf in which the symbol K to be decoded is stored.

If the node Z is a leaf (YES route at Step G6), it means that the event K to be decoded has been found, the leaf/node discriminating unit 47 transmits a symbol (event) output signal to the node number managing unit 42. The node number managing unit 42 having received that signal outputs the symbol K stored in that leaf (Step G7), and outputs an end signal for this decoding process.

As above, by tracking a path expressed with numeral values of "1" and "0" on the code tree generated in the encoder down to a leaf in which the event K is stored, the encoded event K may be decoded.

In the data decompressing apparatus used to carry out the data decompressing method according to the second embodiment of this invention, a decoded character is entered with its own number in a context tree in a tree structure, a code tree corresponding to the context tree is generated and updating while the spray operation is performed thereon. It is therefore possible to perform a process in two stages at the same time, that is, a stage to search a code in coincidence with a code of a character to be decoded, and a stage to output a character stored correspondingly to the coincided code as a decoded character. This manner may largely increase a processing rate in data restoration.

As same as in the decoder, the probability mode is constructed by generating and updating nodes of the code tree in the splay process every time a character is inputted so that an enormous volume of arithmetic operation to reconstruct the probability mode that has been already constructed every time a character is inputted becomes indispensable, and a processing rate in the data restoration is thereby largely increased.

As also same as in the decoder, every time the same code as a code that has been already decoded in the past occurs, a node of the code tree of the same code that has been entered in the past is exchanged with a higher degree node (in the splay process) so as to decrease a code length to a half. This allows a code to be expressed with the fewer number of bits as the same code is decoded more frequently so that an effect of restoration is largely improved.

(b-1) Description of First Modification of Second Embodiment of the Invention

Next description will be of a first modification of the second embodiment according to this invention.

(1) Description of Encoder

Figure 42:
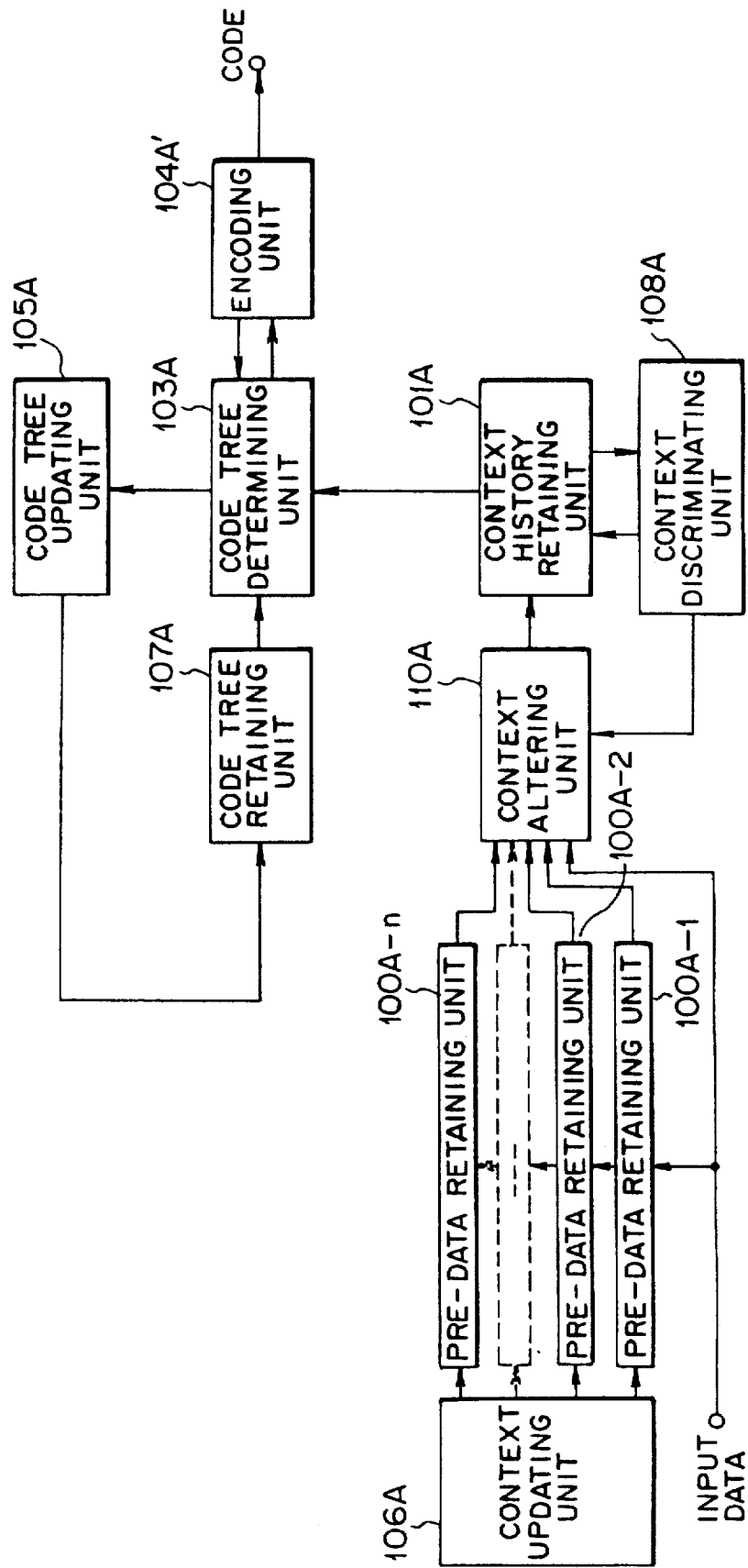
FIG. 42 is a block diagram of a data compressing apparatus according to a first modification of the second embodiment of this invention.

FIG. 42 is a block diagram showing an internal structure of a data compressing apparatus 3 as a modification of the second embodiment of this invention As shown in FIG. 42, the data compressing apparatus 3 of this invention is provided with a context discriminating unit 108A and a context altering unit 110A in addition to the elements having been described by reference to FIG. 33 in the second embodiment. Instead of the decoding unit 104A and the code tree retaining unit 105A in FIG. 33, an encoding unit 104A' and a code tree retaining unit 107A are provided.

For this, description of the same elements in FIG. 42 as those in FIG. 33 is here omitted, only elements different from those in FIG. 33 will be hereinafter described.

The encoding unit 104A', as a code outputting means and an escape code outputting means, outputs an escape code according to a bifurcation extending from a node positioning on the path from a root of a code tree to a leaf in which the escape code is stored if a symbol is not entered in the code tree, or outputs a code of a symbol according to a bifurcation extending from a node positioning on the path from the root of the code tree to a leave in which the symbol is stored if the symbol is entered in the code tree.

The encoding unit 104A', as a control means, repeats a process until data is decoded if an escape code is encoded.

The code tree retaining unit (a code tree retaining means) 107A retains code trees each independent for each context in which an escape code (ESC) representing that a symbol is not stored is in advance entered. The context discriminating unit (a context discriminating means) 108A discriminates whether a symbol is stored in a code tree determined by the code tree determining unit 103 or not. The context altering unit (a context altering means) 110A decreases a length of a context if the symbol is not stored in the code tree.

In the data compressing apparatus 3 shown in FIG. 42 with such the structure different from that shown in FIG. 33, the encoding unit 104A' outputs an ESC code according to a bifurcation extending from a node positioning on the path from a root of a code tree to a leaf in which the ESC is stored if a symbol K is not stored in the code tree, or outputs a code of the symbol K according to a bifurcation extending from a node on the path from the root of the code tree to the leaf in which the symbol K is stored if the symbol K is stored in the code tree.

If encoding the ESC, the encoding unit 104A' repeats a process until the data (symbol) K is encoded.

The code tree retaining unit 107A retains code trees each independent for each context in which an ESC code representing that a symbol is not entered is in advance stored.

The above process will be hereinafter described in more detail by reference to Steps H1 through H11 in a flowchart shown in FIG. 43.

The context altering unit 110A initializes a context character string P0 among all contexts retaining in the pre-data retaining unit 200A-1~200A-n (Step H1). The context character string P0 is set to a context P (Step H2). Then, data (symbol) K to be encoded is inputted (Step H3).

The context altering unit 110A sends the context P and information of the data K to the context history retaining unit 101A and the code tree determining unit 103A. The context history retaining unit 101A sends the information of the context P fed from the context altering unit 110A to the context discriminating unit 108A.

The context discriminating unit 108A discriminates whether a symbol K is stored in the context P from the received information of the context P (Step H4).

If the symbol K has been entered to the context P, the context history retaining unit 101A directs the encoding unit 104A' to encode an escape code (ESC). The encoding unit 104A' outputs a code corresponding to a bifurcation of a node on the path from a leaf of the escape code (ESC) to a root on a code tree corresponding to the context P to encode the escape code (NO route at Step H4 to Step H5).

The encoding unit 104A' directs the code tree updating unit 105A through the code tree determining unit 103A to update the code tree. The code tree updating unit 105A exchanges a leaf of the ESC on the code tree with another leaf or internal node (Step H6).

The degree of the context P (an initial state of the code tree is in degree-0) is changed to the next lower degree (Step H7). The procedure goes back to Step H4, and the process is repeated until it is decided that the symbol K is entered in the context P (that is, until it is judged as YES at Step H4 that the symbol K is entered in the context P).

If the symbol K is stored in the context P at the above Step H4 (that is, until it is judged as YES at Step H4 that the symbol K is stored in the context P), the context history retaining unit 101A directs the encoding unit 104A' to encode the symbol K. The encoding unit 104A' outputs a code according to a bifurcation of a node from a leaf of the symbol K to the root so as to encode it (YES route at Step H4 to Step H8).

The encoding unit 104A' directs the code tree updating unit 105A through the code tree determining unit 103A to update the code tree. The code tree updating unit 105A exchanges a leaf of the event with another leaf or internal node (Step H9).

The context altering unit 106A discards the oldest data (data retained in the pre-data retaining unit 100A-n), and enters a context of the input data K to the pre-data retaining unit 100A-1. The context altering unit 110A updates a context character string P0 based on that information (Step H10).

A check is made on whether the encoding of all data is finished or not (Step H11). If it is not finished, the process after Step H2 is repeated until the encoding of all the data is finished (YES route at Step H11). If it is finished, all the process for the encoding is completed.

For more detailed information on the code outputting process at the above Steps H5 and H8, refer to the Steps B1 through B8 having been described by reference to FIG. 36 in the second embodiment. For more detailed information on the node recombining process, refer to the Steps C1 through C9 having been described by reference to FIG. 37 in the second embodiment.

As above, in the data compressing apparatus according to the first modification of the second embodiment of this invention, an escape code (ESC) representing that the symbol is not entered is entered beforehand in the code tree, a code of this escape code is outputted while the symbol to be encoded is not contained in a context having been entered in advance (in other words, until a context containing the symbol is found and the symbol is encoded). In consequence, it is not necessary to enter beforehand all combinations of symbols (contexts) occurring as input data so that a volume of a storage used to enter contexts therein may be largely reduced.

As above, a code length of an escape code outputted while no symbol is contained in a context having been entered in advance may be decreased (to a half) in the splay process so that a time period necessary to find out a context in which the symbol is entered and encode it may be shortened. This permits an increase in processing rate in the data compression to a large extent, and a decrease in a process load on the data compressing apparatus also to a large extent.

(2) Description of Decoder

Figure 44:
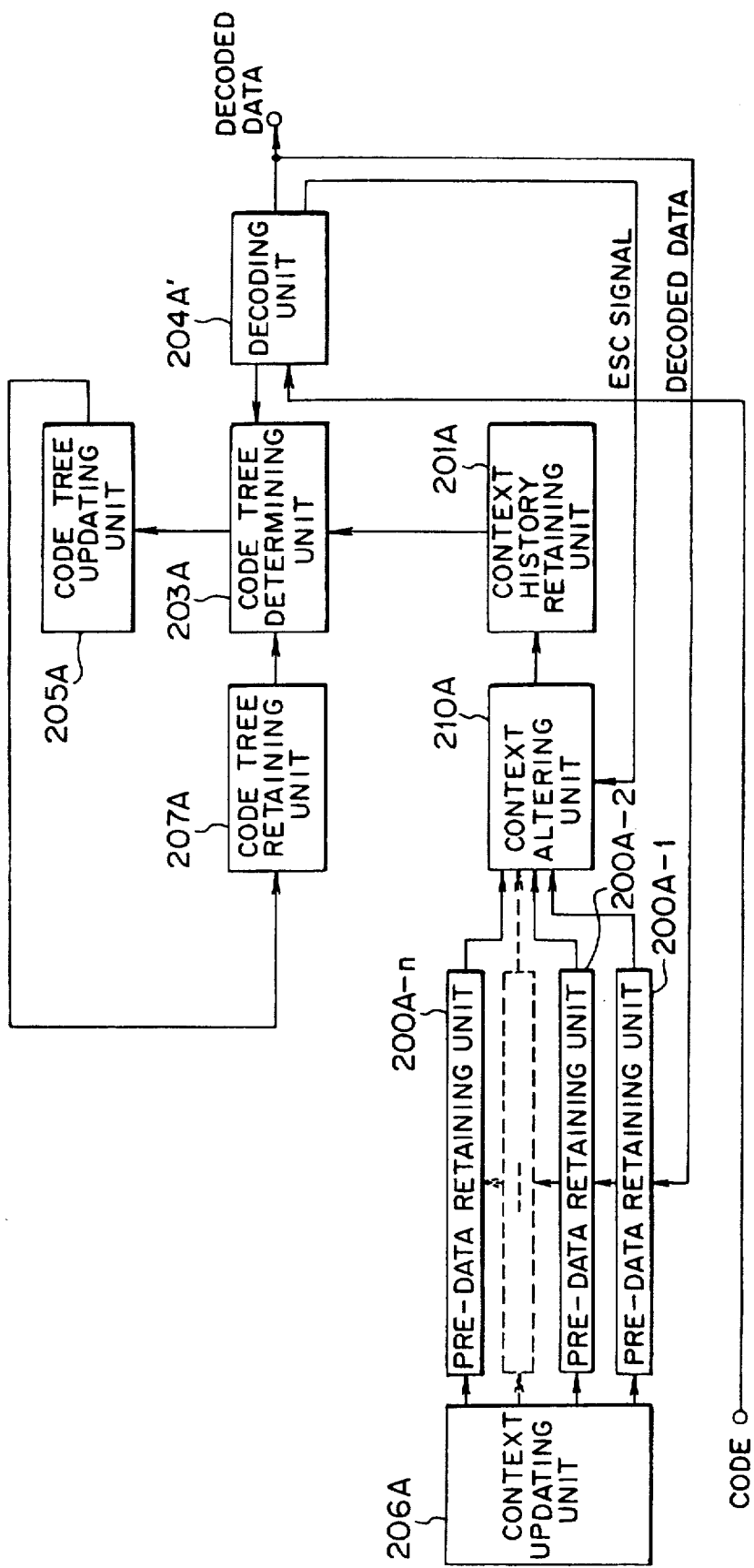
FIG. 44 is a block diagram of a data decompressing apparatus according to the first modification of the second embodiment of this invention.

FIG. 44 shows an internal structure of a data decompressing apparatus 4 as a first modification of the second embodiment of this invention. As shown in FIG. 44, the data restoring apparatus 4 has a context altering unit 210A, in addition to the elements having been described by reference to FIG. 38. Instead of the decoding unit 204A and the code tree retaining unit 205A, there are provided a decoding unit 204A' and a code tree retaining unit 207A.

Description of elements designated by the same reference numbers as those in FIG. 38 is here omitted. Only elements different from those in FIG. 38 will be hereinafter described.

The code tree retaining unit (a code tree retaining means) 207A retains a code tree having been entered an escape code thereto. The context altering unit (a context altering means) 210A discards inputted data when output data is an escape code so as to shorten a context.

The decoding unit 204A' outputs data stored in a leaf reached by scanning a path from a root of a code tree selected by the code tree determining unit 203A to a node (a bifurcation) according to a code having been encoded in the above-mentioned encoder.

The decoding unit 204A', as a control means, causes the context altering unit 210A to reset a context when an escape code is decoded as above, and controls to repeat the process until data excepting an escape code is encoded.

In the data decompressing apparatus with the above structure shown in FIG. 44, different from that shown in FIG. 38, the code tree retaining unit 207A retains a code tree in which ESC has been entered in advance, and the context altering unit 210A discards data K inputted when the data K outputted from the context altering unit 210A is an ESC so as to shorten the context.

The decoding unit 204A' outputs the data K stored in a leaf reached by scanning a path from a root of a code tree selected by the code tree determining unit 203A to a node. The an ESC is decoded, the context altering unit 210A alters the degree of the context, and repeats the process until the data K expecting the ESC is decoded.

Figure 45:
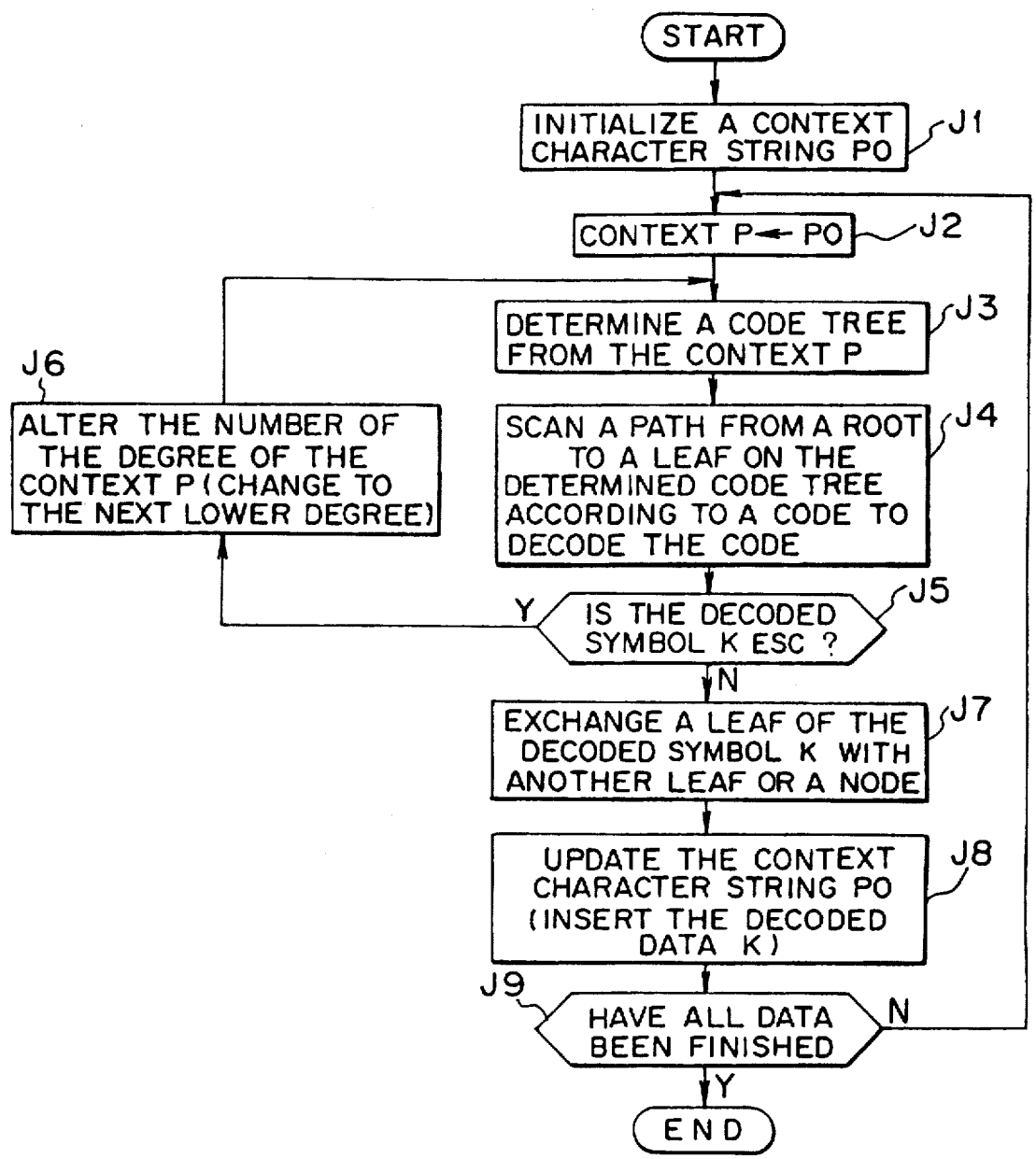
FIG. 45 is a flowchart illustrating a procedure for decoding according to the first modification of the second embodiment of this invention.

The above operation will be next described in more detail by reference to Steps J1 through J9 in a flowchart shown in FIG. 45.

To begin with, the context altering unit 210A initializes a context character string P0 among all contexts retained in the pre-data retaining units 200A-1~200A-n (Step J1). The context character string P0 is set to a context P (Step J2).

The context altering unit 110A sends this context P to the context history retaining unit 201A and the code tree determining unit 203A. The code tree determining unit 203A selects (determines) a code tree from the received context P (Step J3), and sends the determined code tree to the decoding unit 204A'. The decoding unit 204A' decodes a code by scanning a path from a root to a leaf on the determined code tree according to a code having been encoded in the encoder (Step J4). Incidentally, for more detailed description on the process performed by the decoding unit 204A', refer to Steps G1 through G7 having been described by reference to FIG. 41 in the second embodiment.

The decoding unit 204A' checks as to whether an decoded symbol K is an ESC (an escape code)or not (Step J5). If the decoded event is an ESC, the decoding unit 204A' sends an ESC signal to the context altering unit 210A (YES route at Step J5).

The context altering unit 210A having received this ESC signal changes the degree of the context P to the next lower degree (for example, making a context P of the degree-(n-1) regardless of the oldest data retained in the pre-data retaining unit 200A-n) (Step J6). The context altering unit 210A sends this context P to the context history retaining unit 201 and the code tree determining unit 203. The procedure goes back to Step J3.

Namely, the process from Step J2 is repeated until the decoding unit 204A' decodes the symbol K excepting an ESC.

If the decoded symbol K is not an ESC, a leaf of the decoded symbol K is exchanged with another leaf or internal node (NO route at Step J5 to Step J7). For more detail on the process of exchanging leaves or nodes, refer to the Steps C1 through C9 in the flowchart having been described by reference to FIG. 37 in the second embodiment.

The context updating unit 206A discards the oldest data (data retained in the pre-data retaining unit 200A-n), and inserts the decoded symbol K as a context into the pre-data retaining unit 200A-1 to enter it so as to update the context character string P0 (Step J8).

Then, a check is made on whether the decoding of all data is finished or not (Step J9). If it is not finished, the process from Step J2 is repeated (NO route at Step J9 to Step J2). If finished, the decoding process is terminated (YES route at Step J9).

As same as the above-stated example of the encoder, the order of the process of exchanging nodes (at Step J7) and the process of updating the context (at Step J8) is not limited to the above example. The context updating process (Step J8) may be performed ahead of the node recombining process (Step J7), or the both processes may be performed in parallel.

In the data restoring apparatus according to the first modification of the second embodiment of this invention, an escape code (ESC) representing that symbol is not entered is entered beforehand in a code tree. If a decoded symbol is the escape code, a context is shortened (altered) until a code excepting the escape code (that is, a code of a symbol to be decoded) is decoded and a code of the symbol to be decoded is searched. In consequence, it is unnecessary to enter beforehand all combinations of symbols (contexts) occurring as input data to the code tree so that a volume of a storage used to enter the contexts therein may be largely reduced.

So long as a decoded symbol is an escape code, a code length of the escape code is decreased to a half in the splay process. This may decrease a time period required until a context containing the symbol to be decoded is found and the symbol is decoded, resulting in an increase of a processing rate in the data decompression to a large extent, and a decrease of a processing load on the data decompressing apparatus to a large extent.

(b-2) Description of Second Modification of Second Embodiment of the Invention

Description will be next made of a second modification of the second embodiment of this invention.

(1) Description of Encoder

Figure 46:
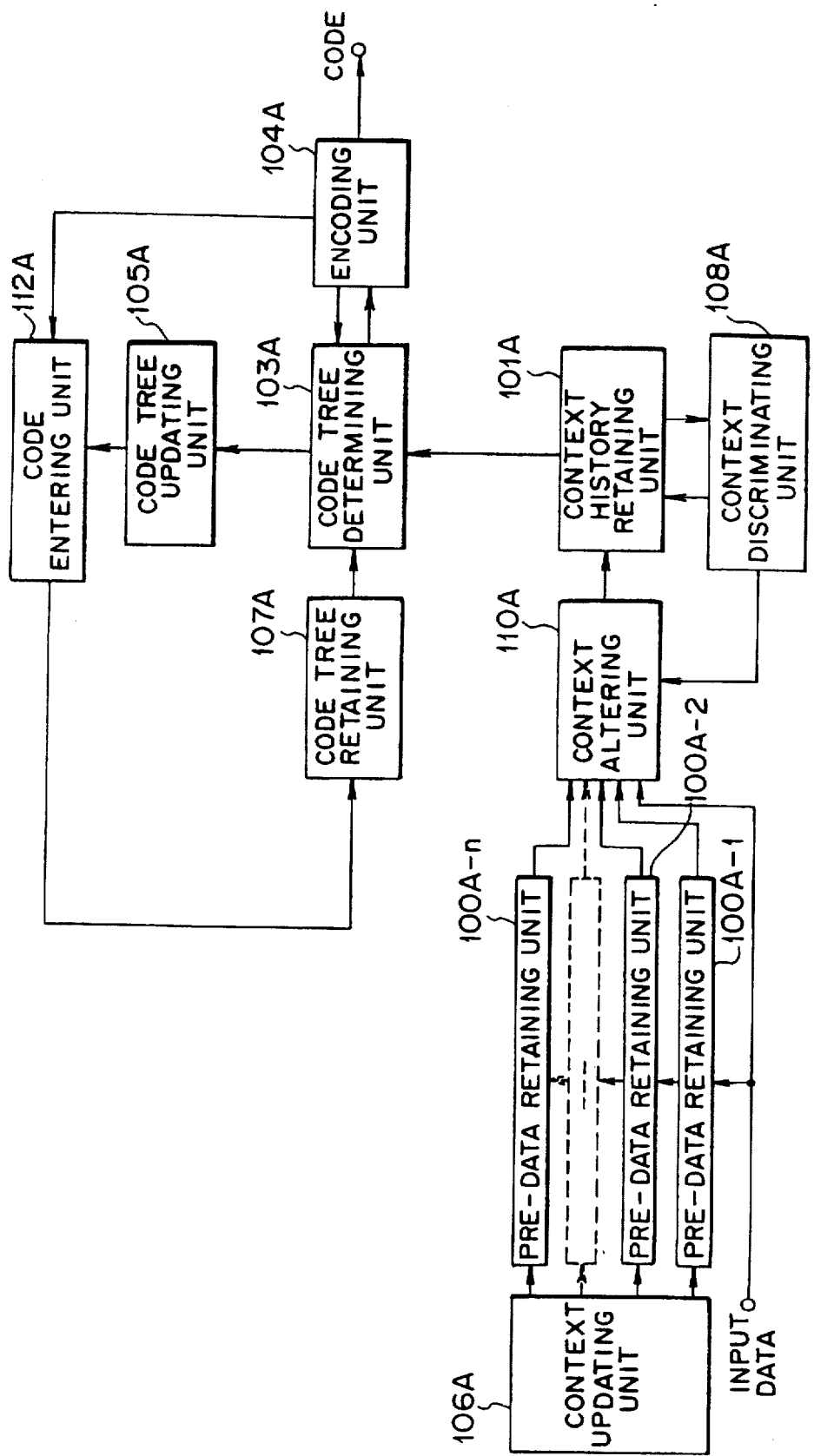
FIG. 46 is a block diagram of a data decompressing apparatus according to a second modification of the second embodiment of this invention.

FIG. 46 shows an internal structure of a data compression apparatus 3 as a second modification according to the second embodiment of this invention. As shown in FIG. 46, the data compressing apparatus 3 according to this embodiment has a code entering unit 112A, in addition to the elements having been described in the first modification of the second embodiment by reference to FIG. 38.

For this, description of the same elements in FIG. 46 as those in FIG. 33 is here omitted.

The code entering unit 112A enters data K in a code tree if the input data K is not stored in the code tree.

With the above structure, the code entering unit 112A may enter the data K to the code tree, if the input data K is not stored in the code tree.

Figure 47:
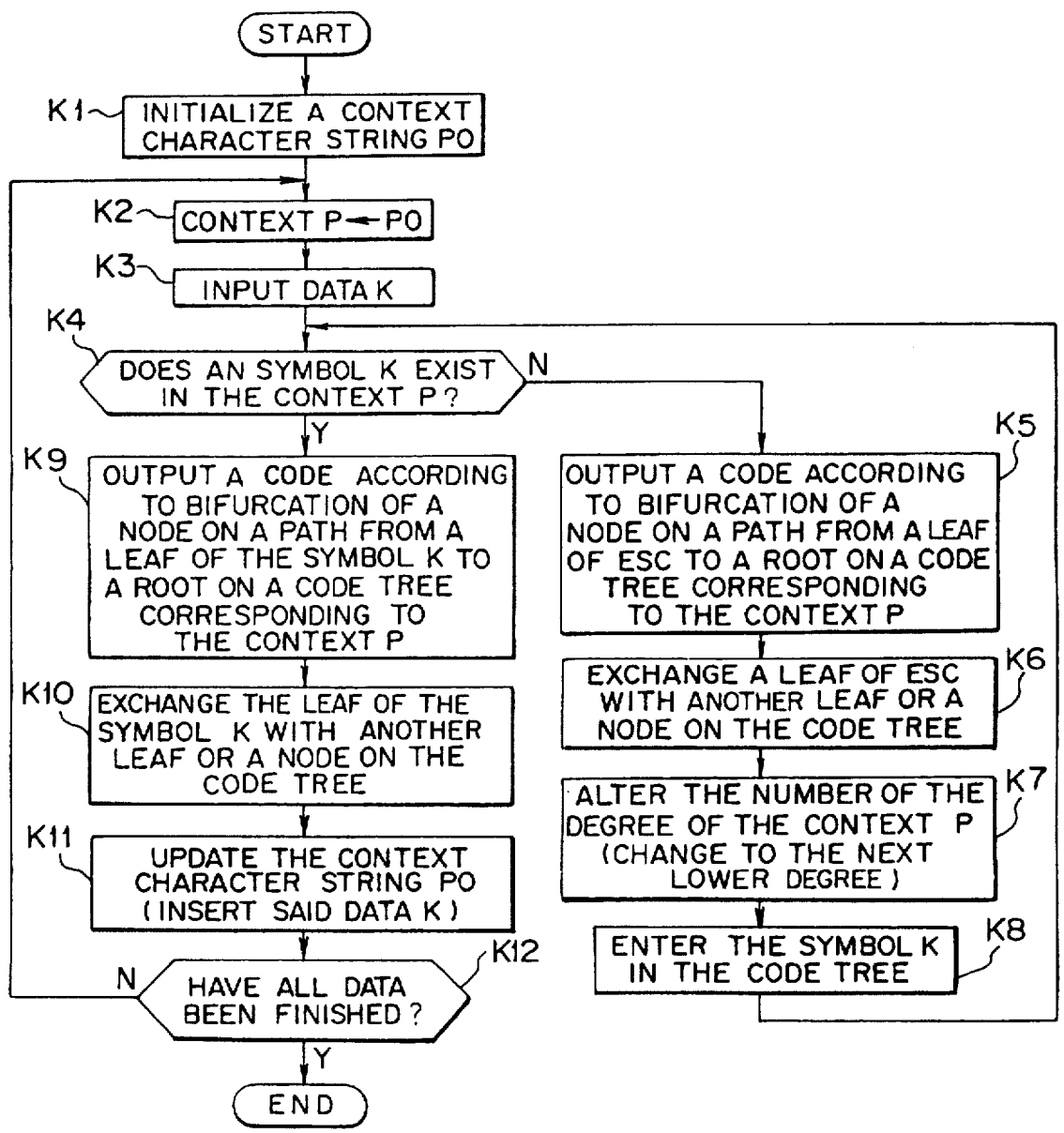
FIG. 47 is a flowchart illustrating a procedure for encoding according to the second modification of the second embodiment of this invention.

The above operation will be next described by reference to Steps K1 through K12 shown in FIG. 47. However, processes shown in FIG. 47 excepting Step K8 is the quite same as Steps H1 through H11 having been described by reference to the flowchart in FIG. 43 in the first modification according to the second embodiment.

Figure 43:
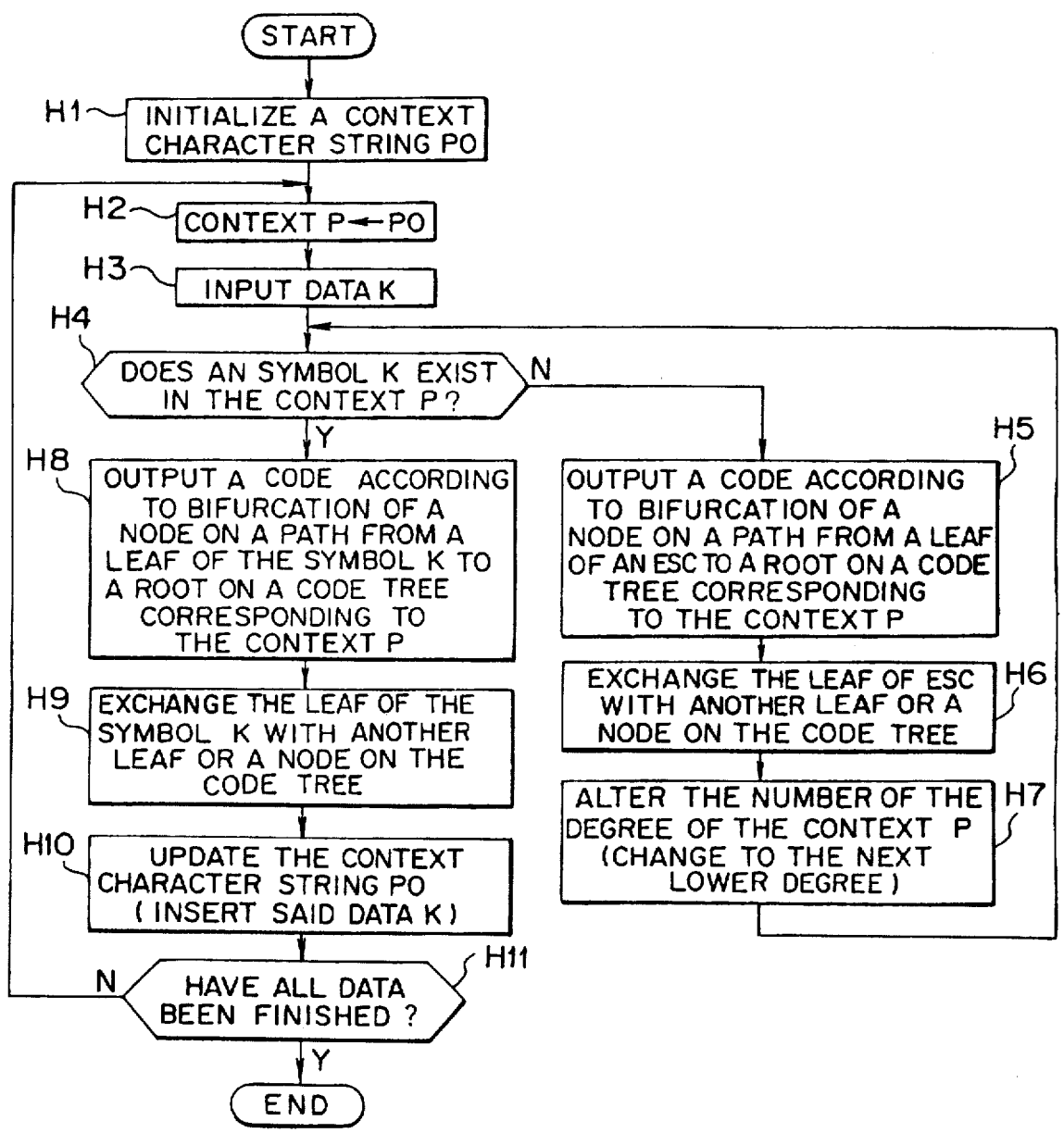
FIG. 43 is a flowchart illustrating a procedure for encoding according to the first modification of the second embodiment of this invention.

In other words, the same process as the process at Steps H1 through H7 in FIG. 43 is performed at Steps K1 through K7 in this embodiment, thereafter a process at Step K8 is performed.

More specifically, if the context discriminating unit 108A decides that the symbol K is not stored in the code tree (NO route at Step K4), the code tree updating unit 105A updates a code of ESC by exchanging a leaf of the ESC with another leaf or internal node on the code tree (Step K6). The context history retaining unit 101A sends a present context P to the code entering unit 112A. The context altering unit 110A changes to the degree of the context P to the next lower degree to alter it (Step K7). Therefore, the code entering unit 112A enters the symbol K in the code tree (Step K8).

If it is decided at Step K4 that the event K is stored in the context tree,. the same process as the above-mentioned process at Steps H8 through H11 shown in FIG. 43 is performed at Steps K9 through K12.

The data compressing apparatus according to the second modification of the second embodiment of this invention may provide the same effect as the encoder according to the first modification of the second embodiment, since the steps of this modification excepting Step K8 are quite the same as the steps of the process in the encoder according to the first modification of the second embodiment.

As above, by providing Step 8, it becomes possible to enter a symbol in the code tree while an escape code is encoded so that a symbol not stored in advance may be encoded in an early stage (in a higher degree) in the next encoding. This may more enhance the compression effect as the coding proceeds further.

(2) Description of Decoder

Figure 48:
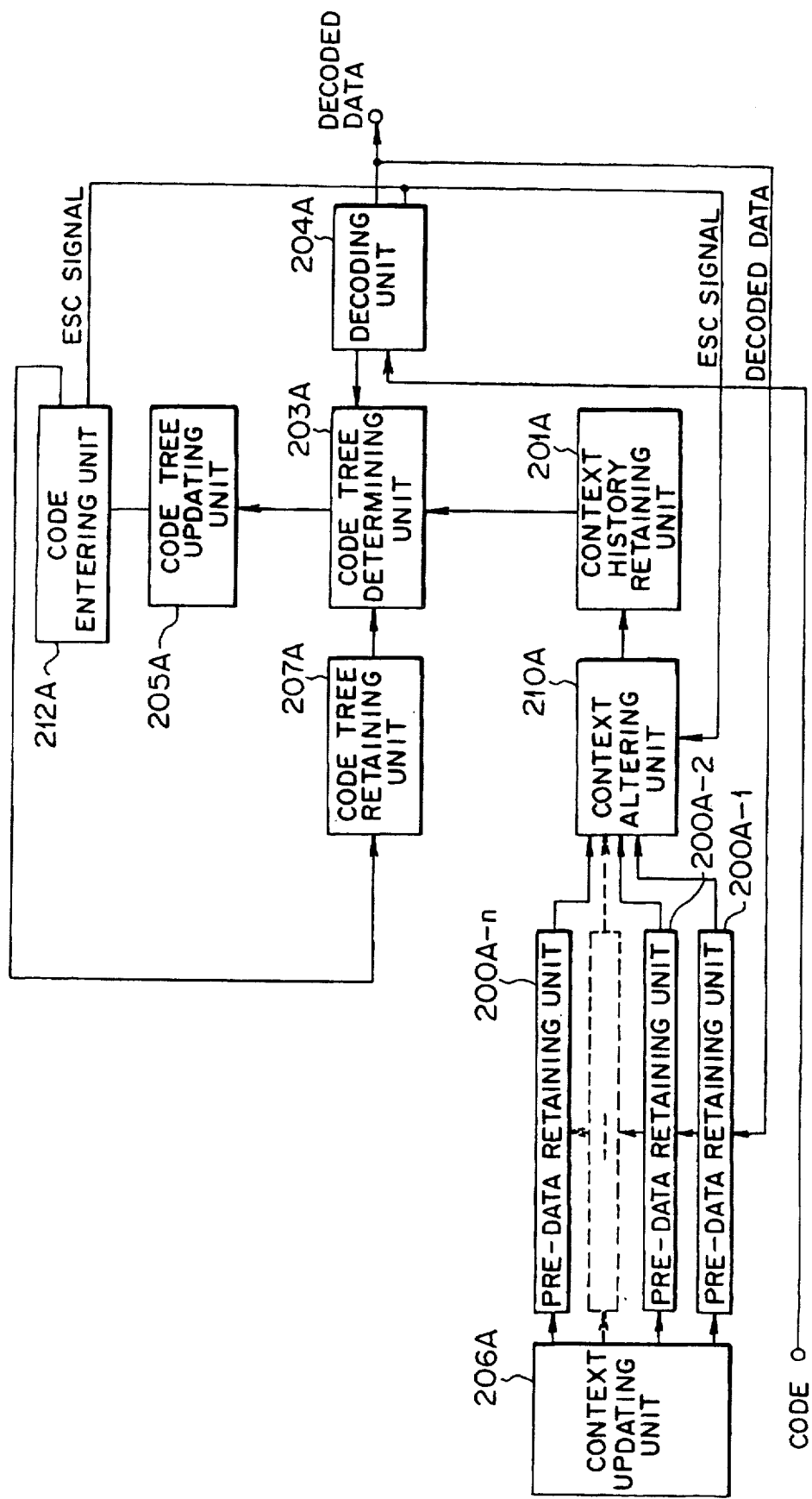
FIG. 48 is a block diagram of the decompressing apparatus according to the second modification of the second embodiment of this invention.

FIG. 48 shows an internal structure of a data decompressing apparatus 4 according to a second modification of the second embodiment of this invention. As shown in FIG. 48, the data decompressing apparatus 4 has a code entering unit 212A, in addition to the elements of the decompressor according to the first modification of the second embodiment having been described by reference to FIG. 44. The code entering unit 212A is provided correspondingly to the structure of the encoder (refer to FIG. 46).

For this, description of the same elements in FIG. 48 as those in FIG. 44 is omitted here.

When an ESC (an escape code) is decoded in the decoding process of data having been encoded in the encoder, the code entering unit 212A enters a code of this decoded data to all code tree corresponding to a context.

In addition to the operation of the decompressor shown in FIG. 44, the code entering unit 212A enters a code of a decoded data K to all the code trees corresponding to the context when an ESC is decoded in the decoding of the encoded data K.

The above operation will be next described in more detail by reference to Steps L1 through L10 in FIG. 49.

Figure 49:
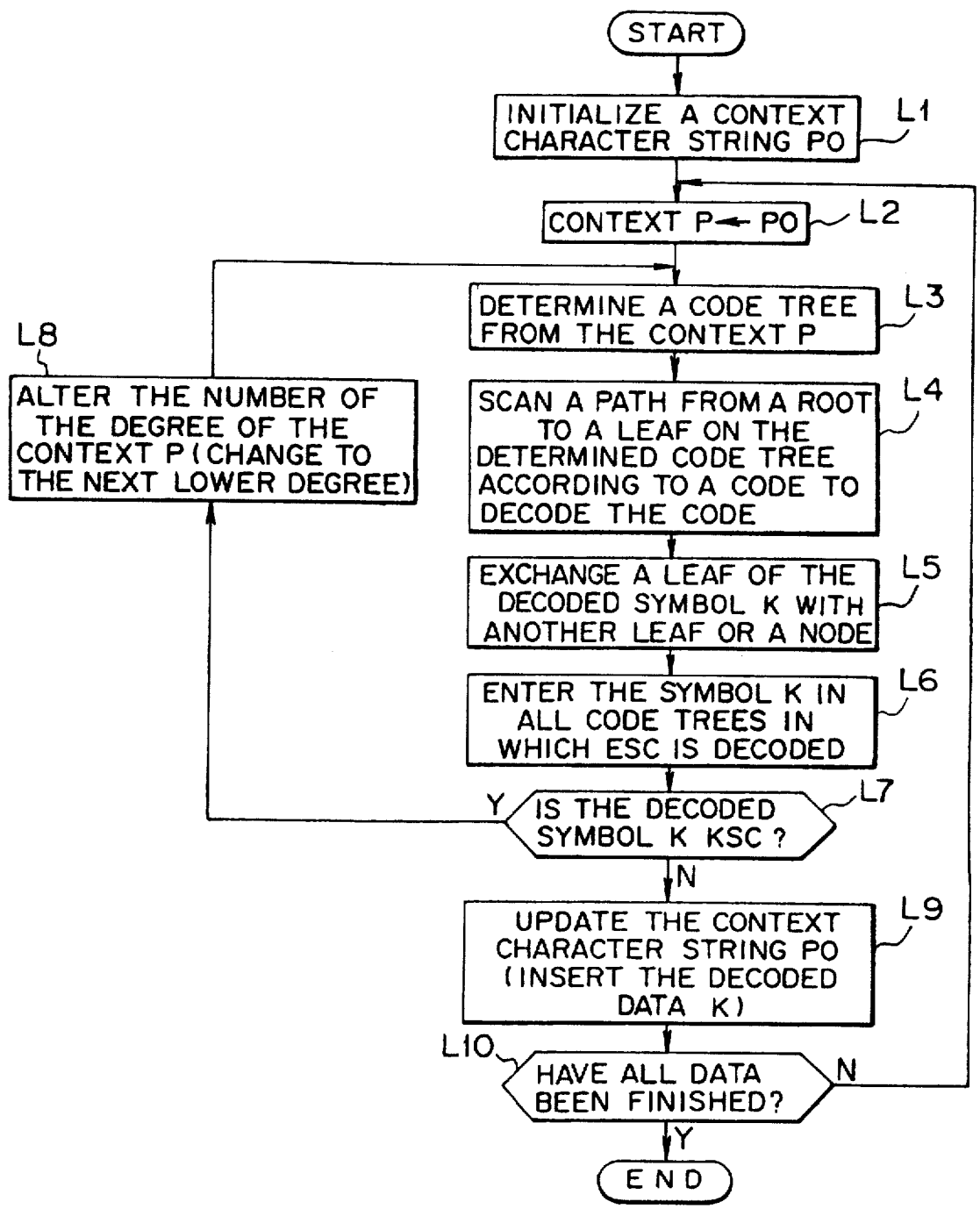
FIG. 49 is a flowchart illustrating a procedure for decoding according to the second modification of the second embodiment of this invention.

As shown in FIG. 49, there is performed at Steps L1 through L4 a process similar to the process at Steps J1 through J4, which has been described by reference to FIG. 45, performed in the decompressor according to the first modification of the second embodiment.

At Step L4, after the decoding unit 204A has decoded a code, the code tree updating unit 205A exchanges a leaf of the decoded symbol K with another leaf or internal node (Step L5).

If the ESC (the escape code) has been decoded in the past and the code tree updating unit 205A has received an ESC signal form the decoding unit 204A at this point of time, the code tree updating unit 205A enters the symbol K in all the code trees in which this ESC has been stored (Step L6).

It is decided whether the decoded symbol K is an ESC or not (Step L7). If the decoded symbol K is an ESC, an ESC signal representing that the decoded symbol K is an ESC is transmitted to the context altering unit 210A and the code entering unit 212A. The context altering unit 210A having received this ESC signal changes the degree of the context P to the next lower degree to alter it (YES route at Step L7 to Step L8).

The procedure then goes back to Step L3 and the process is repeated until the symbol K excepting an ESC is decoded.

As in the above manner, if the symbol K decoded in the decoding unit 204A is an ESC, the code entering unit 212A generates a new leaf on the code tree. If the decoding unit 204A decodes the symbol K excepting an ESC, this symbol K is stored in all leaves newly generated, whereby said symbol may be entered to all the code trees in which the ESC has been decoded.

If the symbol K is not an ESC at the above Step L7, the context updating unit 206A discards the oldest data (data retained in the pre-data retaining unit 200A-n), and enters the decoded symbol K as a context into the pre-data retaining unit 200A-1 so as to update the context character string P0 (Step L9).

A check is then made on whether all the data have been decoded or not (Step L10). If not decoded, the process from Step L2 is repeated (No route at Step L10). If decoded, the decoding process is terminated (YES route at Step L10).

As above, if the decoding unit 204A decodes an ESC, the code tree entering unit 212A newly enters the symbol K in the code tree in the decoder as same as in the encoder.

The data restoring apparatus according to the second modification of the second embodiment of this invention may give the same effect as the decoder according to the first modification of the second embodiment. In addition to that, a code of a symbol to be decoded is entered in the code tree while a code of an escape code is decoded so that a symbol not having been stored in the code tree may be decoded in an early stage in the next decoding, as same as in the encoder. This allows an enhancement of the decompression effect as the decoding process on data such as characters proceeds further, and a large reduction of a processing load on the data decompressing apparatus.

(b-3) Description of Third Modification of Second Embodiment

The next description will be of a third modification according to the second embodiment of this invention.

(1) Description of Encoder

In a data compressing apparatus 3 according to the third modification of this embodiment, if an ESC is decoded even once during encoding of the data K, the context altering unit 110A as a history entering means enters a combination of a context immediately before the encoding of this data and this data in the context history retaining unit 101A, and the code entering unit 112A newly enters the data in the code tree that has an escape code decoded immediately before the encoding of this data, differently from the above-described second modification of the second embodiment.

The above operation will be next described in more detail by reference to Steps M1 through M13 shown in FIG. 50.

Figure 50:
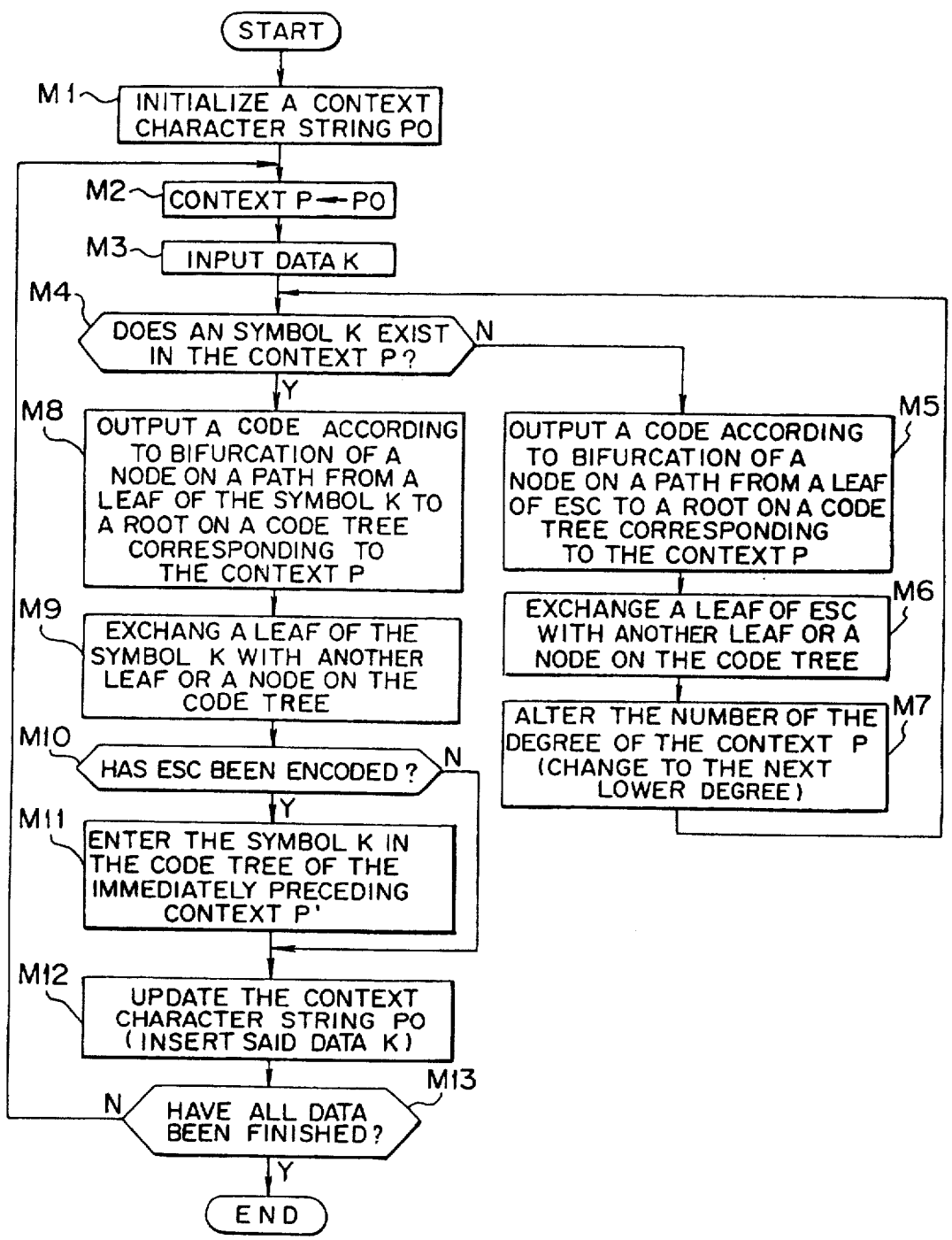
FIG. 50 is a flowchart illustrating a procedure for encoding according to a third modification of the second embodiment of this invention.

As shown in FIG. 50, a process at Steps M1 through M9 is similar to Steps H1 through H9 shown in FIG. 43 according to the first modification of the second embodiment.

If the symbol K of the input data is stored in the context P (YES route at Step M4), the procedure advances to Step M9 via Step M8, where the code tree is reshaped. Thereafter, a check is made on whether the symbol K encoded by the decoding unit 104 at Step M8 s an ESC or not (Step M10).

If the encoded symbol K is an ESC, the code entering unit 112A enters the symbol K to a code tree corresponding to the context P' immediately before the encoding of the symbol K (YES route at Step M10 to Step M11). The context updating unit 106A enters the context P including the symbol K as the latest context in the pre-data retaining unit 100A-1.

From this information, the context altering unit 110A inserts the data K in the context character string P0 to update it (Step M12), and enters it in the context history retaining unit 101A.

Namely, since the data K is stored in the code tree of the context P' immediately before the encoding of the data K at Step M11 (that is, a context encoded last), the context altering unit 106A enters a combination of the data K and the context P' immediately before the encoding of the data K in the context history retaining unit 101A.

If the encoded symbol K is not an ESC (No route at Step M10), the procedure jumps over Step M11 and advances to the above Step M12.

A check is then made on whether the decoding of all the data is finished or not (Step M13). If not finished (NO route at Step M13), the process goes back to Step M2, and the process is repeated until the encoding of all the data is finished. If finished, the encoding process is terminated (YES route at Step M13).

As above, the data compressing apparatus according to the third modification of the second embodiment of this invention may give the same effect as the encoder according to the second modification of the second embodiment. In addition to that, if a symbol is not included in a context entered in advance, this symbol is entered to only a code tree of an escape code encoded last so that a volume of a storage used to enter new context therein may be largely reduced. This may improve a performance of the data compressing apparatus to a large extent.

Further, a node of a code tree of a newly entered symbol is exchanged every time the same symbol is entered later so as to shorten the code length (in the splay process). It is therefore possible to shorten a code length of a code of only a symbol that actually occurs frequently. This may largely improve the compression effect of the data compressing apparatus.

(2) Description of Decoder

In the data decompressing apparatus according to the third modification of this embodiment, differently from the data decompressing apparatus shown in FIG. 48, the context altering unit 210A as the history entering means, enters a context at the time of the last decoding of an ESC (an escape code) in the decoding process of the encoded data K having been encoded in the encoder and the data K in the context history retaining unit 201A, and the code entering unit 212A enters a code of the data K to a code tree corresponding to the context at the time of the last decoding of the ESC in the decoding process of the data K.

The above operation will be next described in more detail by reference to Steps N1 through N10 in FIG. 51.

Figure 51:
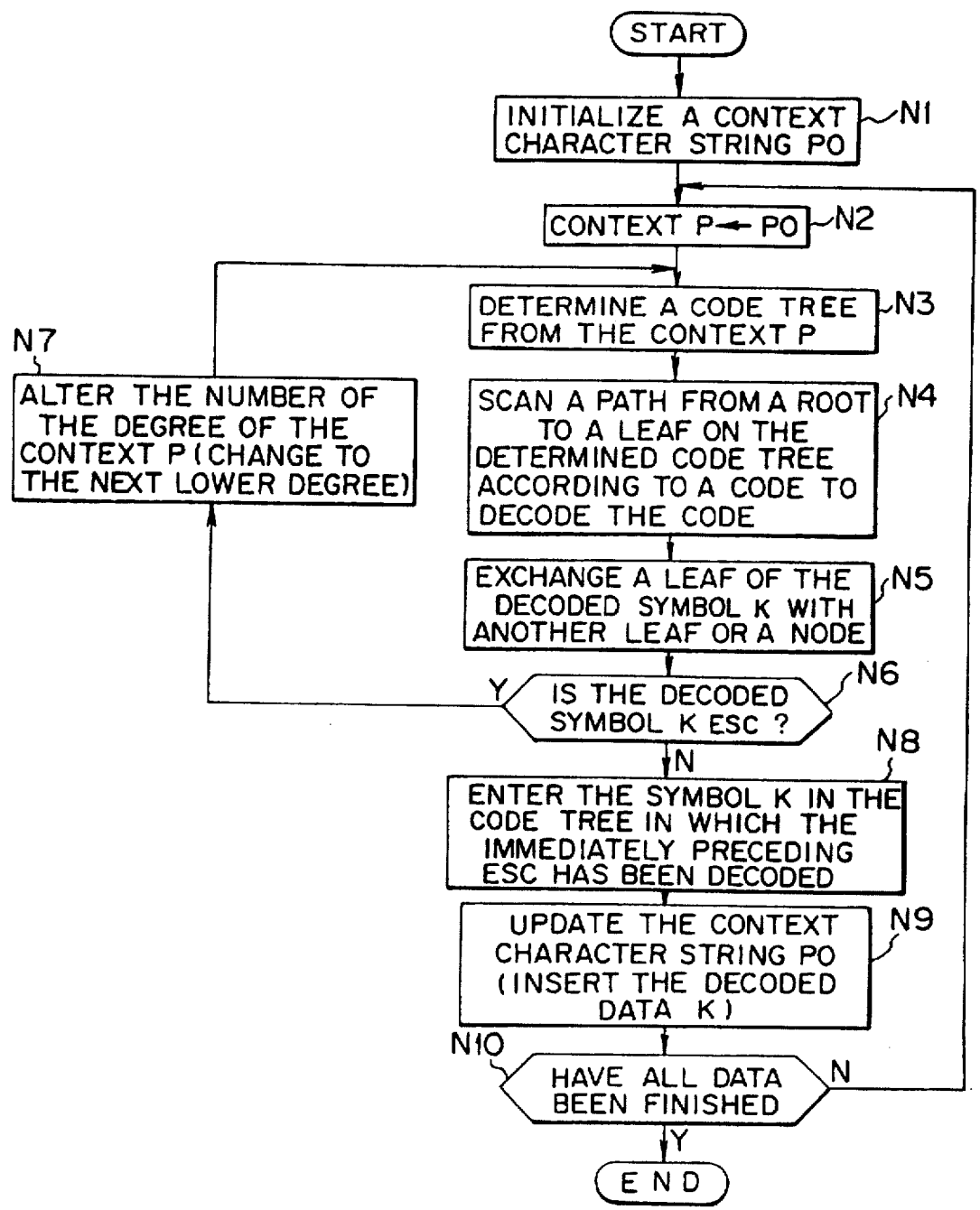
FIG. 51 is a flowchart illustrating a procedure for decoding according to the third modification of the second embodiment of this invention.

As shown in FIG. 51, a process at Step N1 through N5 is similar to that at Steps K1 through K5 shown in FIG. 49 having been described in connection with the above decompressor according to the second modification of the second embodiment.

In the decompressor according to this embodiment, a leaf of the symbol K having been decoded at Step N5 is exchanged with another leaf or internal node, a check is then made on whether the decoded symbol K is an ESC or not (Step N6).

If the decoded symbol K is an ESC, the number of the degree of the context P is altered (YES route at Step N6 to Step N7). The process returns to Step N3, and the process is repeated until the symbol K excepting an ESC is decoded.

If the decoded symbol K is not an ESC, the code tree updating unit 205A generates a new leaf on only a code tree in which an ESC immediately before has been decoded. The code tree entering unit 212A enters the symbol K in the new leaf on this code tree (NO route at Step N6 to Step N8).

The context updating unit 206A discards the oldest data (data retained in the pre-data retaining unit 200A-n), and enters the decoded symbol K as a context in the pre-data retaining unit 200A-1 so as to update the context character string P0 (Step N9).

A check is made on whether decoding of all the data is finished or not (Step N10). If not finished, the process from Step N2 is repeated (NO route at Step N10 to Step N2). If not finished, the decoding process is terminated.

The data decompressing apparatus according to the third modification of the second embodiment gives the same effect as the decompressor according to the second modification of the second embodiment. In addition to that, if a symbol is not contained in a context entered beforehand, a code of this symbol is newly entered in only a code tree of an escape code having been decoded last so that only one entry is necessary for one symbol at all times. This may largely reduces a volume of a storage used to manage nodes IDs for entering codes of a new symbols, improving largely the performance of the data decompressing apparatus.

Further, a node on the code tree in which a new symbol is stored is exchanged every time the same symbol is entered later to decrease the code length (in the splay process) so that only a symbol that actually occurs frequently may has a code of a shorter length. This may largely enhance the decompression effect of the data decompressing apparatus.

(3) Description of Third Embodiment of the Invention

Description will be next made of a third embodiment of this invention. A data compressing apparatus and a data decompressing apparatus according to this embodiment are served to carry out the data compressing method and the data decompressing method of this invention as shown in FIG. 32, as same as the second embodiment.

As same as in the second embodiment, the data compressing apparatus will be referred as an encoder and the data decompressing apparatus will be reference as a decompressor. A context tree and a code tree appearing in the following description have the same structures as those according to the first embodiment.

(1) Description of Encoder

Figure 52:
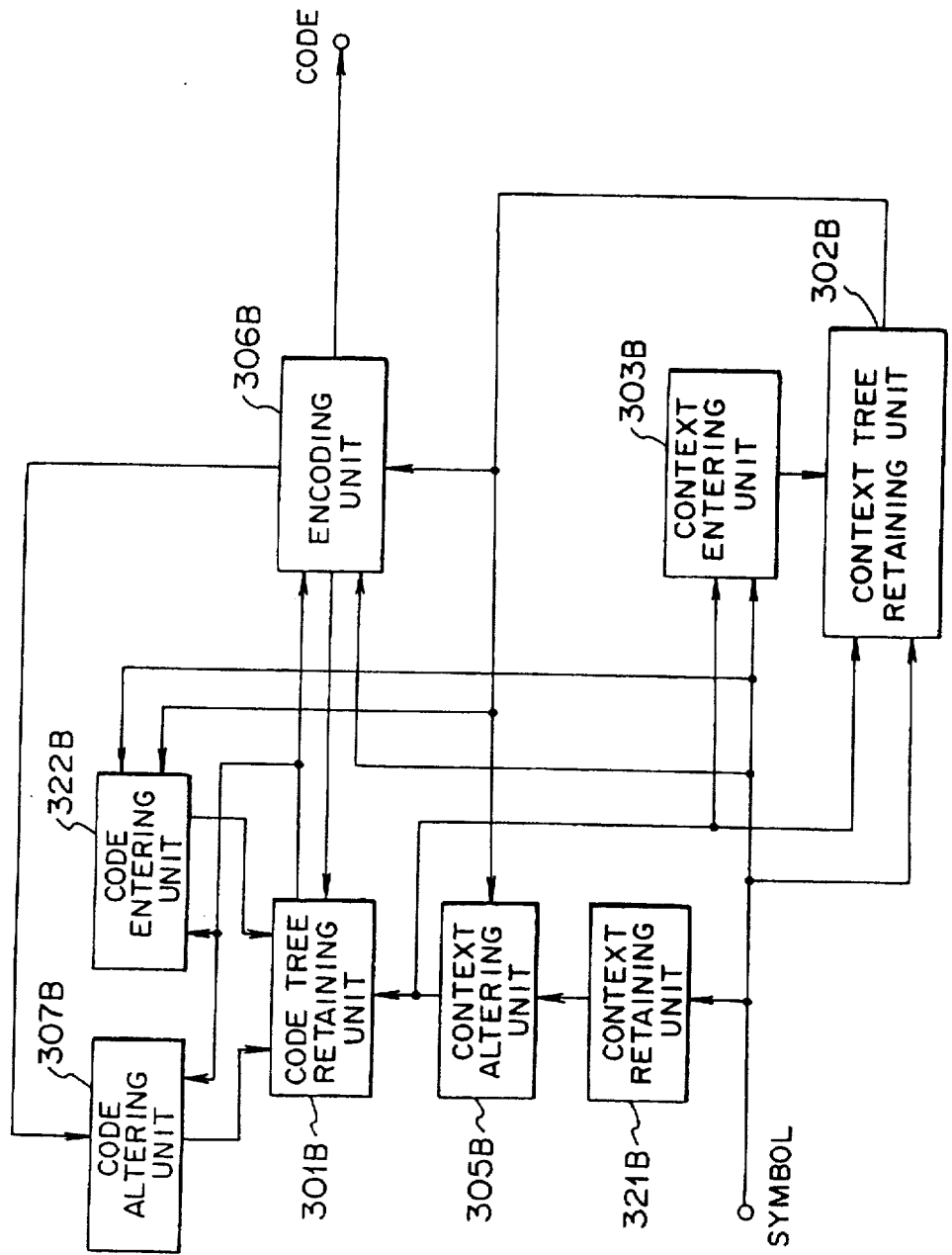
FIG. 52 is a block diagram of a data compressing apparatus according to a third embodiment of this invention.

FIG. 52 is a block diagram showing an internal structure of a data compressing apparatus 3 (refer to FIG. 32) served to carry out a data compressing method according to the third embodiment of this invention. In FIG. 52, reference numeral 301B denotes a code tree retaining unit, 302B denotes a context tree retaining unit, 303B denotes a context entering unit, 305B denotes a context altering unit, 306B denotes an encoding unit, 307B denotes a code altering unit, 321B denotes a context retaining unit and 322B denotes a code entering unit.

The code tree retaining unit (a code tree retaining means) 301B retains a code tree in which an escape code (ESC) is entered beforehand (that is, data representing that data is unentered). The context tree retaining unit (a context tree retaining means) 302B retains a context tree in which a combination of a symbol K (input data) and a context.

The context entering unit (a context entering means) 303B newly enters the symbol K to a context tree after the escape code has been encoded. The context tree retaining unit 321B temporarily retains the inputted symbol K.

After the escape code has been encoded, the code entering unit (a code entering means) 322B branches a leaf (a point to store data therein) of the escape code on the code tree retained in the code tree retaining unit (the code tree retaining means) 301B to newly enter the symbol K.

To this end, the code entering unit 322B includes a new node ID generating unit 61, a latch 62, and a parent information updating unit 63, which will be described later by reference to FIG. 53. Inside the code tree retaining unit 301B, there are provided an external node (leaf ID) retaining unit 64, an internal node (node ID) retaining unit 65, an ESC-ID retaining unit 66 and a code tree managing unit 67.

The context altering unit 305B alters a context if a combination of a symbol K and a context is not retained in the context tree.

The encoding unit 306B outputs a code expressed with "1" and "0" according to bifurcation from a top of the code tree to a leaf in which the symbol K or an escape code is stored.

The code updating unit 307B exchanges leaves in which the encoded symbol K and an escape code are stored with another leaves or an internal node.

Figure 53:
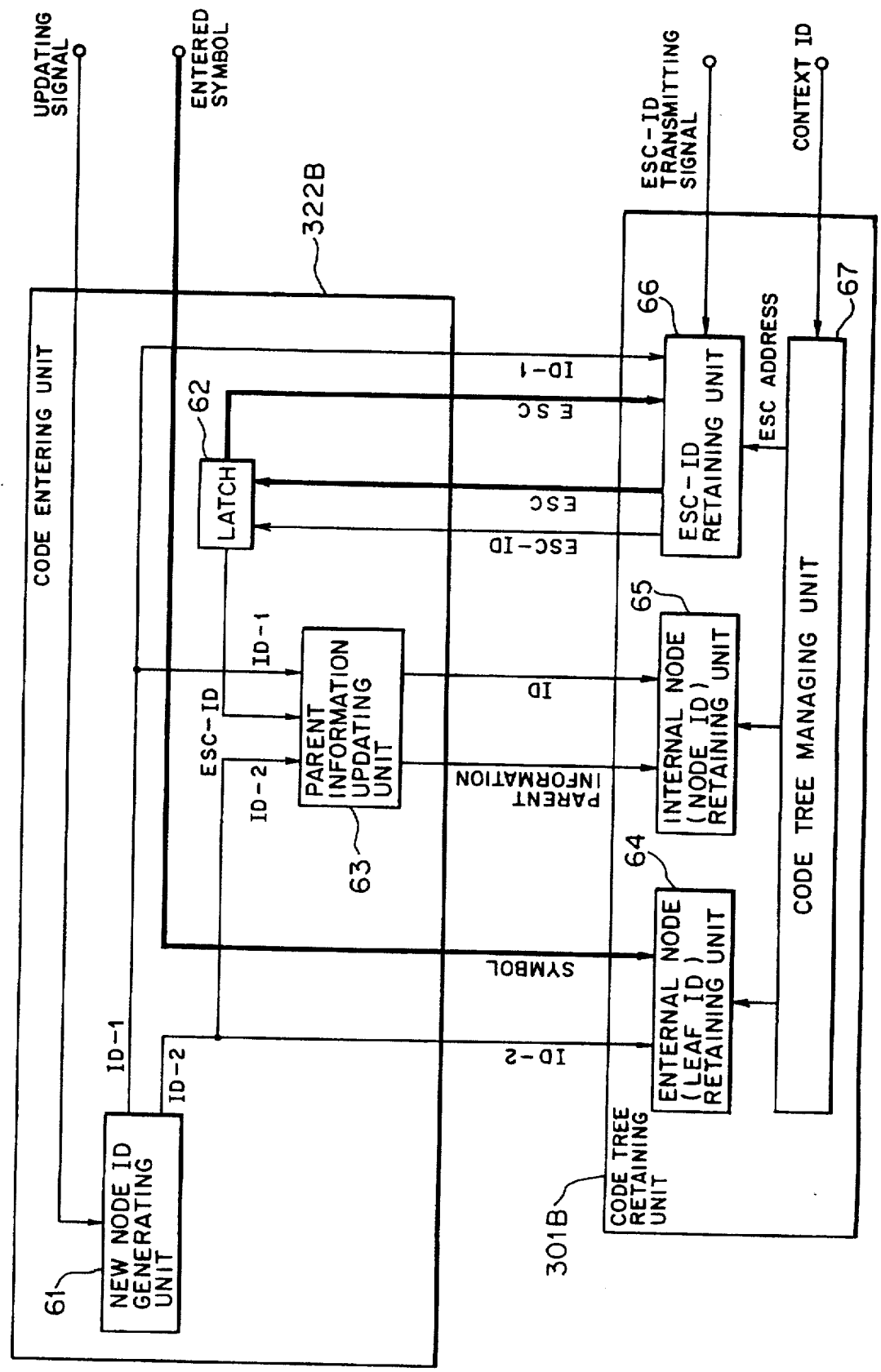
FIG. 53 is a block diagram of a code entering unit and a code tree retaining unit according to the third embodiment of this invention.

As shown in FIG. 53, inside the code entering unit 322B, the new node ID generating unit 61 generates two new node IDs (ID-1, ID-2) when receiving an updating signal from the context retaining unit 302B. The latch 62 temporarily retains an ID (ESC-ID) of an escape code.

The parent information updating unit 63 receives parent information composed of three sorts of information (ESC-ID, ID-1 and ID-2), a node ID of a higher degree node of a node that is an object of the process, a node ID of a lower degree node positioning on the lower right side, and a node ID of a lower degree node positioning on the lower left side, updates this parent information, and sends it to the code tree retaining unit 301B.

In the code tree retaining unit 301B, the external node (leaf ID) retaining unit 64 retains leaf IDs of leaves on a code tree in each of which data is stored, the internal node (node ID) retaining unit 65 retains a node IDs of nodes of a code tree, and the ESC-ID retaining unit 66 retains an escape code of a code tree and an ID of this escape code.

The code tree managing unit 67 receives a context ID from the context tree retaining unit 302B, and sends this context ID to the external node (leaf ID) retaining unit 64, the internal node (node ID) retaining unit 65 and the ESC-ID retaining unit 66.

In the data compressing apparatus 3 with the above structure according to the third embodiment of this invention, the code retaining unit 301B retains a code tree in which an escape code is beforehand stored, the context tree retaining unit 302B retains a context tree in which a combination of a symbol K and a context P is stored, and the context entering unit 303B decodes the escape code, then newly enters the symbol K in the context tree.

The context retaining unit 321B temporarily retains the context P. The code entering unit 322B then encodes the escape tree, branches a leaf of the escape code on the code tree, and newly enters the symbol K.

The context altering unit 305B alters the context P if a combination of the inputted symbol K and the context P is not stored in the context tree.

The encoding unit 306B outputs a code according to bifurcation of a path from a top of the code tree to a leaf in which input data or an escape code is stored. The code updating unit 307B exchanges leaves in which encoded data and an escape code are stored with another leaves or a node.

Figure 57:
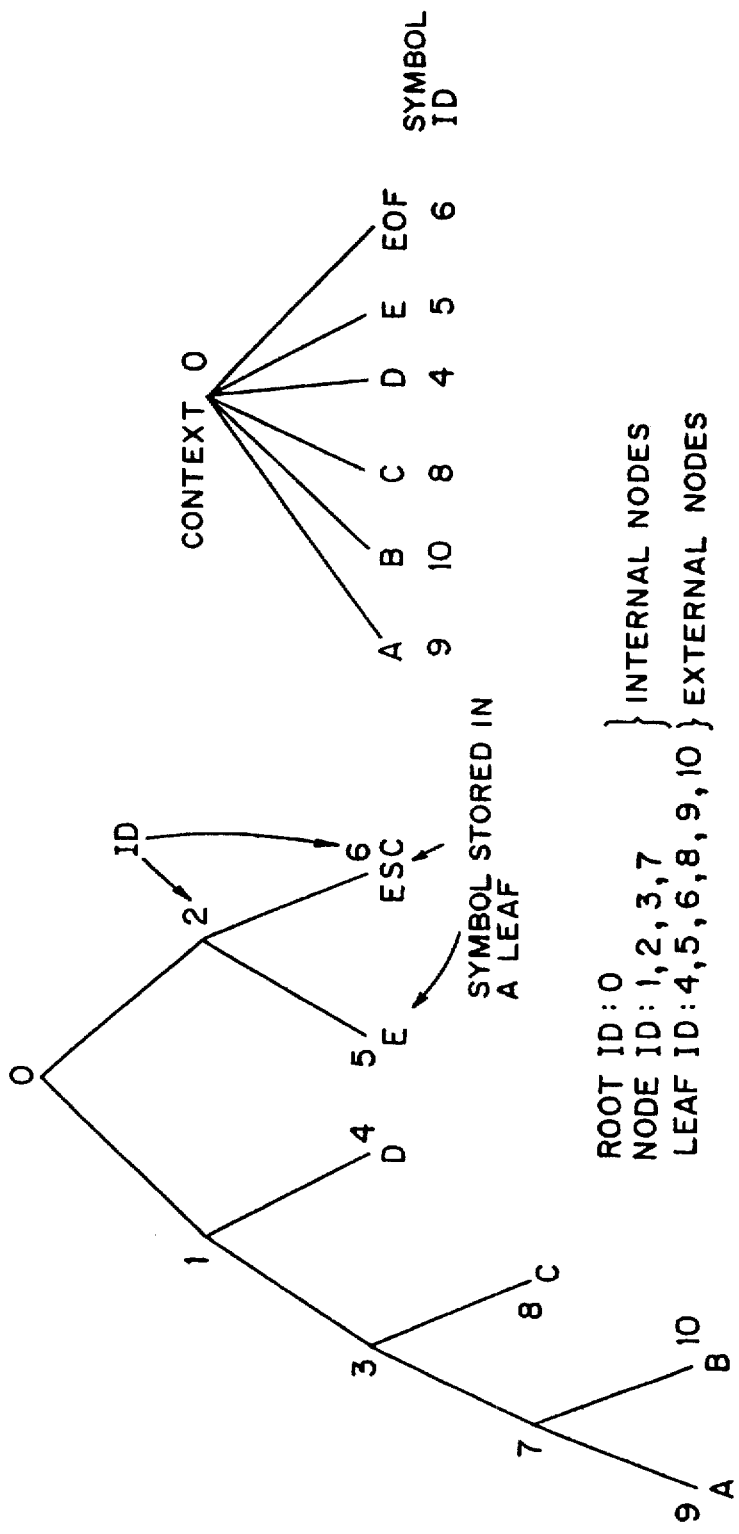
FIGS. 57(a) and 57(b) show examples of a code tree and a context tree, respectively.

FIG. 57(a) shows an example of a code tree, while FIG. 57(b) shows an example of a context tree. As shown in FIG. 57(a), the code tree has ID numbers (0–10) of a root and nodes as internal nodes and leaves as external nodes.

On the other hand, as shown in FIG. 57(b), the context tree has an ID of a context and ID numbers of symbols having been entered in the context. The ID number of the context is identical to an ID number of a root of the code tree, and the ID numbers of the symbols are identical to the ID number of leaves, respectively.

The above operation will be next described in more detail by reference to Steps P1 through P16, which depicts an operation of the decompressor according to this invention shown in FIGS. 54 through 56.

In the following description of the operation, the code tree and the context tree are assumed to have the above-described structures.

Figure 54:
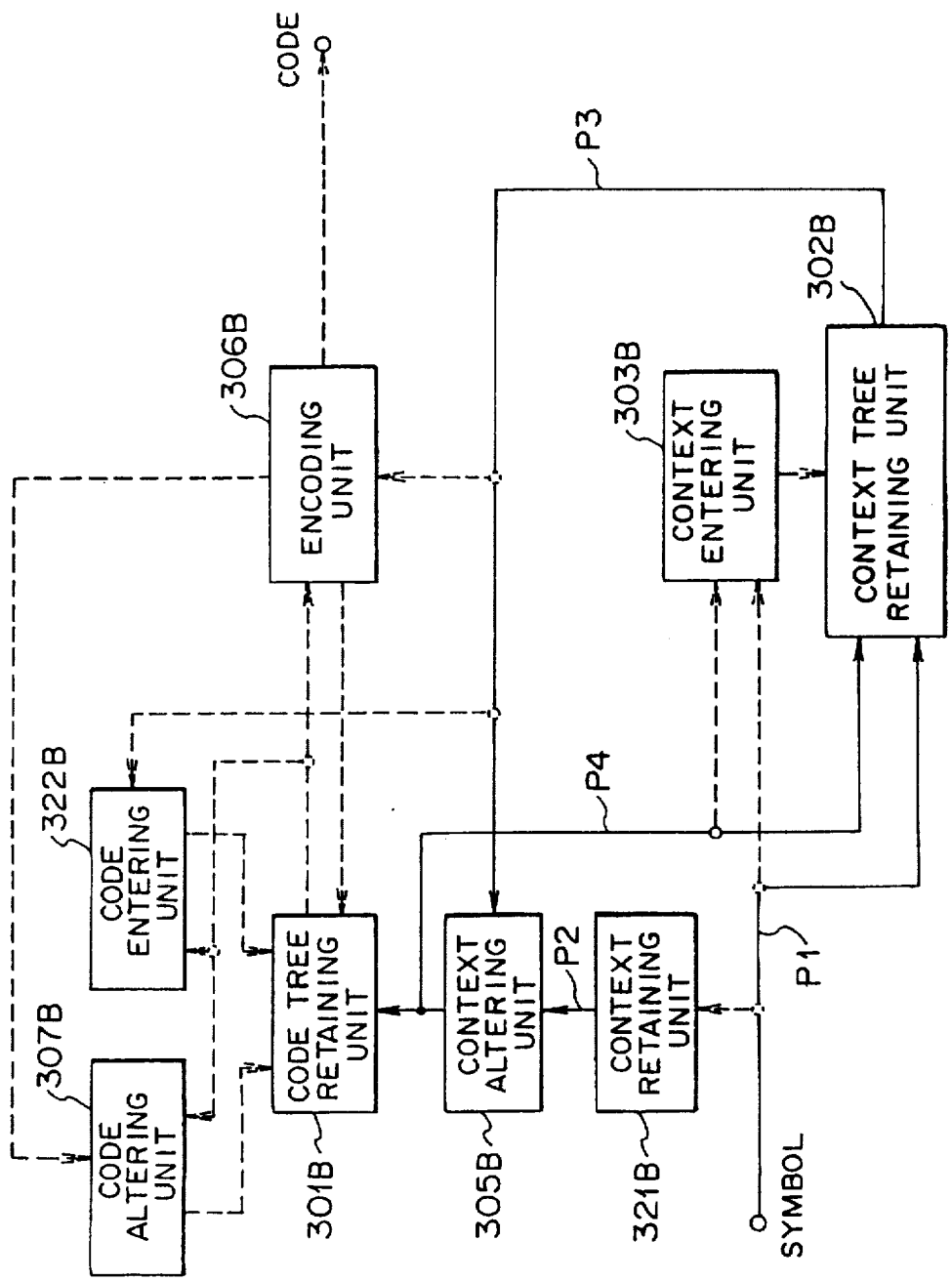
FIG. 54 depicts an operation of the data compressing apparatus according to the third embodiment of this invention.

As shown in FIG. 54, when a symbol K is inputted (Step P1), a context P retained in the context retaining unit 321B is outputted to the context altering unit 305B (Step P2).

The context altering unit 305B receives the context P and the symbol K, and makes a decision whether the symbol K is stored in the context P or not. If the symbol K is not stored in the context P, the context tree retaining unit 302B outputs a context altering signal to the context altering unit 305B (Step P3).

The context altering unit 305B, in response to the context altering signal, discards a character in the highest degree (that is, a leaf having the longest distance from the root on the context tree), and sends the context P in the next lower degree to the context tree retaining unit 302B (Step P4).

This process is repeated until a context P in which the symbol K is stored is determined.

Figure 55:
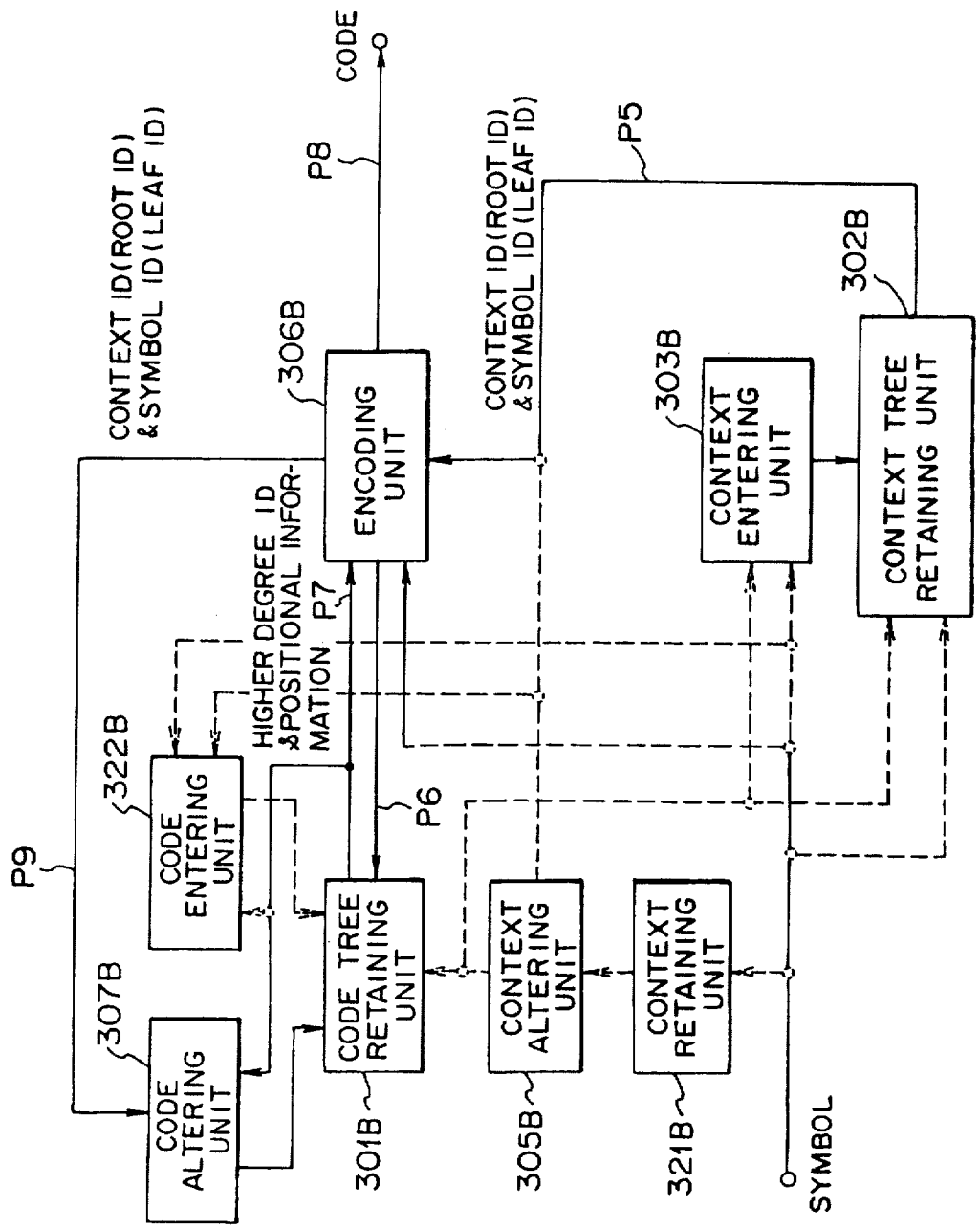
FIG. 55 depicts the operation of the data compressing apparatus according to the third embodiment of this invention.

As shown in FIG. 55, the context tree retaining unit 302B sends an ID (number) of the context P and an ID of the symbol K (or an ESC, if the symbol K is not stored) to the encoding unit 306B (Step P5). The encoding unit 306B transfers the received ID as it is to the code tree retaining unit 301B (Step P6).

The code tree retaining unit 301B sends in ID number of a higher degree node of the received ID and information of whether the ID fed from the encoding unit 306B positions on the left side or the right side of the higher degree node to the encoding unit 306B (Step P7).

The encoding unit 306B outputs "1" as a code if the ID positions on, for example, the right side, or "0" as a code if the ID positions on the left side, according to the positional information about a node having the ID fed from the encoding unit 306B (Step P8).

If the ID of the higher degree node fed along with the above positional information coincides with an ID (root ID) of the context P fed from the context retaining unit 302B, the encoding process is terminated.

If they are not in coincidence, the encoding unit 306B outputs the ID of that context P to the code altering unit 307B (on the same route at Step P6), obtains a higher degree node ID and its positional information from the code tree retaining unit 301B.

The above process is repeated until an ID number of the higher degree node fed from the code tree retaining unit 301B coincides with an ID of the context P.

After completion of this process, the code altering unit 307B receives an ID of the context P (that is, a root ID of the code tree) and a leaf ID of the encoded symbol K from the encoding unit 306B (Step P9), exchanges these nodes (in the splay process) so as to update the code length. This node exchanging process is performed in the same manner as in the first and second embodiment.

In the case where the symbol K has been inputted and stored in the context P, if the symbol K is further inputted, a node of the symbol K having been stored is exchanged with a higher degree node so as to reduce the code length to a half (½).

Figure 56:
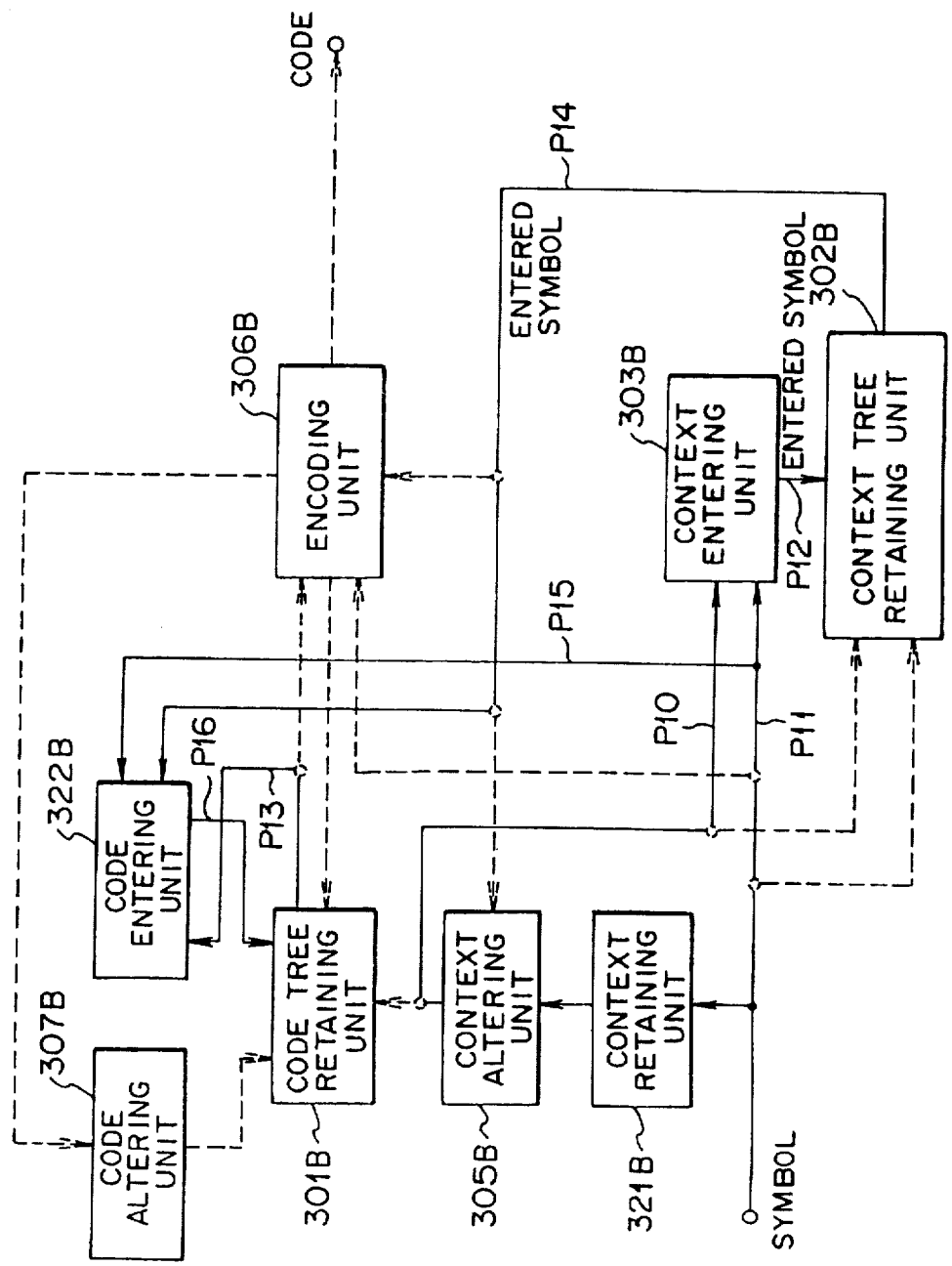
FIG. 56 depicts the operation of the data compressing apparatus according to the third embodiment of this invention.

If the symbol K is not stored in the above context P, the context entering unit 310B, as shown in FIG. 56, receives a context P to be entered from the context altering unit 305B (Step 10). Along with that, the context entering unit 310B receives the symbol K (Step P11), and outputs an ID Of the entered symbol to the context retaining unit 302B (Step P12). the context retaining unit 302B newly enters the symbol K below the context P.

On the other hand, the code entering unit 322B receives a code tree to be entered a code therein from the code tree retaining unit 301B (Step P13). The code entering unit 322B also receives the symbol K to be entered and an ID of the symbol to be entered from the context tree retaining unit 302B (Steps P14 and P15), newly enters the symbol K in the code tree, and stores it again in the code tree retaining unit 301B (Step P16).

As above, the symbol that has not been stored in the context P is entered (encoded).

The operation of the code entering unit 322B to encode the escape code, branch a leaf of the escape code of a code tree retained in the code tree retaining unit 301B to newly enter the symbol K (at Steps P13 through P16) will be next described in more detail by reference to FIG. 53.

To begin with, the code tree managing unit 67 provided in the code tree retaining unit 301B receives a context ID, and sends an ESC address of the context to the ESC-ID retaining unit.

The ESC-ID retaining unit 66 receives the ESC address, and outputs an ID of the ESC and a symbol (an ESC in this case) stored at this ID. The code entering unit 322B causes the latch 62 to latch the ESC-ID and the ESC.

The new ID generating unit 61 sends two ID numbers (ID-1 and ID-2) in response to an updating signal. An ID-1 is stored, along with the ESC latched as a new ESC-ID in the ESC-ID retaining unit 66 in the code tree retaining unit 301B.

In the code tree, there are stored IDs and parent information representing positional information of the IDs. This parent information composed of three sorts of information, that is, a higher degree node ID of its own, a node ID positioning on the lower right side of its own and a node ID positioning on the lower left side of its own.

The parent information updating unit 63 updates the parent information in response to the three IDs (that is, the ESC-ID, ID-1 and ID-2 before alteration). More specifically, there are entered information, that is, the ESC-ID is entered as a higher degree ID of the ID-1 and ID-2, the ID-1 is positioned on the lower right side of the ESC-ID, and the ID-2 is positioned on the lower left side of the ESC-ID.

The parent information is stored along with each ID in the node ID retaining unit 65 of the code tree retaining unit 301B.

On the other hand, an entered symbol and a new ID (ID-2) are entered in the leaf ID retaining unit 64 of the code tree retaining unit 301B.

Through the above process, the new ESC-ID (ID-1) is entered to the ESC, the old ESC-ID is retained as a node ID along with the parent information in the node ID retaining unit, the new ID (ID-2) and the symbol K are retained as a new leaf in the leaf ID retaining unit, and the symbol K is entered by branching a leaf on the code tree retained in the code tree retaining unit 301B, in which the escape code is stored. As this, a process to newly enter the symbol K is completed.

The operation having been described by reference to FIGS. 53 through 56 is summarized as a flowchart in FIG. 58.

First, "0" is inputted to a context $P_0$, and the context $P_0$ is initialized (Step Q1). The context $P_0$ is inputted as a variable to a context P (Step Q2). Incidentally, the context $P_0$ is a character (symbol) that has been inputted and encoded immediately before. For instance, if an encoding according to this embodiment is a model using a degree-(n-th) context, (n-1) characters that have been inputted and encoded up to immediately before is stored in the context $P_0$.

When the symbol K is inputted, a search is made on whether the symbol K is stored in the context tree of the context P (Step Q3).

If the the symbol K is not stored in the context tree of the context P, a code of an ESC (an escape code) is outputted (NO route at Step Q3 to Step Q4), and a leaf in which the ESC of a code tree corresponding to the context P is processed in the splay operation (Step Q5).

Then a leaf of the above ESC is branched (Step Q6). The ESC and the symbol K are entered in respective new leaves obtained by the branching (Step Q7). The symbol K is also entered in the context tree of the context P.

Further, after the symbol K has been entered as above, the oldest character in the context P is discarded. Next, a context P having the next lower degree is newly assigned as the context P so as to alter the context P (Step Q8).

Back to Step Q3, the process to successively alter the context P is continued until the symbol K is found to be stored in the context P.

If the symbol K is stored in the context tree of the context P, a code of the symbol K is outputted (YES route at Step Q3 to Step Q9), and a leaf of a code tree in which the symbol K is stored corresponding to this context P is processed in the splay operation (Step Q10).

After the encoding of the symbol K, the symbol K is additionally entered in the context $P_0$ so as to update the context $P_0$ (Step Q11). (For instance, the symbol K is additionally added to the context $P_0$ and the oldest character in the context $P_0$ is discarded.) A check is then made on whether the encoding of all characters (symbols) is finished or not (Step Q12). If not finished (NO route at Step Q12), the process goes back to Step Q2, and the process is repeated until the encoding of all characters is finished.

Figure 58:
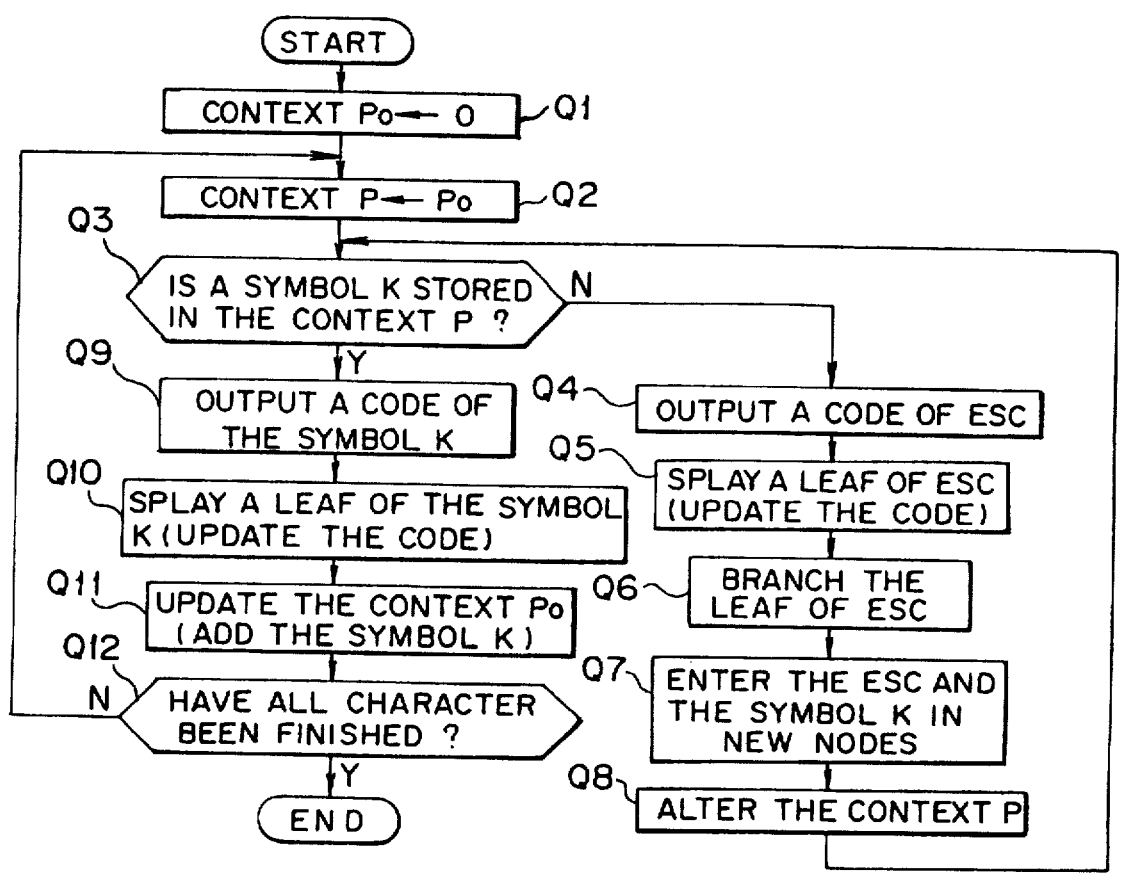
FIG. 58 is a flowchart illustrating a procedure for encoding according to the third embodiment.

In the above process shown in FIG. 58, a leaf of an ESC is processed in the splay operation after the ESC and the symbol K have been entered. The order of these process may perform reversely. In which case, the processing steps becomes as shown in FIG. 59.

Figure 59:
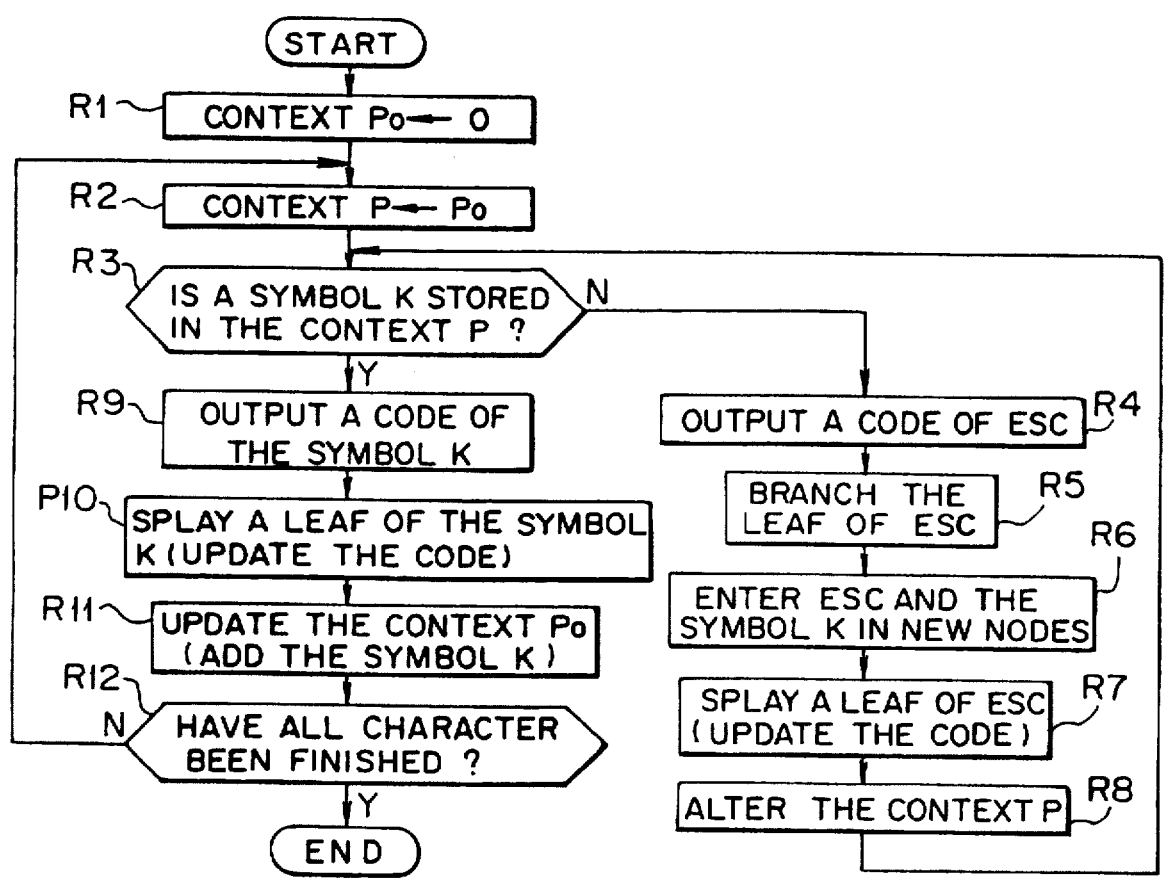
FIG. 59 is a flowchart illustrating a procedure for encoding according to the third embodiment.

As shown in FIG. 59, processes at Steps R1 through R3 and Steps R9 through R12 are similar to those at Steps Q1 through Q3 and Steps Q9 through Q12 in FIG. 58.

If the symbol K is not stored in the context P at Step R3, a code of the ESC is outputted (Step R4). Then, a leaf of the ESC is branched (Step R5), and the ESC and the symbol K are entered in new leaves (Step R6).

After the ESC and the symbol K have been entered as above, a leaf of the ESC is processed in the splay operation (Step R7).

As same as at Step Q8 in FIG. 58, the context P is altered (Step R12), and the process is repeated until the symbol K is detected at Step R3.

In the case where characters (symbols) A through E have been already encoded and entered in the code tree as shown in FIG. 60(a), if the symbol K is processed as a character F at the above Steps R1 through R12 (or Steps Q1 through Q12 in FIG. 58), a leaf of the ESC at the leaf numbered 6 is branched, and the ESC and the character F are entered in leaves numbered 11 and 12 which are newly generated.

For example, in the case where the context used in the above process is a degree-3 context, when the symbol K is encoded in degree-0 (at an initial state), the symbol K is entered in each of the degree-1, degree-2 and degree-3 contexts (hereinafter, a manner entering in all degrees will be referred as a full-entry type).

Steps N1 through N12 in FIG. 58 and Steps Q1 through Q12 in FIG. 59 show a process to enter the symbol K in the contexts of all degrees every time the ESC is encoded, as stated above. However, it is possible to enter the symbol K in only one context of a certain degree which has been encoded immediately before the symbol K is encoded (entered). In which case, a flowchart of this process is as shown in FIG. 61.

Figure 61:
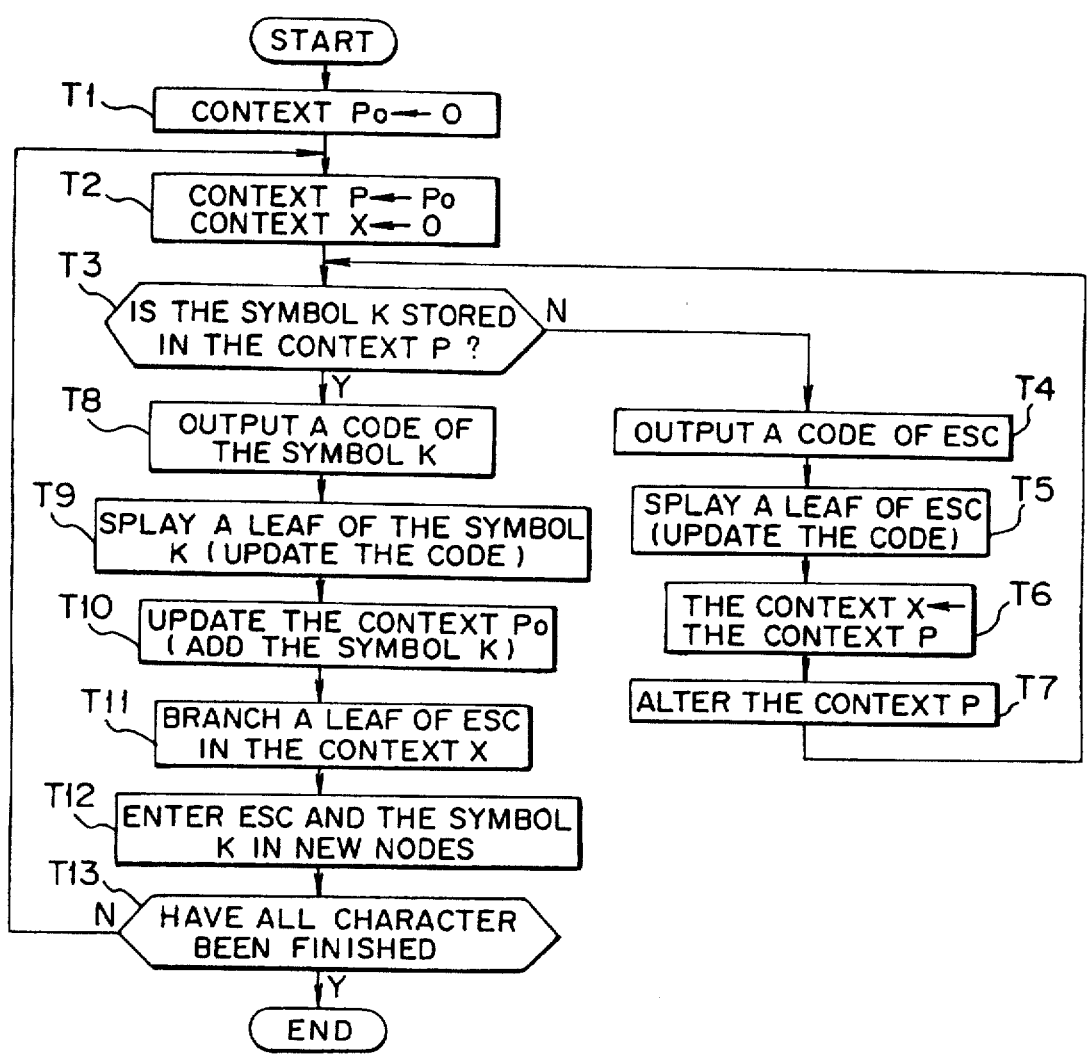
FIG. 61 is a flowchart illustrating another procedure for encoding according to the third embodiment of this invention.

More specifically, in the process shown in FIG. 61, a context $P_0$ is initialized and set to 0 (Step T1). The context $P_0$ is inputted to a context (a variable) P and 0 is inputted to a context (variable) X (Step T2).

A search is then made on whether a symbol K is stored in the context P or not (Step T3). If the symbol K is not stored in the context P, a process similar to that at the above-mentioned Steps Q4 and Q5 (refer to FIG. 58) is performed (NO route at Step T3 to Step T4, and Step T5).

Thereafter, the context P is inputted to the context X (Step T6). The context P is then altered (Step T7). The process is repeated until the symbol K is found to be stored in the context P.

If the symbol K is stored in the context P at the above Step T3, a process similar to that at Steps Q9 through Q11 (refer to FIG. 58) or at Steps R9 through R11 (refer to FIG. 59) is performed (Steps T8 through Thereafter, a leaf of an ESC of the context X is branched (Step T11). The ESC and the symbol K are entered in two new leaves obtained by the branching (Step T12).

A check is further made on whether the encoding of all characters (symbols) is finished or not (Step T13). If it is not finished, the process after Step T2 is repeated (NO route at Step T13). If finished, the encoding process is terminated (YES route at Step T13).

Through the above process, the symbol K is not entered in the contexts of all degrees but entered in only the context (context X) of a certain degree immediately before the symbol has been encoded (hereinafter, a manner to enter a symbol K to only a context of a degree immediately before the encoding of the symbol will be referred as a sequential-entry type).

In the data compression apparatus according to the third embodiment of this invention, if the symbol K is not stored in the context P, the escape code (ESC) at the time of branching and entering may have a code length of [(a code length of a leaf before branching)+1] bits, and the newly entered code and the escape code may have a code length of as small as 2 bits. In the case of data outputting a relatively large number of escape codes is dealt with, or in an initial stage in which dictionary entry (entry of symbols to a code tree) is insufficient, this invention may provide a high encoding rate.

The splay process performed before new entry of a symbol as above allows a code length of a code or an escape code to be as small as 2 bits, or the splay process performed after new entry of a symbol allows a code length of an escape code to be as small as 1 bit. It is therefore possible to largely improve an efficient of the encoding.

In the case of the above-mentioned sequential-entry type, the symbol is entered one by one at all times. If the same symbol occurs two or three times, the symbol is entered secondary or thirdly so that only a symbol having repeatability is entered in the higher degree of the code tree. In consequence, it is possible to prevent a decrease in encoding efficiency caused by existence of a symbol that has been once entered but is not frequently used, thereby improving largely the encoding efficiency after the sufficient number of symbols have been entered in the dictionary.

The sequential-entry type requires a storage capacity (a dictionary capacity) smaller than that required by the full-entry type.

(2) Description of Decoder

Figure 62:
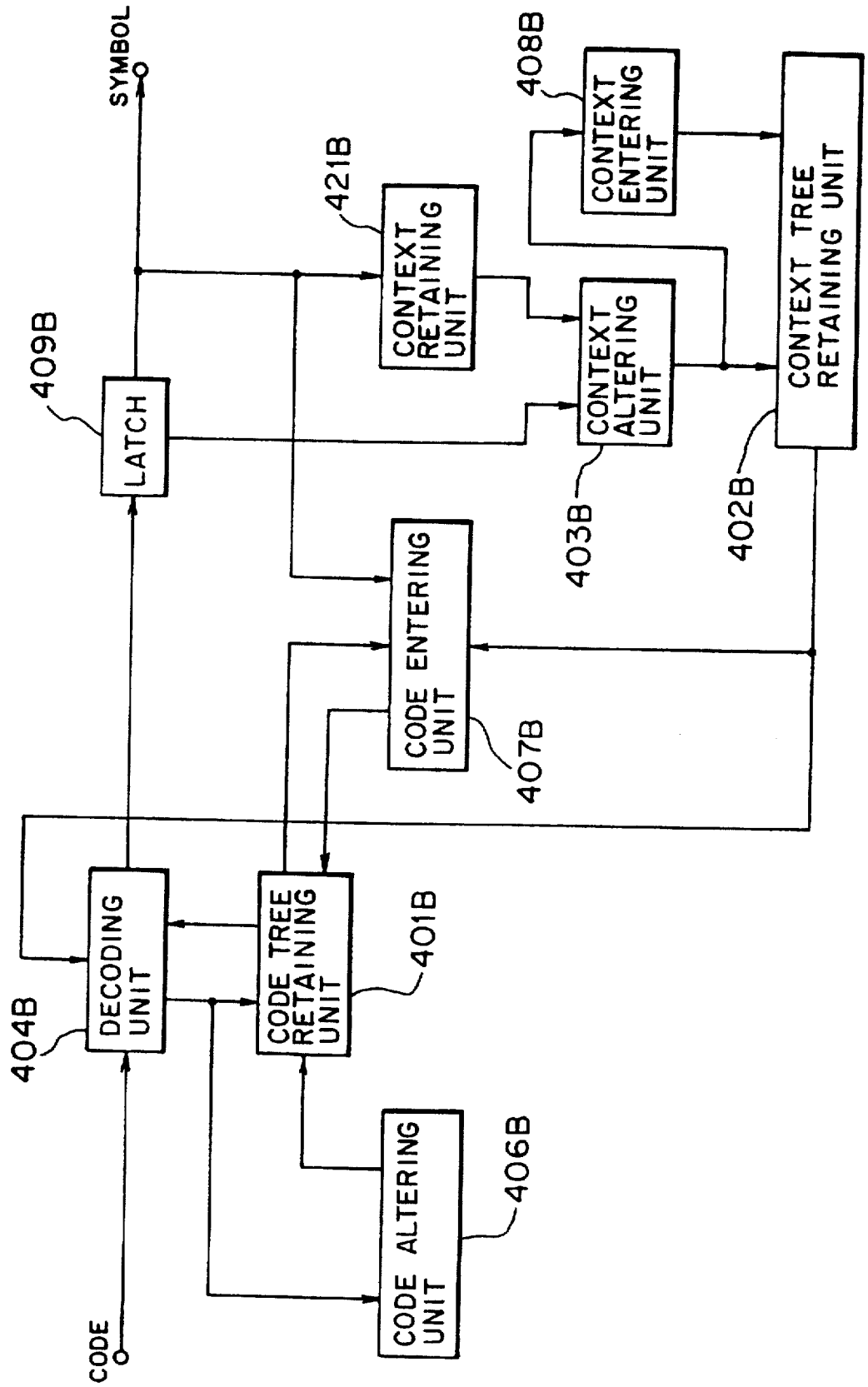
FIG. 62 is a block diagram of the data decompressing apparatus according to the third embodiment of this invention.

FIG. 62 is a block diagram showing an internal structure of the data decompressing apparatus 4 (refer to FIG. 32) served to carry out the data decompressing method according to the third embodiment of this invention. In FIG. 62, reference numeral 401B denotes a code tree retaining unit, 402B denotes a context tree retaining unit, 403B denotes a context altering unit, 404B denotes a decoding unit, 407B denotes a code entering unit, 408B denotes a context entering unit, 409B denotes a latch and 421B denotes a context retaining unit.

The code tree retaining unit (a code tree retaining means) 401B retains a code tree in which an escape code (ESC) (that is, a data representing that no data is not stored) is entered beforehand. The context tree retaining unit (a context tree retaining means) 402B retains a context tree in which a combination of a decoded symbol (data) and a context.

The context altering unit 403B searches a context tree retained in the context tree retaining unit 402B, and alters the context if a reached leaf is an escape code. When inputted a symbol K having been encoded in the encoder, the decoding unit 404B decodes a code of the symbol K by scanning a path from a root (a top) of a code tree retained in the code tree retaining unit 401B to a leaf (a data storing point) according to the code of the symbol R.

The code altering unit 406B exchanges leaves of the decoded symbol K and the escape code with another leaves or a node that is a bifurcation point.

The code entering unit (a code entering means) 407B, which functions as a code tree determining means, determines a code tree retained in the code tree retaining unit 401B in which a code of the symbol K is stored, from a symbol having been decoded up to immediately before the decoding of the symbol K. When an escape code is encoded, the code entering unit 407B branches a leave of the escape code stored in that code tree to generate a new leaf, and newly enters the decoded symbol K in this leaf.

To this end, the code entering unit 407B and the above-mentioned code tree retaining unit 401 have the same internal structures (refer to FIG. 53) as those of the code entering unit 322B and the code tree retaining unit 301B in the compressor (refer to FIG. 52).

The context entering unit 408B enters the symbol K having been entered by the code entering unit 407 in a context tree retained in the context tree retaining unit 402B. The latch 409B temporarily retains the symbol K having been encoded in the encoding unit 404B. The context retaining unit 421B retains the encoded symbol K.

The above-mentioned code tree retaining unit 401B can retain a code tree in which an escape code has been beforehand stored. The context tree retaining unit 402B can retain a context tree in which a combination of the decoded symbol K and a context P is stored.

The context altering unit 403B can alter a context if a reached leaf is an escape code. The decoding unit 404B can decode a code of the symbol K by scanning a path from a root to a leaf of a code tree according to a code of the encoded symbol K.

The code altering unit 406 serving also as a code tree determining means can determine a code tree, in which a code of the symbol K is retained, from a symbol having been decoded up to immediately before, and exchange leaves of the decoded symbol K and an escape code with another leaves or an internal node.

When the code entering unit 407B decodes an escape code, a leaf of the escape code is branched to generate a new leaf, and the decoded symbol K is newly entered in this new leaf.

The context entering unit 408B can enter the symbol K having been entered by the code entering unit 407B in a context tree retained in the context tree retaining unit 402B. The latch 409B can temporarily retain the symbol K having been decoded by the decoding unit 204B. The context retaining unit 421B can temporarily retain the symbol K having been decoded by the decoding unit 204B.

The above operation will be next described in more detail by reference to Steps U1 through U14 showing an operation of the decompressor in FIGS. 63 and 64.

Figure 63:
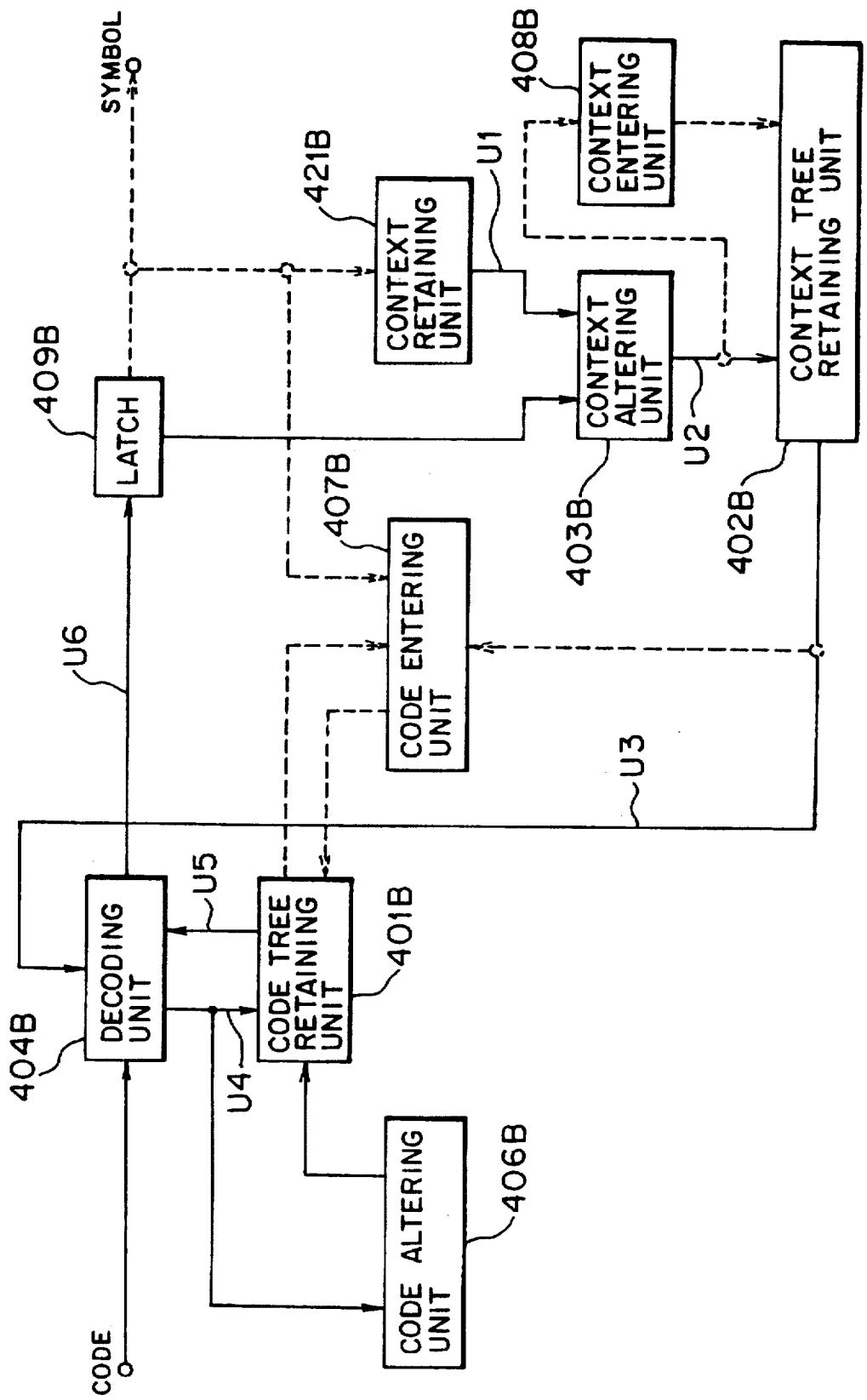
FIG. 63 depicts an operation of the data decompressing apparatus according to the third embodiment of this invention.

As shown in FIG. 63, the context retaining unit 421B retains symbols (a context) that have been encoded up to that time, and outputs them to the context altering unit 403B (Step U1). The context altering unit 403B outputs the context fed from the context retaining unit 421B as it is to the context tree retaining unit 402B in the first time (Step U2).

The context tree retaining unit 402B outputs an ID of the context, that is, a root ID, fed from the context altering unit 403B to the decoding unit 404B (Step U3). At this time, the decoding unit 404B demands an ID of a node positioning on the lower right side if a code (1 bit) is, for example, "1" for the supplied root ID, or for an ID of a node positioning on the lower left side if a code is "0" from the code tree retaining unit 401B (Step U4).

The code tree retaining unit 401B sends a node ID of a demanded node (or leaf) as a response to the decoding unit 404B (Step U5).

The encoding unit 404B and the code tree retaining unit 401B repeat the above process until obtaining a leaf ID of a leaf that is an end of the code tree.

More specifically, the decoding unit 404B traces a code tree retained in the code tree retaining unit 401B according to a code having been encoded in the encoder until reaching a leaf in which the symbol K to be decoded is stored.

When finding a leaf that is an object, the decoding unit 404B decodes this leaf. The code altering unit 406B processes this decoded leaf in the splay operation as same as in the encoder to update the code length.

If the symbol that has been decoded in this process is an ESC, the decoding unit 404B sends this symbol (ESC) to the latch (Step U6). The latch temporarily retains this symbol, and sends it to the context altering unit 403B (Step U7). The context altering unit 403B performs a context altering process similar to that in the encoder to decode it again.

Figure 64:
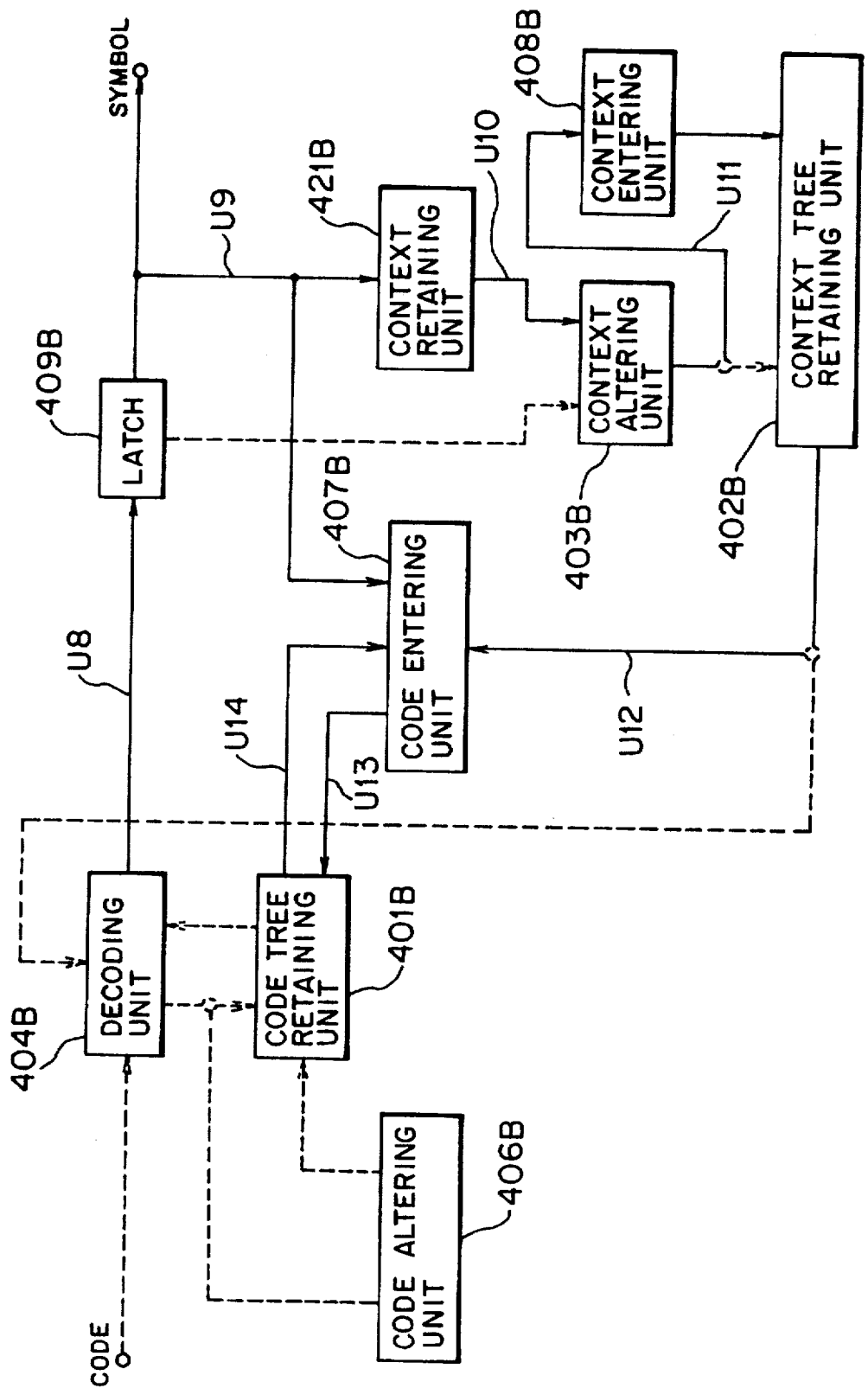
FIG. 64 depicts the operation of the data decompressing apparatus according to the third embodiment of this invention.

If the symbol decoded by the decoding unit 404B in the above process is a symbol excepting an ESC, that is, the symbol K, the decoding unit 404B sends this decoded symbol K to the context entering unit 408B via the latch 409B and the context retaining unit 421B (Steps U8 through U11) as shown in FIG. 64. The context entering unit 408B newly enters this symbol K in the context tree retaining unit 402B.

The code entering unit 407B receives a root ID of a context P in which the symbol K is stored fed from the context tree retaining unit 407B (Step U12), and sends this root ID to the code tree retaining unit 401B (Step U13).

The code retaining unit 401B sends back a root ID of a code tree having a root ID identical to the root ID of the supplied context P to the code entering unit 407B (Step U14). The code entering unit 407B enters a new code of the symbol K in the code tree having this root ID (the same route at Step U13).

The above process in the decompressor in which the code entering unit 407B enters the symbol K in the code tree retaining unit 401B is similar to the process in the encoder in which the code entering unit 322B enters the symbol K in the code tree retaining unit 301B.

If the entry process in the encoder is of the full-entry type having been described in connection with the encoder as shown in FIGS. 58 and 59, the process in the decompressor should be of the same full-entry type where the ESC is entered to all decoded contexts. If the process is of a sequential-entry type shown in FIG. 61, the process in the decompressor should be of the same sequential-entry type where the symbol K is entered in a contexts of ESC having decoded last.

Figure 65:
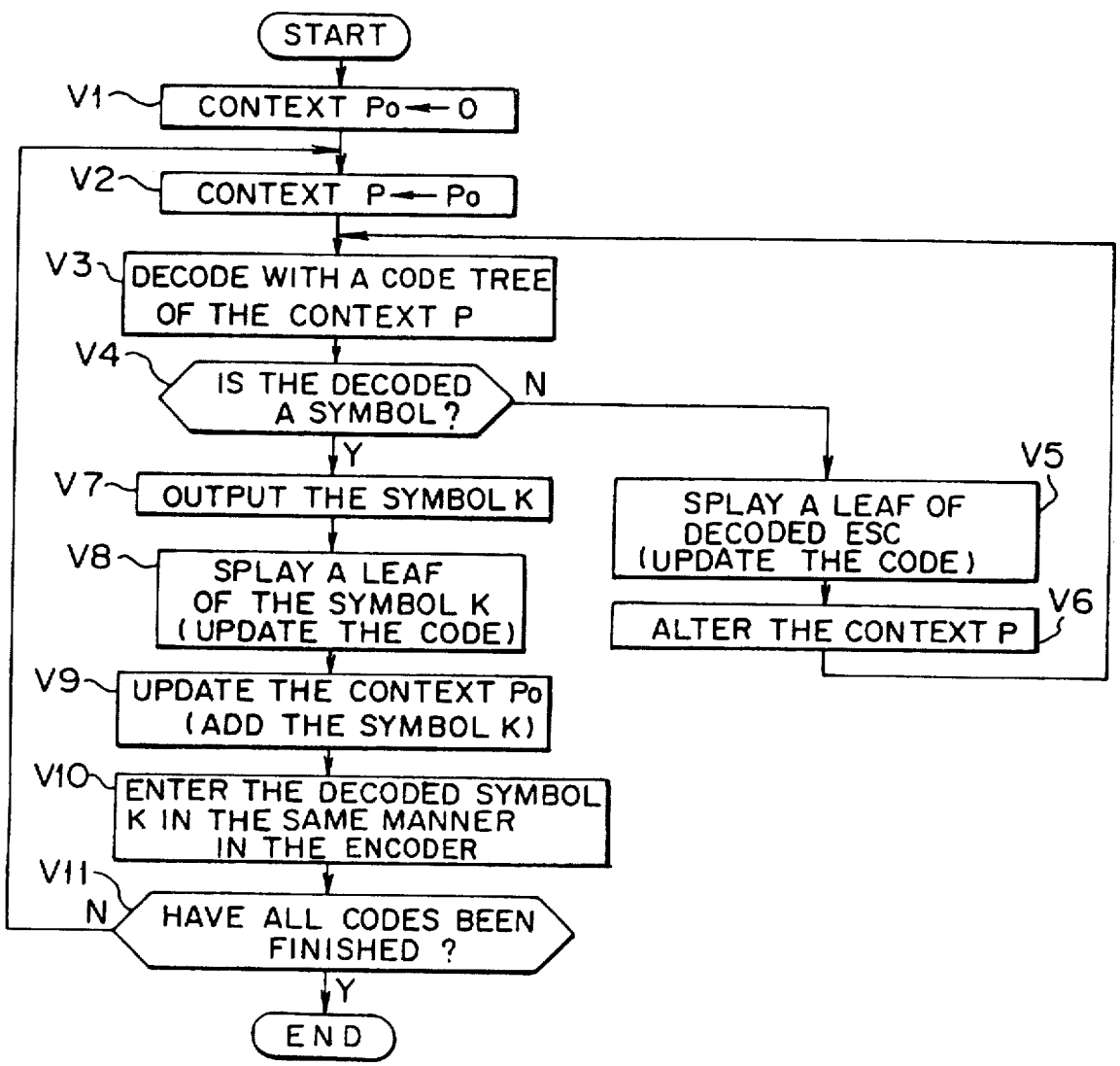
FIG. 65 is a flowchart illustrating a procedure for decoding according to the third embodiment of this invention.

As same as in the description of the encoder, the above process in the decoder may be illustrated in a flowchart in FIG. 65.

A numerical value of the maximum degree is inputted to a context (a variable) $P_0$ to initialize it (Step V1). The context $P_0$ is then inputted to a context P (Step V2).

Namely, if a code is tried to be encoded, a process is performed with a context in the maximum degree to begin with.

A code stored in a leaf of a code tree corresponding to the context P in the maximum degree is decoded (Step V3).

A check is then made on whether this decoded code is a symbol or not (Step V4). If the decoded code is not a symbol, but an ESC, a leaf of the decoded ESC is processed in the splay operation as same as in the encoder (NO route at Step V4 to Step V5). The highest degree symbol (the oldest symbol) in the context P is discarded, and the degree of the context is changed to the next lower degree so as to be updated (Step V6). The procedure returns to Step V2. In other words, the number of the degree of the context P is decremented one by one from the highest degree until a symbol excepting an ESC (that is, the symbol K) is decoded so as to make a search for the context P in which the symbol K is stored.

If the decoded signal is a symbol, it means that the symbol K is decoded, so this symbol is outputted (YES route at Step V4 to Step V7). A leaf of this symbol K is processed in the splay operation in the same manner as in the encoder so as to shorten (update) a code length of the symbol K (Step V8).

Further, the symbol K is additionally entered in the context $P_0$ (Step V9). The ESC is discarded. Incidentally, alteration of this context $P_0$ is performed in the same manner as in the encoder.

The decoded symbol K is newly entered by branching a leaf of the ESC in the same entry manner as in the encoder, for example, in the full-entry manner if the encoder employs the full-entry manner (Step V10).

A check is then made on whether decoding of all inputted codes is finished or not (Step V11). If it is not finished (NO route at Step V11), the procedure returns to Step V2, and the process is repeated until the decoding of all the codes is completed.

As above, in the data decompressing apparatus according to the third embodiment of this invention, a leaf already existing on the code tree is divided into two to make a code length of this leaf to be of [(a code length of the leaf before divided)+1] bits in the process of new entry of a symbol as same as in the decompressor, whereby a code length of the newly entered symbol K or an escape code may be of as small as 2 bits. This may therefore improve largely an efficiency in the data decompression if there are dealt with data where a relatively large number of escape codes are encoded, or in a stage in which dictionary entry is not sufficient.

As stated above, the splay process before new entry of a symbol allows a code length of the decoded symbol or an escape code to be of as small as 2 bits. The splay process after the new entry allows a code length of an escape code to be of as small as 1 bit. Consequently, it is possible to improve largely an efficiency in the data decompression.

Also as stated above, the decompressor performs the same entry process as in the decompressor so that codes may be accurately decoded.

(C-1) Description of First Modification of Third Embodiment of the Invention

Next description will be of a first modification according to the third embodiment of this invention. A data compressing apparatus and a data decompressing apparatus according to the first modification of this embodiment are also served to carry out the data compressing method and data decompressing method shown in FIG. 32, as same as in the above-mentioned third embodiment.

As same as in the third embodiment, a data compressing apparatus 3 will be referred as an compressor and a data decompressing apparatus 4 will be referred as a decoder.

(1) Description of Encoder

The Encoder has the same structure as that described in the third embodiment shown in FIG. 52.

Figure 66:
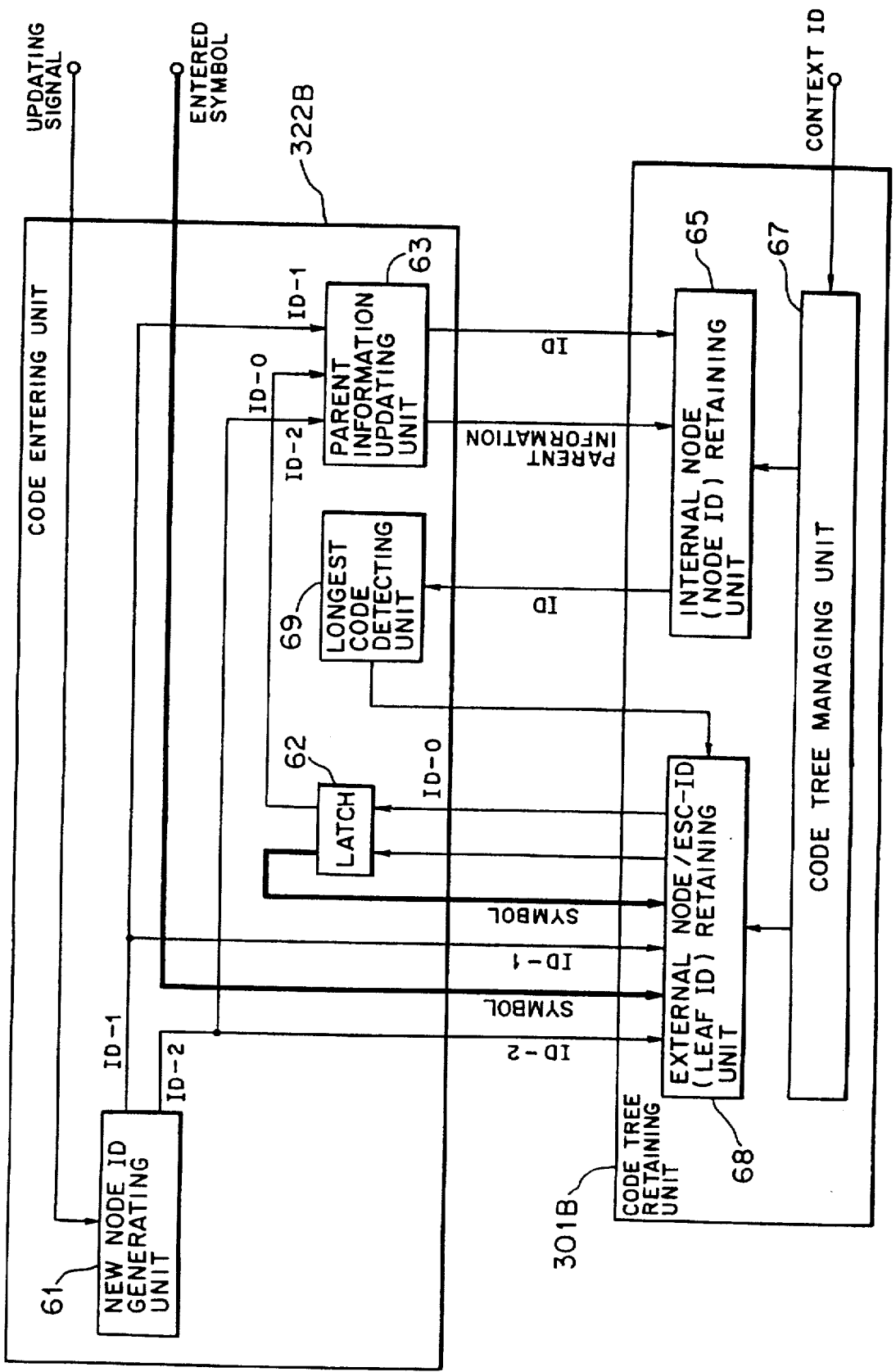
FIG. 66 is a block diagram of a code entering unit and a code tree retaining unit according to a first modification of the third embodiment of this invention.

In order to enter a symbol in a leaf having the longest code length on a code tree retained in the code tree retaining means 301B, the code entering unit 322B shown in FIG. 52 according to this embodiment includes a new node ID generating unit 61, a latch 62, a parent information updating unit 63 and a longest code length detecting unit (a bifurcation position searching means) 69, as shown in FIG. 66. The code tree retaining unit 301B has, correspondingly to that, an internal node (node ID) retaining unit 65, a code tree managing unit 67 and an external node/ESC-ID (leaf ID) retaining unit 68.

In the code entering unit 322B, the new node ID generating unit 61 generates two new node IDs (ID-1 and ID-2) in response to an updating signal from the context tree retaining unit 302B. The latch 62 latches a leaf ID detected by the longest code length detecting unit 69.

The parent information updating unit 63 receives parent information composed of three sorts of information (ESC-ID, ID-1 and ID-2) that is, an ID of the higher degree node that is an object of the process, an ID of the lower degree node positioning in the lower right of the object node, and an ID of the lower node positioning in the lower left of the object node, updates this parent information, and sends it to the code tree retaining unit 301B.

The longest code detecting unit (the bifurcation position searching means) 69 obtains a node ID of a code tree from the code tree retaining unit 301B to detect an ID (ID-0) of a leaf having the longest code length on this code tree.

In the code tree retaining unit 301B, the internal node (node ID) retaining unit 65 retains node IDs of the code tree and the external node/ESC-ID (leaf ID) retaining unit 68 retains leaf IDs of the code tree.

The code tree managing unit 67 receives a context ID from the context tree retaining unit 302B, and sends this context ID to the internal node (node ID) retaining unit 65 and the external node/ESC-ID (leaf ID) retaining unit 68.

With the above structures of the code entering unit 322B and the code tree retaining unit 301B, the code entering unit 322B searches a leaf having the longest code length on the code tree retained in the code tree retaining unit 301B, branches the leaf having the longest code length obtained by the search after encoding an escape code, and newly enters a symbol K therein.

The above process will be next described in more detail by reference to Steps W1 through W13 of a flowchart shown in FIG. 67.

In order to search a context containing the symbol K, a context (a context P) retained in the context retaining unit 302B is selected (Steps W1 and W2). A check is then made on whether the symbol K is stored in this context P or not (Step W3). If the symbol K is stored in the context P, a process similar to that at above-mentioned Steps Q9 through Q12 in the third embodiment shown in FIG. 58 is performed (Steps W9 through W12).

If the symbol K is not entered in the context P, the encoding unit 306B outputs a code of an ESC as same as at Steps Q4 and Q5 in FIG. 58 (Step W4). The code altering unit 307B processes a leaf of the ESC on the code tree retained in the code tree retaining unit 301B in the splay operation (Step W5).

Thereafter, the code tree retaining unit 301B receives an ID (a root ID) of the context P from the context tree retaining unit 302B, and sends the node ID of this context P and parent information thereof to the longest code detecting unit 69.

The longest code detecting unit 69 detects an ID (ID-0) of a leaf X(p) having the longest code length from the parent information (Step W6).

Then the longest code detecting unit 69 sends the ID, that is, the ID-0 of the detected leaf X(p) to the leaf ID retaining unit 68. The latch 70 latches this ID-0 and a symbol stored in the ID-0.

The new node ID generating unit 71 generates two new node IDs (ID-0 and ID-2). The parent information updating unit 63 receives three IDs (ID-0, ID-1 and ID-2) to update the parent information. The parent information updating unit 63 enters these node IDs in the node ID retaining unit 65 in the code tree retaining unit 301B.

On the other hand, the symbol K to be entered, the new ID (ID-2), a symbol having been entered in the ID-0 and the ID-1 are respectively entered as new leaves in the leaf ID retaining unit 68 in the code tree retaining unit 301B (Step W7).

Through the above process, a leaf having the longest code length becomes an internal node, and two new leaves are entered below this node.

The context P is then altered (Step W8). The above process is repeated until it is detected that the symbol K is stored in the context P.

In the data compression apparatus according to the first modification of the third embodiment of this invention, a leaf X(p) having the longest code length (that is, the farthest leaf from the root) is detected, and this leaf is branched to newly enter the symbol K and a symbol having been entered in the X(p) in the code tree. For this, the first modification of the third embodiment of this invention may give an advantage, in addition to the advantage given by the encoder according to the third embodiment, that a decrease in the coding efficiency caused by that the code length is extended by one bit because of (the longest code length)=(a symbol whose frequency of occurrence is the smallest) may be suppressed to a minimum. This may allow a large improvement in a processing rate in the data compression, and may largely reduce a processing load on the data compressing apparatus.

(2) Description of Decoder

A data restoring apparatus 4 according to the first modification of this embodiment has a structure similar to that shown in FIG. 62. A code entering unit 407B and a code tree retaining unit 401B in the decompressor have internal structures similar to those of the code entering unit 322B and the code tree retaining unit 301B in the encoder, respectively (refer to FIG. 66).

Since the code entering unit 407B and the code tree retaining unit 401B have the same structure as the code entering unit 322B and the code tree retaining unit 301B in the encoder, respectively, a process performed in the code entering unit 407B to newly enter an decoded symbol in the code tree retaining unit 401B is the same as that performed in the encoder.

It is sufficient to perform a process to decode a symbol K having been encoded in the encoder in the same manner as in the above-mentioned process (at Steps V1 through V11) shown in FIG. 65 according to the first embodiment. At Step V10 shown in FIG. 65, the same process as at Steps W7 and W8 in the encoder (refer to FIG. 67) is performed.

As this, in the data decompressing apparatus according to the first modification of the third embodiment of this invention, a leaf X(p) having the longest code length (that is, the farthest leaf from the leaf) on a code tree of a context P is detected, this leaf X(p) is branched, and a symbol K and a symbol having been stored in the X(p) are newly entered in the code tree, as same as in the encoder according to the third embodiment. For this, the data compressing apparatus according to the first modification of the third embodiment of this invention may give an advantage, in addition to the advantage given by the encoder according to the third embodiment, that a decrease in the coding efficiency caused by that the code length is extended by one bit because of (the longest code length)=(a symbol whose frequency of occurrence is the smallest) may be suppressed to a minimum. This may allow a large improvement in a processing rate in the data compression, and may largely reduce a processing load on the data compressing apparatus.

As stated above, the same entry process for a symbol in the encoder and decoder allows accurate decoding of the symbol having been encoded in the encoder.

(c-2) Description of Second Modification of Third Embodiment of the Invention

Next description will be of a second modification according to the third embodiment of this invention.

(1) Description of Encoder

A compressor of this embodiment has the same structure as that having been described in the third embodiment shown in FIG. 52.

A code entering unit 322B of this embodiment shown in FIG. 52 is provided with a new node ID generating unit 61, a latch 62, a parent information updating unit 63 and a latest entered ID retaining unit 70 in order to branches a leaf newly entered in a code tree retained in a code tree retaining unit 301B to enter a symbol therein. The code tree retaining unit 301B includes an external node (leaf ID) retaining unit 64, an internal node (node ID) retaining unit 65, an ESC-ID retaining unit 66 and the code tree managing unit 67.

In the above structure, the same reference characters designate the same and corresponding parts in FIG. 53 or FIG. 66, whose detailed description is here skipped.

The latest entered ID retaining unit (a bifurcation position retaining means) 70, which is newly provided in this embodiment, retains an ID of a leaf that has been entered last in a code tree retained in the code tree retaining unit 301B.

As the code entering unit 322B and the code tree retaining unit 301B have the above structures, the code entering unit 322B branches the latest leaf in which a symbol has been entered last on the code tree retained in the code tree retaining unit 301B, and enters a symbol K in this newly generated leaf.

Figure 69:
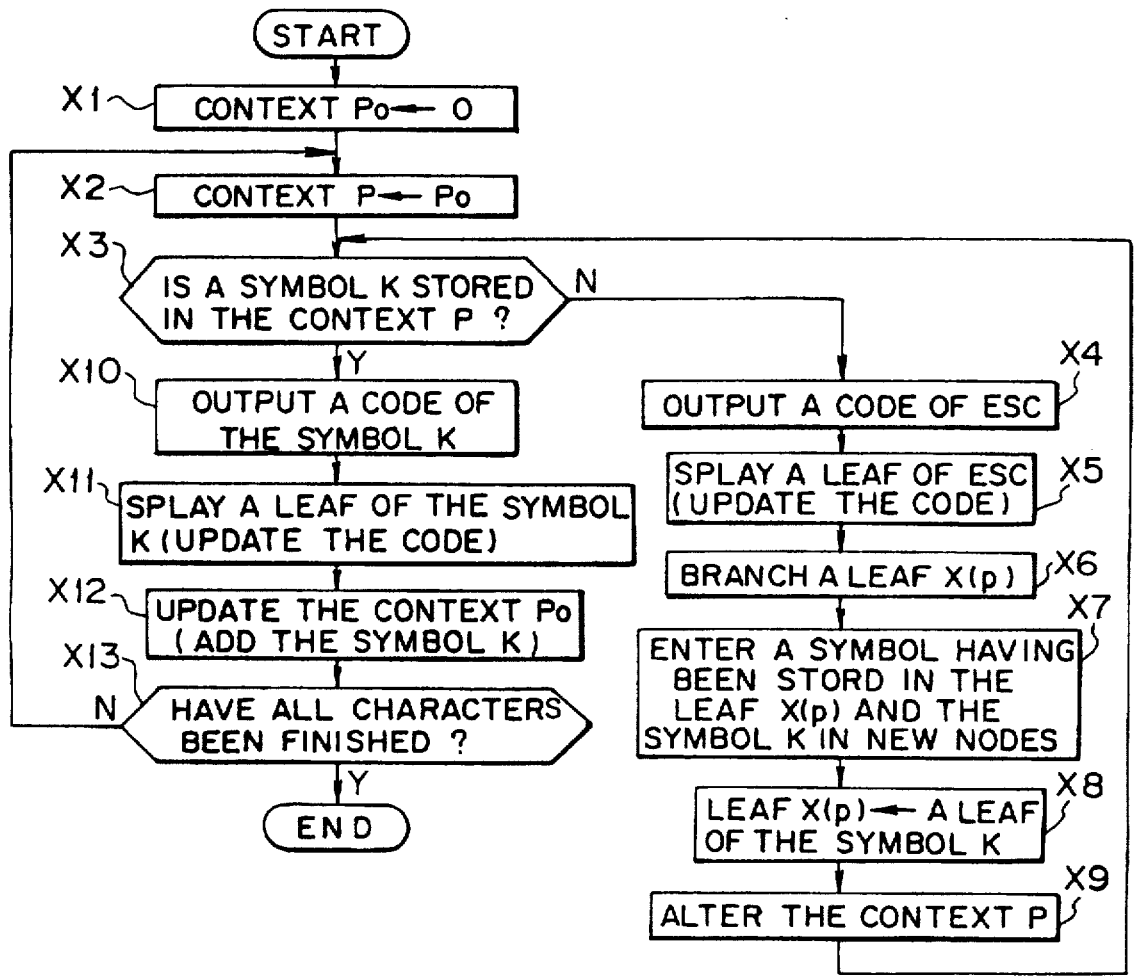
FIG. 69 is a flowchart illustrating a procedure for encoding according to the second modification of the third embodiment of this invention.
Figures 70A, 70B:
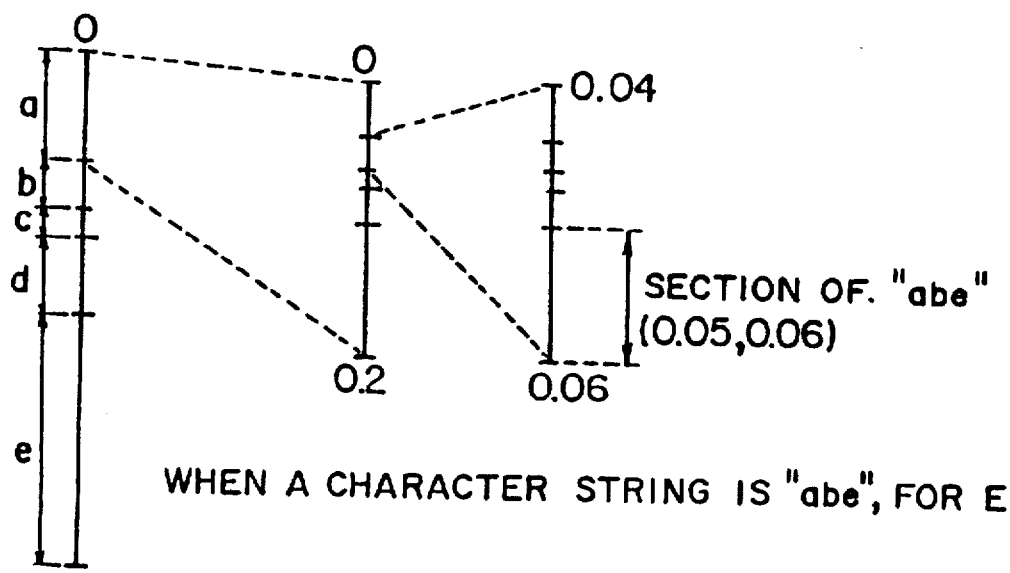
FIGS. 70(a) and 70(b) illustrate a principle of a multi-value arithmetic coding.
Figure 71B:
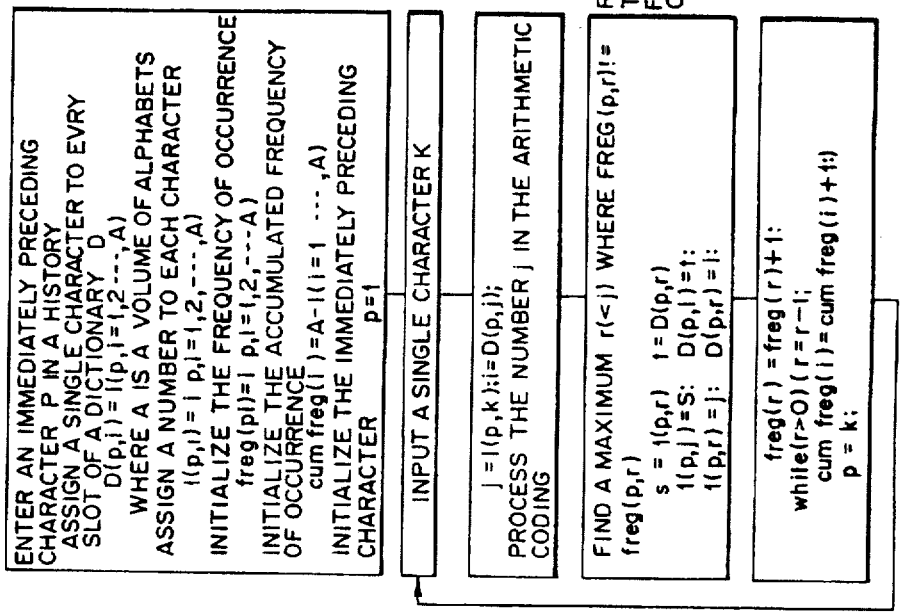
FIGS. 71(a) and 71(b) are flowcharts illustrating procedures in the multi-value arithmetic coding to compress data by a character, respectively.
Figure 71A:
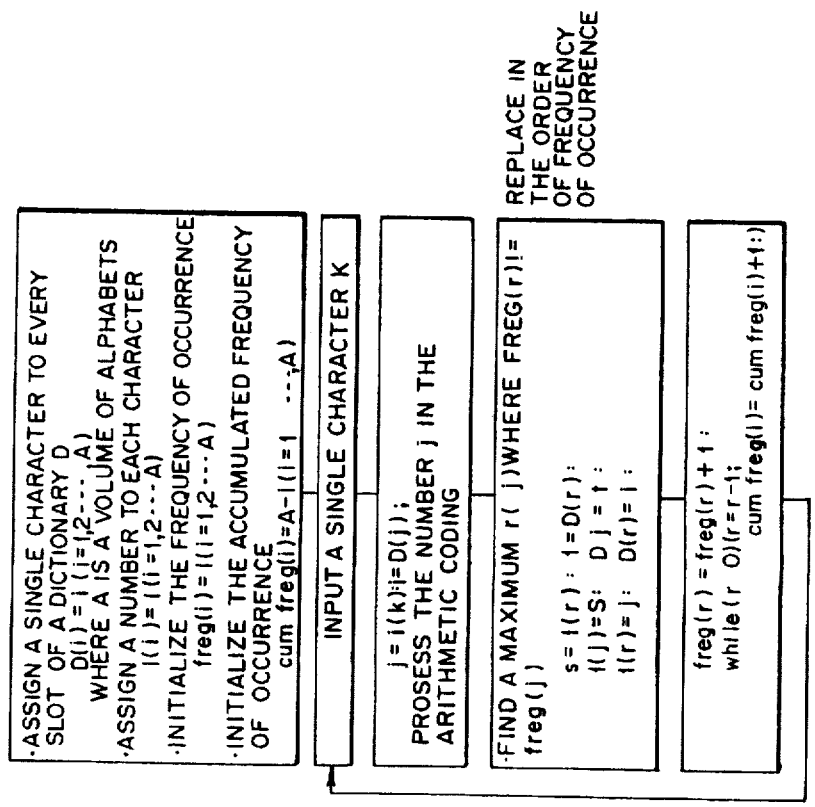
Figure 73A:
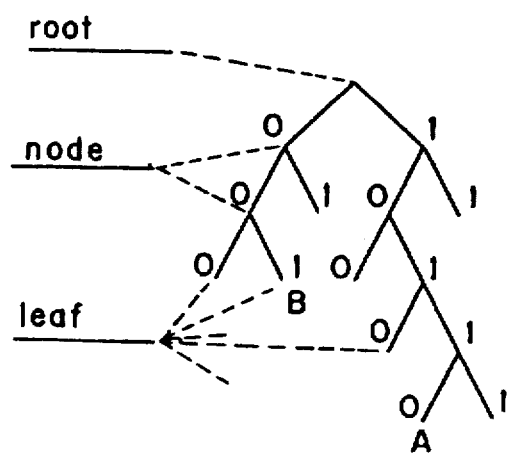
FIGS. 73(a) and 73(b) illustrate a principle of a splay coding.
Figure 73B:
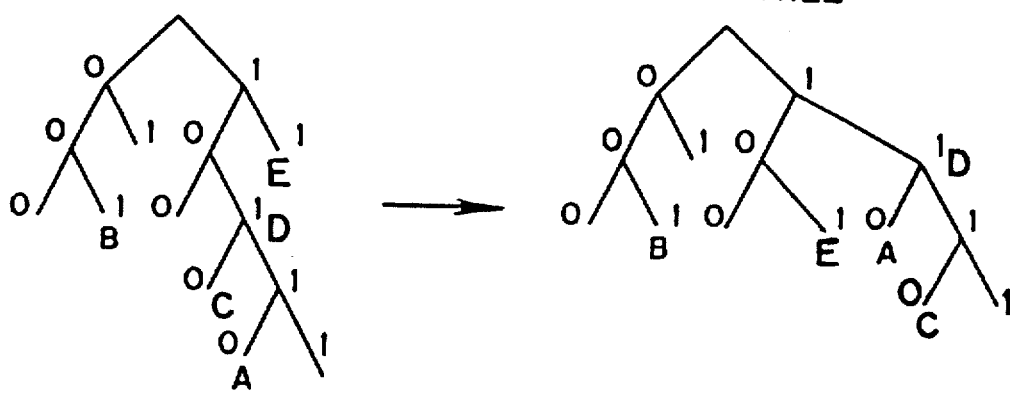
Figure 74:
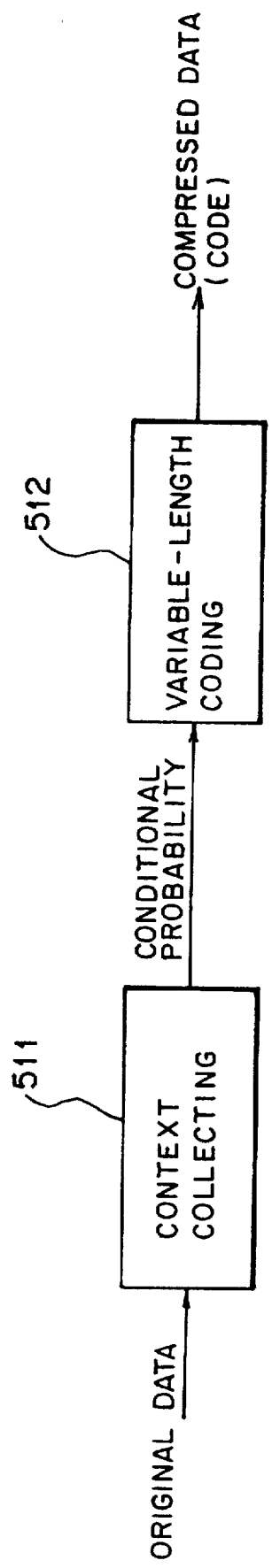
FIG. 74 illustrates a principle of a statistic encoding.
Figure 75A:
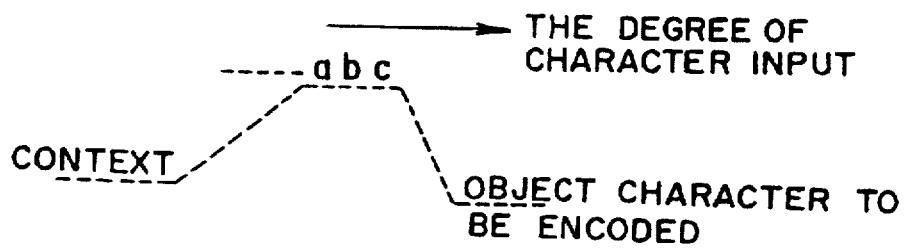
FIGS. 75(a) and 75(b) show an example of entry to a context tree.
Figure 75B:
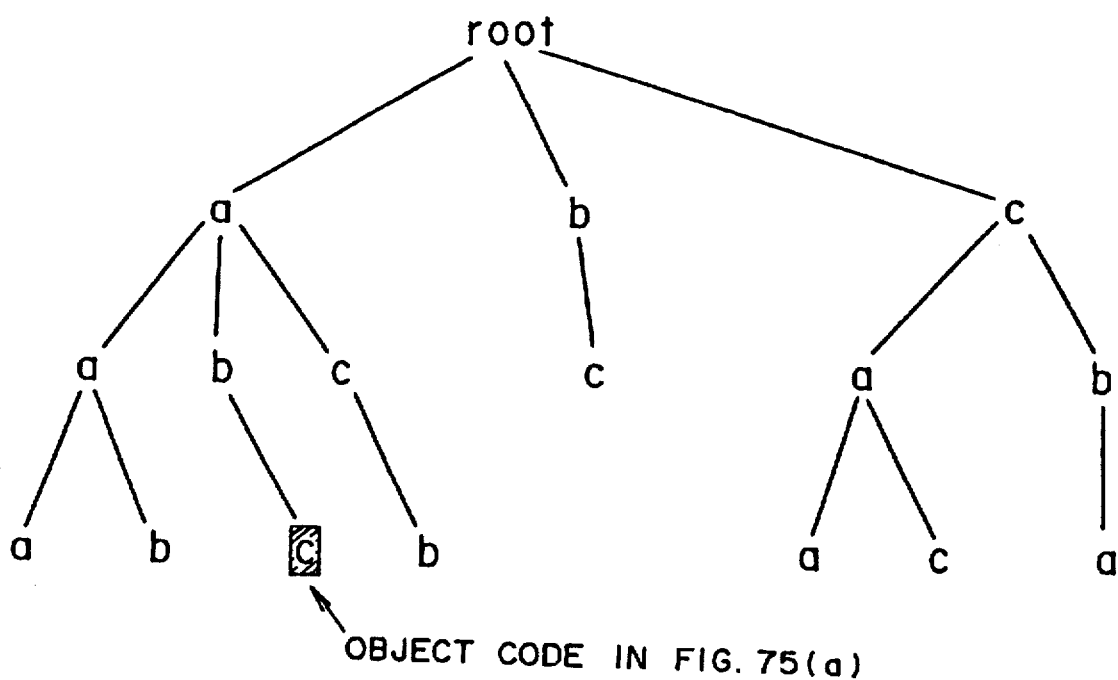

The above process will be next described in more detail by reference to Steps X1 through X13 in FIG. 69.

In the above process, an ID of the latest entered leaf that has been entered last is retained in the latest entered ID retaining unit 70 and the ID is branched to be used for new entry.

More specifically, in order to search a context containing a symbol K, a context (a context P) retained in the context retaining unit 302 is selected (Steps X1 and X2). A check is made on whether the symbol K is stored in this context or not (Step X3). If the symbol K is stored, the same process at Steps W10 through W13 in FIG. 67 having been described in the third embodiment is performed (YES route at Step X3 to Steps X10 through X13).

Figure 67:
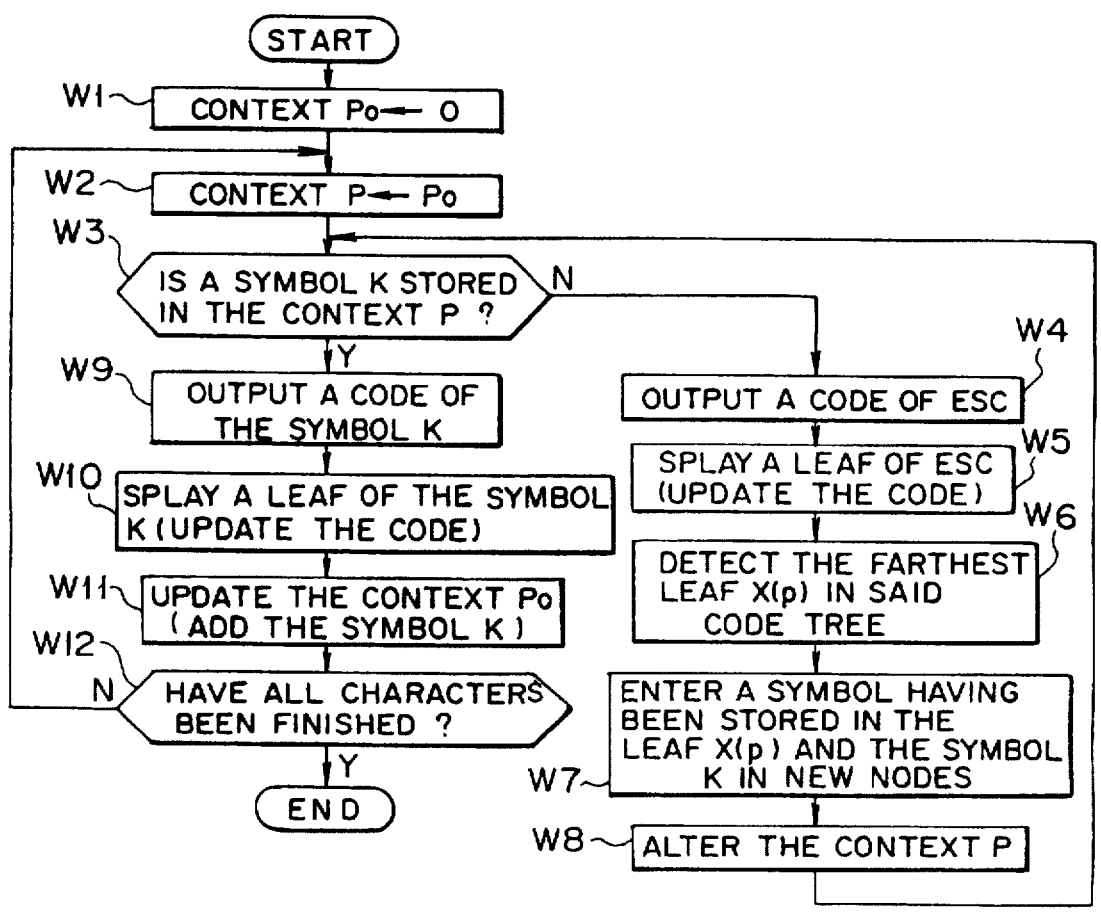
FIG. 67 is a flowchart illustrating a procedure for encoding according to the first modification of the third embodiment of this invention.

If the symbol K is not stored in the context P, the encoding unit 306B outputs a code of an ESC as same as at Steps X4 and X5 shown in FIG. 67 (Step X4). The code altering unit 307B processes a leaf of the ESC of the code tree retained in the code tree retaining unit 301B in the splay operation (Step X5).

Thereafter, the code tree retaining unit 301B outputs an ID (a root ID) of the context P as it is to the latest entered ID retaining unit 70.

The latest entered ID retaining unit 70 sends a leaf ID (ID-0) of the latest entered leaf X(p) of a code tree corresponding to the context P to the leaf ID retaining unit 64 in the code tree retaining unit 301B. The latch 62 latches the ID-0 and a symbol retained in the ID-0.

The new ID generating unit 61 generates two new IDs (ID-1 and ID-2). The parent information updating unit 63 receives three IDs (ID-0, ID-1 and ID-2) to update parent information so as to branch the leaf X(p) (Step X6). This information is entered in the node ID retaining unit 65 in the code tree retaining unit 301B.

On the other hand, the entered symbol K to be entered and a symbol having been stored in the leaf X(p) are entered as new leaves in the leaf ID retaining unit 64 in the code tree retaining unit 301B (Steps X7 and X8). The ID-2 that is a new ID is stored in the latest entered ID retaining unit 70.

The context P is then altered (Step X9). The above process is repeated until it is detected that the symbol K is entered in the context P.

Through the above process, when a new symbol K is inputted, the latest entered leaf that has been entered immediately before the input of the symbol K is divided to enter the symbol K therein.

As above, in the data compressing apparatus according to the second modification of the third embodiment of this invention, a symbol is entered in a code tree by branching a leaf in which a symbol has been entered immediately before to enter the symbol therein so as to approximate (a symbol of a leaf having entered immediately before) to (a symbol having a relatively long code length). As having stated in the first modification of the third embodiment, it is possible to skip the process to detect a leaf having the longest code length, thereby increasing a processing rate in the data compression.

(2) Description of Decoder

Figure 68:
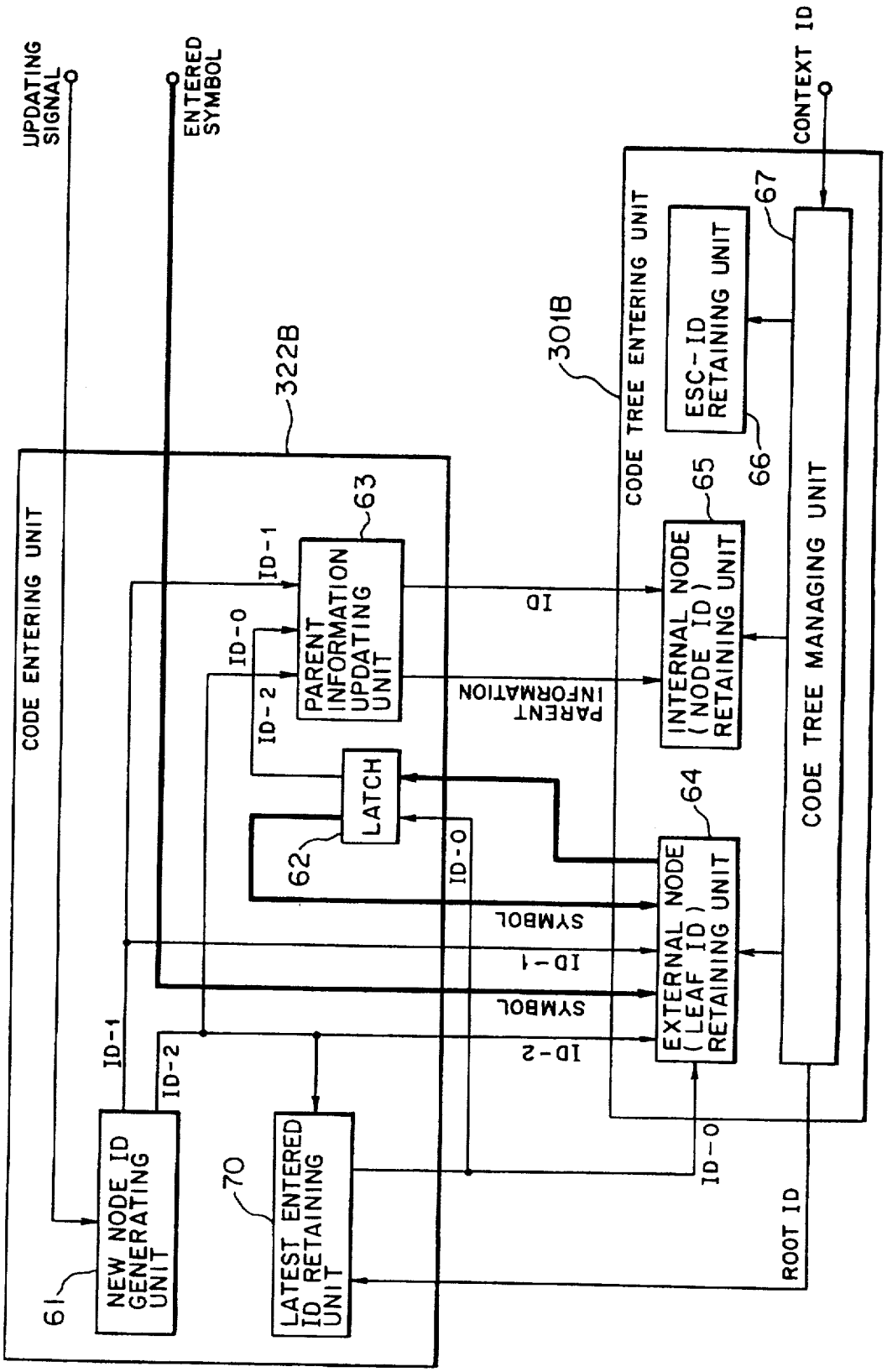
FIG. 68 is a block diagram of a code entering unit and a code tree retaining unit according to a second modification of the third embodiment of this invention.

The decompressor, as same as the encoder, has the same structure as the encoder having been described in the third embodiment shown in FIG. 62. A code entering unit 407B and a code tree retaining unit 401B in the decompressor have the same internal structure as the code entering unit 322B and the code tree retaining unit 301B in the decompressor, respectively (refer to FIG. 68).

As the code entering unit 407B and the code tree retaining unit 401B have the same structures as the code entering unit 322B and the code tree retaining unit 301B in the encoder, respectively, a process performed by the code entering unit 407B to newly enter a code of an decoded symbol in the code tree retaining unit 401B is the same as in the encoder, similarly to the decompressor according to the first modification of the third embodiment.

In consequence, a process to decode a symbol K having been encoded in the encoder according to this embodiment is performed in the same manner (Steps V1 through V11) shown in FIG. 65 according to the third embodiment. In other words, the similar process at Steps X6 through X8 in FIG. 69 that is an entry process in the encoder is performed at Step V11 in FIG. 65.

As above, in the data compressing apparatus according to the second modification of the third embodiment of this invention, a leaf of a symbol that has been entered immediately before is branched to newly enter a symbol in this leaf on a code tree in the same manner as in the encoder so as to approximate (symbol of a leaf entered immediately before) to (a symbol having a relatively long code length). It is therefore possible to skip a process to detect a leaf having the longest code length as having stated in the first modification of the third embodiment, thereby largely increasing a processing rate in the data decoding.

When a symbol is entered in a code tree in the decompressor, the same process as in the encoder is performed. This allows an accurate decoding of a symbol having been encoded in the encoder.

In the third embodiment and the modifications thereof, the method carried out in the encoder is changed depending on data to be encoded or a system. For this, it is possible to add an ID number representing which system is employed to the header portion in prior to transmission of the encoded data, and determine an entry method having been used in the encoder from the ID number to select it in the decompressor.

What is claimed is:

1. A statistical data compression method for compressing input data by encoding the input data according to a frequency of occurrence of the input data in the past, comprising the steps of:

deciding a maximum number of characters of plural characters to be registered in a code tree;

encoding and updating said input data by using a code of plural characters having been registered in said code tree coinciding as long as possible with said input data; and if the number of characters of said plural characters coinciding as long as possible with said input data does not reach said maximum number of characters, adding a character to said plural characters and additionally registering said plural characters in a leaf of said code tree.

2. The statistical data compression method according to claim 1, further comprising the steps of:

setting plural code trees each for a different encoded immediately preceding character; and encoding, updating and registering plural characters following said immediately preceding character in a corresponding code tree.

3. The statistical data compression method according to claim 2, further comprising the steps of:

registering every single character appearing in an independent code tree which is different from said plural code trees each for a different immediately preceding character;

if plural characters following said immediately preceding character corresponding to said input data do not exist in said code trees each for a different immediately preceding character, encoding an effect that said plural characters do not exist in said code trees each for a different immediately preceding character and encoding single character corresponding to said input data existing in said independent code tree; and registering said encoded single character following said immediately preceding character in said code tree corresponding to said immediately preceding character.

4. A statistical data decompression method for decompressing encoded data obtained by encoding input data according to a frequency of occurrence of the input data in the past, comprising the steps of:

deciding a maximum number of characters of plural characters to be registered in a code tree;

searching, decoding and updating plural characters having been registered in said code tree corresponding to said encoded data; and if the number of characters of said decoded plural characters does not reach said maximum number of characters, adding a character to said plural characters and additionally registering said plural characters in a leaf of said code tree.

5. The statistical data decompression method according to claim 4, further comprising the steps of:

setting plural code trees each for a different decoded immediately preceding character;

decoding plural characters following said immediately preceding character from a corresponding code tree, and updating and registering said plural characters in said code tree.

6. The statistical data decompression method according to claim 5, further comprising the steps of:

registering every single character appearing in an independent code tree which is different from said plural code trees each for a different immediately preceding character;

if plural characters following said immediately preceding character corresponding to said encoded data do not exist in said code trees each for a different immediately preceding character, decoding a code representing that said plural characters to not exist in said code trees for a different immediately preceding character;

decoding said single character existing in said independent code tree corresponding to said encoded data; and registering said decoded single character following said immediately preceding character in said code tree corresponding to said immediately preceding character.

7. A statistical data compression method for compressing input data by encoding the input data according to a frequency of occurrence of the input data in the past, comprising the steps of:

collecting a context for retaining a combination of input data and a context composed of continuous n data followed by said input data;

retaining code trees each independent for each of said context;

outputting a code defined as unique data according to bifurcation of nodes that is a bifurcating point on a path from a root that signifies a top of said code tree to a on said code tree leaf in which said data is stored if data corresponding to the context retained in said context collecting step occurs;

rearranging a code tree for exchanging a leaf of said data with a leaf of another data or an internal node after a process at said code outputting step.

8. A statistical data compression method for compressing input data by encoding the input data according to a frequency of occurrence of the input data in the past, comprising the steps of:

collecting a context for retaining a combination of input data and a context composed of continuous n data followed by said input data;

retaining code trees each independent for each of said context;

outputting a code defined as unique data according to bifurcation of a node that is a bifurcating point on a path from a root that signifies a top of said code tree to a leaf on said code tree in which said data is stored if data corresponding to the context retained in said context collecting step occurs;

rearranging a code tree for exchanging a leaf of said data with a leaf of another data or an internal node after a process at said code outputting step;

discriminating whether said combination of the input data and the context is retained at said context collecting step;

retaining in advance on said code tree a leaf in which an escape code defined as data representing that data is not stored;

if said combination of the input data and the context is not retained in a previous data at said context collecting step, outputting said escape code, repeating a process to shorten a context of said data until a combination retained at said context collecting step is obtained.

9. A statistical data compression method for compressing input data by encoding the input data according to a frequency of occurrence of the input data in the past, comprising the steps of:

collecting a context for retaining a combination of input data and a context composed of continuous n data followed by said input data;

retaining code trees each independent for each of said context;

outputting a code defined as unique data according to bifurcation of a node that is a bifurcating point on a path from a root that signifies a top of said code tree to a leaf on said code tree in which said data is stored if data corresponding to the context retained at said context collecting step occurs;

rearranging a code tree for exchanging a leaf of said data with a leaf of another data or an internal node after a process at said code outputting step;

discriminating whether said combination of the input data and the context is retained at said context collecting step;

retaining in advance on said code tree a leaf in which an escape code defined as data representing that data is not stored;

newly entering said combination of input data and a context in said context collecting step if said combination of the input data and the context is not retained in a previous data at said context collecting step;

if said combination of the input data and the context is not retained in a previous data at said context collecting step, newly entering said data in said code tree corresponding to the context;

if said combination of the input data and the context is not retained in the previous data at said context collecting step, outputting a code of said escape code, entering at the same time said combination of the input data and the context in the previous data, entering said data in said code tree corresponding to the context, repeating a process to shorten the context of said data until a combination retained at said context collecting step is obtained.

10. A statistical data compression method for compressing input data by encoding the input data according to a frequency of occurrence of the input data in the past, comprising the steps of:

collecting a context for retaining a combination of input data and a context composed of continuous n data followed by said input data;

retaining code trees each independent for each of said context;

outputting a code defined as unique data according to bifurcation of a node that is a bifurcating point on a path from a root that signifies a top of said code tree to a leaf on said code tree in which said data is stored if data corresponding to the context retained at said context collecting step occurs;

rearranging a code tree for exchanging a leaf of said data with a leaf of another data or an internal node after a process at said code outputting step;

discriminating whether said combination of the input data and the context is retained at said context collecting step;

retaining in advance on said code tree a leaf in which an escape code defined as data representing that data is not stored;

newly entering said combination of input data and a context in said context collecting step if said combination of the input data and the context is not retained in a previous data at said context collecting step;

if said combination of the input data and the context is not retained in a previous data at said context collecting step, newly entering said data in said code tree corresponding to the context;

at said context newly entering step and said code tree newly entering step, entering only a combination of an immediately preceding context which is decided to be included in the previous data and said data.

11. A statistical data decompression method for decompressing encoded data obtained by encoding input data according to a frequency of occurrence of the input data in the past, comprising the steps of:

collecting a context for retaining data of a combination of decoded data and a context;

retaining code trees each independent for each of said context;

determining a code tree of said data from a context of data having been decoded up to immediately before;

decoding said data from said code tree determined at said code tree determining step and a code of said data;

rearranging a code tree for exchanging a leaf that is a data storing point on said code tree with another leaf or an internal node that is a bifurcating point on said code tree using the same means as a compressor after said data has been decoded at said decoding step.

12. A statistical data decompression method for decompressing encoded data obtained by encoding input data according to a frequency of occurrence of the input data in the past, comprising the steps of:

collecting a context for retaining data of a combination of decoded data and a context;

retaining code trees each independent for each context;

determining a code tree of said data from a context of data having been decoded up to immediately before;

decoding said data from said code tree determined at said code tree determining step and a code of said data;

rearranging a code tree for exchanging a leaf that is a data storing point on said code tree with another leaf or an internal node that is a bifurcating point on said code tree using the same means as a compressor after said data has been decoded at said decoding step;

entering in advance an escape code defined as data representing that data is not stored in each of said code trees corresponding respective contexts, if said escape code is decoded at the decoding step, repeating a process to shorten a length of a context until a code excepting said escape code is decoded.

13. A statistical data decompression method for decompressing encoded data obtained by encoding input data according to a frequency of occurrence of the input data in the past, comprising the steps of:

retaining data of a combination of decoded data and a context;

retaining code trees each independent for each context;

determining a code tree of said data from a context of data having been decoded up to immediately before;

decoding said data from said code tree determined at said code tree determining step and a code of said data;

rearranging a code tree for exchanging a leaf that is a data storing point on said code tree with another leaf or an internal node that is a bifurcating point on said code tree using the same means as a compressor after said data has been decoded at said decoding step;

newly entering said data at said context collecting step;

newly entering the decoded data in said code tree corresponding to the context;

if an escape code defined as data representing that data is not stored is decoded, executing said context newly entering step and said code tree newly entering step, repeating a process to shorten a length of the context until a code excepting said escape code is decoded.

14. A statistical data decompression method for decompressing decoded data obtained by encoding input data according to a frequency of occurrence of the input data in the past, comprising the steps of:

collecting a context for retaining data of a combination of decoded data and a context;

retaining code trees each independent for each context;

determining a code tree of said data from a context of data having been decoded up to immediately before;

decoding said data from said code tree determined at said code tree determining step and a code of said data;

rearranging a code tree for exchanging a leaf that is a data storing point on said code tree with another leaf or an internal node that is a bifurcating point on said code tree using the same means as an encoder after said data has been decoded at said decoding step;

newly entering said data at said context collecting step;

newly entering the decoded data in said code tree corresponding to the context;

if an escape code is decoded even once in a process until a code excepting the escape code defined as data representing that data is not stored is decoded, newly entering the decoded data in a context obtained immediately before the decoding of a code excepting said escape code at said context newly entering step and said code tree newly entering step.

15. A statistical data compression apparatus encoding input data according to a frequency of occurrence of the input data in the past to compress the input data, comprising:

a pre-data retaining means retaining a context composed of n input data having been inputted up to immediately before an input of said input data;

a data retaining means retaining a combination of said input data and a context;

a code tree retaining means retaining code trees each independent for each of said context;

code tree determining means determining a code tree of said data from said input data obtained up to immediately before retained in said pre-data retaining means;

a code outputting means outputting unique data according to bifurcation from a node that is a bifurcating point positioning on a path from a root that signifies a top of said code tree selected by said code tree determining means to a leaf in which said data is stored;

a code tree rearrangement means exchanging an encoded leaf with another leaf or an internal node;

a pre-data updating means entering said data in said pre-data retaining means.

16. A statistical data compression apparatus encoding input data according to a frequency of occurrence of the input data in the past to compress the input data, comprising:

a pre-data retaining means retaining a context composed of n input data having been inputted up to immediately before an input of said input data;

a data retaining means retaining a combination of said input data and a context;

a code tree retaining means retaining code trees each independent for each context in which an escape code defined as data representing that data is not stored is entered in advance;

a code tree determining means determining a code tree of said data from said context and said input data;

a context discriminating means discriminating whether said data is stored in said code tree determined by said code tree determining means;

an escape code outputting means outputting an escape code according to bifurcation from a node that is a bifurcating point positioning on a path from a leaf that signifies a top of said code tree to a leaf that is a data storing point if said data is not stored in said code tree;

a context altering means shortening a length n of the context if said data is not stored in said code tree;

a code outputting means outputting a code of said data according to bifurcation from a node positioning on a path from a root of said code tree to a leaf of said data if said data is not stored in said code tree;

a code tree rearrangement means exchanging an encoded leaf with another leaf or an internal node;

a pre-data updating means entering said data in said pre-data retaining means;

a control means repeating a process until said data is encoded if said escape code is encoded.

17. A statistical data compression apparatus encoding input data according to a frequency of occurrence of the input data in the past to compress the input data, comprising:

a pre-data retaining means retaining a context composed of n input data having been inputted up to immediately before an input of said input data;

a data retaining means retaining a combination of said input data and a context;

a code tree retaining means retaining code trees each independent for each context in which an escape code defined as data representing that data is not stored is entered in advance;

a code tree determining means determining a code tree of said data from said context and said input data;

a context discriminating means discriminating whether said data is stored in said code tree determined by said code tree determining means;

an escape code outputting means outputting an escape code according to bifurcation from a node that is a bifurcating point positioning on a path from a leaf that signifies a top of said code tree to a leaf that is a data storing point if said data is not stored in said code tree;

a data entering means entering said combination of said data and the context in said history retaining means if said data is not stored in said code tree;

a code entering means newly entering said data in said code tree if said data is not stored in said code tree;

a context altering means shortening a length n of the context if said data is not stored in said code tree;

a code outputting means outputting a code of said data according to bifurcation from a node positioning on a path from a root of said code tree to a leaf of said data if said data is stored in said code tree;

a code tree rearrangement means exchanging an encoded leaf with another leaf or an internal node;

a pre-data updating means entering said data in said pre-data retaining means;

a control means repeating a process until said data is encoded if said escape code is encoded.

18. A statistical data compression apparatus encoding input data according to a frequency of occurrence of the input data in the past to compress the input data, comprising:

a pre-data retaining means retaining a context composed of n input data having been inputted up to immediately before an input of said input data;

a data retaining means retaining a combination of said input data and a context;

a code tree retaining-means retaining code trees each independent for each context in which an escape code defined as data representing that data is not stored is entered in advance;

a code tree determining means determining a code tree of said data from said context and said input data;

a context discriminating means discriminating whether said data is stored in said code tree determined by said code tree determining means;

an escape code outputting means outputting an escape code according to bifurcation from a node that is a bifurcating point positioning on a path from a leaf that signifies a top of said code tree to a leaf that is a data storing point if said data is not stored in said code tree;

a context altering means shortening a length n of the context if the said data is not stored in said code tree;

an escape code outputting means outputting a code of said data according to bifurcation from a node positioning on a path from a root of said code tree to a leaf of said data if said data is stored in said code tree;

a data entering means entering the combination of said data and the context in said history retaining means;

a code entering means newly entering said data in a code tree;

a code tree rearrangement means exchanging an encoded leaf with another leaf or an internal node;

a data pre-updating means entering said data in said pre-data retaining means;

a control means causing said history entering means to enter a combination of a context immediately before the encoding of said data and said data in said data retaining means if said escape code is encoded even one in encoding of said data, and causing said code entering means to newly enter said data in a code tree having an escape code having been encoded immediately before the encoding of said data.

19. A statistical data decompression apparatus for decoding a code having been encoded according to a frequency of occurrence in the past, comprising:

a pre-data retaining means retaining n data having been decoded before decoding a code;

a data retaining means retaining a combination of decoded data and a context therein;

a code tree determining means determining a code tree used to decode said data from the context retained in said pre-data retaining means;

a decoding means outputting data stored in a leaf that is a data storing point on a path reached by scanning a node that is a bifurcating point from a root that signifies a top of said code tree selected by said code tree determining means according to a code;

a code tree rearrangement means exchanging a decoded leaf with another leaf or an internal node; and a pre-data updating means entering the decoded data in said pre-data retaining means.

20. A statistical data decompression apparatus for decoding a code having been encoded according to a frequency of occurrence in the past, comprising:

a pre-data retaining means retaining n data having been encoded in the past;

a data retaining means retaining a combination of decoded data and a context;

a code tree retaining means retaining a code tree in which an escape code defined as data representing that data is not stored is entered in advance;

a code tree determining means determining a code tree used to decode said data from the context retained in said pre-data retaining means;

a decoding means outputting data stored in a leaf that is a data storing point reached by scanning a node that is a bifurcating point on a path from a root that signifies a top of said code tree selected by said code tree determining means according to a code;

a code tree rearrangement means exchanging a decoded leaf with another leaf or an internal node;

a context altering means discarding said data if outputted data is said escape code to shorten the context;

a pre-data updating means entering the decoded data in said pre-data retaining means;

a control means causing said context altering means to reset the context when said escape code is decoded and repeating a process until a code excepting said escape code is decoded.

21. A statistical data decompression apparatus for decoding a code having been encoded according to a frequency of occurrence in the past, comprising:

a pre-data retaining means retaining n data having been decoded before decoding a code;

a data retaining means retaining a combination of decoded data and a context;

a code tree retaining means retaining a code tree in which an escape code is stored in advance;

a code tree determining means determining a code tree used to decode said data from the context retained in said pre-data retaining means;

a decoding means outputting data stored in a leaf that is a data storing point reached by scanning a node that is a bifurcating point on a path from a root that signifies a top of said code tree selected by said code tree determining means according to a code;

a code tree rearrangement means exchanging the decoded leaf with another leaf or internal node;

a context altering means discarding said data if output data is said escape code to shorten the context;

a pre-data updating means entering the decoded data in said data retaining means;

a data entering means entering all contexts obtained when said escape code is decoded in a decoding process and decoded data in said history retaining means;

a code entering means entering a code of said data in all code trees corresponding to the context obtained at the time of decoding of said escape code in the decoding process for said data;

a control means causing said context altering means to reset the context when said escape code is decoded and repeating a process until said escape code is decoded.

22. A statistical data decompression apparatus for decoding a code having been encoded according to a frequency of occurrence in the past, comprising:

a pre-data retaining means retaining n data having been decoded before decoding a code;

a data retaining means retaining a combination of decoded data and a context therein;

a code tree retaining means retaining a code tree in which an escape code defined as data representing that data is not entered is stored in advance;

a code tree determining means determining a code tree used to decode said data from the context retained in said pre-data retaining means;

a decoding means outputting data stored in a leaf that is a data storing point reached by scanning a node that is a bifurcating point on a path from a root that means a top of said code tree selected by said code tree determining means according to a code;

a code tree rearrangement means exchanging decoded leaf with another leaf or an internal node;

a context altering means discarding said data if outputted data is said escape code to shorten the context;

a pre-data updating means entering the decoded data in said pre-data retaining means;

a data entering means entering a context at the time of the last decoding of said escape code in a decoding process for said data and the decoded data in said history retaining means;

a code entering means entering a code of said data in a code tree corresponding to a context at the time of the last decoding of said escape code in the decoding process for said data;

a control means causing said context altering means to reset the context if said escape code is decoded and repeating a process until a code excepting said escape code is decoded.

23. A statistical data compression method for encoding input data according to a frequency of occurrence of the input data in the past to compress the input data, comprising the steps of:

retaining a context tree in which a combination of input data and a context composed of continuous n data followed by said input data;

retaining code trees each independent for each of said context;

newly entering said data in the context tree retained at said context tree retaining step if said combination of the input data and the context is not retained at said context tree retaining step;

newly entering said data in the code tree retained at said code tree retaining step if said combination of the input data and the context is not retained at said context tree retaining step;

storing said data in a new leaf obtained by branching a leaf that is a data storing point on the code tree retained at said code tree retaining step if said combination of the input data and the context is not retained at said context tree retaining step;

altering the context if said combination of the input data and the context is not retained at said context tree retaining step;

outputting a code according to bifurcation on a path from a top of said code tree to a leaf in which said input data or a specific code is stored on said code tree;

exchanging a leaf in which said input data or the specific code in said code tree is stored with another leaf or an internal node defined as a bifurcating point excepting the top of said code tree;

branching a leaf in which said specific code is stored to enter said specific code and new data in newly obtained two leaves at said newly entering step.

24. A statistical data compression method for encoding input data according to a frequency of occurrence of the input data in the past to compress the input data, comprising the steps of:

retaining a code tree in which an escape code defined as data representing that data is not stored is stored in advance;

retaining a context tree in which a combination of input data and continuous n data followed by said input data;

newly entering said data in the context tree retained at said context tree retaining step if said combination of the input data and the context is not retained at said context tree retaining step;

newly entering said data in the code tree retained at said code tree retaining step if said combination of the input data and the context is not retained at said context tree retaining step;

storing said data in a new leaf obtained by branching a leaf that is a data storing point on the code tree retained at said code three retaining step if said combination of the input data and the context is not retained at said context tree retaining step;

altering the context if said combination of the input data and the context is not retained at said context tree retaining step;

outputting a code according to bifurcation on a path from a top of said code tree to a leaf in which said input data or the escape code is stored;

exchanging a leaf in which said input data or the escape code is stored with another leaf or an internal node defined as a bifurcating point excepting the top of said code tree;

branching a leaf in which said escape code is stored to enter said escape code and new data in newly obtained two leaves at said newly entering step.

25. A data compressing method according to claim 24, wherein at said newly entering step, a leaf having the longest distance from the root defined as the top of the code tree among leaves under the same context is branched, and data having been stored in the branched leaf and new data are entered in newly obtained two leaves.

26. A data compressing method according to claim 24, wherein at said newly entering step, a leaf having been entered last among leaves under the same context is branched, data having been stored in the branched leaf and new data are stored in newly obtained two leaves.

27. A statistical data decompression method for decoding a code obtained by encoding input data according to a frequency of occurrence of the input data in the past, comprising the steps of:

retaining a context tree in which a combination of decoded data and a context is stored;

retaining code trees each independent for each said context;

determining a code tree of said code from data having been decoded up to immediately before;

decoding a code by scanning a path from a root that signifies a top of said code tree to a leaf that is a data storing point according to said code;

altering the context if the reached leaf is a specific code in the code tree;

exchanging leaves of the decoded data and said specific code with another leaves or an internal node that is a bifurcating point;

newly entering the decoded data in the code tree if said specific code is decoded;

entering the data having been entered at said newly entering step in the context tree retained at said context tree retaining step;

at said newly entering step, branching the same leaf as a leaf having been selected to be branched in an encoder to enter new data therein.

28. A statistical data decompression method for decoding a code obtained by encoding input data according to a frequency of occurrence of the input data in the past, comprising the steps of:

retaining a code tree in which an escape code defined as data representing that data is not stored is stored in advance;

retaining a context tree in which a combination of decoded data and a context is stored;

determining a code tree of said code from data having been decoded up to immediately before;

decoding a code by scanning a path from a root that signifies a top of said code tree to a leaf that is a data storing point according to said code;

altering the context if a reached leaf is said escape code;

exchanging leaves of the decoded data and said escape code with another leaves or an internal node that is a bifurcating point;

newly entering the decoded data in the code tree if said escape code is decoded;

entering the data having been entered at said newly entering step in the context tree retained at said context tree retaining step;

at said newly entering step, branching the same leaf as a leaf having been selected to be branched in an encoder to enter new data therein.

29. A statistical data compression apparatus for encoding input data according to a frequency of occurrence of the input data in the past, comprising:

a code tree retaining means retaining a code tree in which an escape code defined as data representing that data is not stored is stored in advance;

a context tree retaining means retaining therein a context tree in which a combination of input data and a context is stored;

a context entering means newly entering said data in said context tree after said escape code has been encoded;

a code entering means branching a leaf that is a data storing point of said escape code on the code tree after said escape code has been encoded to newly enter said data therein;

a context altering means altering the context if the combination of said input data and the context is not retained in the context tree;

an encoding means outputting a code according to bifurcation on a path from a top of the code tree to a leaf in which said input data or an escape code is stored;

a code updating means exchanging leaves in which encoded data and said escape code are stored with another leaves or a node.

30. A statistical data compression apparatus for encoding input data according to a history of occurrence of the input data in the past comprising:
- a code tree retaining means retaining a code tree in which an escape code defined as data representing that data is not stored is stored in advance;
- a context tree retaining means retaining therein a context tree in which a combination of input data and a context is stored;
- a context entering means newly entering said data in the context tree after said escape code has been encoded;
- a branching position searching means searching a leaf having the longest code length on said code tree;
- a code entering means branching a leaf that is a data stored point having been searched by said branching position searching means to newly enter said data after said escape code has been encoded;
- a context altering means altering the context if the combination of said input data and the context is not retained in the context tree;
- an encoding means outputting a code according to bifurcation on a path from a top of the code tree to a leaf in which the input data or said escape code is stored; and
- a code updating means exchanging leaves in which encoded data and said escape code are stored with another leaves or a node.

31. A statistical data compression apparatus for encoding input data according to a frequency of occurrence of the input data in the past, comprising:
- a code tree retaining means retaining a code tree in which an escape code defined as data representing that data is not stored in advance;
- a context tree retaining means retaining a context tree in which a combination of input data and a context is stored;
- a context entering means newly entering said data in the context tree after said escape code has been encoded;
- a branching position retaining means retaining a position of a leaf that is a data storing point having been newly entered in said code tree;
- a code entering means branching a leaf in a position retained in said branching position retaining means after said escape code has been encoded to newly enter said data therein;
- a context altering means altering the context if the combination of said input data and the context is not stored in the context tree;
- an encoding means outputting a code according to bifurcation on a path from a top of the code tree to a leaf in which the input data or said escape code is stored;
- a code updating means exchanging leaves in which encoded data and said escape code are stored with another leaves or a node that is a bifurcating point.

32. A statistical data decompression apparatus for decoding a code obtained by encoding input data according to a frequency of occurrence of the input data in the past, comprising:
- a code tree retaining means retaining a code tree in which an escape code defined as data representing that data is not stored in advance;
- a context tree retaining means retaining a context tree in which a combination of decoded data and a context is stored;
- a code tree determining means determining a code tree of said code from data having been decoded up to immediately before;
- a decoding means decoding a code by scanning a path from a root that signifies a top of said code tree to a leaf that is a data storing point according to said code;
- a context altering means altering the context if a reached leaf is said escape code;
- a code updating means exchanging leaves of the decoded data and said escape code with another leaves or a node that is a bifurcating point;
- a code entering means branching a leaf of said escape code when said escape code is decoded to newly enter the decoded data therein;
- a context tree entering means entering the data having been entered by said code entering means in the context tree retained in said context tree retaining means.

33. A statistical decompression apparatus for decoding a code obtained by encoding input data according to a frequency of occurrence of the input data in the past, comprising:
- a code tree retaining means retaining a code tree in which an escape code defined as data representing that data is not stored is stored in advance;
- a context tree retaining means retaining a context tree in which a combination of decoded data and a context is stored;
- a code tree determining means determining a code tree of said code from data having been decoded up to immediately before;
- a decoding means decoding a code by scanning a path from a root that signifies a top of said code tree to a leaf that is a data storing point according to said code;
- a context altering means altering the context if a reached leaf is said escape code;
- a code updating means exchanging leaves of the decoded data and said escape code with another leaves or an internal node that is a bifurcating point;
- a branching position searching means searching a leaf having the longest code length on said code tree;
- a code entering means branching a leaf having been searched by said branching position searching means after said escape code has been encoded to newly enter said data therein;
- a context tree entering means entering the data having been entered by said code entering means in the context tree retained in said context tree retaining means.

34. A statistical data decompression apparatus for decoding a code obtained by encoding input data according to a frequency of occurrence of the input data, comprising:
- a code tree retaining means retaining a code tree in which an escape code defined as data representing that data is not stored is stored in advance;
- a context tree retaining means retaining a context tree in which a combination of decoded data and a context is stored;
- a code tree determining means determining a code tree of said code from data having been decoded up to immediately before;
- a decoding means decoding a code by scanning a path from a root that signifies a top of said code tree to a leaf that is a data storing point according to said code;
- a context altering means altering the context if a reached leaf is said escape code;
- a code updating means exchanging leaves of the decoded data and said escape code with another leaves or an internal node that is a bifurcating point;

a branching position retaining means retaining a position of a leaf having been newly entered in said code tree;

a code entering means branching a leaf in a position retained in said branching position retaining means after said escape code has been encoded to newly enter said data therein;

a context tree entering means entering the data having entered by said code entering means in the context tree retained in said context tree retaining means.

* * * * *